United States Patent
Stoessel et al.

(10) Patent No.: US 12,250,871 B2
(45) Date of Patent: Mar. 11, 2025

(54) METAL COMPLEXES

(71) Applicant: UDC IRELAND LIMITED, Dublin (IE)

(72) Inventors: Philipp Stoessel, Frankfurt am Main (DE); Falk May, Mainz (DE); Armin Auch, Darmstadt (DE); Charlotte Walter, Darmstadt (DE)

(73) Assignee: UDC IRELAND LIMITED, Dublin (IE)

( * ) Notice: Subject to any disclaimer, the term of this patent is extended or adjusted under 35 U.S.C. 154(b) by 736 days.

(21) Appl. No.: 17/603,704

(22) PCT Filed: Apr. 14, 2020

(86) PCT No.: PCT/EP2020/060368
§ 371 (c)(1),
(2) Date: Oct. 14, 2021

(87) PCT Pub. No.: WO2020/212296
PCT Pub. Date: Oct. 22, 2020

(65) Prior Publication Data
US 2022/0209141 A1 Jun. 30, 2022

(30) Foreign Application Priority Data
Apr. 15, 2019 (EP) .................................. 19169355

(51) Int. Cl.
| | | |
|---|---|---|
| H01L 51/00 | (2006.01) | |
| C07F 15/00 | (2006.01) | |
| C09K 11/06 | (2006.01) | |
| H10K 85/30 | (2023.01) | |
| H10K 50/11 | (2023.01) | |
| H10K 101/10 | (2023.01) | |

(52) U.S. Cl.
CPC ....... H10K 85/342 (2023.02); C07F 15/0033 (2013.01); C07F 15/0086 (2013.01); C09K 11/06 (2013.01); H10K 85/346 (2023.02); *C09K 2211/1059* (2013.01); *C09K 2211/1066* (2013.01); *C09K 2211/185* (2013.01); *H10K 50/11* (2023.02); *H10K 2101/10* (2023.02)

(58) Field of Classification Search
CPC .............. H10K 85/342; H10K 85/346; C09K 2211/185
See application file for complete search history.

(56) References Cited

U.S. PATENT DOCUMENTS

| | | | |
|---|---|---|---|
| 2007/0034863 A1* | 2/2007 | Fortte | H10K 85/361 |
| | | | 546/10 |
| 2008/0214818 A1* | 9/2008 | Chin | C07D 471/04 |
| | | | 546/81 |
| 2012/0153816 A1 | 6/2012 | Takizawa et al. | |
| 2015/0179960 A1* | 6/2015 | Wang | H10K 85/342 |
| | | | 546/4 |
| 2015/0270500 A1 | 9/2015 | Stoessel | |
| 2015/0295189 A1 | 10/2015 | Brooks et al. | |
| 2016/0233443 A1 | 8/2016 | Stoessel | |
| 2016/0351812 A1* | 12/2016 | Lam | C09K 11/06 |
| 2018/0337344 A1 | 11/2018 | Lin et al. | |
| 2018/0337349 A1 | 11/2018 | Li | |

FOREIGN PATENT DOCUMENTS

| | | |
|---|---|---|
| CN | 103003290 | 3/2013 |
| CN | 104428392 | 3/2015 |
| CN | 104520308 | 4/2015 |
| CN | 104718219 | 6/2015 |
| CN | 104870458 | 8/2015 |
| CN | 104870459 | 8/2015 |
| CN | 105531347 | 4/2016 |
| CN | 105916868 | 8/2016 |
| CN | 105980519 | 9/2016 |
| CN | 107207550 A | 9/2017 |
| CN | 107849077 | 3/2018 |
| CN | 107922451 | 4/2018 |
| CN | 108690092 | 10/2018 |
| CN | 109415344 | 3/2019 |
| JP | 2011222650 | 11/2011 |
| JP | 2014513070 | 5/2014 |
| JP | 2016537397 | 12/2016 |
| JP | 2018510903 | 4/2018 |
| WO | 2010/086089 A1 | 8/2010 |
| WO | 2011/157339 A1 | 12/2011 |

OTHER PUBLICATIONS

International Search Report and Written Opinion received for PCT Patent Application No. PCT/EP2020/060368, mailed on Sep. 21, 2021, 14 pages (6 pages of English Translation and 8 pages of Original Document).

* cited by examiner

*Primary Examiner* — Alexander C Kollias
(74) *Attorney, Agent, or Firm* — Riverside Law LLP

(57) ABSTRACT

The present invention relates to metal complexes and electronic devices, in particular organic electroluminescent devices, containing said metal complexes.

14 Claims, No Drawings

METAL COMPLEXES

CROSS-REFERENCE TO RELATED APPLICATIONS

This application is a national stage application (under 35 U.S.C. § 371) of PCT/EP2020/060368, filed Apr. 14, 2020, which claims benefit of European Application No. 19169355.5, filed Apr. 15, 2019, both of which are incorporated herein by reference in their entirety.

The present invention relates to metal complexes suitable for use as emitters in organic electroluminescent devices.

In organic electroluminescent devices (OLEDs) in which organic semiconductors are used as functional materials, emitting materials used are frequently organometallic complexes which exhibit phosphorescence rather than fluorescence. In general terms, there is still a need for improvement in OLEDs which exhibit triplet emission, especially with regard to efficiency, operating voltage and lifetime. Triplet emitters used are iridium complexes and platinum complexes in particular. Iridium complexes used are especially bis- and tris-ortho-metalated complexes having aromatic ligands, wherein the ligands bind to the metal via a negatively charged carbon atom and an uncharged nitrogen atom. Examples of such complexes are imidazoisoquinoline complexes, for example according to WO 2010/086089 or WO 2011/157339, or imidazophenanthridine complexes, for example according to US 2012/0153816 or US 2015/0295189, in which the ligand coordinates to the iridium in each case via one six-membered ring and one five-membered ring.

It is an object of the present invention to provide novel metal complexes that are suitable as emitters for use in OLEDs, especially for emission colors in the range from green to red, and lead to good efficiency and lifetime.

It has been found that, surprisingly, particular metal chelate complexes described in detail below are of very good suitability for use in an organic electroluminescent device. The present invention therefore provides these metal complexes and organic electroluminescent devices comprising these complexes.

The invention provides a compound of formula (1)

containing a substructure $M(L)_n$ of the formula (2):

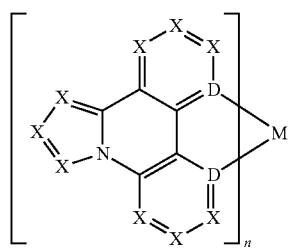

where the symbols and indices used are as follows:
M is iridium or platinum;
D is C or N, where one D is C and the other D is N;
X is the same or different at each instance and is CR or N;
R is the same or different at each instance and is H, D, F, Cl, Br, I, $N(R^1)_2$, CN, $NO_2$, $OR^1$, $SR^1$, $COOR^1$, $C(=O)$ $N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals, where one or more nonadjacent $CH_2$ groups may be replaced by $Si(R^1)_2$, $C=O$, $NR^1$, O, S or $CONR^1$, or an aromatic or heteroaromatic ring system which has 5 to 60 aromatic ring atoms, preferably 5 to 40 aromatic ring atoms, and may be substituted in each case by one or more $R^1$ radicals; at the same time, two R radicals together may also form an aliphatic, heteroaliphatic, aromatic or heteroaromatic ring system;
$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may each be substituted by one or more $R^2$ radicals, where one or more nonadjacent $CH_2$ groups may be replaced by $Si(R^2)_2$, $C=O$, $NR^2$, O, S or $CONR^2$ and where one or more hydrogen atoms in the alkyl, alkenyl or alkynyl group may be replaced by D, F, Cl, Br, I or CN, or an aromatic or heteroaromatic ring system which has 5 to 40 aromatic ring atoms and may be substituted in each case by one or more $R^2$ radicals; at the same time, two or more $R^1$ radicals together may form an aliphatic, heteroaliphatic, aromatic or heteroaromatic ring system;
$R^2$ is the same or different at each instance and is H, D, F, CN or an aliphatic, aromatic or heteroaromatic organic radical, especially a hydrocarbyl radical, having 1 to 20 carbon atoms, in which one or more hydrogen atoms may also be replaced by F;
L' is the same or different at each instance and is a ligand;
n is 1, 2 or 3;
m is 0, 1, 2, 3 or 4;
at the same time, it is also possible for two or more ligands L to be joined together or for L to be joined to L' by a single bond or a bivalent or trivalent bridge, thus forming a tridentate, tetradentate, pentadentate or hexadentate ligand system.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. Preferably, the heteroaryl group contains 1, 2 or 3 heteroatoms, of which not more than one is selected from O and S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 60 carbon atoms in the ring system. A heteroaromatic ring system in the context of this invention contains 1 to 60 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl or terphenyl, shall likewise be regarded as an aromatic or heteroaromatic ring system.

A cyclic alkyl, alkoxy or thioalkoxy group in the context of this invention is understood to mean a monocyclic, bicyclic or polycyclic group. When two or more substituents together form an aliphatic ring system, the term "aliphatic ring system" in the context of the present invention also includes heteroaliphatic ring systems.

In the context of the present invention, a $C_1$- to $C_{40}$-alkyl group in which individual hydrogen atoms or $CH_2$ groups may also be substituted by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-60 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The wording that two or more radicals together may form an aliphatic ring, in the context of the present description, should be understood to mean, inter alia, that the two radicals are joined to one another by a chemical bond with formal elimination of two hydrogen atoms. This is illustrated by the following scheme:

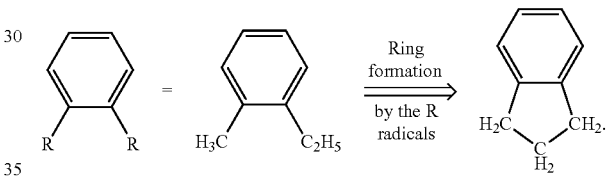

The formation of a fused-on aromatic or heteroaromatic group is also possible, as illustrated by the following scheme:

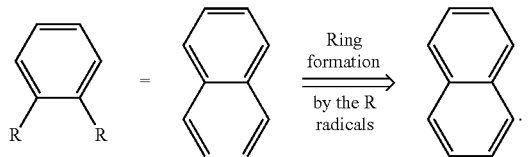

In addition, however, the abovementioned wording shall also be understood to mean that, if one of the two radicals is hydrogen, the second radical binds to the position to which the hydrogen atom was bonded, forming a ring. This shall be illustrated by the following scheme:

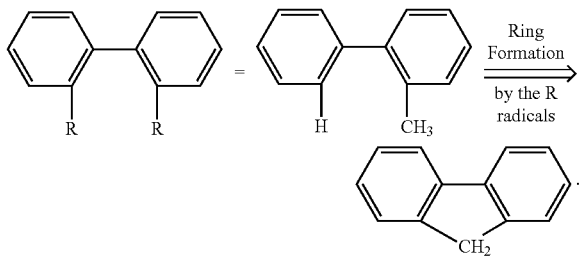

Preference is given to compounds of formula (1), characterized in that they are uncharged, i.e. electrically neutral. This is achieved in a simple manner by selecting the charge of the ligands L and L' such that it compensates for the charge of the complexed metal atom M.

In the complexes of the formula (1), the indices n and m are chosen such that the coordination number at the metal M overall, according to the metal, corresponds to the coordination number customary for this metal. This is the coordination number 6 for iridium(III) and the coordination number 4 for platinum(II).

In one embodiment of the invention, M=iridium(III), and the index n is 1, 2 or 3, preferably 2 or 3. When the index n=1, another four monodentate or two bidentate or one bidentate and two monodentate or one tridentate and one monodentate or one tetradentate ligand L', preferably two bidentate ligands L', are coordinated to the iridium. When the index n=2, one bidentate or two monodentate ligands L', preferably one bidentate ligand L', are also coordinated to the iridium. When the index n=3, the index m=0.

In a further embodiment of the invention, M=platinum (II), and the index n is 1 or 2. When the index n=1, one bidentate or two monodentate ligands L', preferably one bidentate ligand L', are also coordinated to the platinum M. When the index n=2, the index m=0.

According to which of the D groups is C and which is N, two structures arise for the formula (2). These are represented by the following formulae (3) and (4):

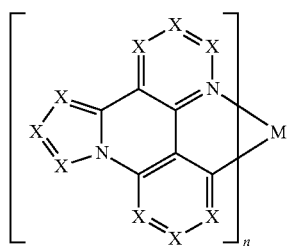

Formula (3)

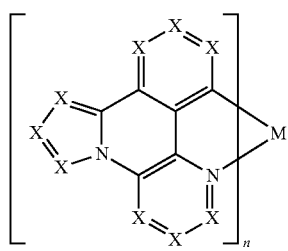

Formula (4)

where the symbols and indices used have the same definitions as described above.

In a preferred embodiment of the invention, not more than one X, if any, is N and the other X groups are CR. More preferably, the symbols X in the two six-membered rings are CR, or one symbol X in the six-membered ring that coordinates via the carbon atom is N and the other symbols X in the two six-membered rings are CR, and exactly one symbol X in the five-membered ring is N. Preferred embodiments of the formula (3) are the structures of the following formulae (3a) to (3f), and preferred embodiments of the formula (4) are the structures of the following formulae (4a) to (4f):

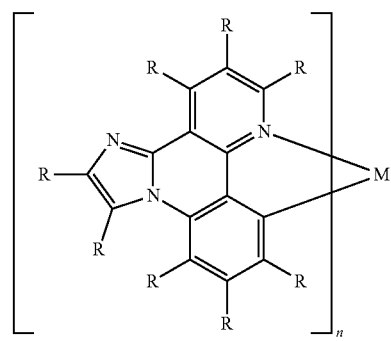

Formula (3a)

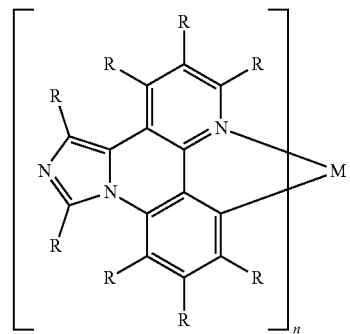

Formula (3b)

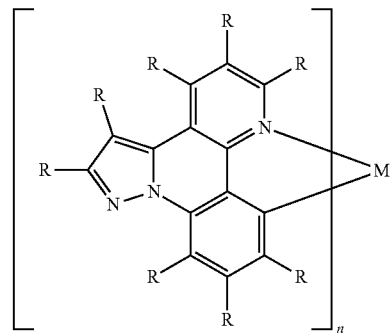

Formula (3c)

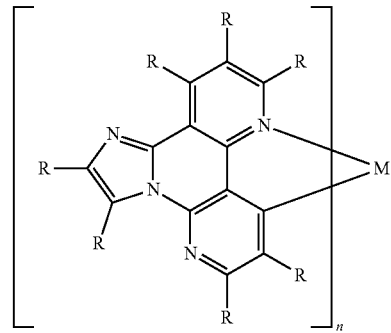

Formula (3d)

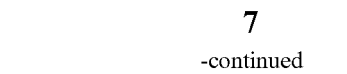
Formula (3e)
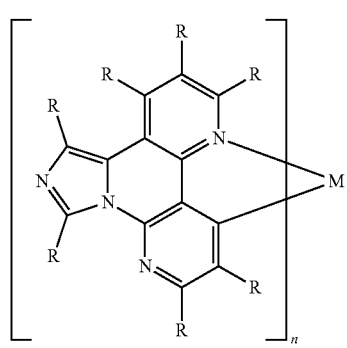
Formula (3f)
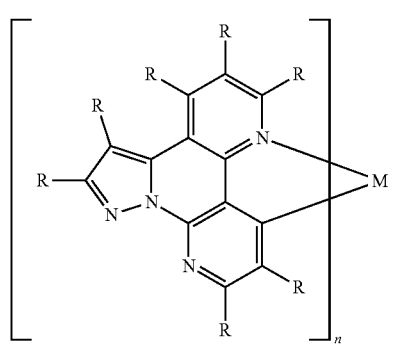
Formula (4a)
Formula (4b)
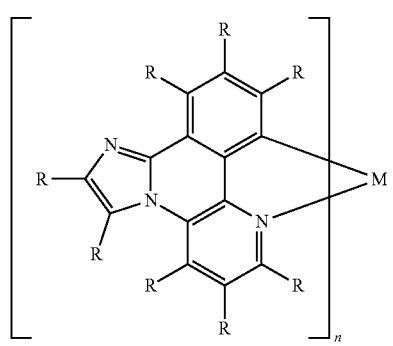
Formula (4c)
Formula (4d)
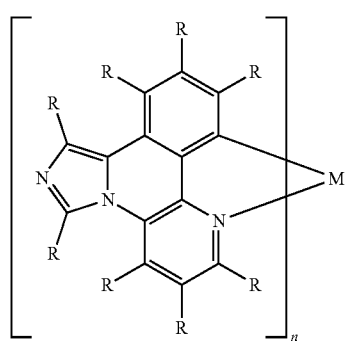
Formula (4e)
Formula (4f)
where the symbols and indices used have the definitions given above.

It is preferable when the structure of the formula (2) is a structure of the following formulae (3a-1) to (4f-1):
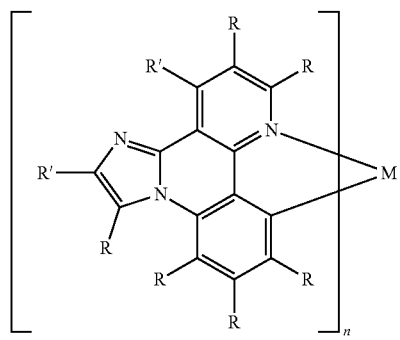
Formula (3a-1)
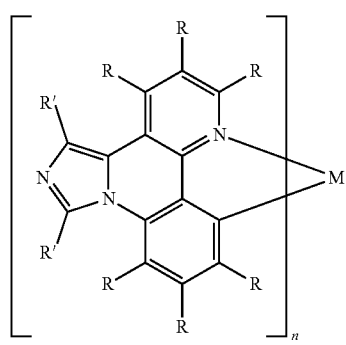
Formula (3b-1)
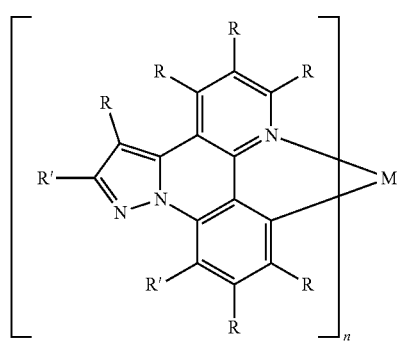
Formula (3c-1)
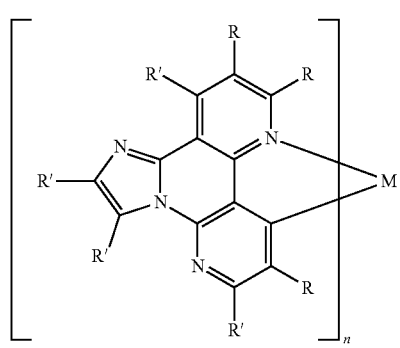
Formula (3d-1)
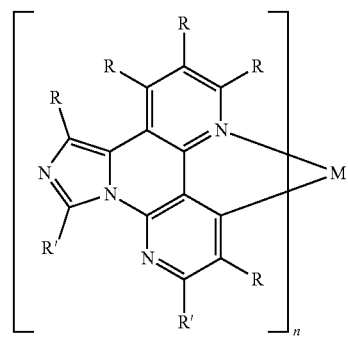
Formula (3e-1)
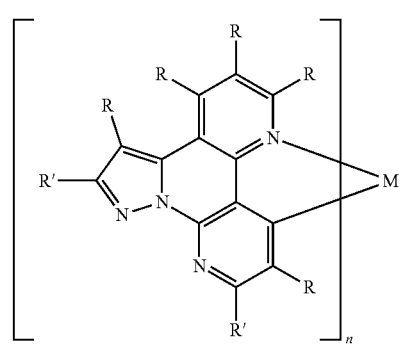
Formula (3f-1)
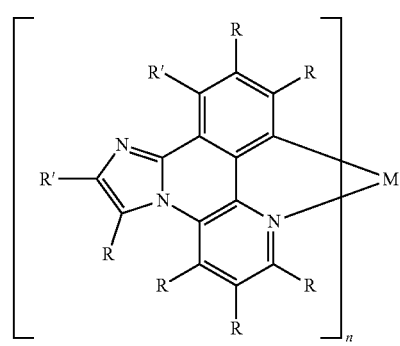
Formula (4a-1)
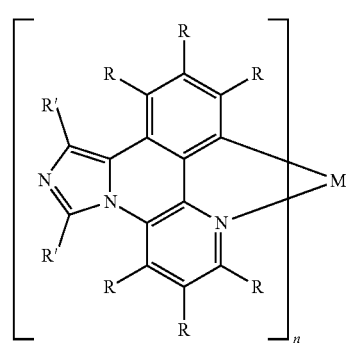
Formula (4b-1)

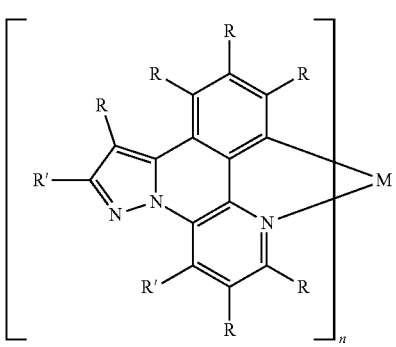

Formula (4c-1)

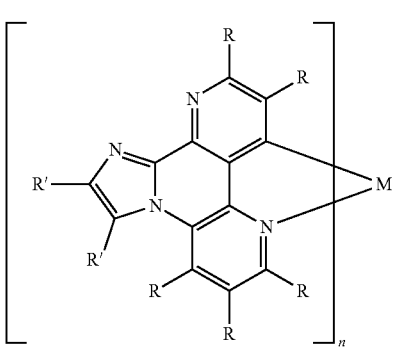

Formula (4d-1)

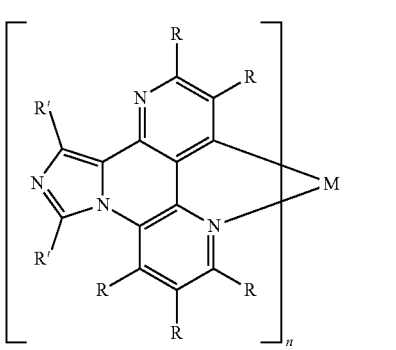

Formula (4e-1)

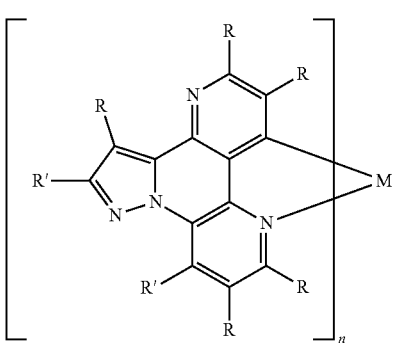

Formula (4f-1)

where the symbols and indices used have the definitions given above, and R' has the same definition as R, where at least one substituent R' is not H or D.

Preference is given to the structures of the formula (3) or (3a) to (3c). Particular preference is given to the structures of the formula (3a).

According to the substituents and formation of rings by the substituents, it is possible to influence the triplet energy of the unit of formula (2) and hence the emission color. If, for example, the two substituents R in the five-membered ring of the formulae (3a), (3c), (3d), (4a), (4c) and (4d) together form a fused-on benzene ring, this reduces the triplet energy of the $IrL_n$ unit, which then results in a bathochromic shift in the emission of the $IrL_n$ unit.

As described above, adjacent R radicals together may form an aliphatic, aromatic or heteroaromatic ring system. In one embodiment of the invention, two adjacent R radicals on the five-membered ring together form a fused benzo group that may be substituted by one or more $R^1$ radicals. Preferred embodiments are the structures of the formulae (3a-2) to (4a-6)

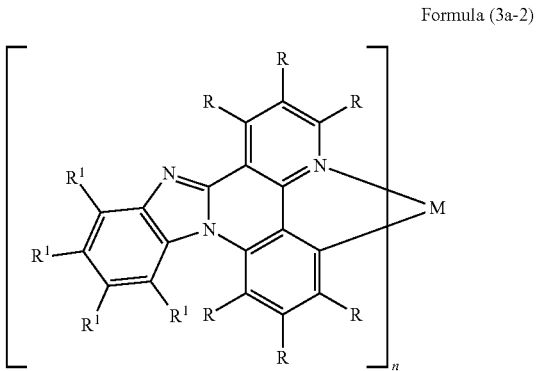

Formula (3a-2)

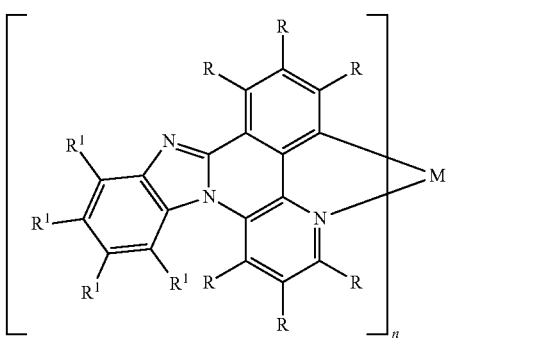

Formula (4a-2)

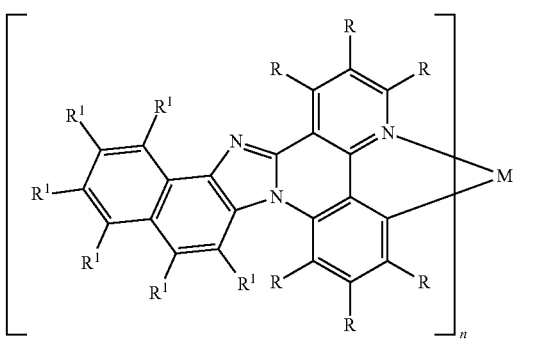

Formula (3a-3)

Formula (4a-3)
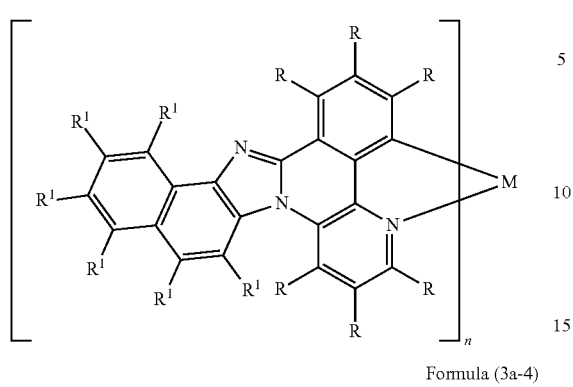
Formula (3a-4)
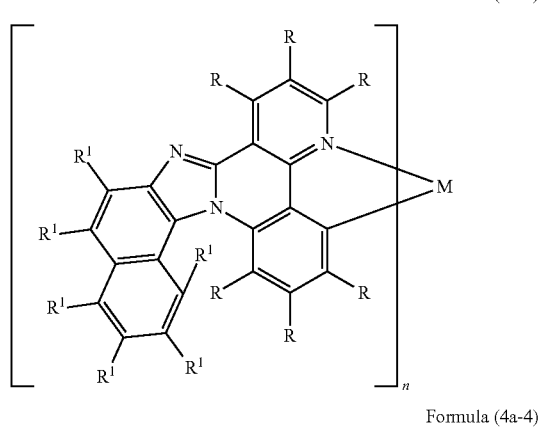
Formula (4a-4)
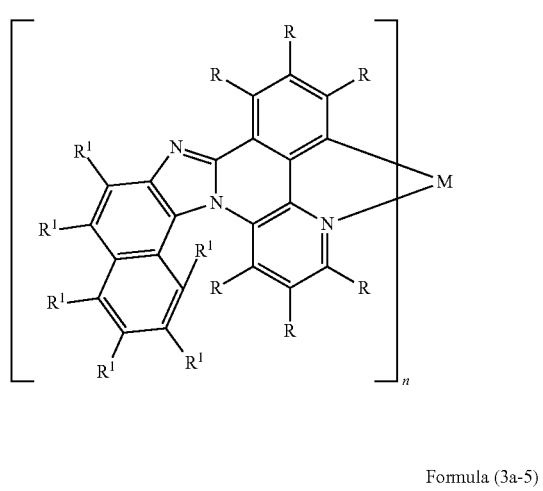
Formula (3a-5)
Formula (4a-5)
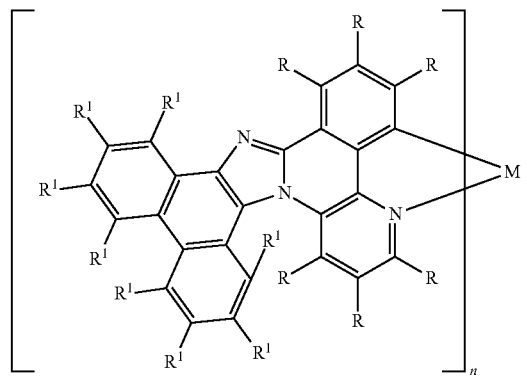
Formula (3a-6)
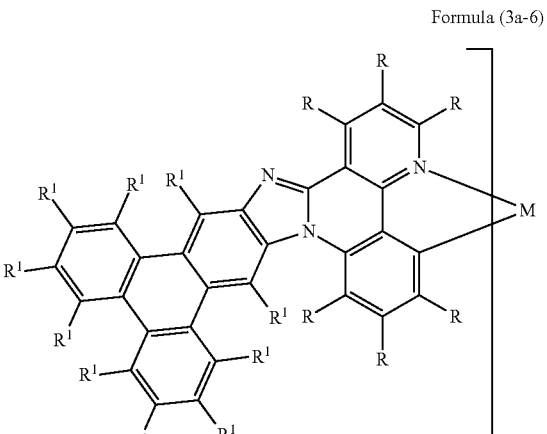
Formula (3a-5)
Formula (4a-5)
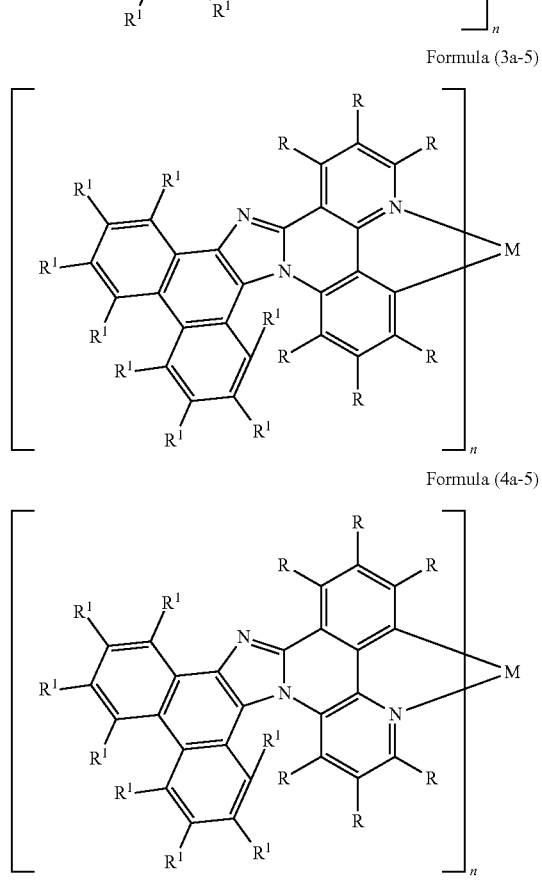

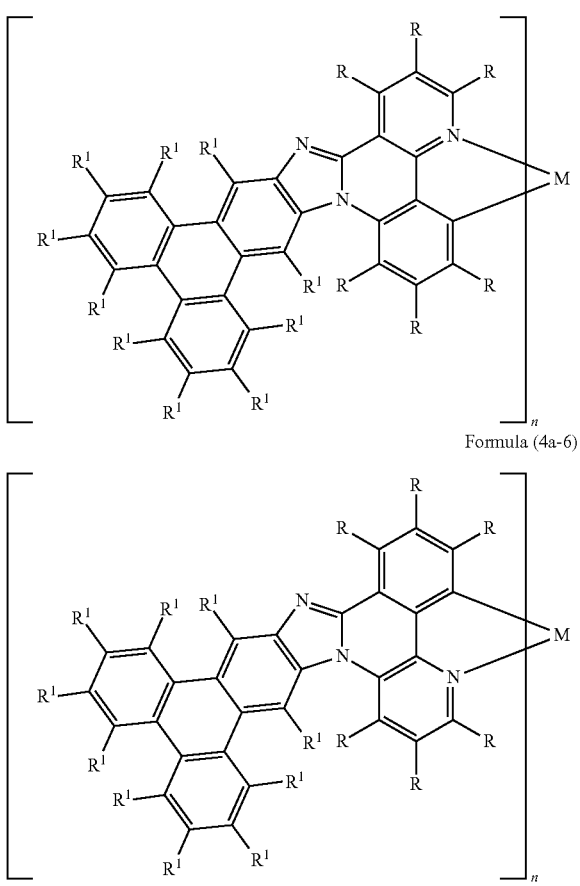

Formula (3a-6)

Formula (4a-6)

where the symbols and indices used have the definitions given above.

Preferred R radicals the same or different at each instance and selected from the group consisting of H, D, F, Br, I, $N(R^1)_2$, CN, $Si(R^1)_3$, $B(OR^1)_2$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, where one or more hydrogen atoms may be replaced by D or F, or an aromatic or heteroaromatic ring system which has 5 to 24 aromatic ring atoms and may be substituted in each case by one or more $R^1$ radicals; at the same time, two preferably adjacent R radicals together may also form an aliphatic, heteroaliphatic, aromatic or heteroaromatic ring system. More preferably, these R radicals are the same or different at each instance and are selected from the group consisting of H, D, F, $N(R^1)_2$, CN, a straight-chain alkyl group having 1 to 6 carbon atoms or an alkenyl group having 2 to 6 carbon atoms or a branched or cyclic alkyl group having 3 to 10 carbon atoms, where one or more hydrogen atoms may be replaced by D or F, or an aromatic or heteroaromatic ring system which has 6 to 13 aromatic ring atoms and may be substituted in each case by one or more $R^1$ radicals; at the same time, two adjacent R radicals together may also form an aliphatic or aromatic ring system.

Preferred $R^1$ radicals are the same or different at each instance and are H, D, F, CN, a straight-chain alkyl group having 1 to 10 carbon atoms or an alkenyl group having 2 to 20 carbon atoms or a branched or cyclic alkyl group having 3 to 10 carbon atoms, each of which may be substituted by one or more $R^2$ radicals, where one or more hydrogen atoms may be replaced by F, or an aromatic or heteroaromatic ring system which has 5 to 24 aromatic ring atoms and may be substituted in each case by one or more $R^2$ radicals; at the same time, two or more adjacent $R^1$ radicals together may form an aliphatic, aromatic or heteroaromatic ring system. Particularly preferred $R^1$ radicals are the same or different at each instance and are H, D, F, a straight-chain alkyl group having 1 to 4 carbon atoms or a branched or cyclic alkyl group having 3 to 6 carbon atoms or an aromatic or heteroaromatic ring system having 6 to 13 aromatic ring atoms, each of which may be substituted by one or more $R^2$ radicals, but is preferably unsubstituted; at the same time, two or more adjacent $R^1$ radicals together may form an aliphatic or aromatic ring system.

Preferred $R^2$ radicals are selected from the group consisting of H, D, F, CN, an alkyl group having 1 to 6 carbon atoms or an aromatic ring system having 6 to 12 carbon atoms.

In a further embodiment of the invention, two adjacent R radicals together form an aliphatic ring system. In the case of adjacent radicals, this is possible on one or both of the six-membered rings and/or on the five-membered ring. Preferred aliphatic ring systems are selected from the structures of the following formulae (5) to (11):

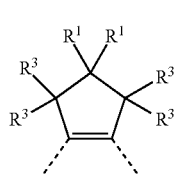

Formula (5)

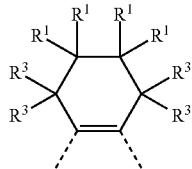

Formula (6)

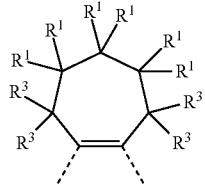

Formula (7)

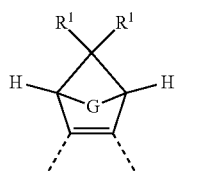

Formula (8)

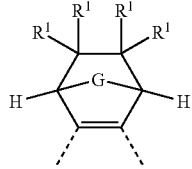

Formula (9)

Formula (10)

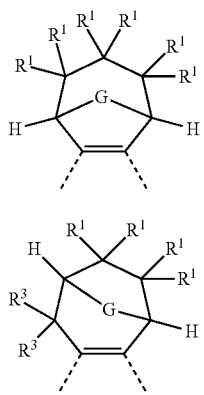

Formula (11)

where R[1] and R[2] have the definitions given above, the dotted bonds signify the attachment of the two carbon atoms in the ligand, and in addition:

G is an alkylene group which has 1, 2 or 3 carbon atoms and may be substituted by one or more R[2] radicals, —CR[2]=CR[2]— or an ortho-bonded arylene or heteroarylene group which has 5 or 6 aromatic ring atoms and may be substituted by one or more R[2] radicals;

R[3] is the same or different at each instance and is F, OR[2], a straight-chain alkyl group having 1 to 10 carbon atoms, a branched or cyclic alkyl group having 3 to 10 carbon atoms, where the alkyl group in each case may be substituted by one or more R[2] radicals, where one or more nonadjacent CH$_2$ groups may be replaced by R[2]C=CR[2], C≡C, Si(R[2])$_2$, C=O, NR[2], O, S or CONR[2], or an aryl or heteroaryl group which has 5 or 6 aromatic ring atoms and may be substituted in each case by one or more R[2] radicals; at the same time, two R[3] radicals which are bonded to the same carbon atom may together form an aliphatic ring system and thus form a spiro system; in addition, R[3] with an adjacent R or R[1] radical may form an aliphatic ring system.

In the above-depicted structures of the formulae (5) to (11) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond.

Preferred embodiments of the groups of the formulae (5) to (11) can be found in patent applications WO 2014/023377, WO 2015/104045 and WO 2015/117718.

As described above, in the compounds of the invention, instead of one R radical, it is also possible for a bridging unit to be present, which joins the ligand L to one or more further ligands L or L'. In a preferred embodiment of the invention, a bridging unit is present rather than one of the R radicals that are in the ortho or meta position to the coordinating atom on one of the coordinating six-membered rings, especially in the meta position to the coordinating atom, such that the ligands have tridentate or polydentate or polypodal character. It is also possible for two bridging units of this kind to be present. This leads to the formation of macrocyclic ligands or to the formation of cryptates.

Preferred structures having polydentate ligands are the metal complexes of the following formulae (12) to (15):

Formula (12)

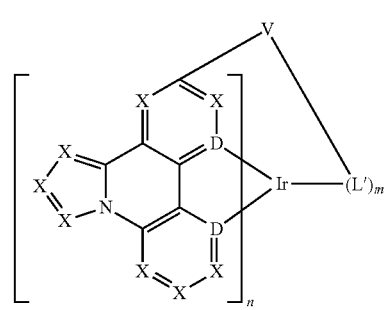

Formula (13)

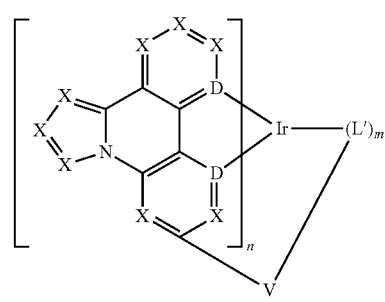

Formula (14)

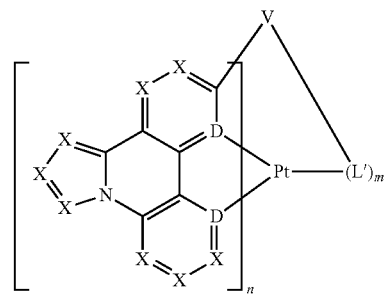

Formula (15)

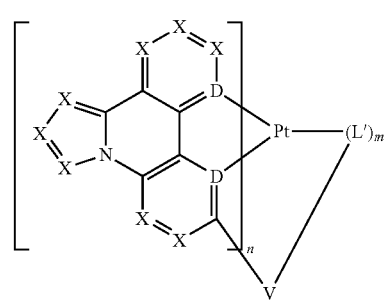

where the symbols and indices used have the definitions given above. L' is preferably a bidentate subligand, especially a monoanionic bidentate subligand that coordinates via a carbon atom and a nitrogen atom.

V here in the structures of the formulae (14) and (15) is preferably selected from the group consisting of BR[1], B(R[1])$_2^-$, C(R[1])$_2$, C(=O), Si(R[1])$_2$, NR[1], PR[1], P(R[1])$_2^+$, P(=O)(R[1]), P(=S)(R[1]), O, S, Se, or a unit of one of the formulae (16) to (25)

Formula (16)
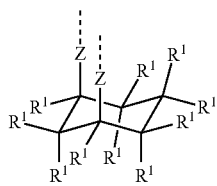

Formula (17)
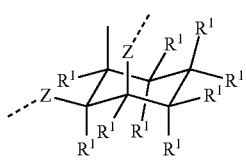

Formula (18)
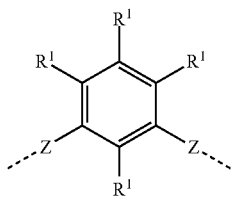

Formula (19)
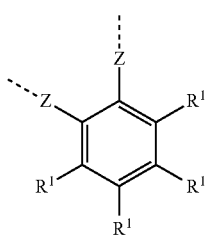

Formula (20)
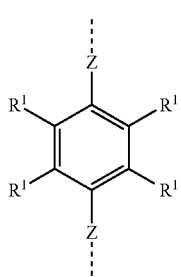

Formula (21)
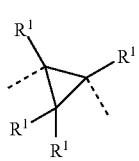

Formula (22)
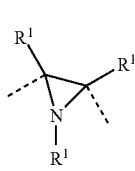

Formula (23)
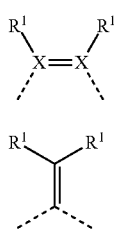

Formula (24)
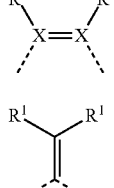

Formula (25)

where the dotted bonds each indicate the bond to the sub-ligands L or L', Q is the same or different at each instance and is $C(R^1)_2$, $N(R^1)$, O or S, Z is the same or different at each instance and is selected from the group consisting of a single bond, O, S, S(=O), S(=O)$_2$, $NR^1$, $PR^1$, $P(=O)R^1$, $C(R^1)_2$, C(=O), C(=N$R^1$), C(=C($R^1$)$_2$), Si($R^1$)$_2$ and B$R^1$, and the further symbols used each have the definitions detailed above.

In addition, V in the structures of the formulae (12) and (13) is preferably a group of the following formula (26), where the dotted bonds represent the position of the linkage of the sub-ligands L and L':

Formula (26)
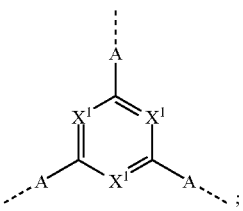

where:
$X^1$ is the same or different at each instance and is CR or N;
A is the same or different at each instance and is CR$_2$—CR$_2$, CR$_2$—O, CR$_2$—NR, C(=O)—O, C(=O)—NR or a group of the following formula (27):

Formula (27)
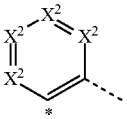

where the dotted bond in each case represents the position of the bond of the bidentate sub-ligands L and L' to this structure, * represents the position of the attachment of the unit of the formula (27) to the central trivalent aryl or heteroaryl group and $X^2$ is the same or different at each instance and is CR or N.

Preferred substituents in the group of the formula (27) when $X^2$=CR are selected from the above-described substituents R.

In a preferred embodiment of the invention, A is the same or different at each instance and is CR$_2$—CR$_2$ or a group of the formula (27). Preference is given here to the following embodiments:
all three A groups are the same group of the formula (27);
two A groups are the same group of the formula (27), and the third A group is CR$_2$—CR$_2$;
one A group is a group of the formula (27), and the two other A groups are the same CR$_2$—CR$_2$ group; or
all three A groups are the same CR$_2$—CR$_2$ group.

What is meant here by "the same group of the formula (27)" is that these groups all have the same base skeleton and the same substitution. Moreover, what is meant by "the same $CR_2$—$CR_2$ group" is that these groups all have the same substitution.

When A is $CR_2$—$CR_2$, R is preferably the same or different at each instance and is H or D, more preferably H.

The group of the formula (27) is an aromatic or heteroaromatic six-membered ring. In a preferred embodiment of the invention, the group of the formula (27) contains not more than one heteroatom in the aryl or heteroaryl group. This does not mean that any substituents bonded to this group cannot also contain heteroatoms. In addition, this definition does not mean that formation of rings by substituents does not give rise to fused aromatic or heteroaromatic structures, for example naphthalene, benzimidazole, etc. The group of the formula (27) is preferably selected from benzene, pyridine, pyrimidine, pyrazine and pyridazine.

Preferred embodiments of the group of the formula (27) are the structures of the following formulae (28) to (35):

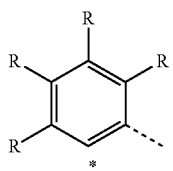

Formula (28)

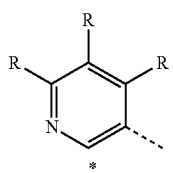

Formula (29)

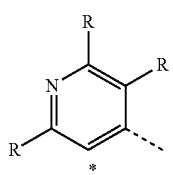

Formula (30)

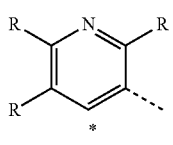

Formula (31)

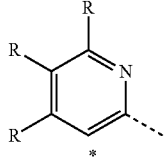

Formula (32)

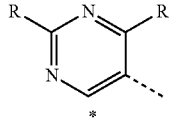

Formula (33)

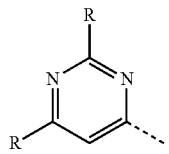

Formula (34)

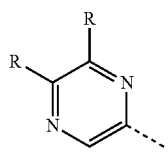

Formula (35)

where the symbols used have the definitions given above.

Particular preference is given to the optionally substituted groups of the formulae (28) to (32). Very particular preference is given to ortho-phenylene, i.e. a group of the formula (28).

At the same time, as also detailed above in the description of the substituents, it is also possible for adjacent substituents together to form a ring system, such that fused structures, including fused aryl and heteroaryl groups, for example naphthalene, quinoline, benzimidazole, carbazole, dibenzofuran or dibenzothiophene, can form.

Preferred embodiments of the group of the formula (26) are the structures of the following formulae (36) to (39):

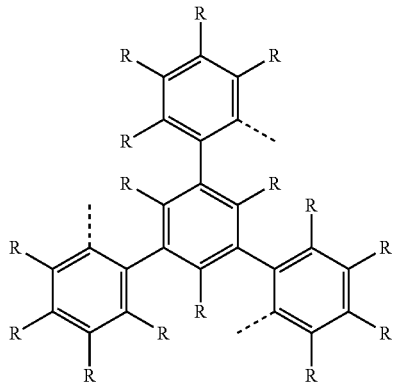

Formula (36)

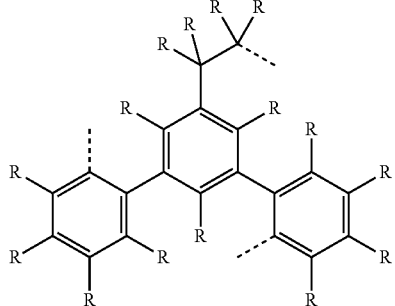

Formula (37)

Formula (38)

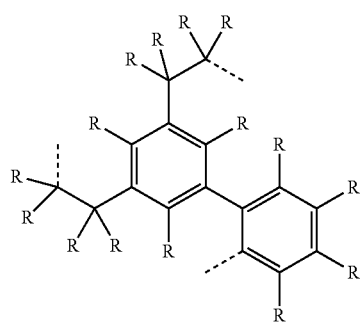

Formula (39)

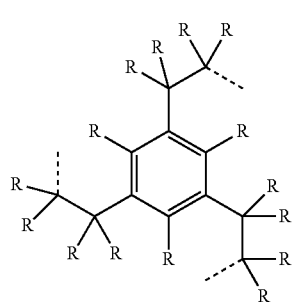

where the symbols used have the definitions given above.

More preferably, all substituents R in the central ring of the formulae (36) to (39) are H, and so the structures are preferably selected from the formulae (36a) to (39a)

Formula (36a)

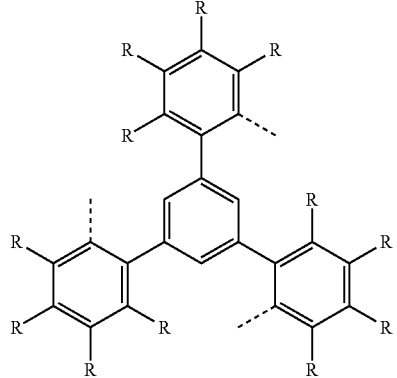

Formula (37a)

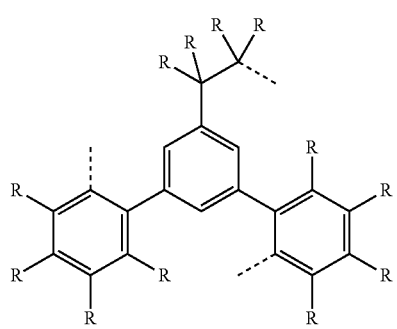

Formula (38a)

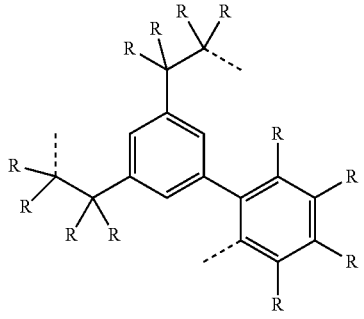

Formula (39a)

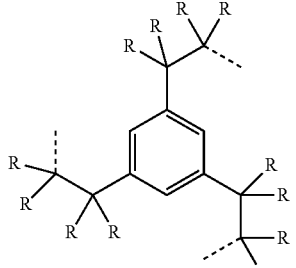

where the symbols used have the definitions given above.

More preferably, the groups of the formulae (36) to (39) are selected from the structures of the following formulae (36b) to (39b):

Formula (36b)

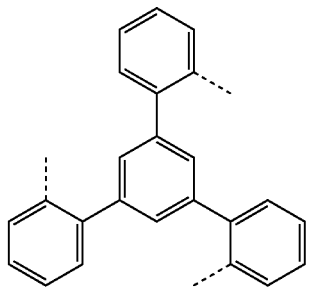

Formula (37b)

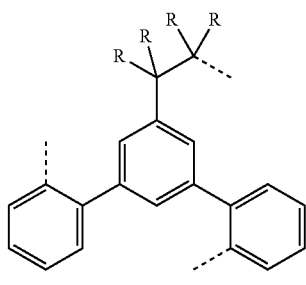

Formula (38b)

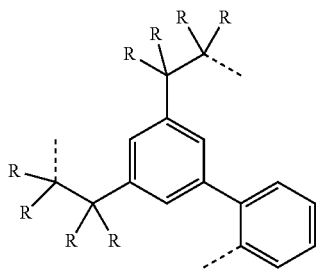

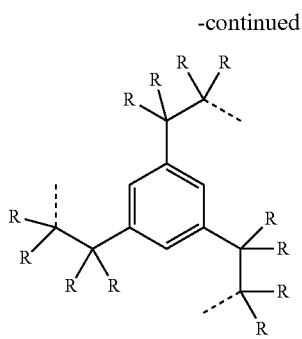

Formula (39b)

where R is the same or different at each instance and is H or D, preferably H.

There follows a description of preferred ligands L' as occur in formula (1). It is also possible to choose the ligands L' correspondingly when they are bonded to L via a bridging V unit.

The ligands L' are preferably uncharged, monoanionic, dianionic or trianionic ligands, more preferably uncharged or monoanionic ligands, especially monoanionic ligands. They may be monodentate, bidentate, tridentate or tetradentate and are preferably bidentate, i.e. preferably have two coordination sites. As described above, the ligands L' may also be bonded to L via a bridging V group. More preferably, the ligands L' are bidentate and monoanionic.

Preferred uncharged monodentate ligands L' are selected from the group consisting of carbon monoxide, nitrogen monoxide, alkyl cyanides, for example acetonitrile, aryl cyanides, for example benzonitrile, alkyl isocyanides, for example methyl isonitrile, aryl isocyanides, for example benzoisonitrile, amines, for example trimethylamine, triethylamine, morpholine, phosphines, especially halophosphines, trialkylphosphines, triarylphosphines or alkylarylphosphines, for example trifluorophosphine, trimethylphosphine, tricyclohexylphosphine, tri-tert-butylphosphine, triphenylphosphine, tris(pentafluorophenyl)phosphine, dimethylphenylphosphine, methyldiphenylphosphine, bis(tert-butyl)phenylphosphine, phosphites, for example trimethyl phosphite, triethyl phosphite, arsines, for example trifluoroarsine, trimethylarsine, tricyclohexylarsine, tri-tert-butylarsine, triphenylarsine, tris(pentafluorophenyl)arsine, stibines, for example trifluorostibine, trimethylstibine, tricyclohexylstibine, tri-tert-butylstibine, triphenylstibine, tris(pentafluorophenyl)stibine, nitrogen-containing heterocycles, for example pyridine, pyridazine, pyrazine, pyrimidine, triazine, and carbenes, especially Arduengo carbenes.

Preferred monoanionic monodentate ligands L' are selected from hydride, deuteride, the halides $F^-$, $Cl^-$, $Br^-$ and $I^-$, alkylacetylides, for example methyl-$C\equiv C^-$, tert-butyl-$C\equiv C^-$, arylacetylides, for example phenyl-$C\equiv C^-$, cyanide, cyanate, isocyanate, thiocyanate, isothiocyanate, aliphatic or aromatic alkoxides, for example methoxide, ethoxide, propoxide, iso-propoxide, tert-butoxide, phenoxide, aliphatic or aromatic thioalkoxides, for example methanethiolate, ethanethiolate, propanethiolate, iso-propanethiolate, tert-thiobutoxide, thiophenoxide, amides, for example dimethylamide, diethylamide, di-iso-propylamide, morpholide, carboxylates, for example acetate, trifluoroacetate, propionate, benzoate, aryl groups, for example phenyl, naphthyl, and anionic nitrogen-containing heterocycles such as pyrrolide, imidazolide, pyrazolide. At the same time, the alkyl groups in these groups are preferably $C_1$-$C_{20}$-alkyl groups, more preferably $C_1$-$C_{10}$-alkyl groups, most preferably $C_1$-$C_4$-alkyl groups. An aryl group is also understood to mean heteroaryl groups. These groups have the definitions given above.

Preferred di- or trianionic ligands are $O^{2-}$, $S^{2-}$, carbides which lead to a coordination of the R—C≡M form, and nitrenes which lead to a coordination of the R—N=M form, where R is generally a substituent, or $N^{3-}$.

Preferred uncharged or mono- or dianionic, bidentate or higher polydentate ligands L' are selected from diamines, for example ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, for example 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[(1-(iso-propylimino)ethyl]pyridine, 2-[1-(tert-butylimino)ethyl]pyridine, diimines, for example 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-iso-propylphenylimino)butane, 2,3-bis(2,6-di-tert-butylphenylimino)butane, heterocycles containing two nitrogen atoms, for example 2,2'-bipyridine, o-phenanthroline, diphosphines, for example bis(diphenylphosphino)methane, bis(diphenylphosphino)ethane, bis(diphenylphosphino)propane, bis(diphenylphosphino)butane, bis(dimethylphosphino)methane, bis(dimethylphosphino)ethane, bis(dimethylphosphino)propane, bis(diethylphosphino)methane, bis(diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, for example acetylacetone, benzoylacetone, 1,5-diphenylacetylacetone, dibenzoylmethane, bis(1,1,1-trifluoroacetyl)methane, 3-ketonates derived from 3-keto esters, for example ethyl acetoacetate, carboxylates derived from aminocarboxylic acids, for example pyridine-2-carboxylic acid, quinoline-2-carboxylic acid, glycine, N,N-dimethylglycine, alanine, N,N-dimethylaminoalanine, salicyliminates derived from salicylimines, for example methylsalicylimine, ethylsalicylimine, phenylsalicylimine, dialkoxides derived from dialcohols, for example ethylene glycol, 1,3-propylene glycol, dithiolates derived from dithiols, for example ethylene-1,2-dithiol, propylene-1,3-dithiol, bis(pyrazolylborates), bis(imidazolyl)borates, 3-(2-pyridyl)diazoles or 3-(2-pyridyl)triazoles.

Preferred tridentate ligands are borates of nitrogen-containing heterocycles, for example tetrakis(1-imidazolyl)borate and tetrakis(1-pyrazolyl)borate.

Preference is further given to bidentate monoanionic, uncharged or dianionic ligands L', especially monoanionic ligands, having, together with the metal, a cyclometalated five-membered ring or six-membered ring having at least one metal-carbon bond, especially a cyclometalated five-membered ring. These are especially ligands as generally used in the field of phosphorescent metal complexes for organic electroluminescent devices, i.e. ligands of the phenylpyridine, naphthylpyridine, phenylquinoline, phenylisoquinoline type, etc., each of which may be substituted by one or more R radicals. The person skilled in the art in the field of phosphorescent electroluminescent devices is aware of a multitude of such ligands, and will be able without exercising inventive skill to select further ligands of this kind as ligand L' for compounds of formula (1). It is generally the case that a particularly suitable combination for this purpose is that of two groups as shown by the formulae (40) to (88) which follow, where one group preferably binds via an uncharged nitrogen atom or a carbene carbon atom and the other group preferably via a negatively charged carbon atom or a negatively charged nitrogen atom. The ligand L' can then be formed from the groups of the formulae (40) to (88) by virtue of these groups each binding to one another at the position indicated by #. The positions at which the groups coordinate to the metal are indicated by *. These groups may also be bonded to the ligands L via one or two bridging V units.

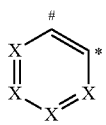

Formula (40)

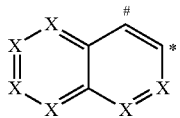

Formula (41)

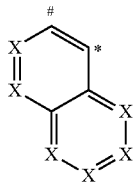

Formula (42)

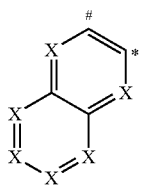

Formula (43)

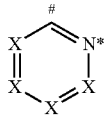

Formula (44)

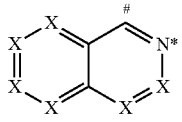

Formula (45)

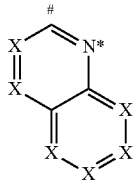

Formula (46)

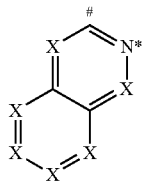

Formula (47)

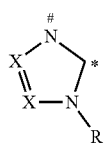

Formula (48)

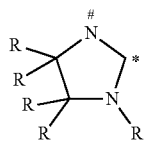

Formula (49)

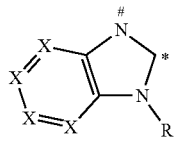

Formula (50)

Formula (51)

Formula (52)

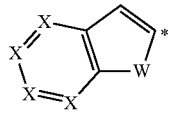

Formula (53)

Formula (54)

Formula (55)

Formula (56)

-continued
Formula (57)
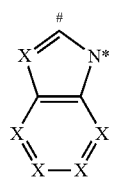
Formula (58)
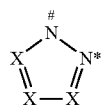
Formula (59)
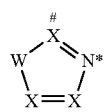
Formula (60)
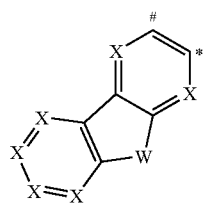
Formula (61)
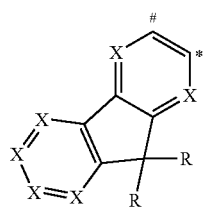
Formula (62)
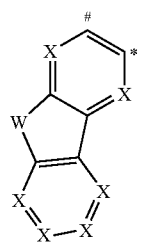
Formula (63)
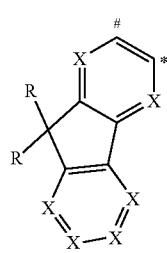
-continued
Formula (64)
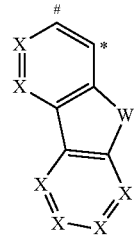
Formula (65)
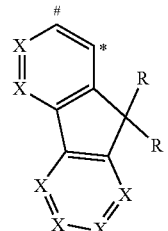
Formula (66)
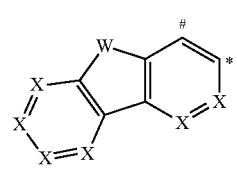
Formula (67)
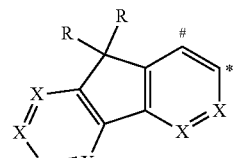
Formula (68)
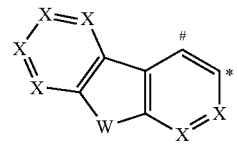
Formula (69)
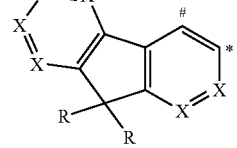
Formula (70)
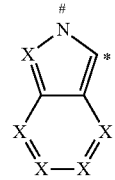
Formula (71)
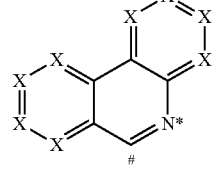

-continued
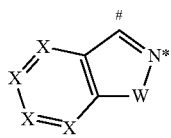
Formula (72)
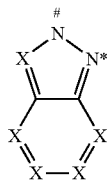
Formula (73)
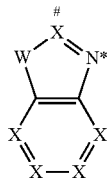
Formula (74)
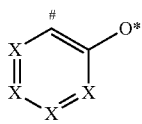
Formula (75)
Formula (76)
Formula (77)
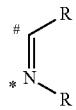
Formula (78)
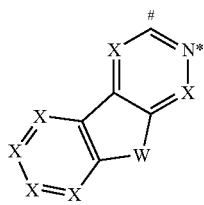
Formula (79)
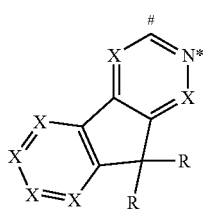
Formula (80)
-continued
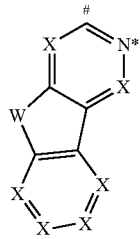
Formula (81)
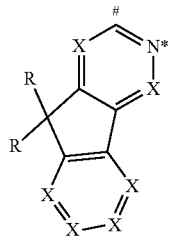
Formula (82)
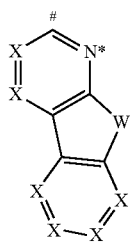
Formula (83)
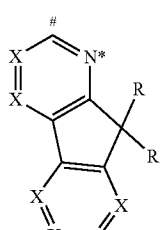
Formula (84)
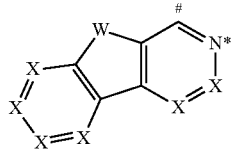
Formula (85)
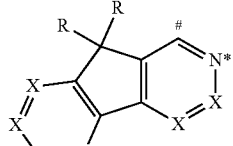
Formula (86)
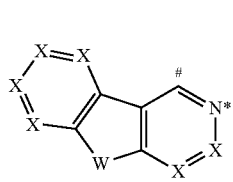
Formula (87)

Formula (88)

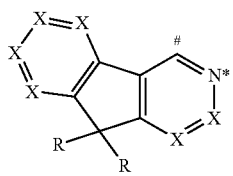

X and R here have the definitions given above, and W is NR, O or S. Preferably, not more than three X symbols in each group are N, more preferably not more than two X symbols in each group are N, and even more preferably not more than one X symbol in each group is N. Especially preferably, all symbols X are CR.

At the same time, it is also possible, through ring formation from adjacent substituents, for a fused heteroaryl group to form from the two individual aryl or heteroaryl groups, which coordinates to M as a bidentate ligand L'.

Further suitable coligands L' are structures which are not fully heteroaromatic but which have a keto group in the ligand base structure, as disclosed in WO 2011/044988, WO 2014/094962, WO 2014/094961 and WO 2014/094960.

Examples of suitable coligands L' in which the radicals on the individual coordinating groups form a ring system with one another are listed in the following table, with the CAS number also cited in each case:

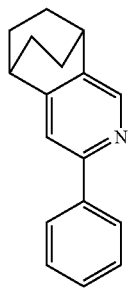

1801620-35-8

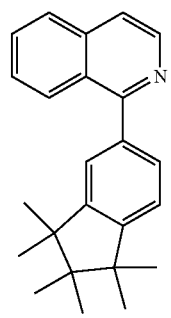

1562419-08-2

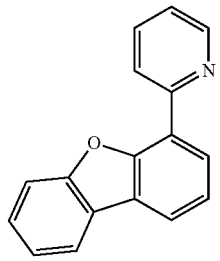

1062595-43-0

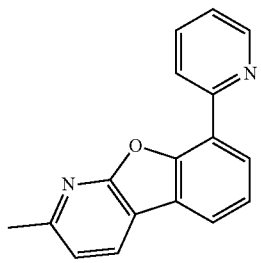

1609373-99-0

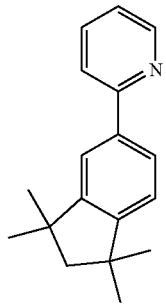

1643142-96-4

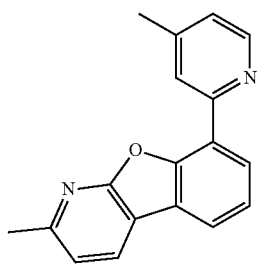

1609374-01-7

1562419-06-0

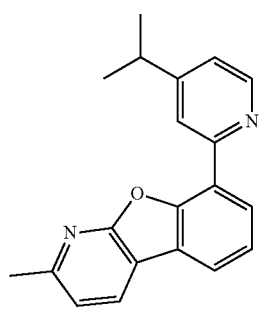
1883375-18-5
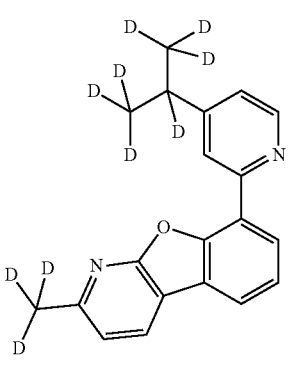
1869120-59-1
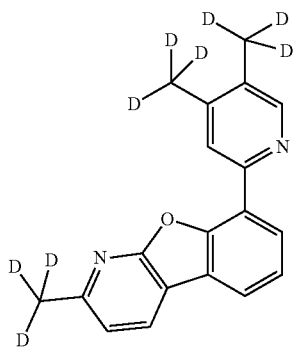
1883376-43-9
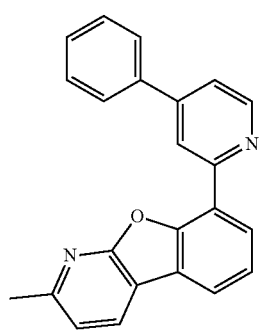
1609374-06-2
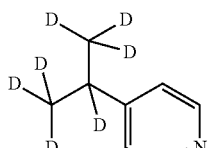
1971052-32-0
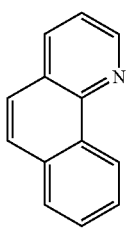
230-27-3
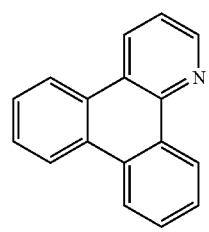
217-65-2
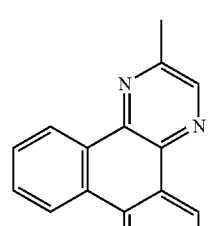
536753-86-3
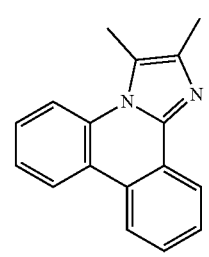
943454-10-2

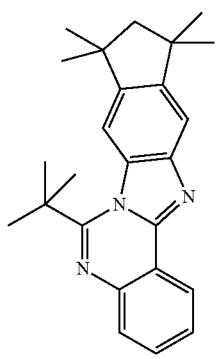
1541107-37-2
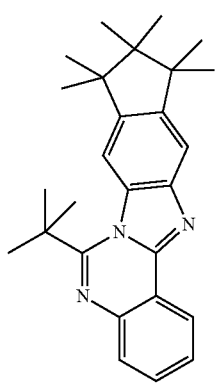
1541107-73-6
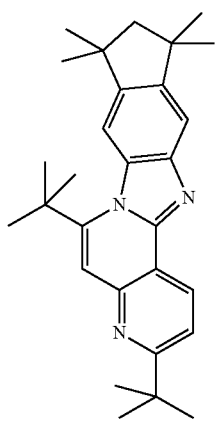
1541109-75-4
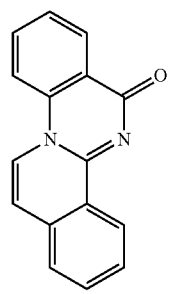
1615694-84-2
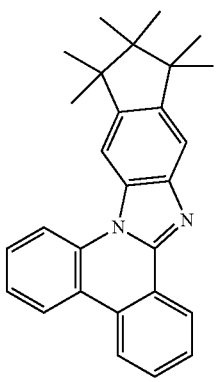
1541112-31-5
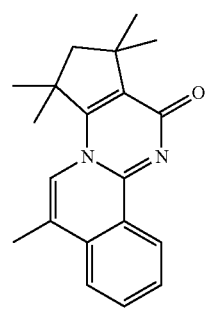
1616465-51-0
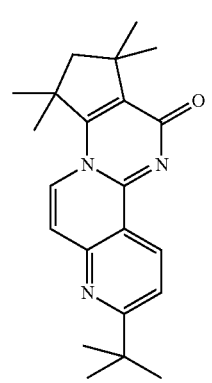
1615218-31-9

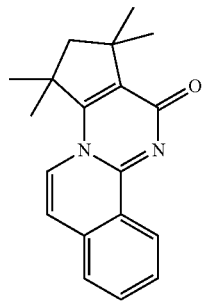

1616465-35-0

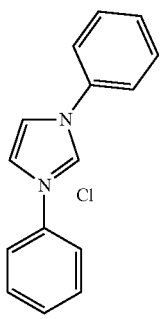

26956-10-5

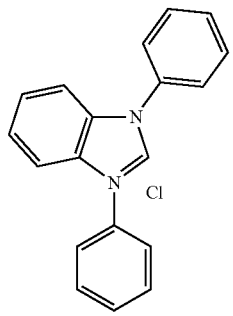

868697-84-2

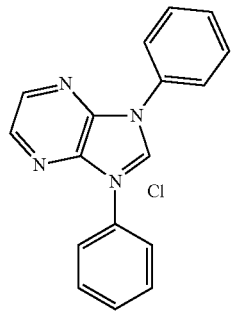

1501154-71-7

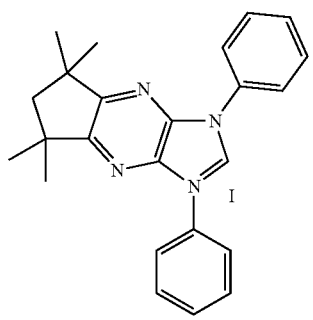

1311465-49-2

When the ligands L' are composed of the structures of the formulae (40) to (88), preferred R radicals in these structures are the same as already detailed above as R radicals for formula (2) when X is CR.

The complexes of the invention may be facial or pseudo-facial, or they may be meridional or pseudomeridional.

The abovementioned preferred embodiments can be combined with one another as desired. In a particularly preferred embodiment of the invention, the abovementioned preferred embodiments apply simultaneously.

Examples of compounds of the invention are the structures shown in the following table:

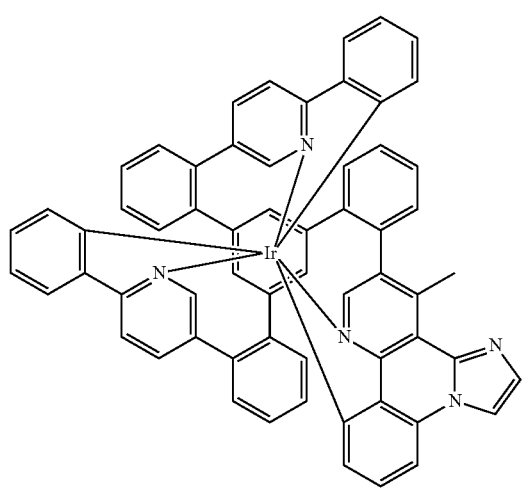

1

-continued
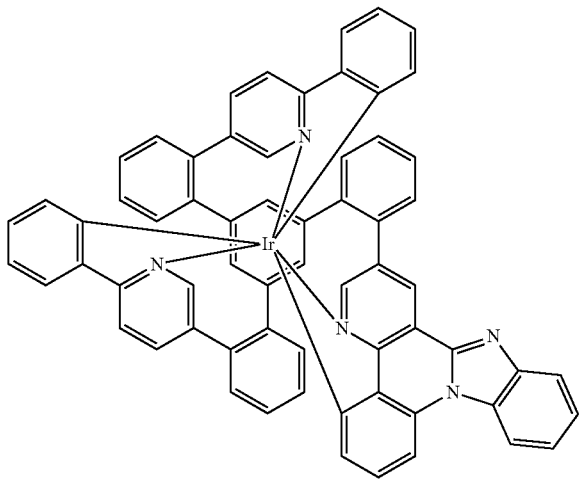
2
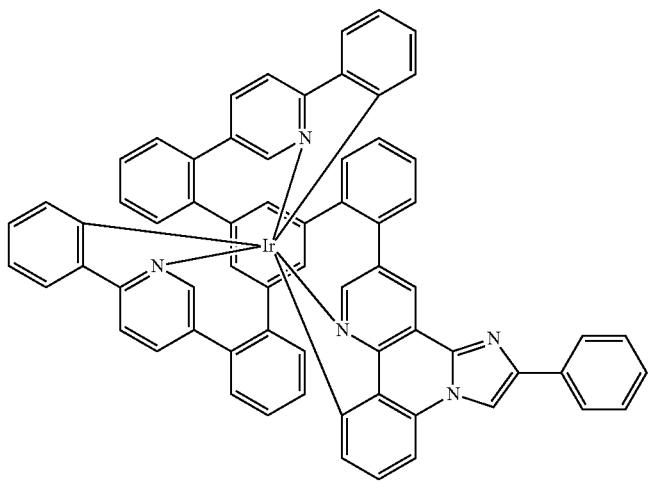
3
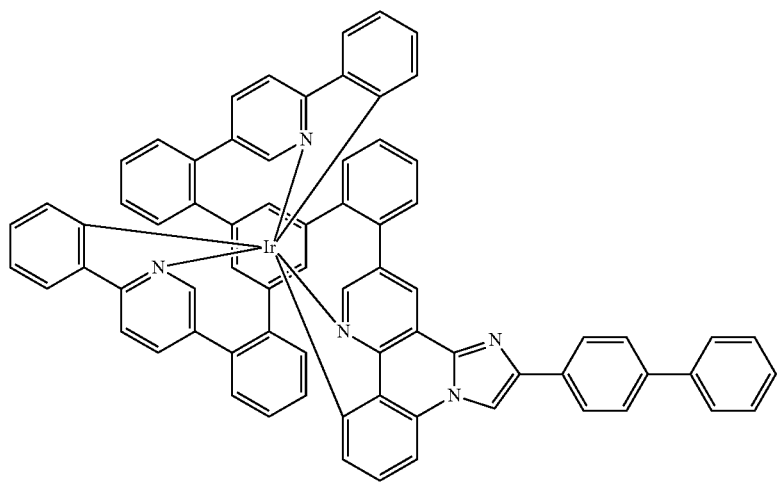
4

-continued
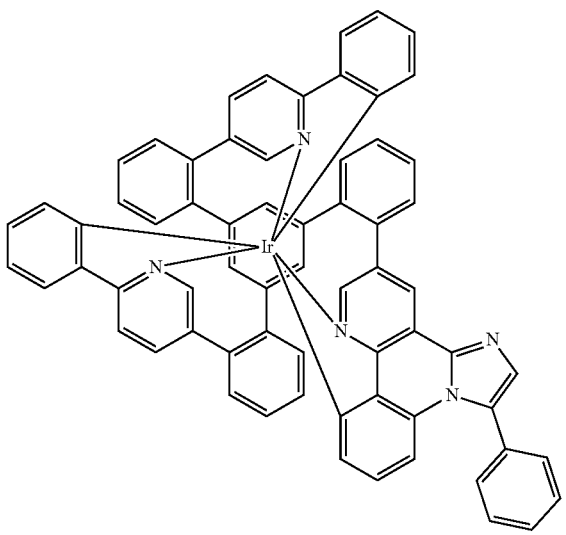
5
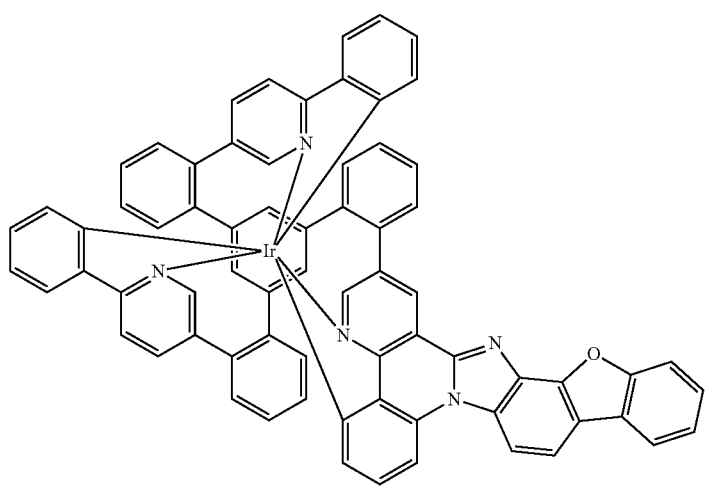
6
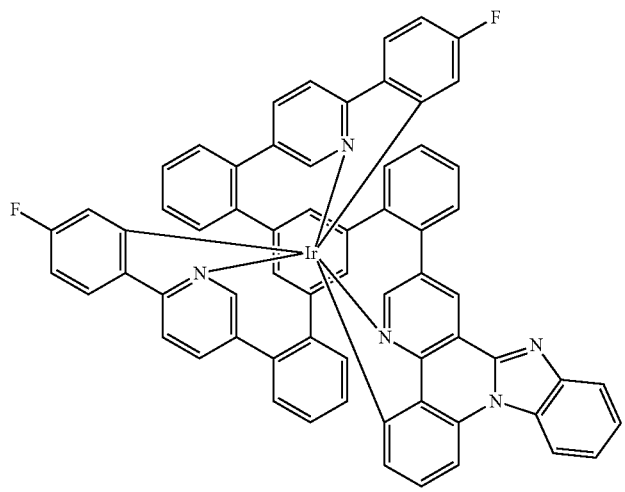
7

-continued
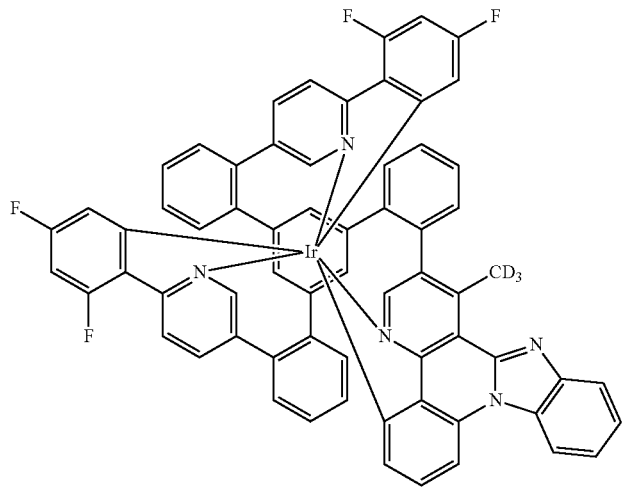
8
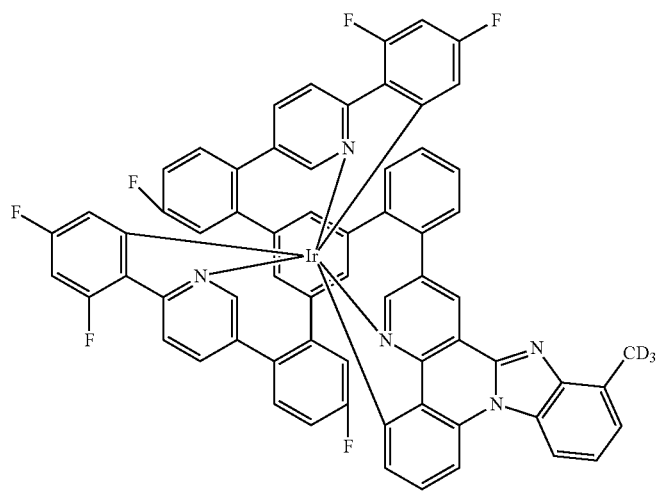
9
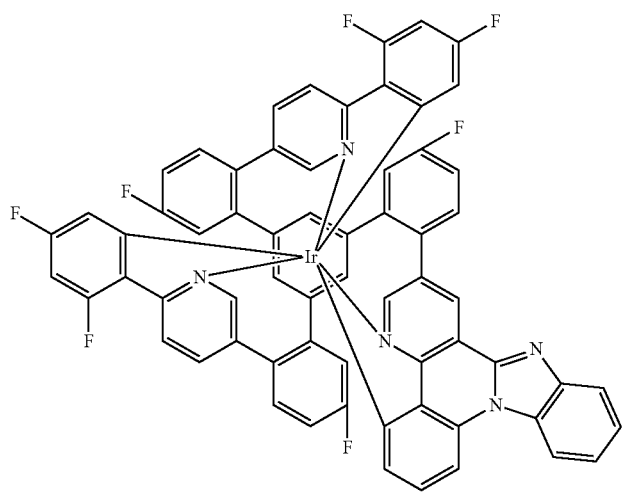
10

-continued
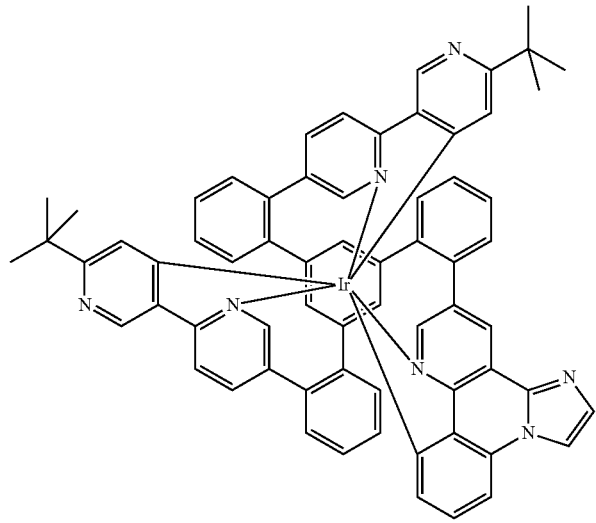
11
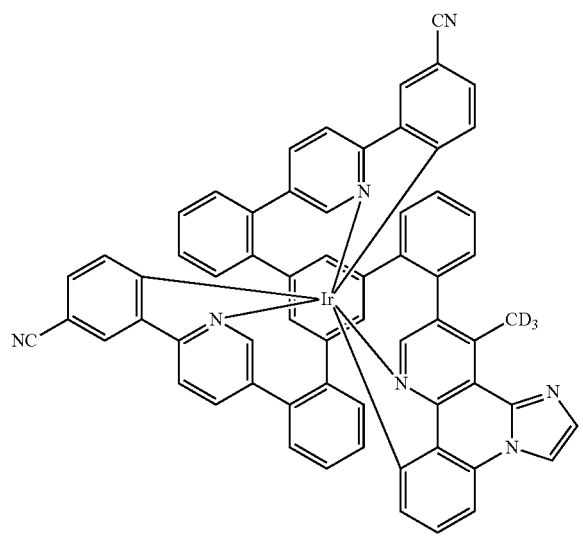
12
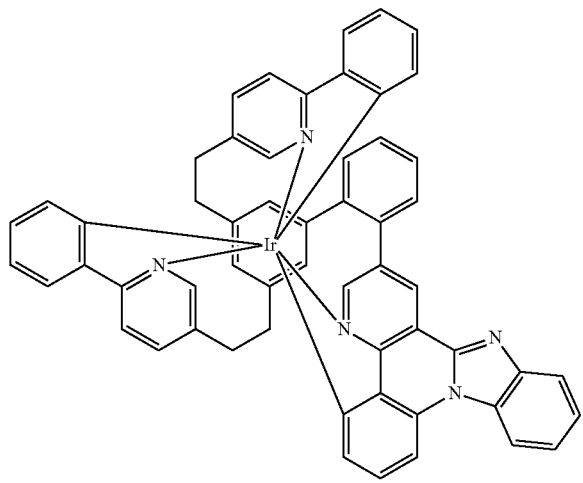
13

-continued
14
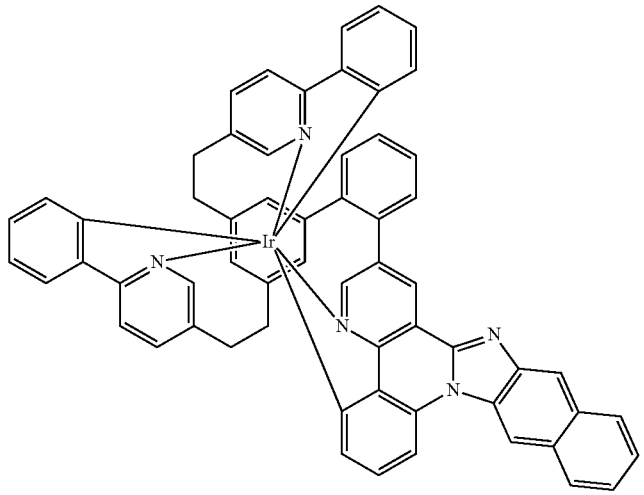
15
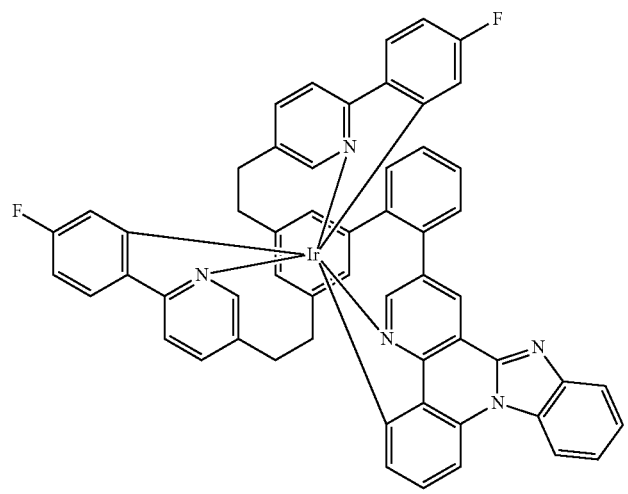
16
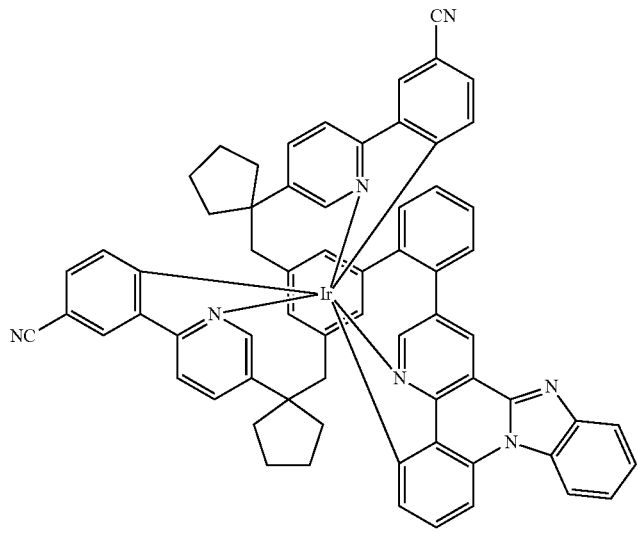

-continued
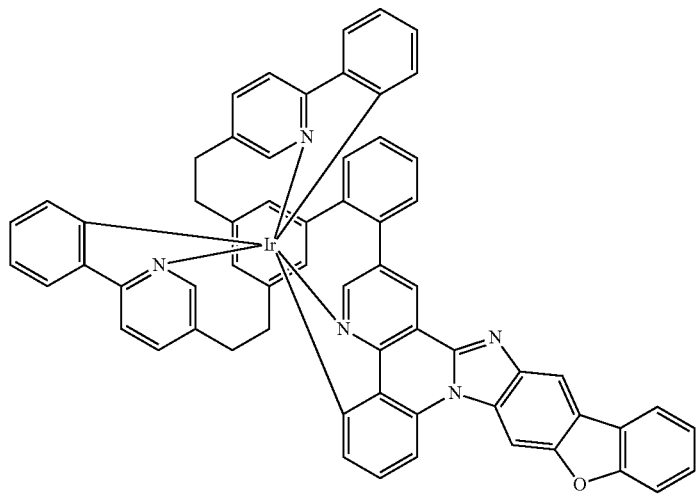
17
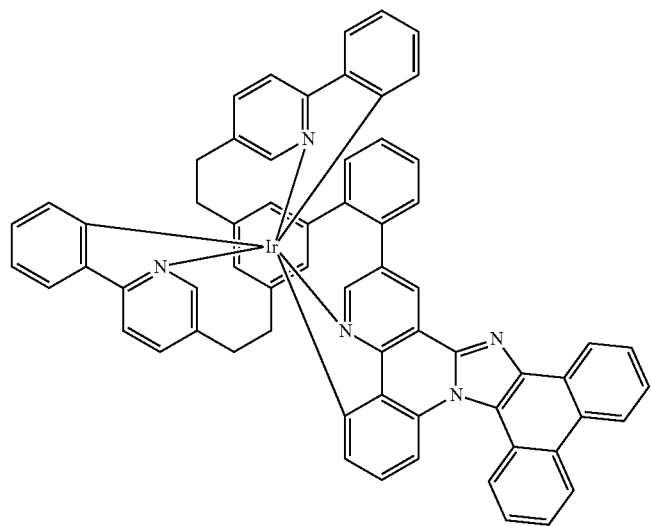
18
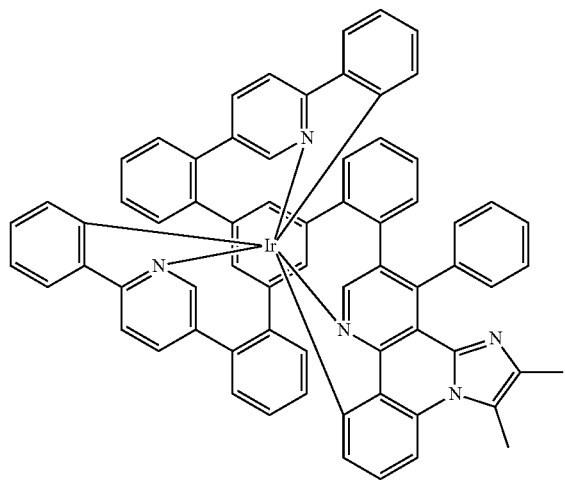
19

-continued
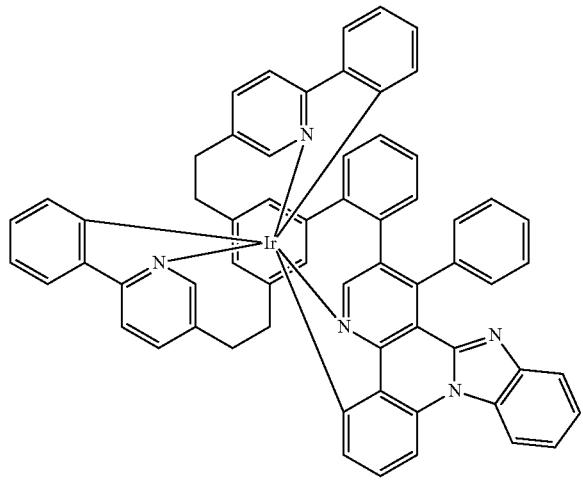
20
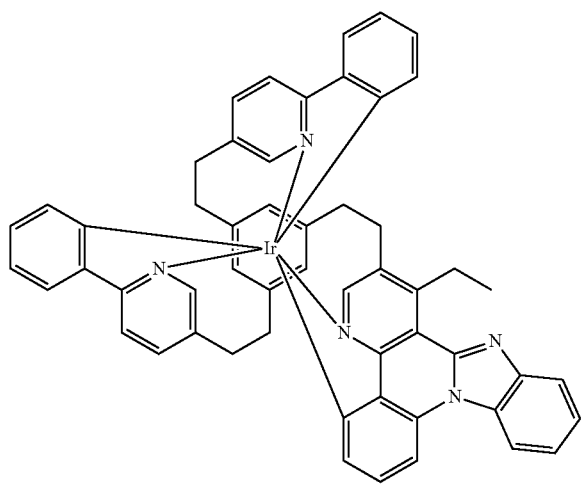
21
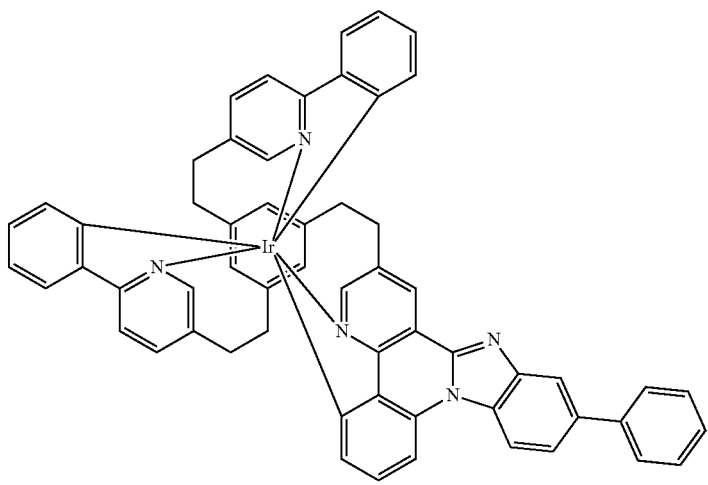
22

-continued
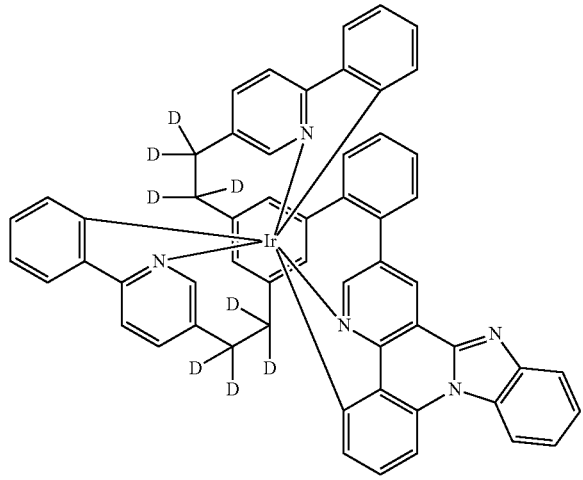
23
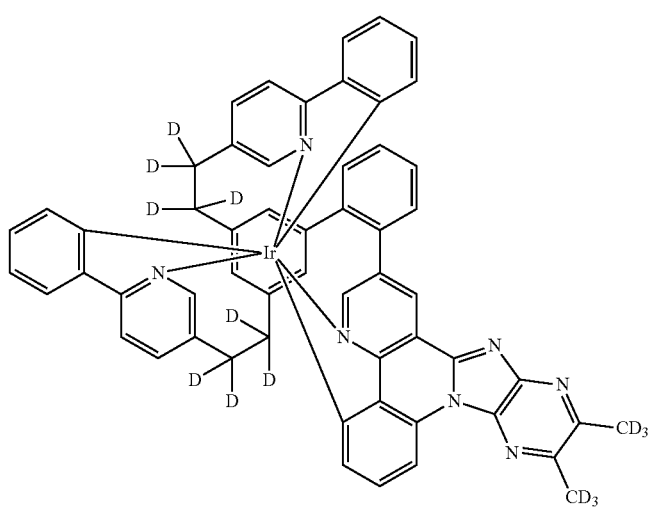
24
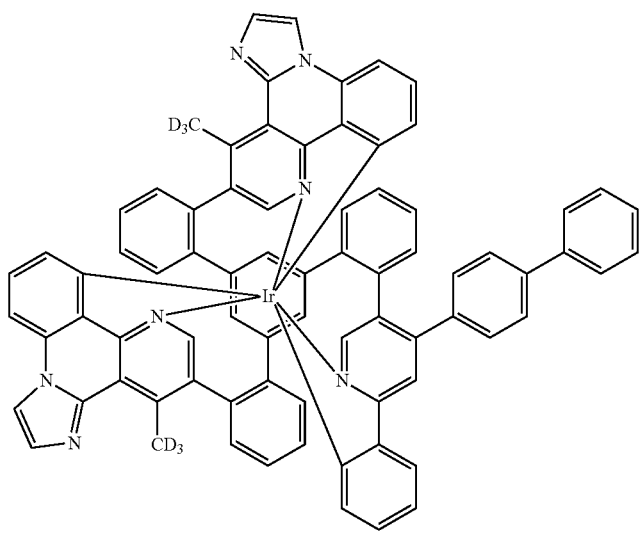
25

-continued
26
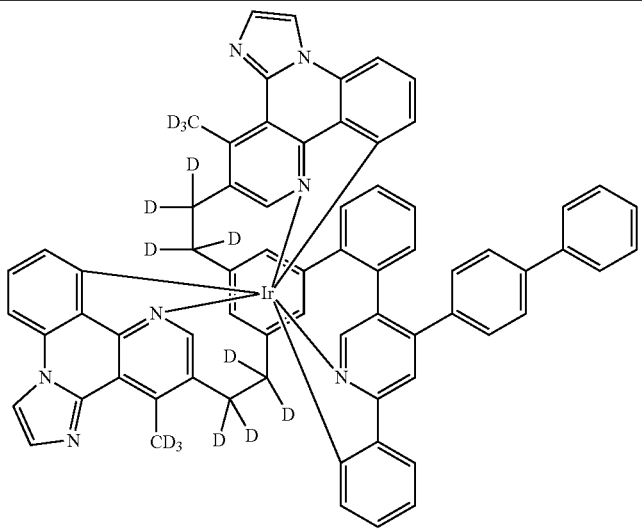
27
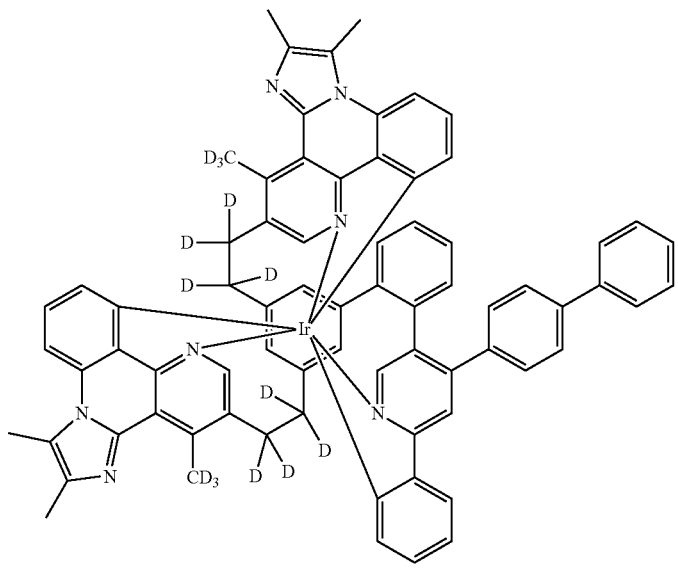
28
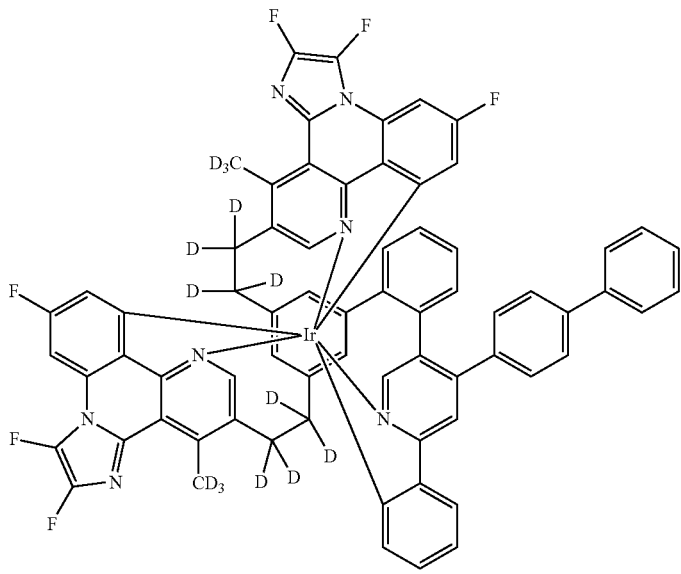

-continued
29
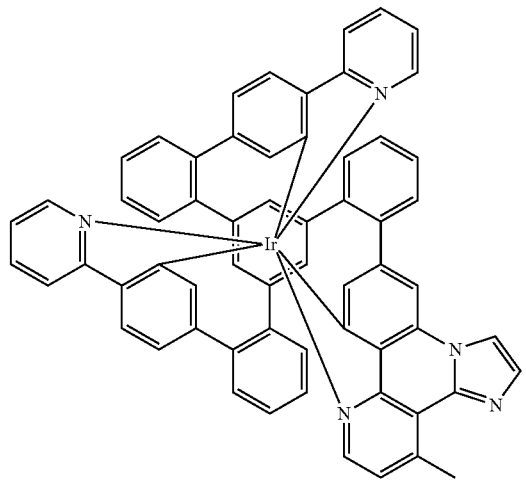
30
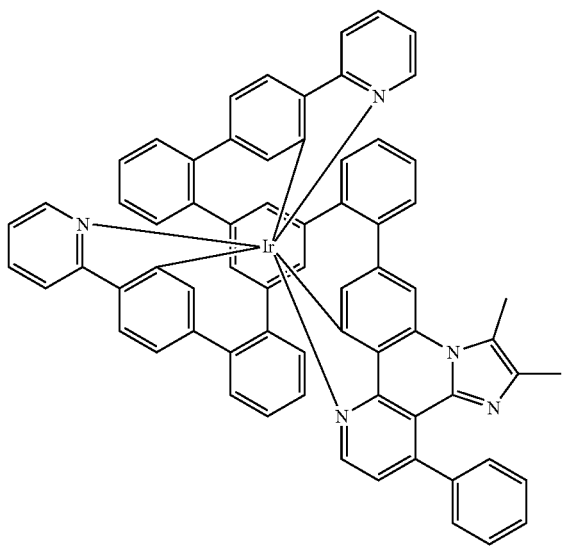
31
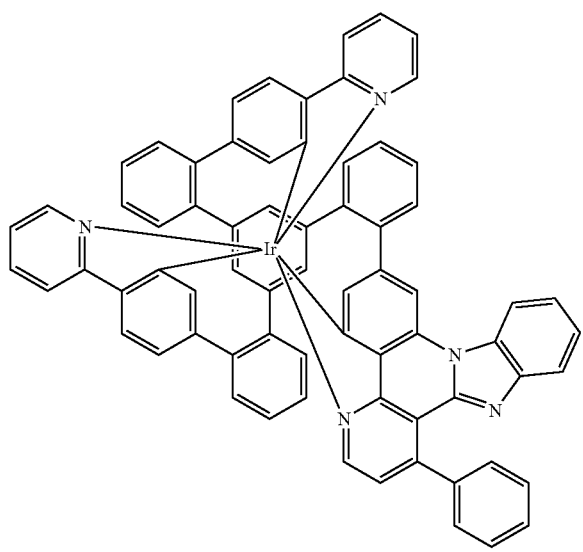

-continued
32
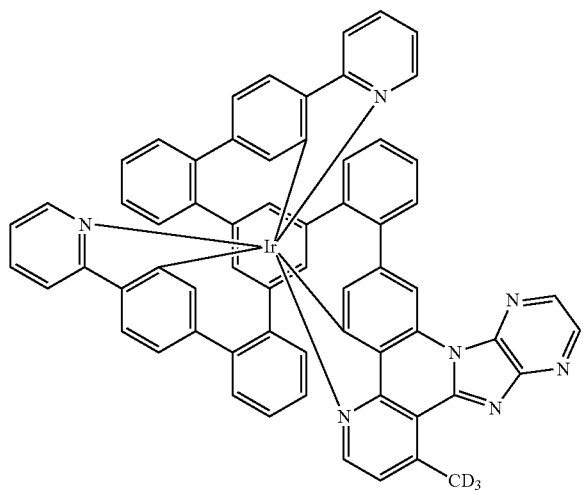
33
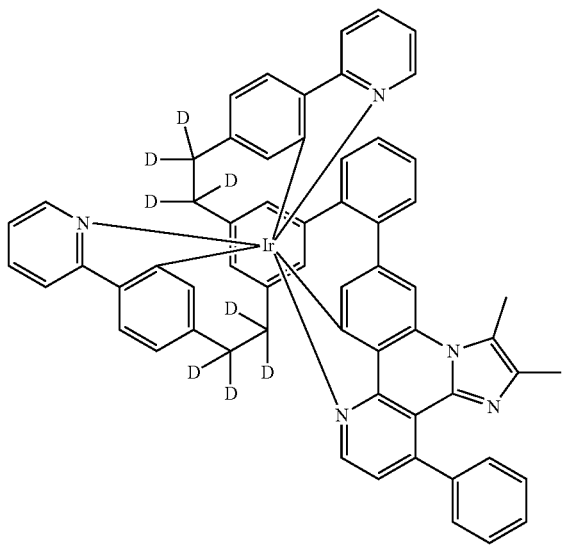
34
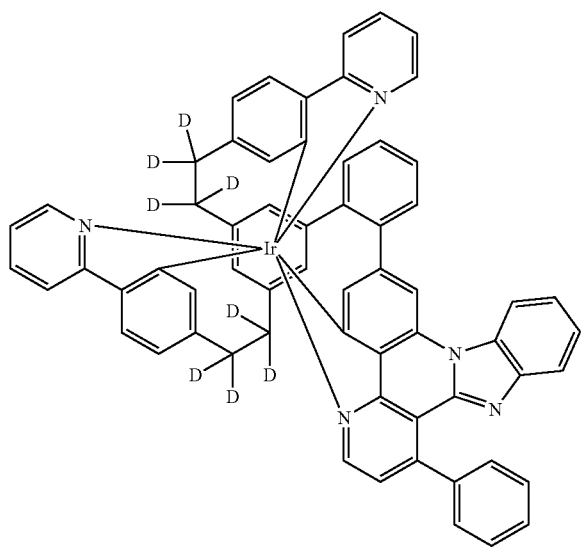

-continued
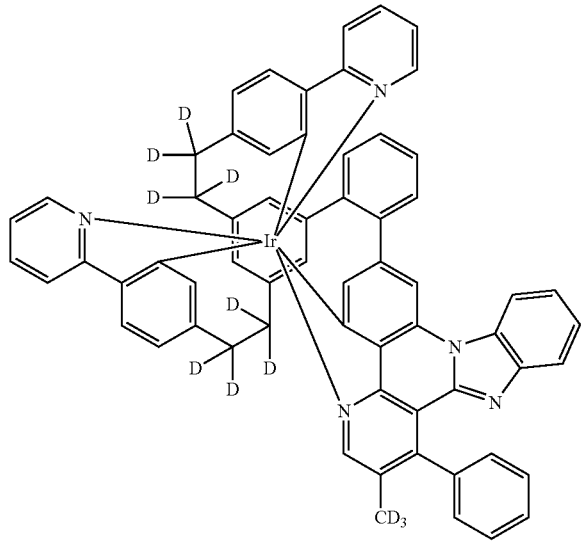
35
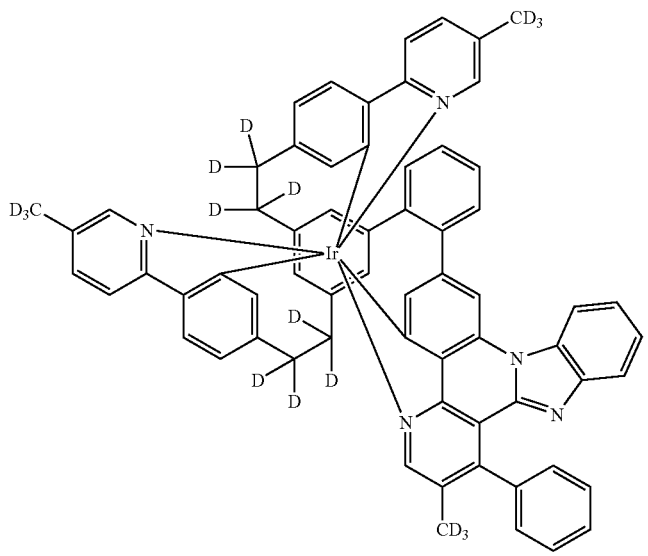
36
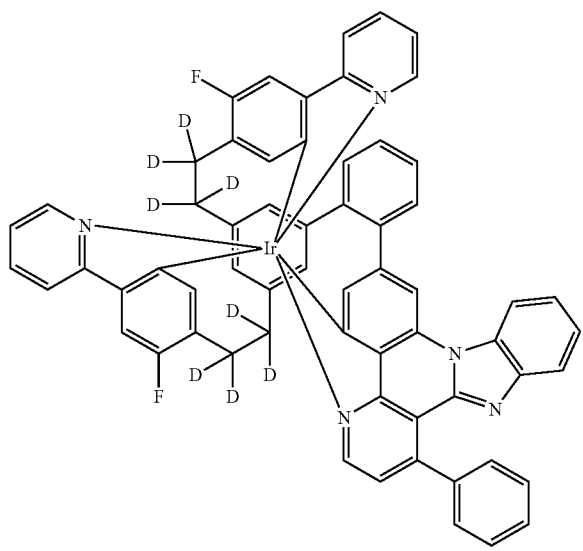
37

-continued
38
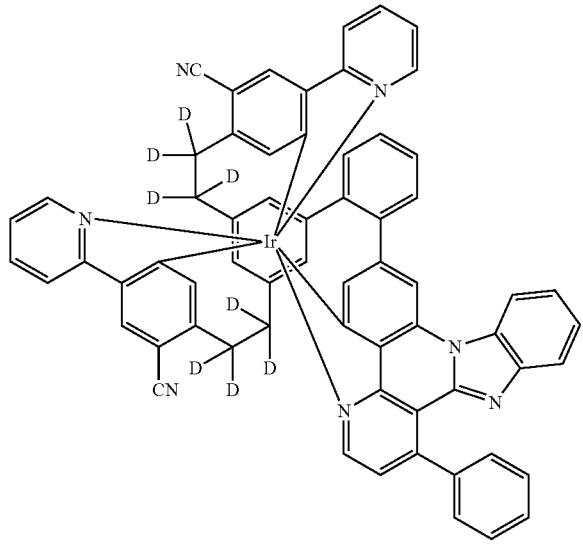
39
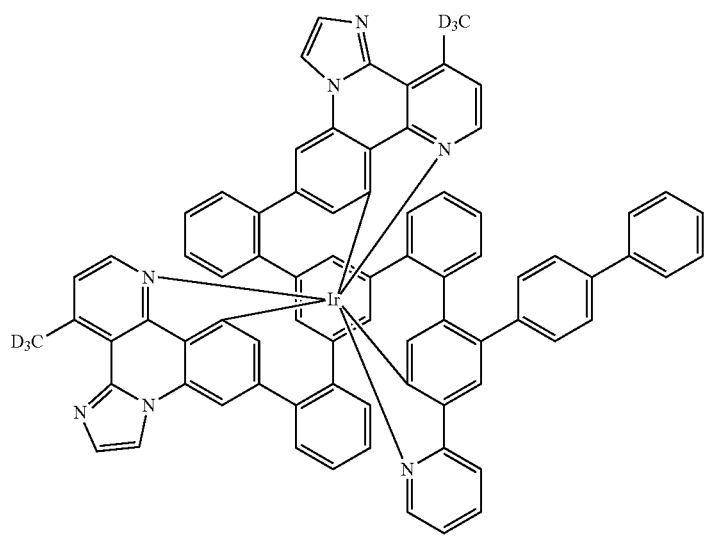
40
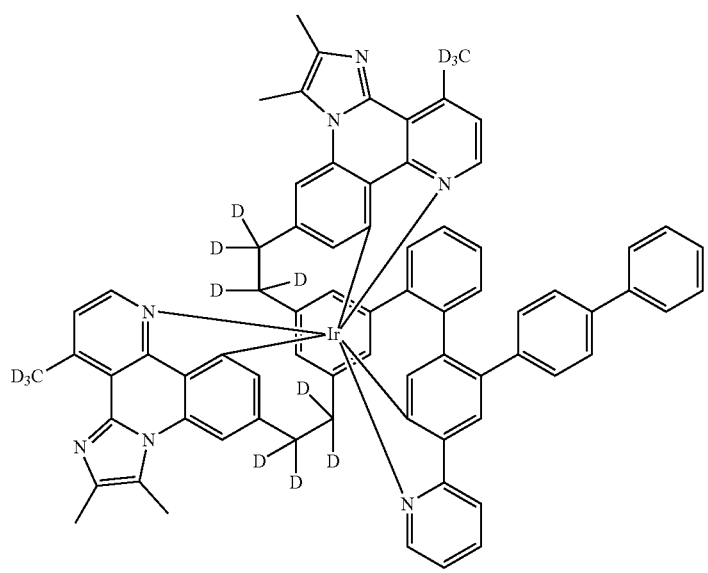

-continued
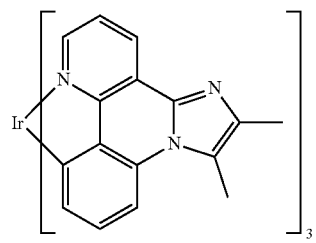 41
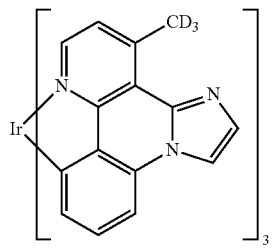 42
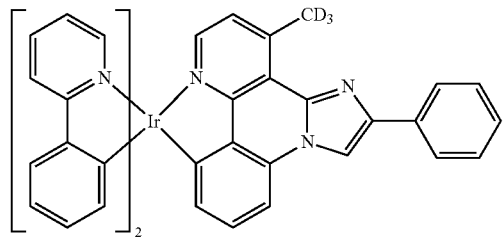 43
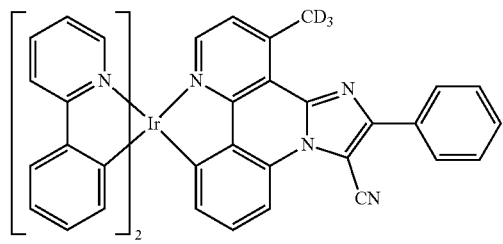 44
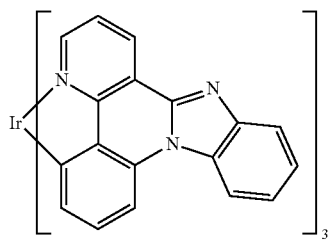 45
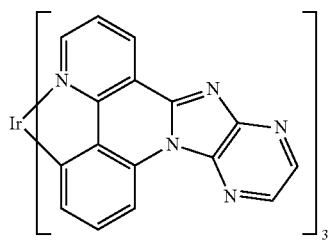 46

-continued
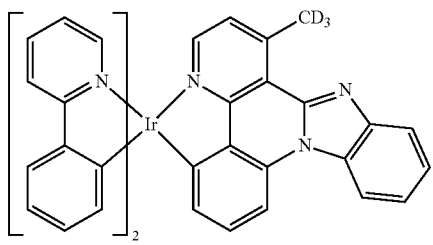
47
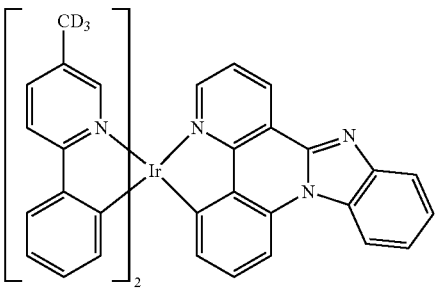
48
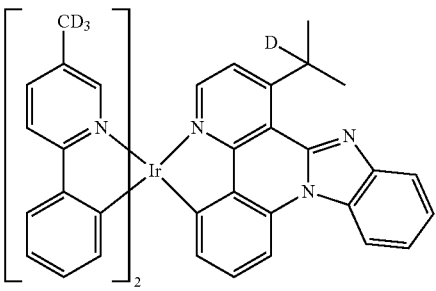
49
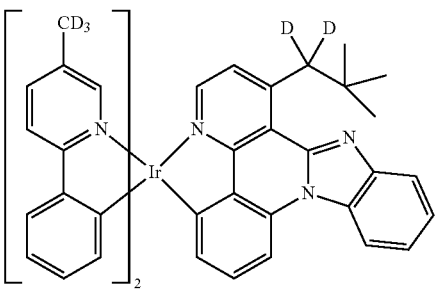
50
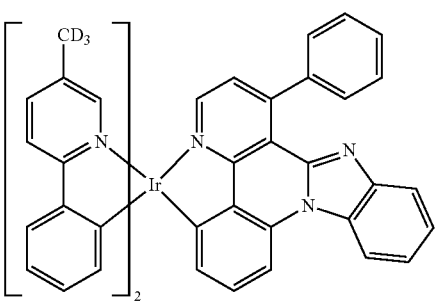
51

-continued
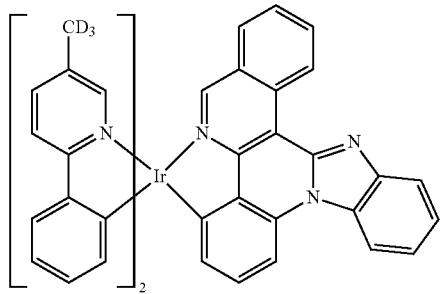
52
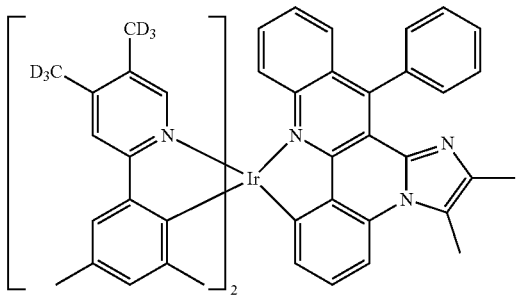
53
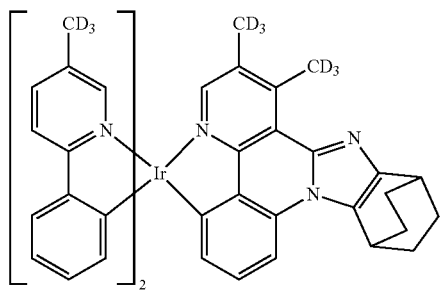
54
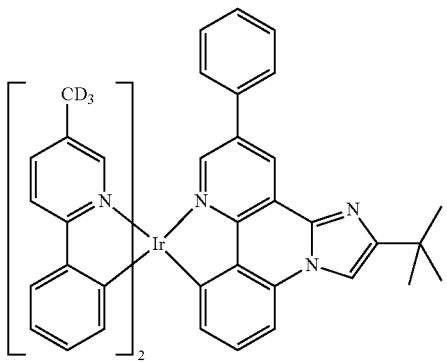
55
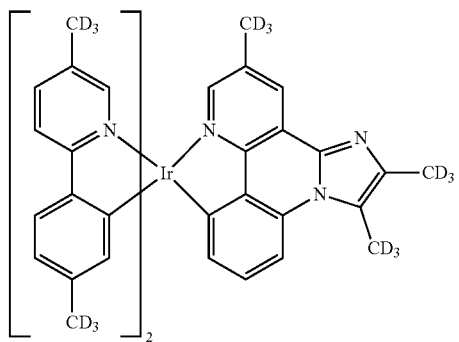
56

-continued
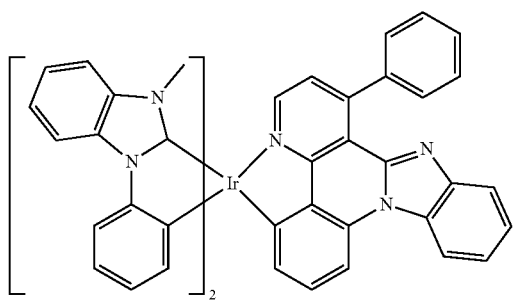
57
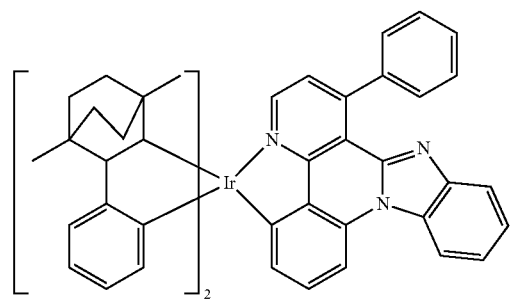
58
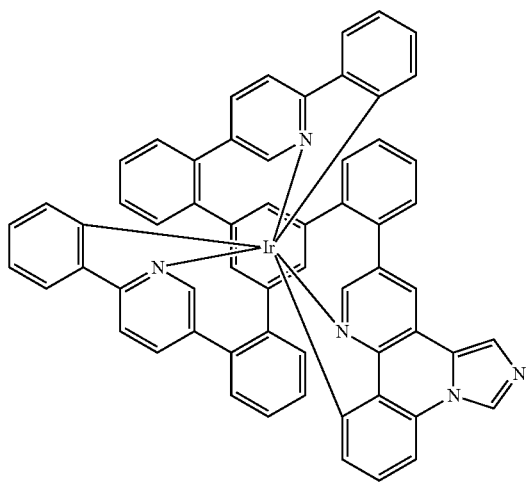
59
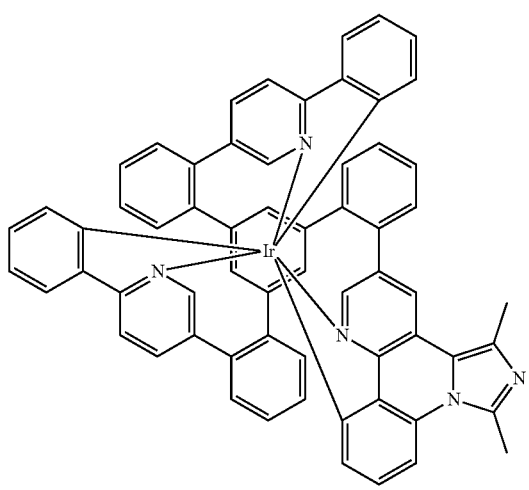
60

-continued
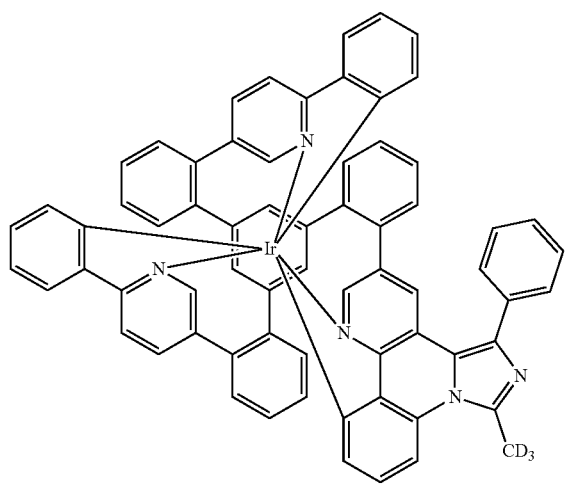
61
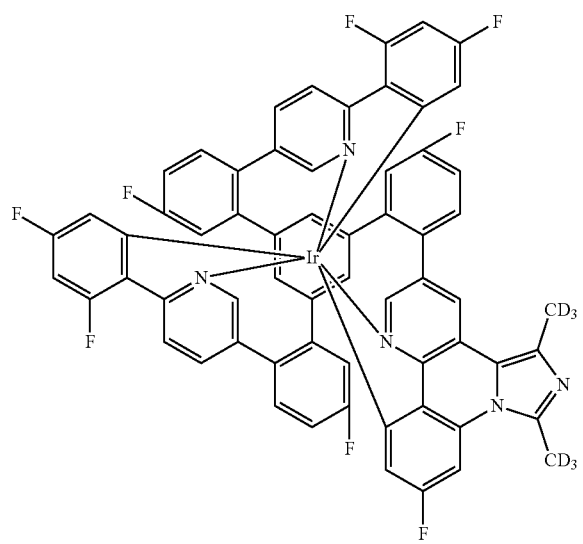
62
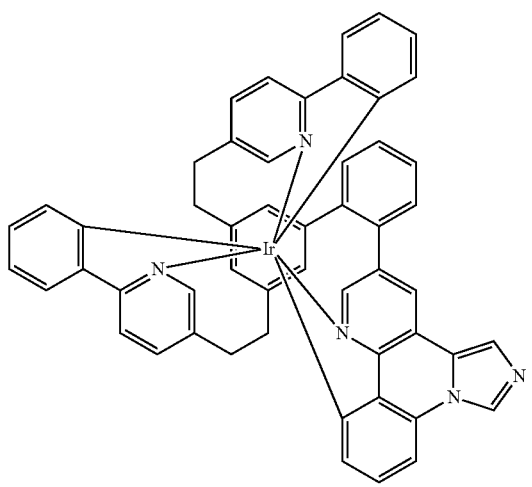
63

-continued
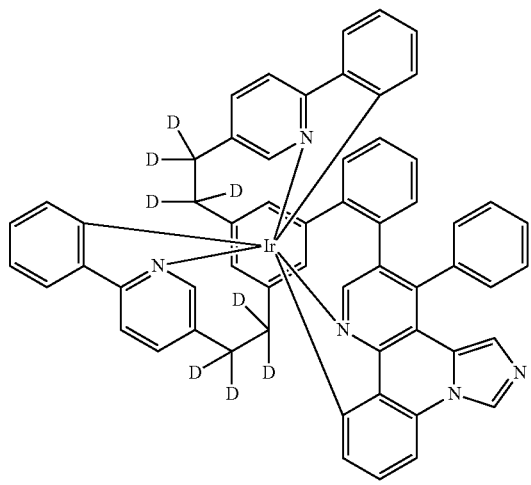
64
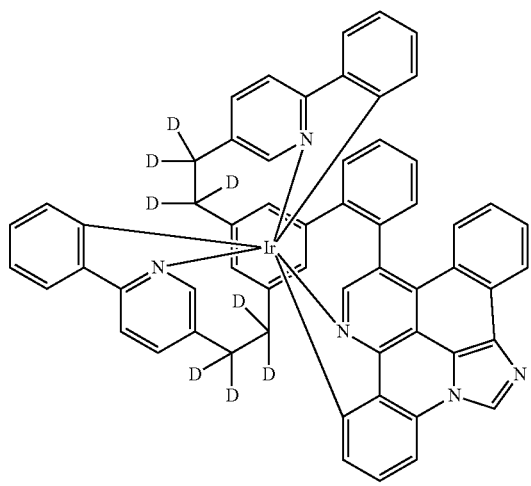
65
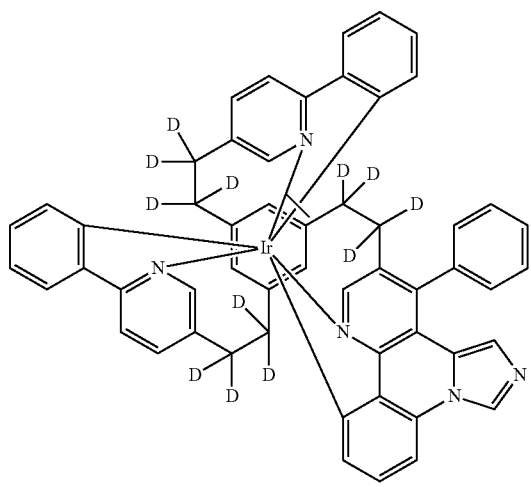
66

-continued
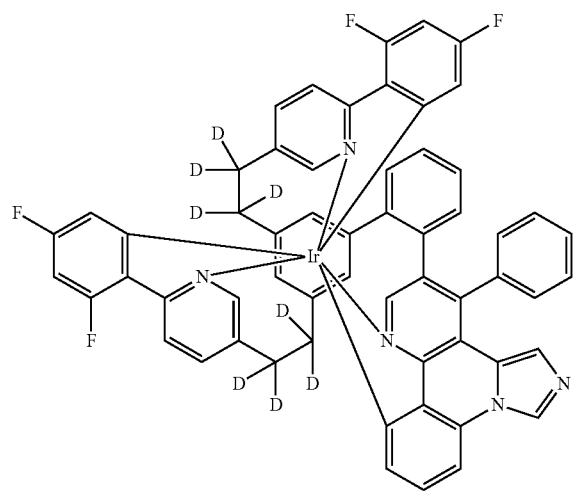
67
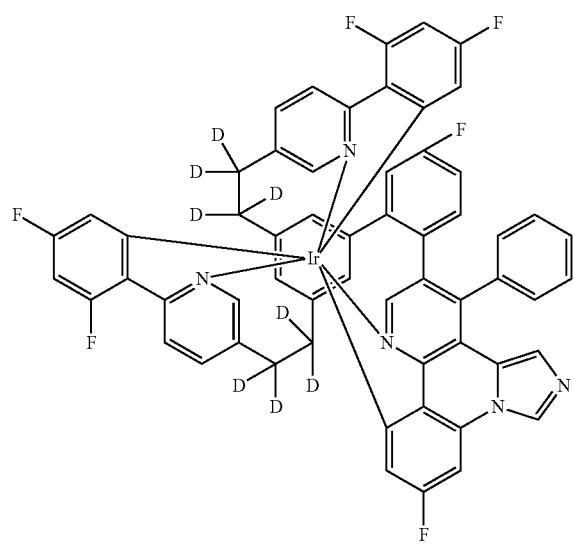
68
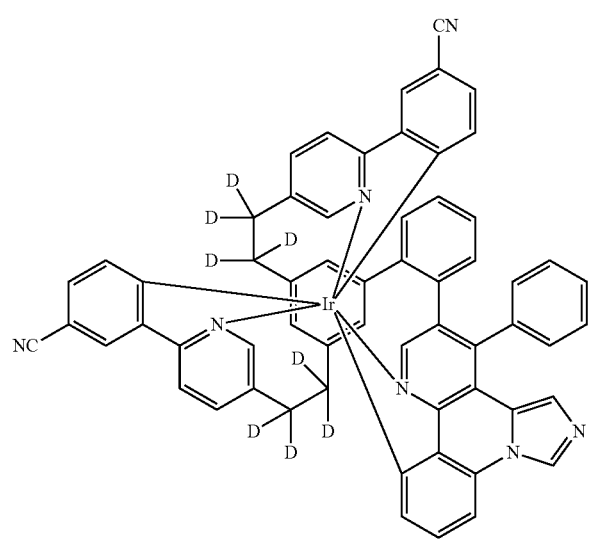
69

-continued
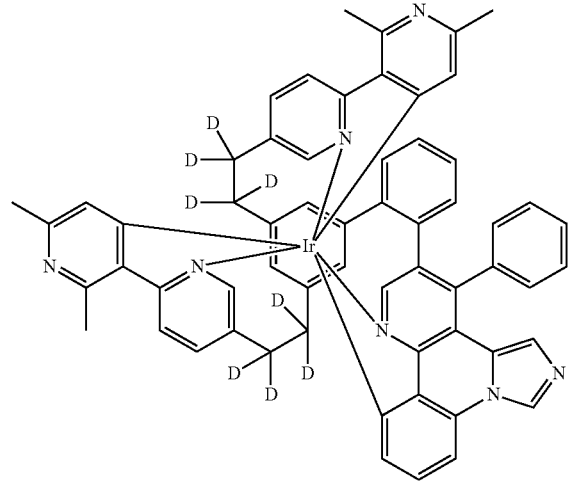
70
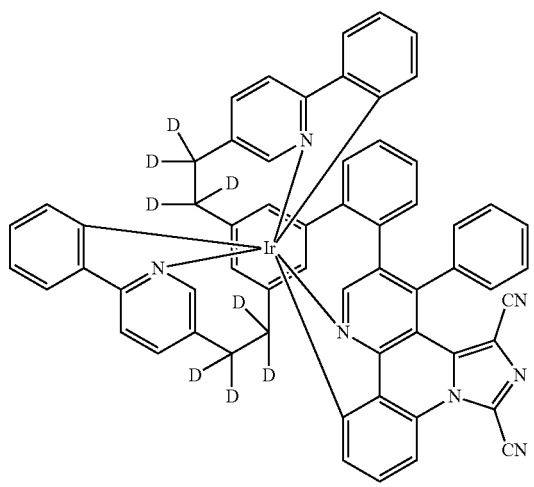
71
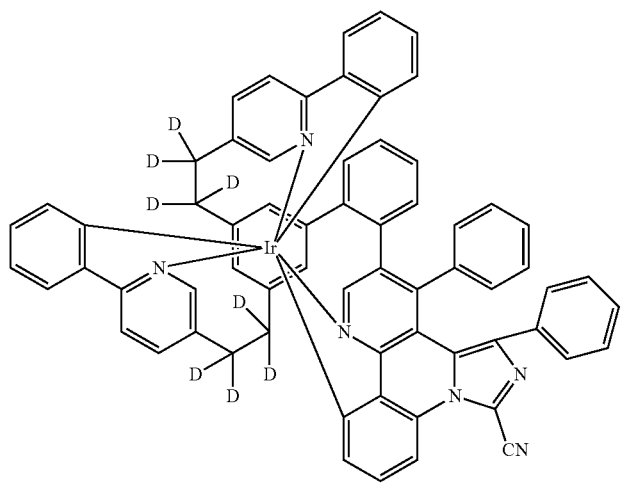
72

-continued
73
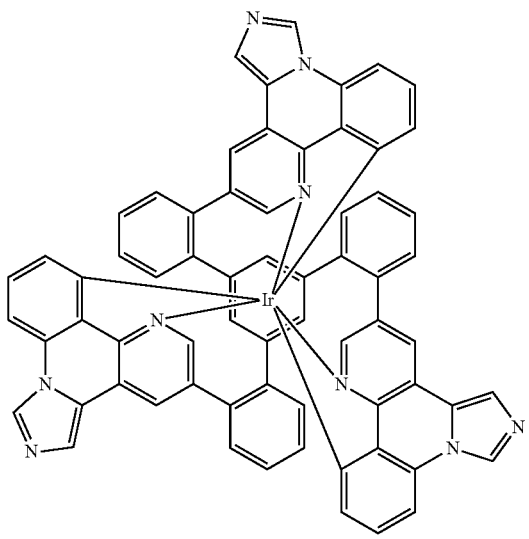
74
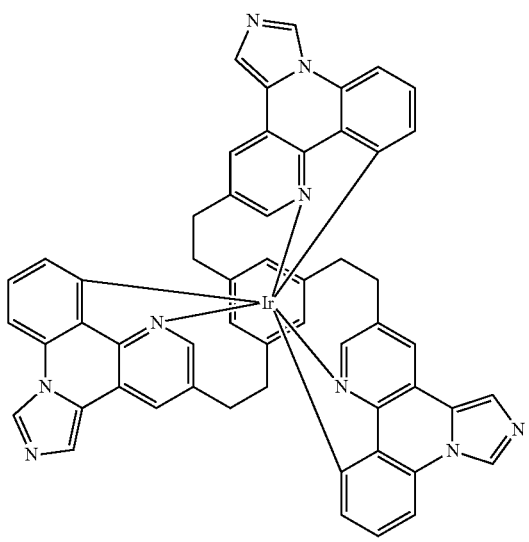
75
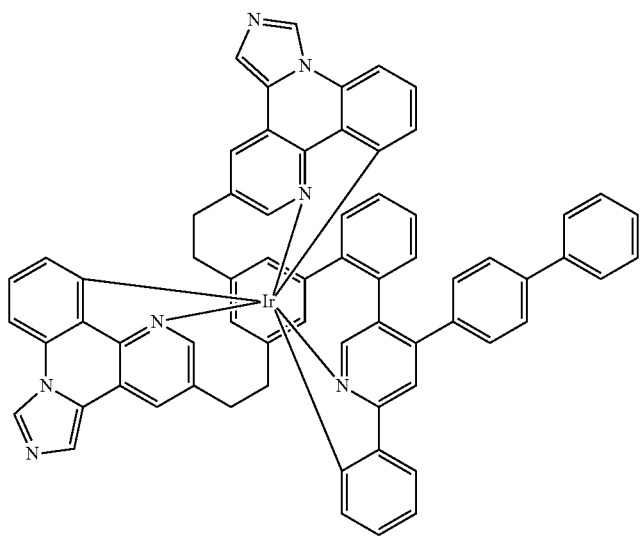

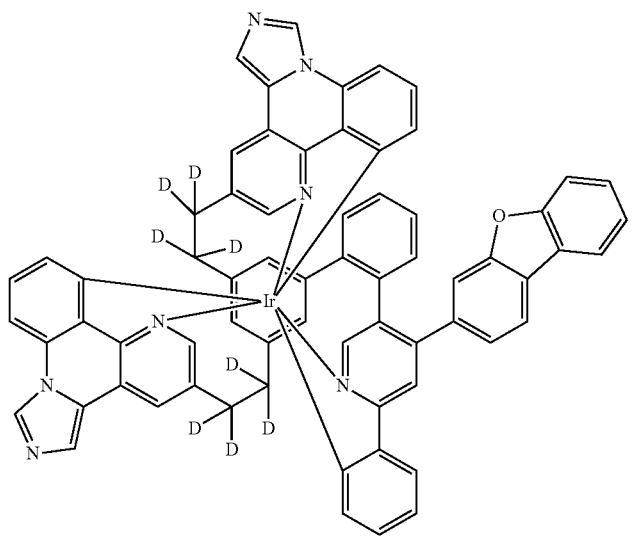
76
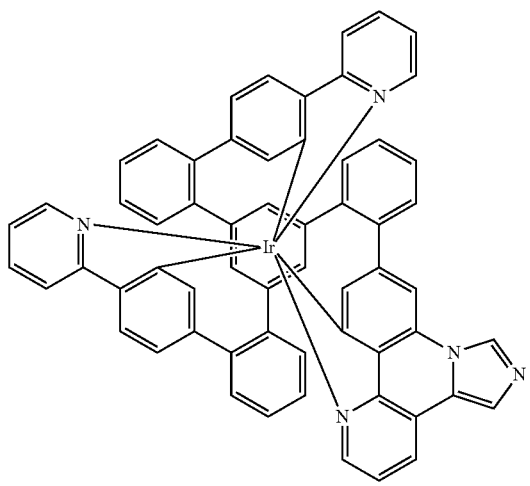
77
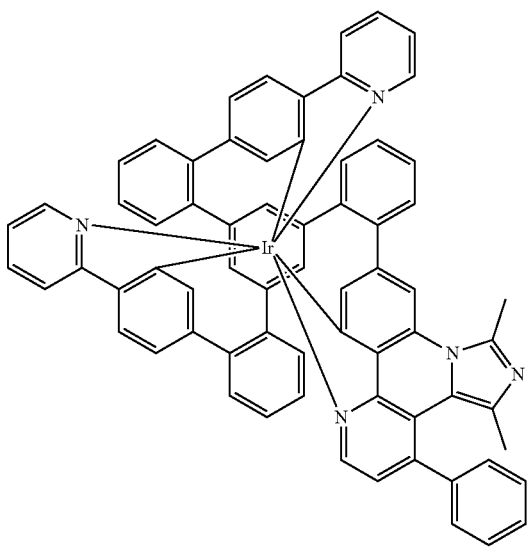
78

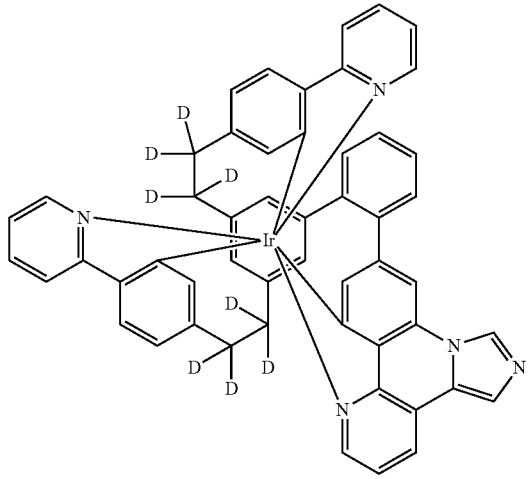
79
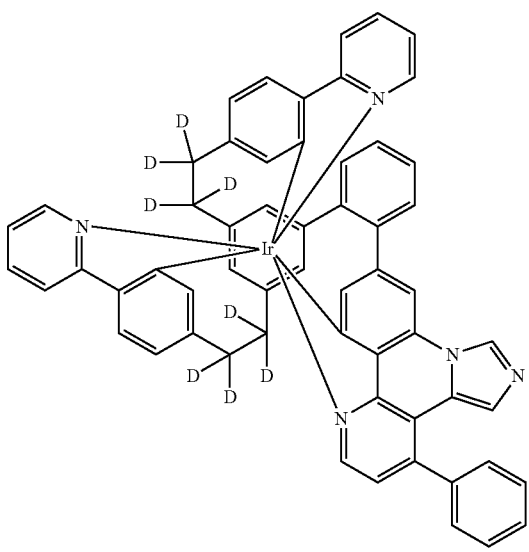
80
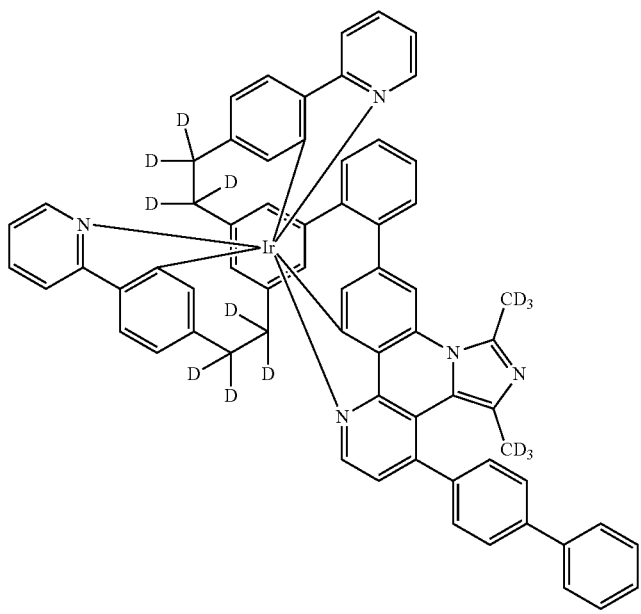
81

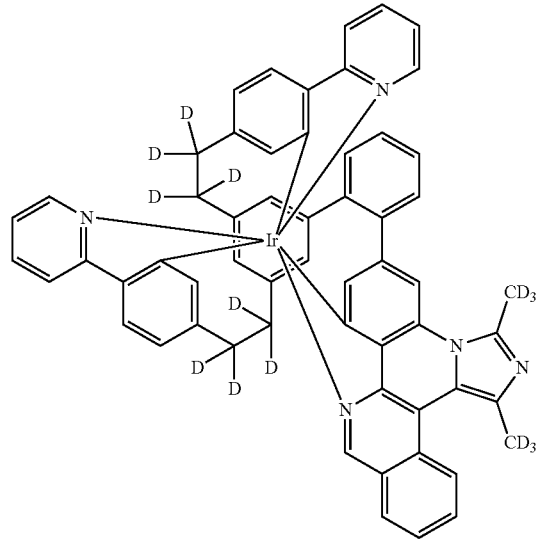
82
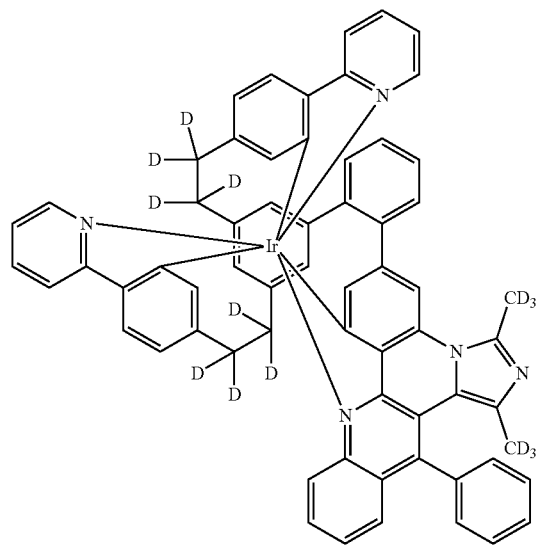
83
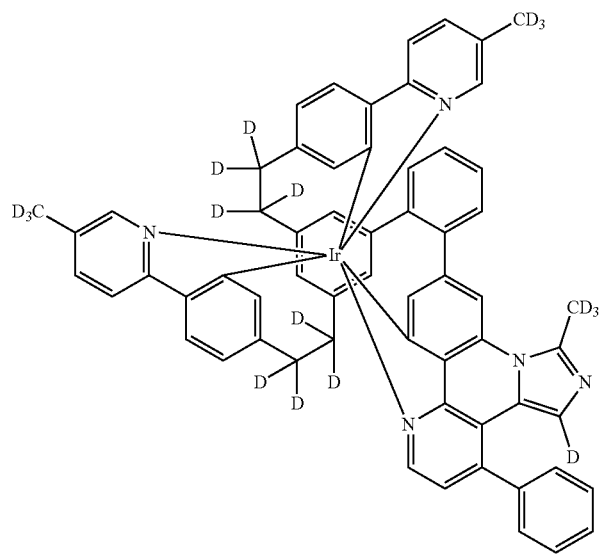
84

85
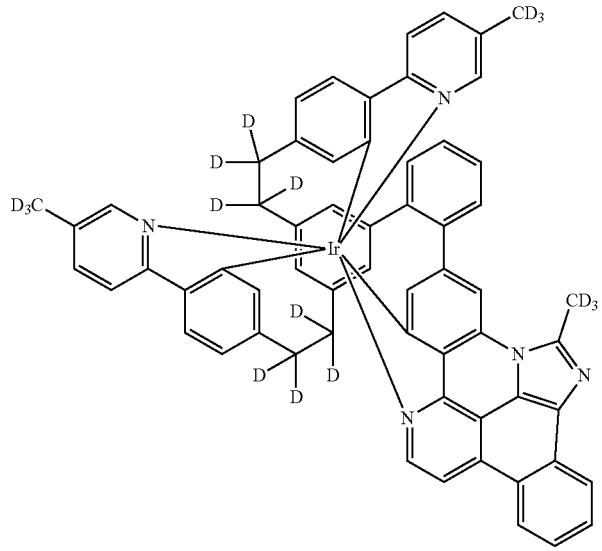
86
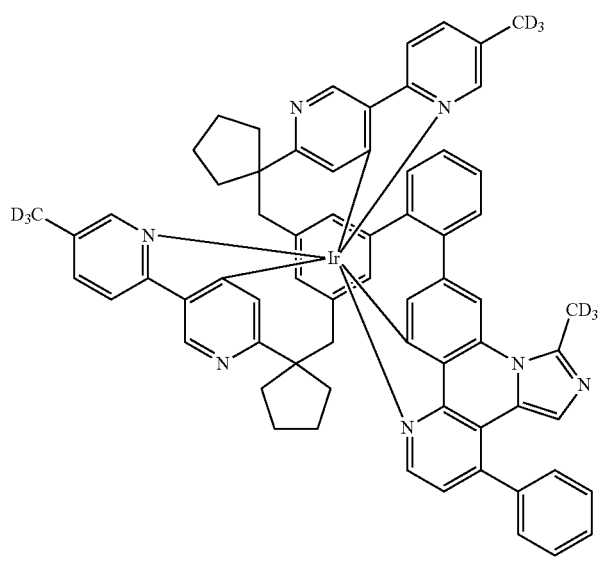
87
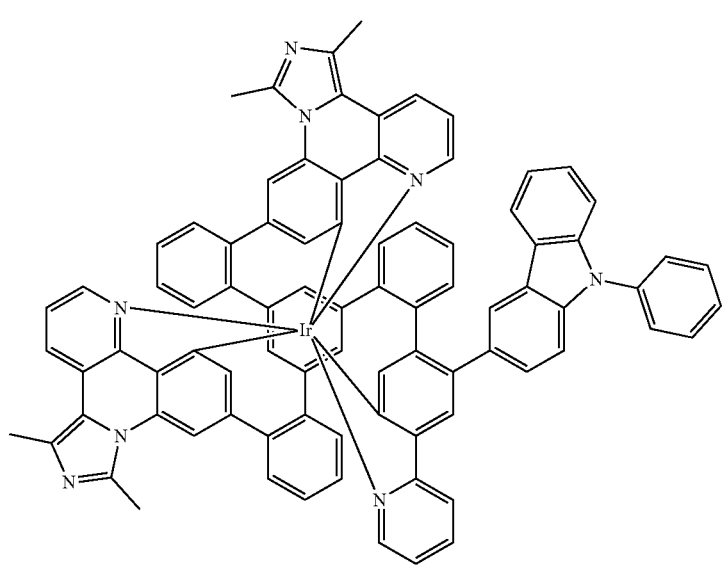

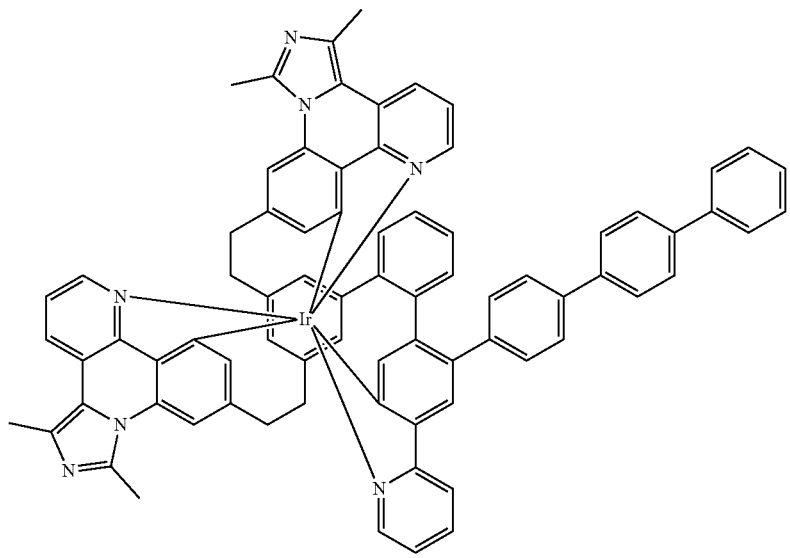
88
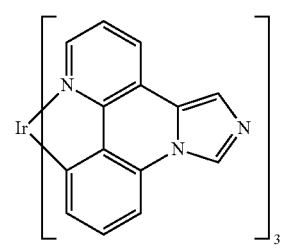
89
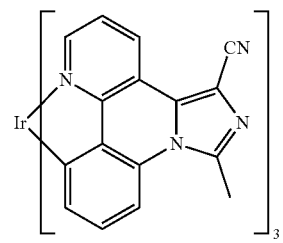
90
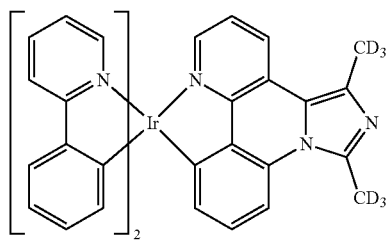
91
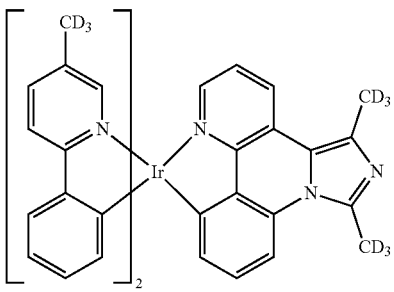
92

93
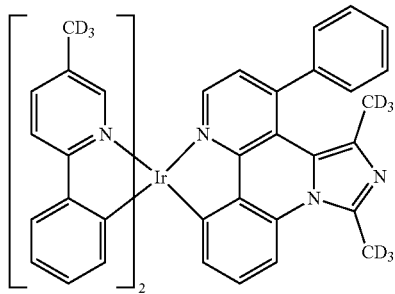
94
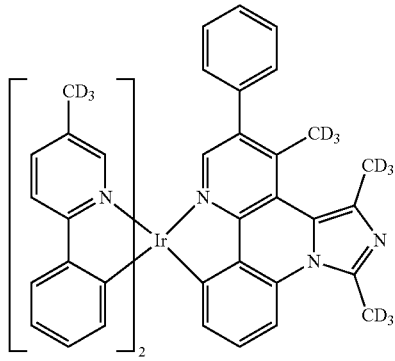
95
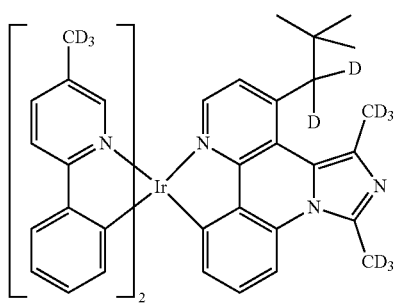
96
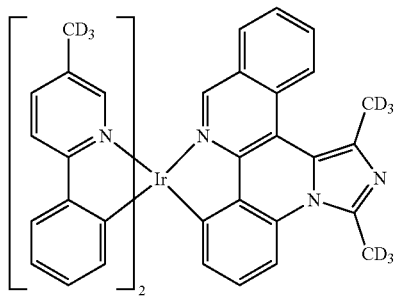
97
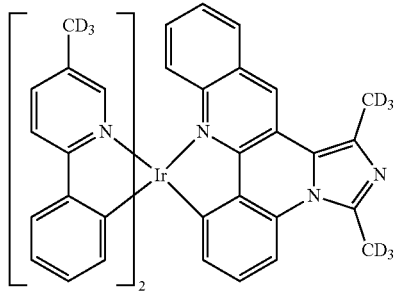

-continued
98
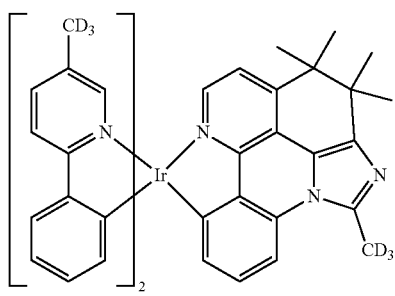
99
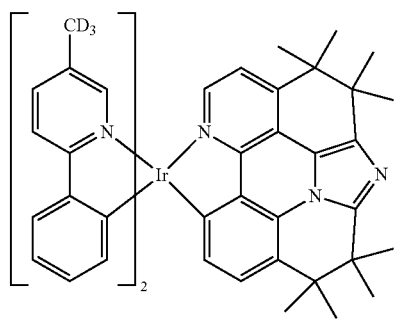
100
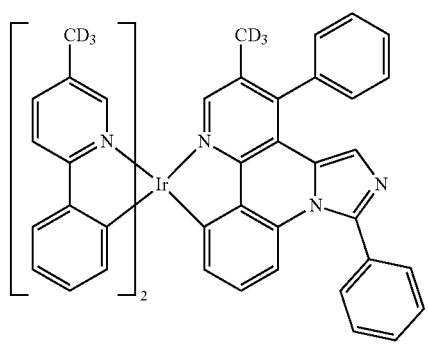
101
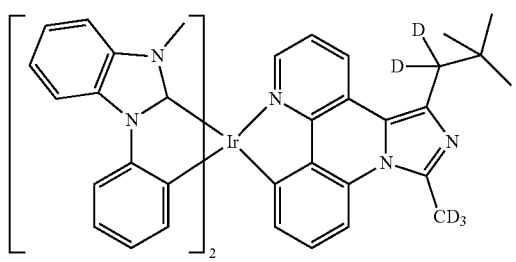
102
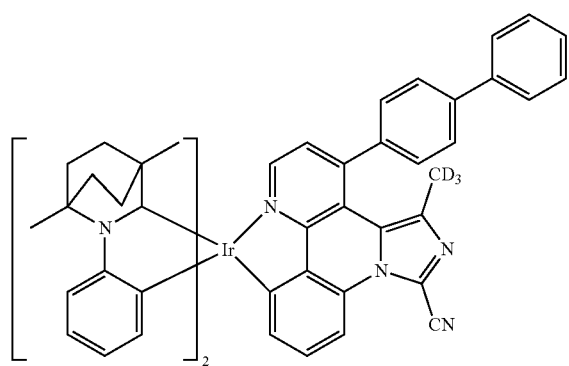

-continued
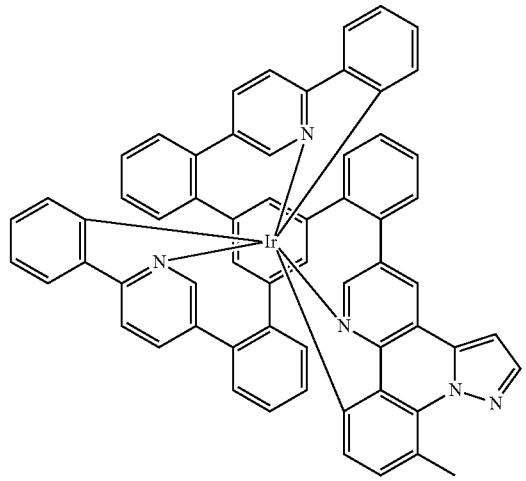
102
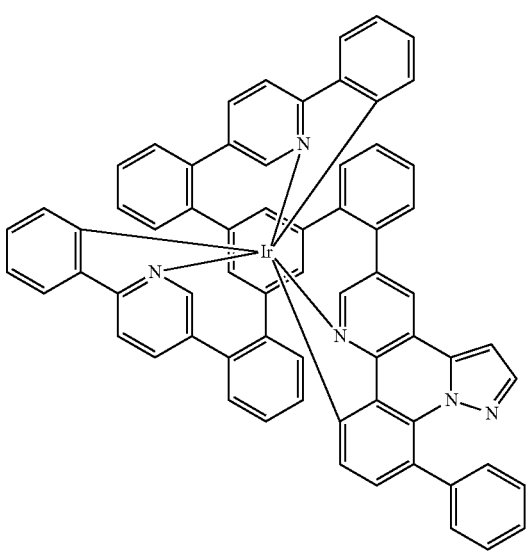
103
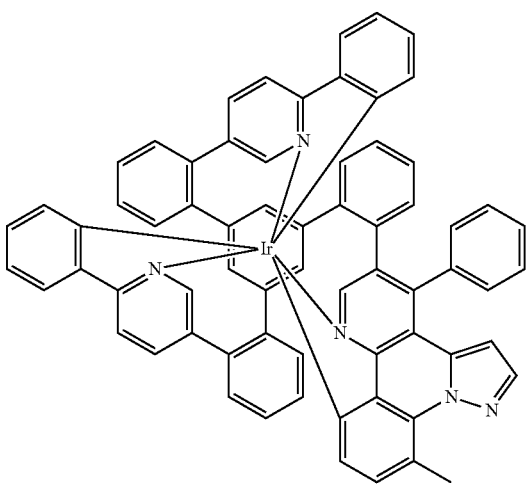
104

-continued
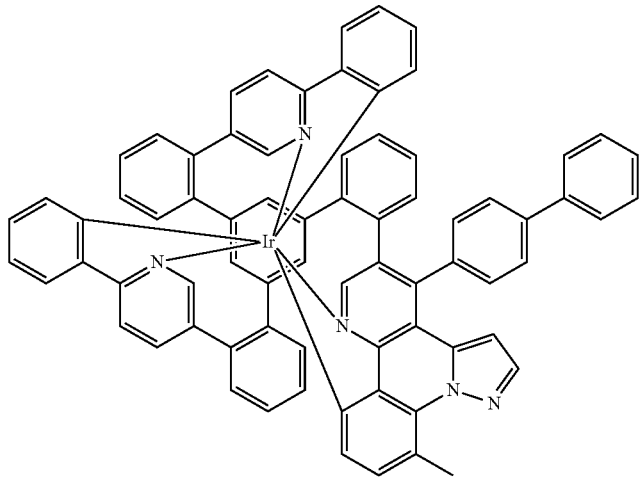
105
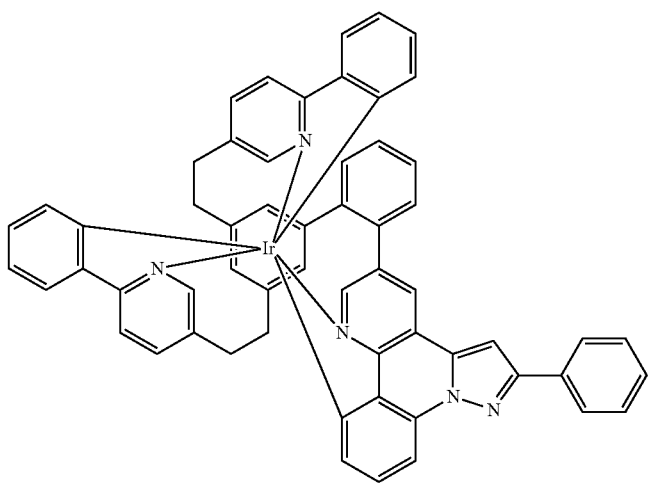
106
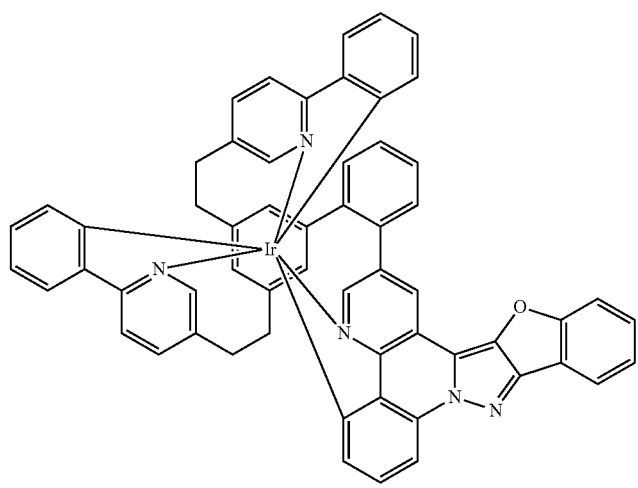
107

-continued
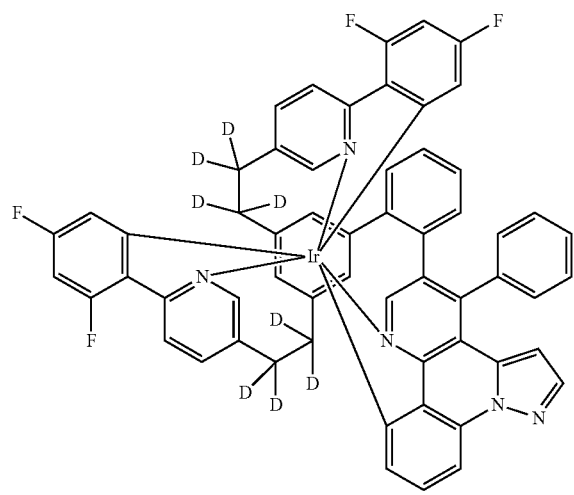
108
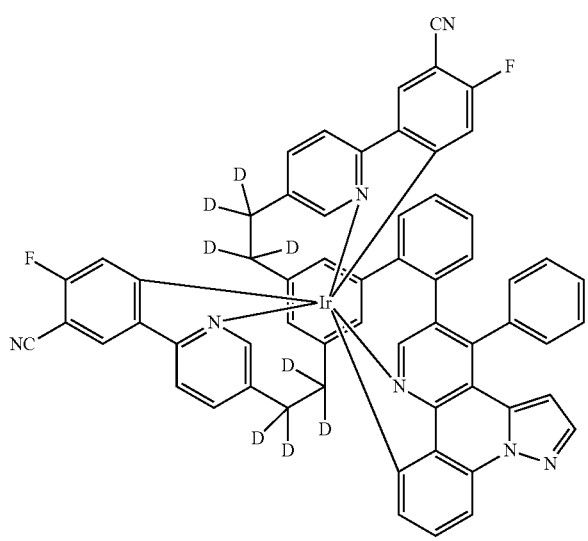
109
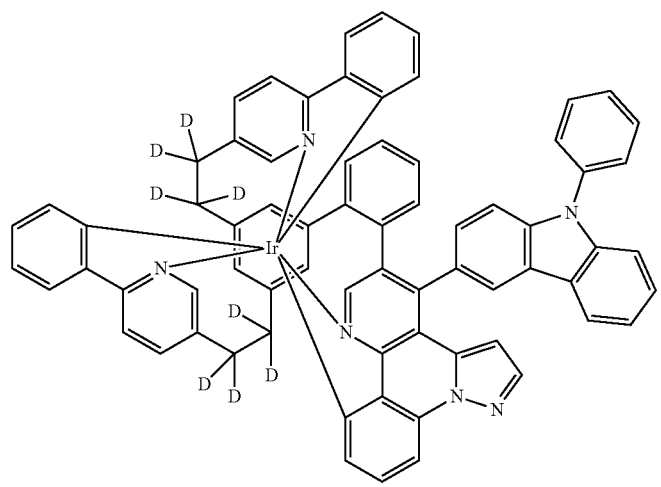
110

111
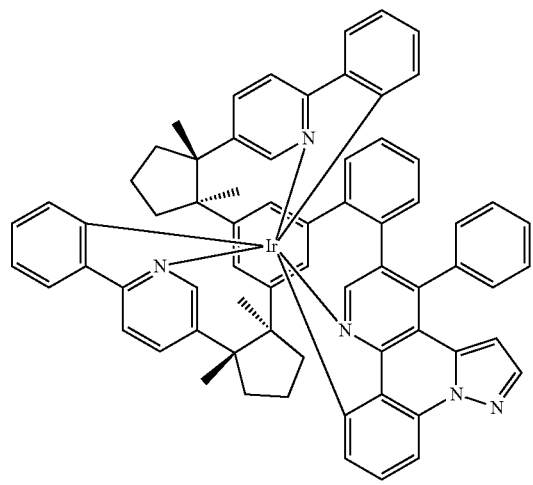
112
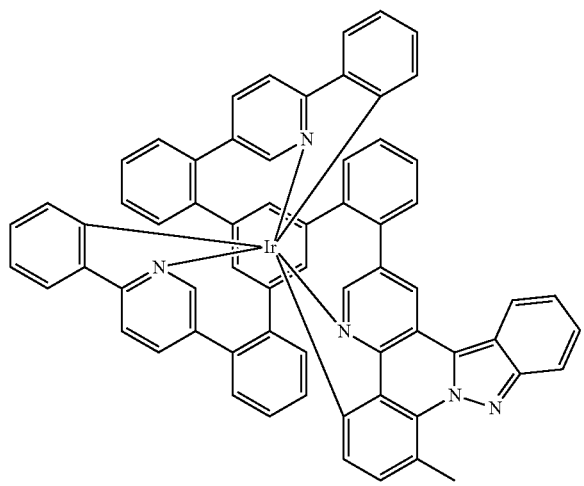
113
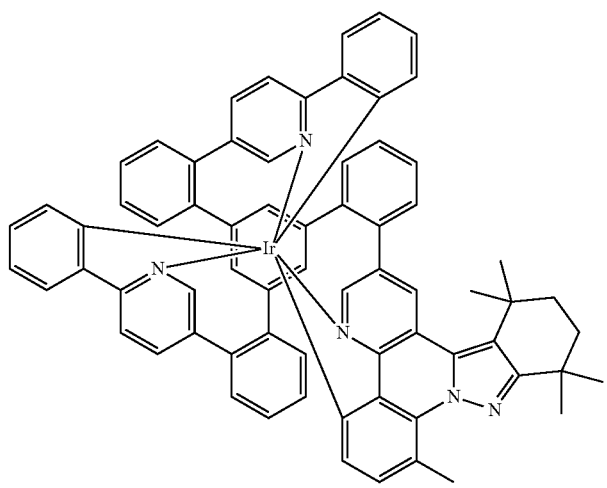

-continued
114
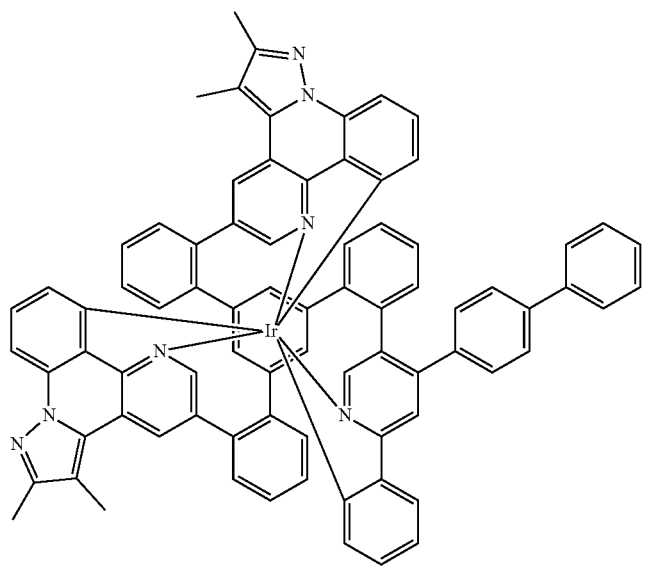
115
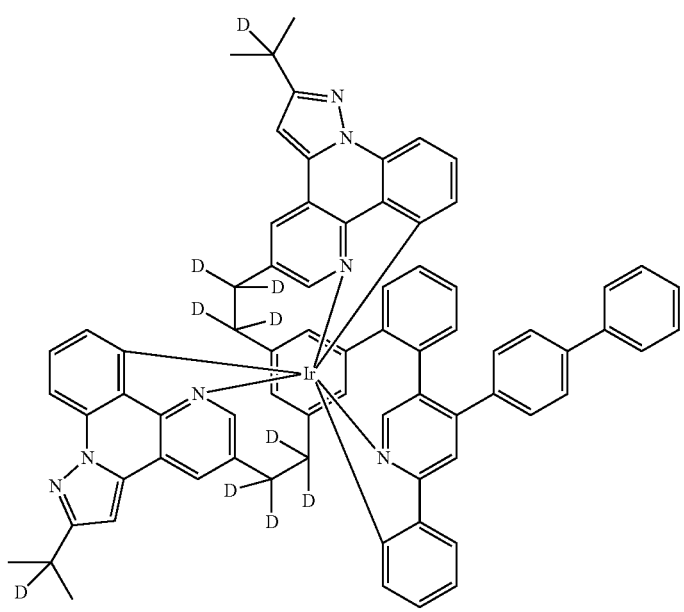
116
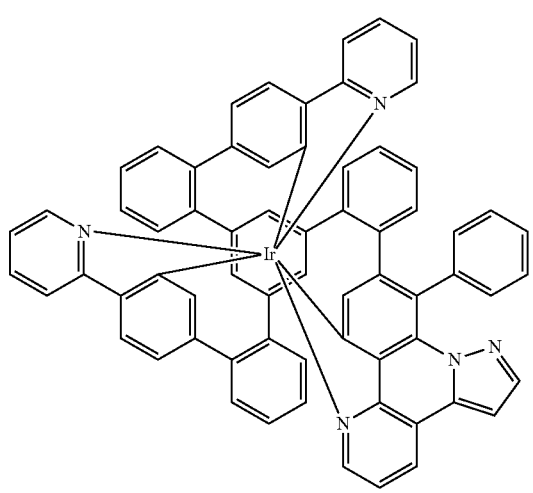

117
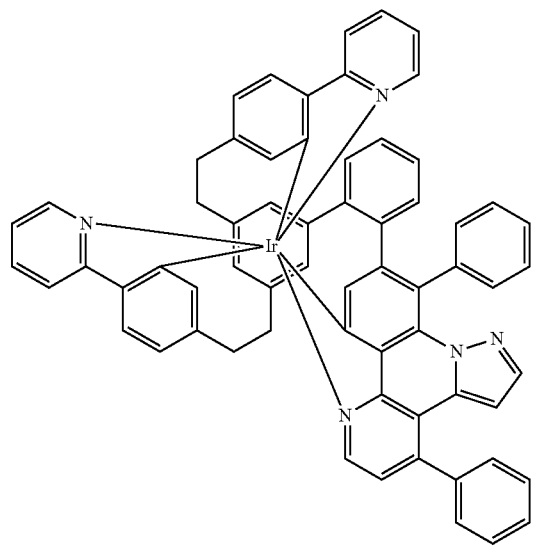
118
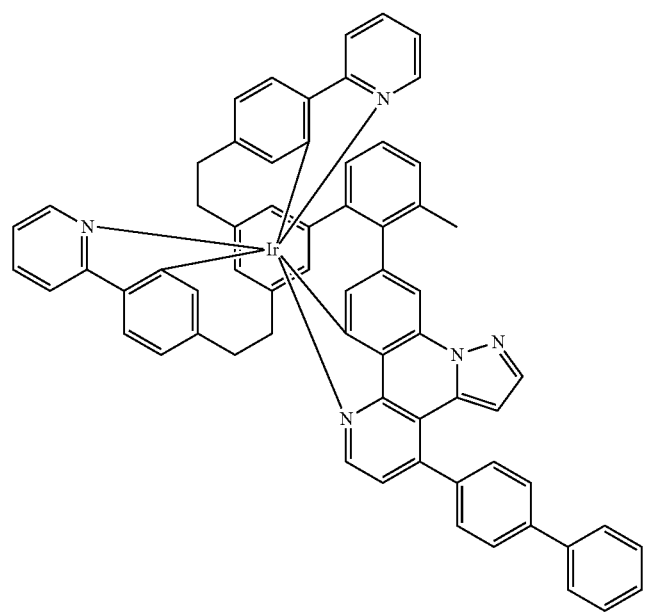

-continued
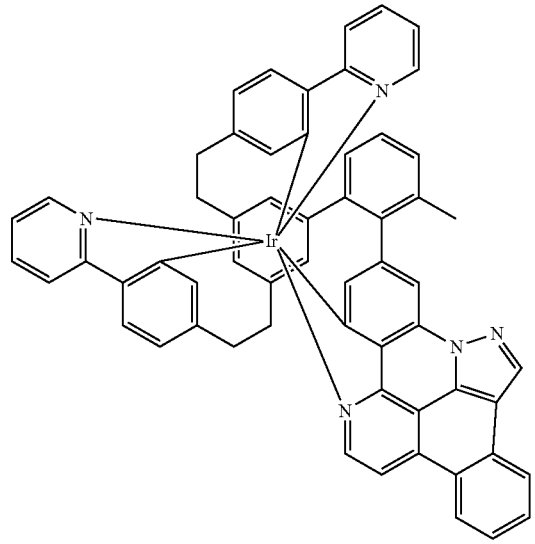
119
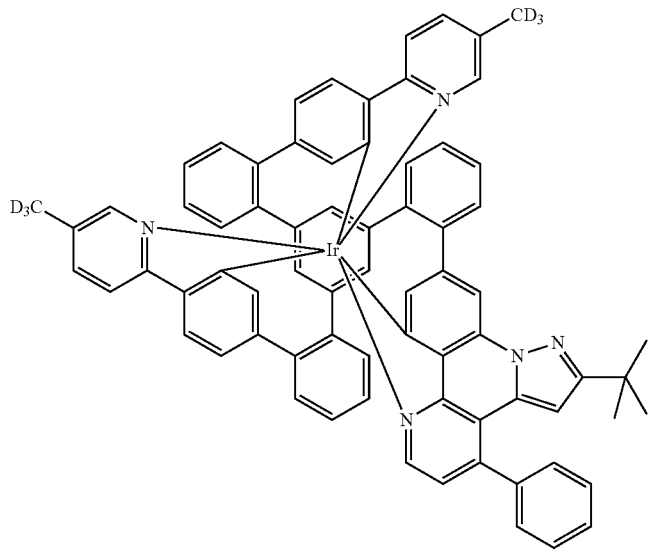
120
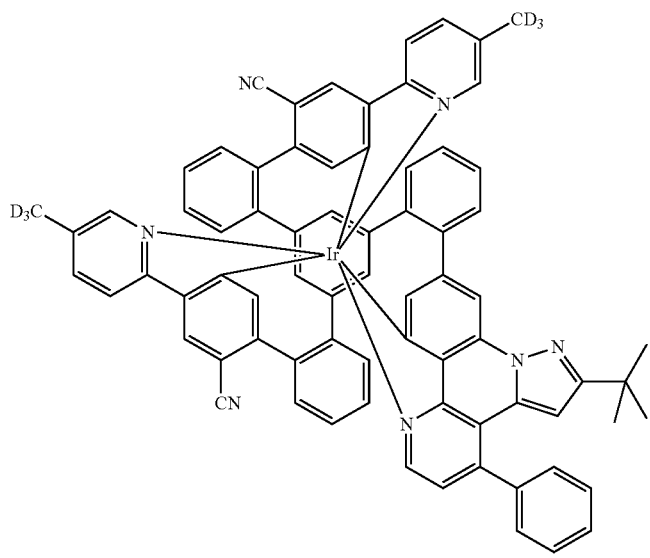
121

-continued
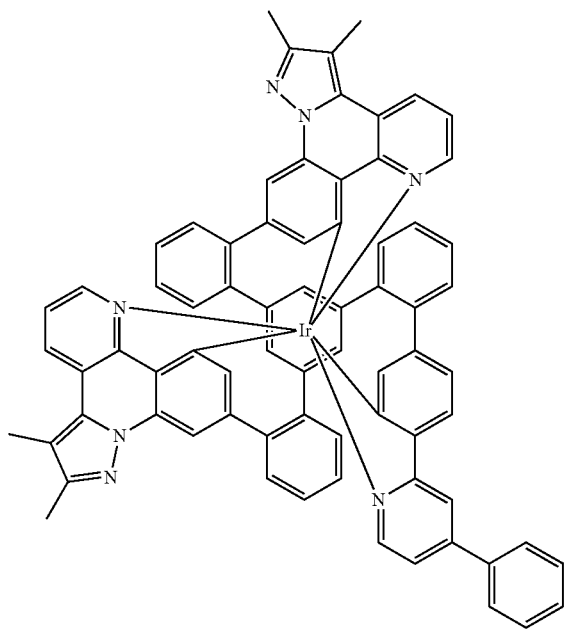
122
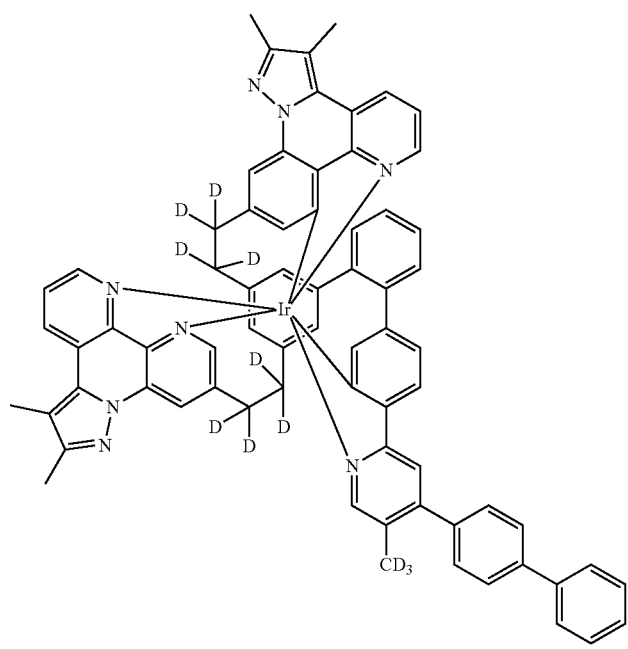
123
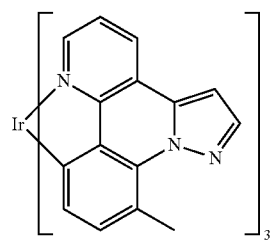
124

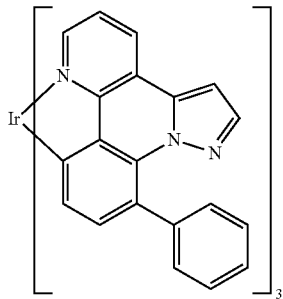
125
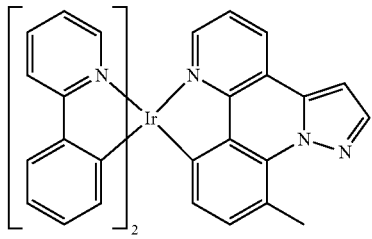
126
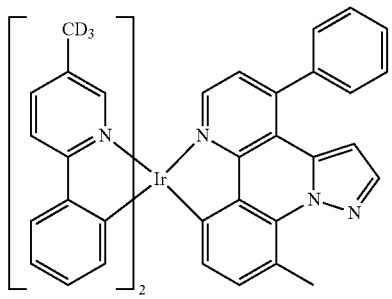
127
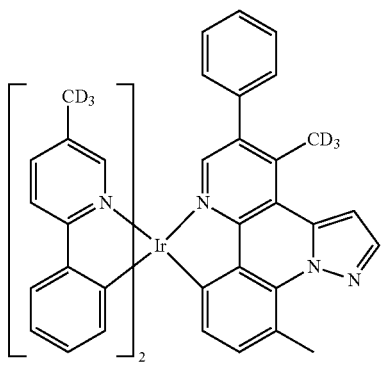
128
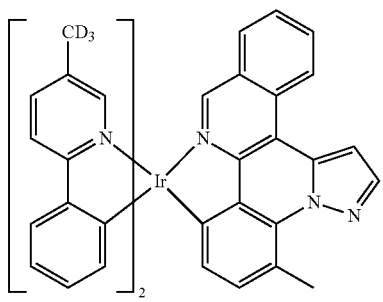
129

-continued
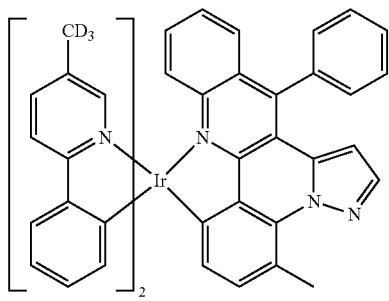
130
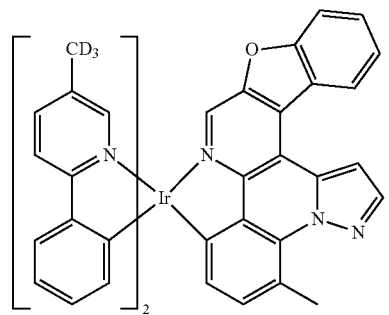
131
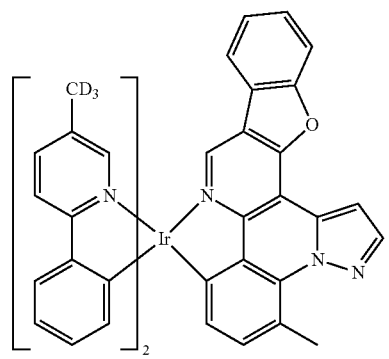
132
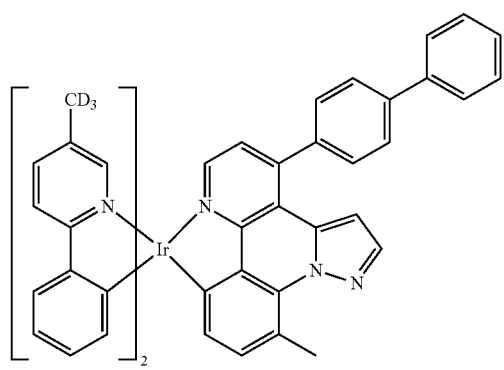
133

-continued
134
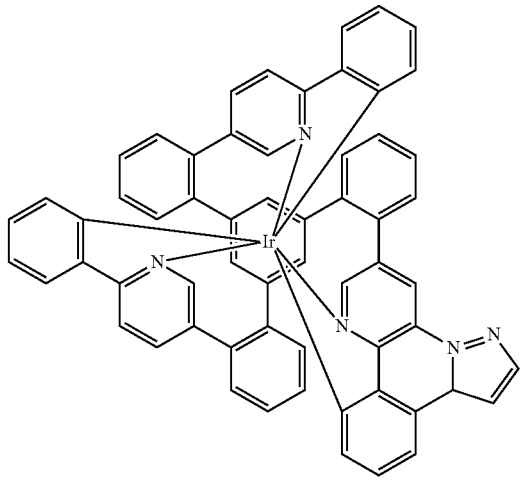
235
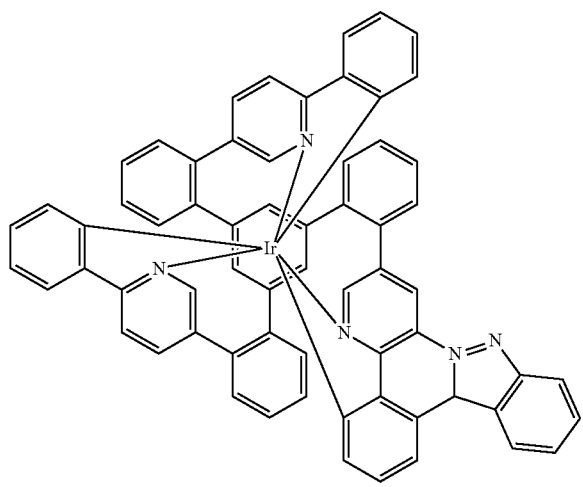
236
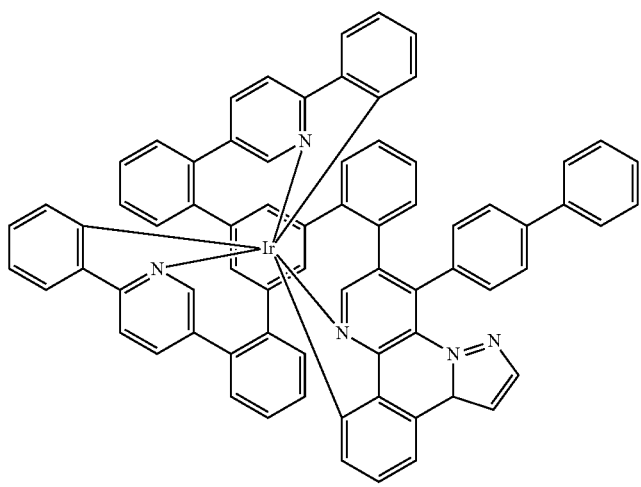

-continued
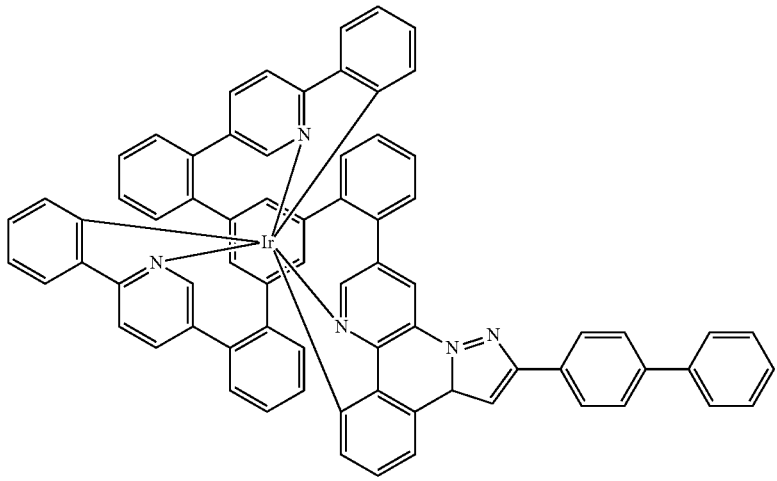
137
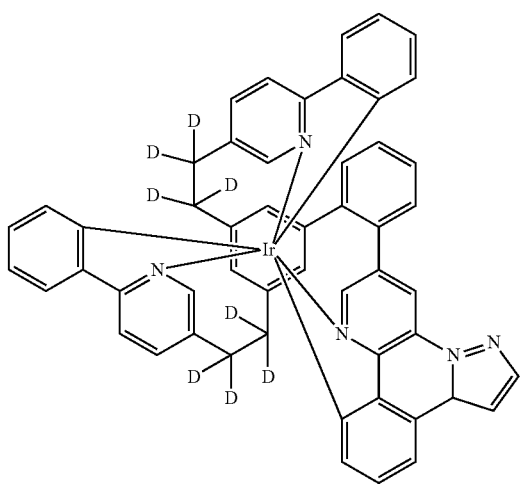
238
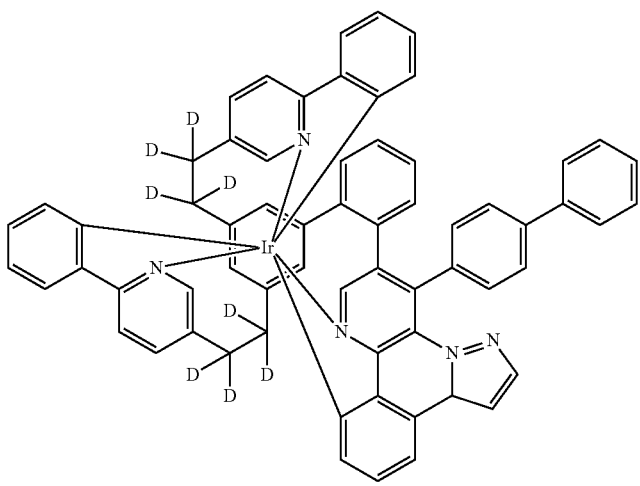
139

-continued
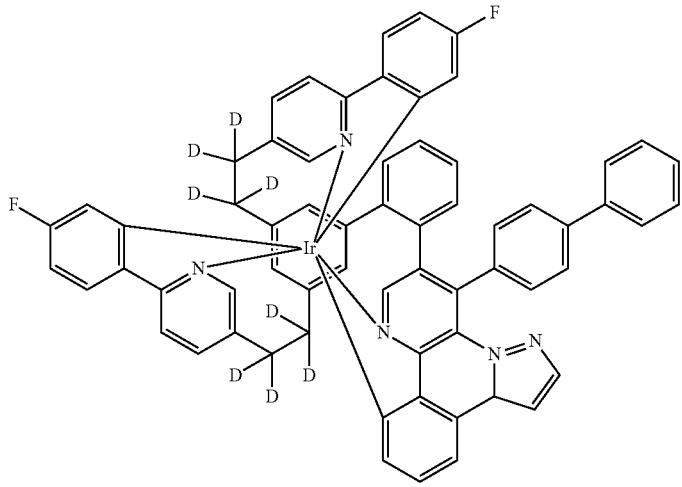
140
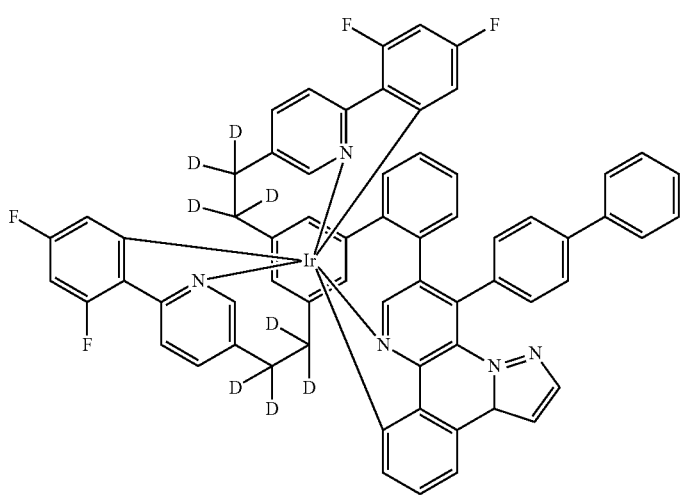
141
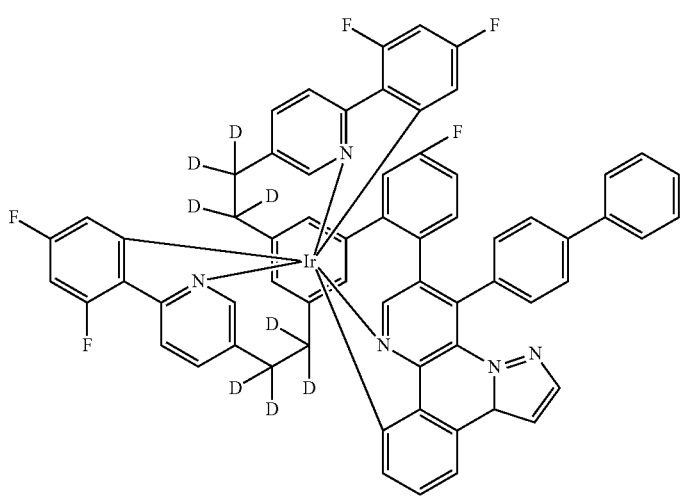
142

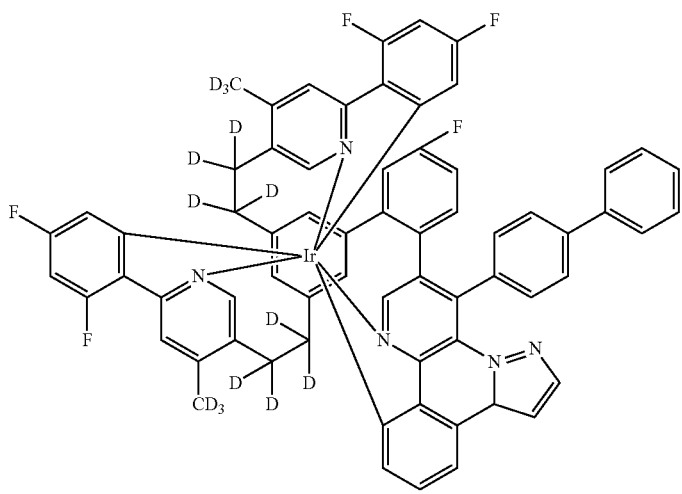
143
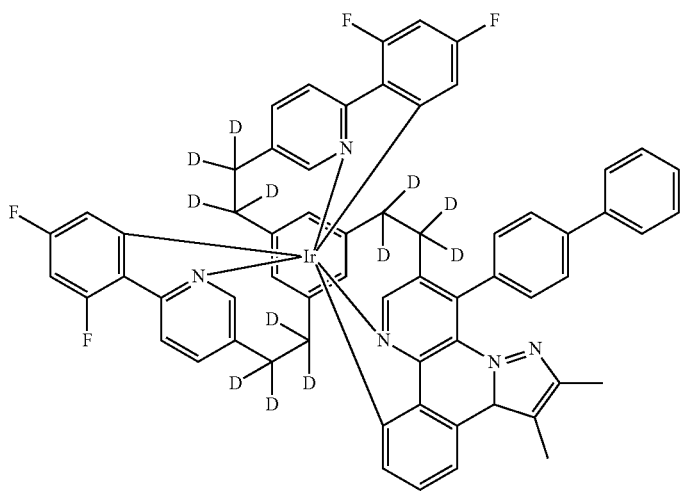
144
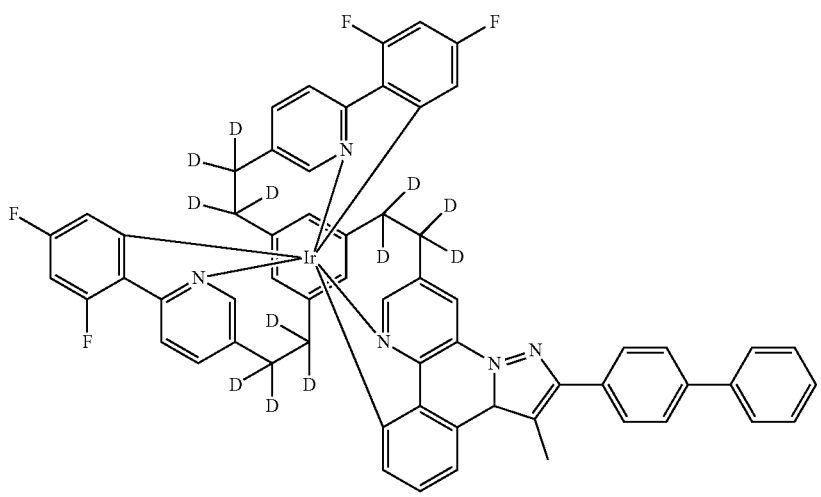
145

-continued
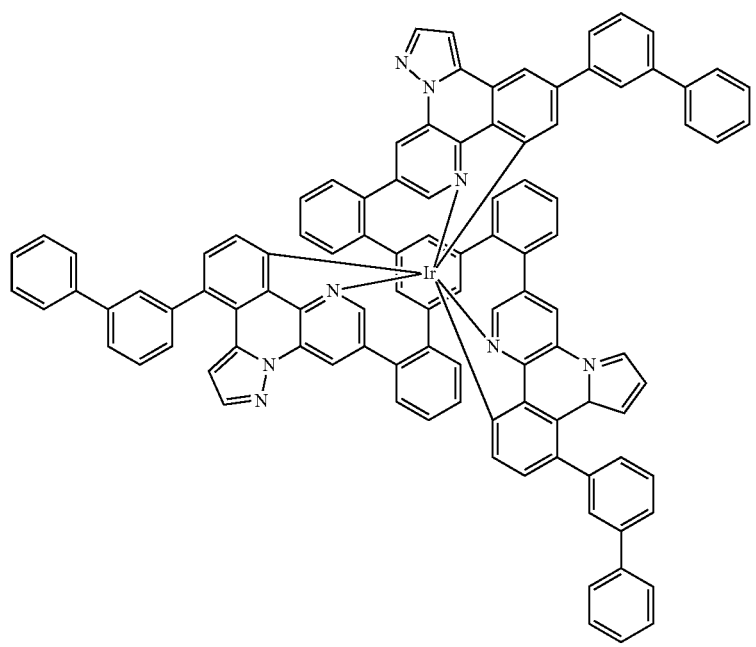
146
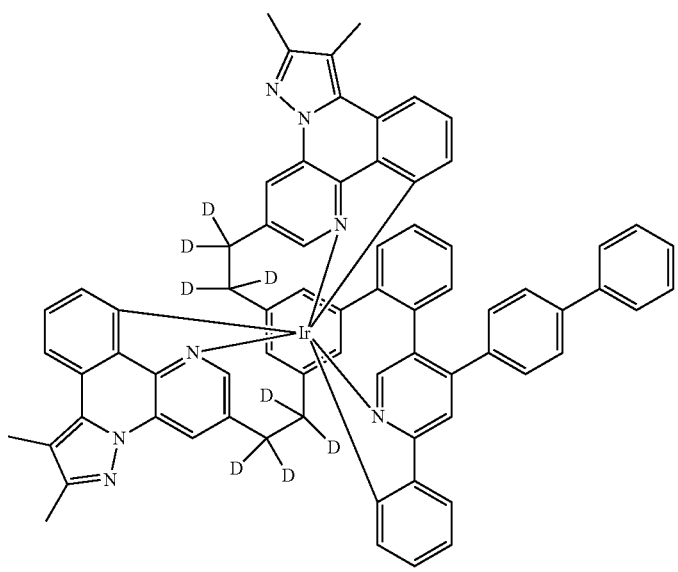
147

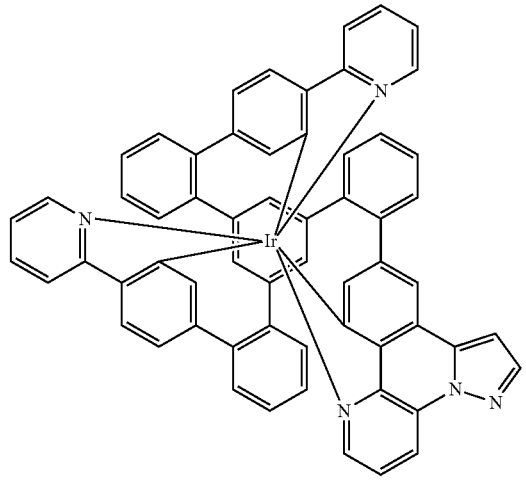
148
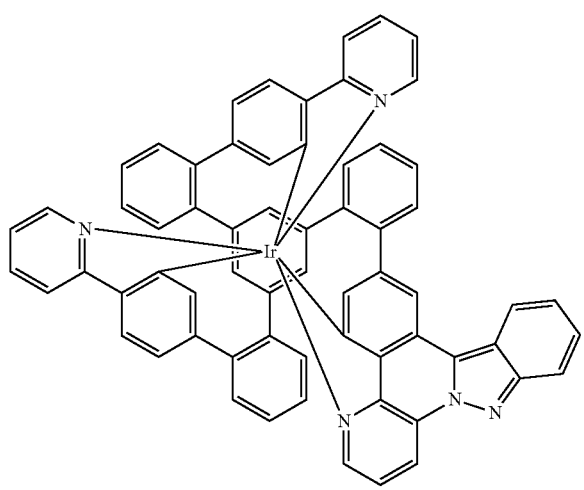
149
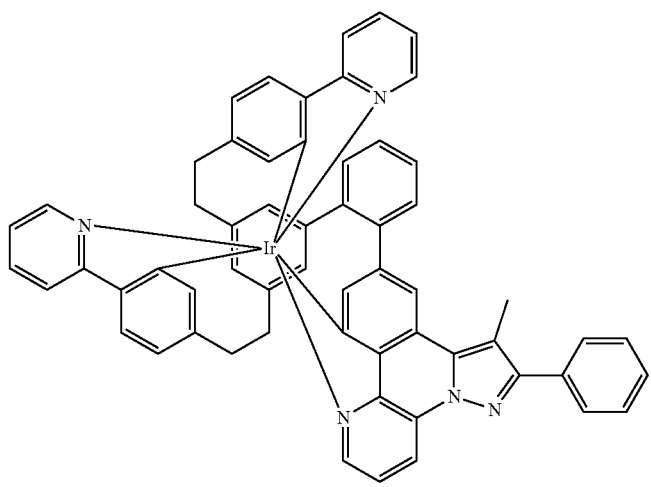
150

-continued
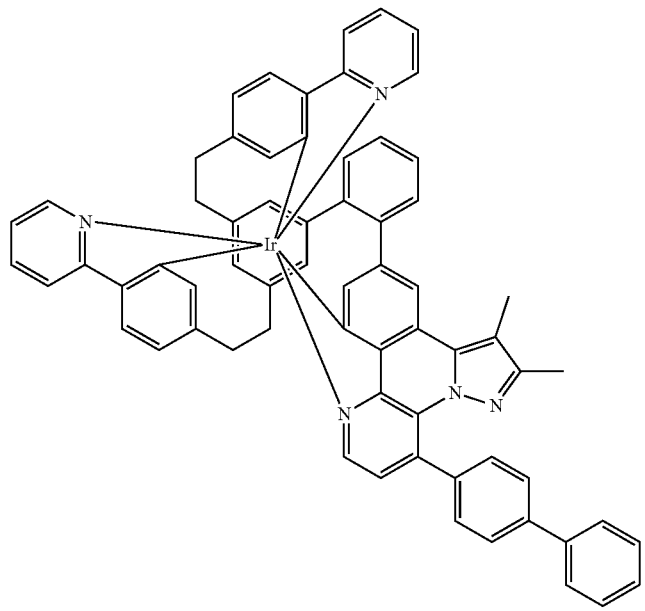
151
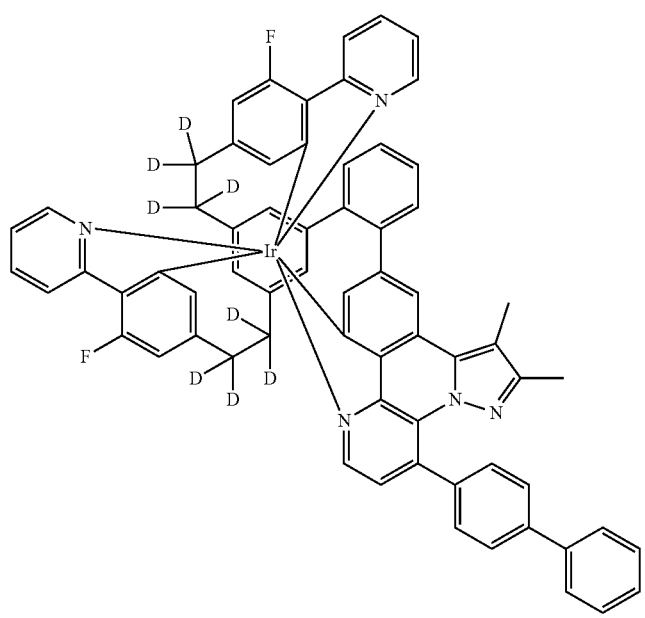
152

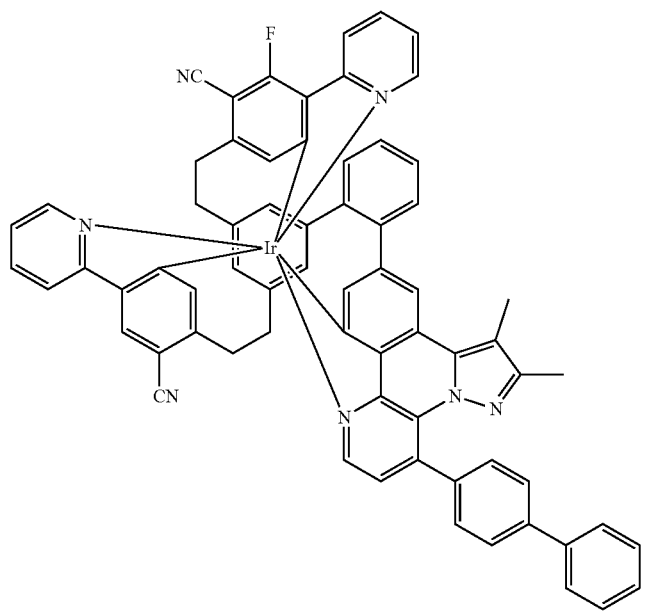
153
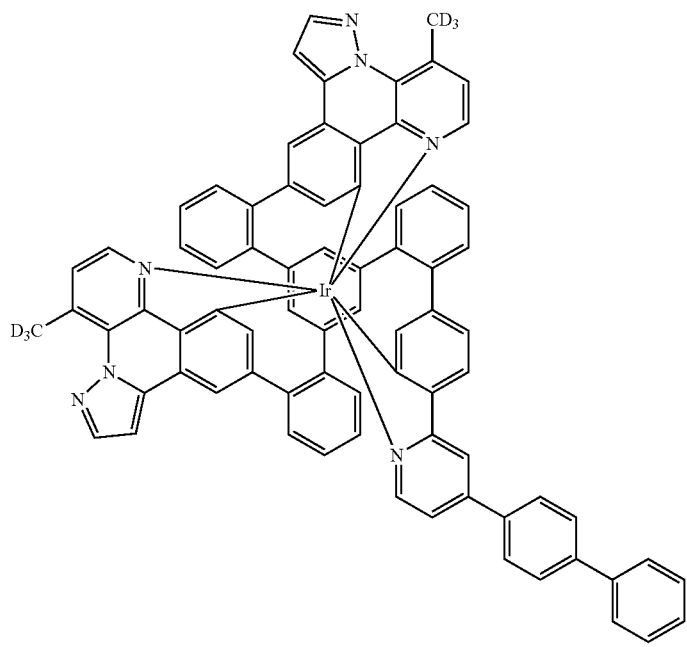
154

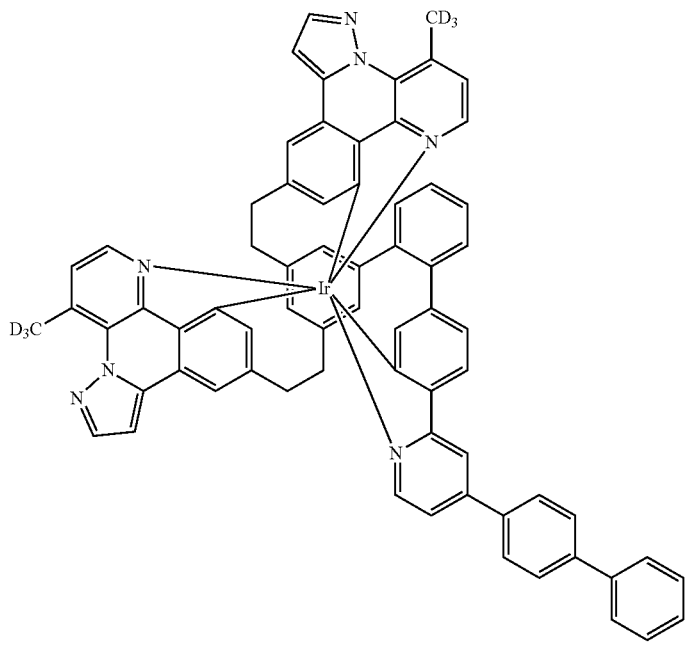
155
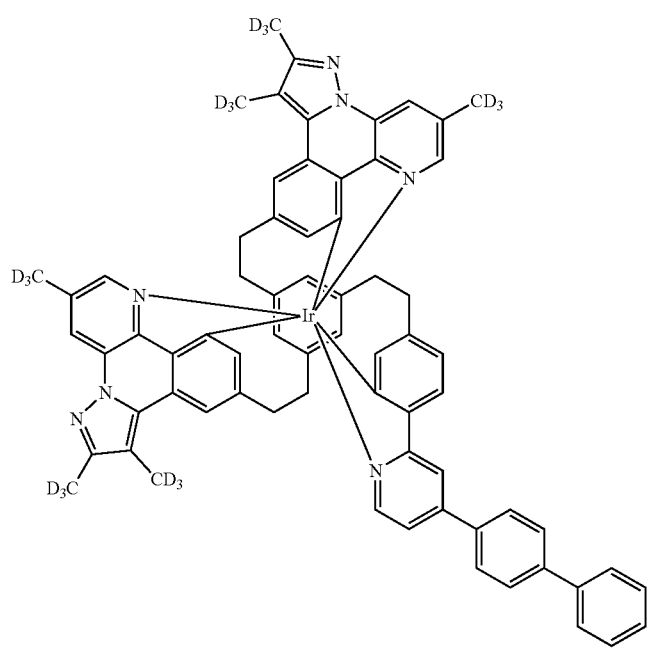
156

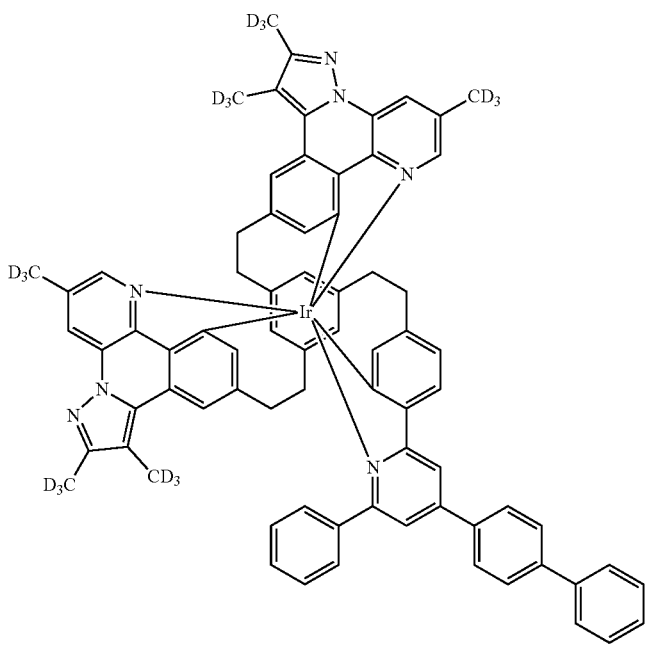
157
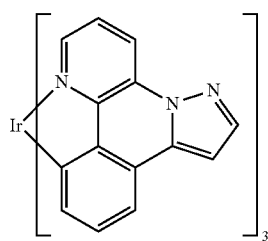
158
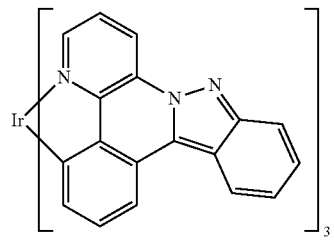
159
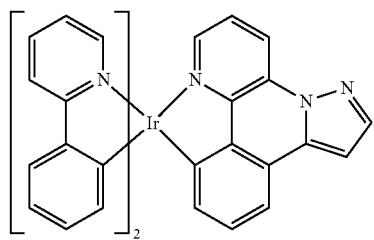
160

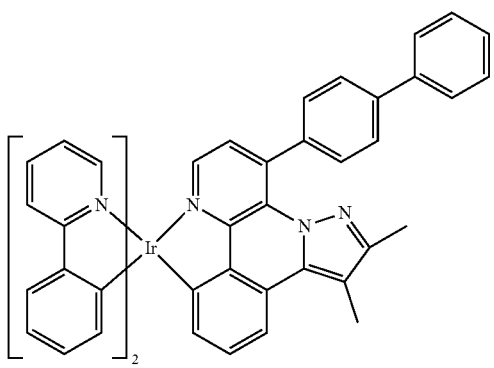
161
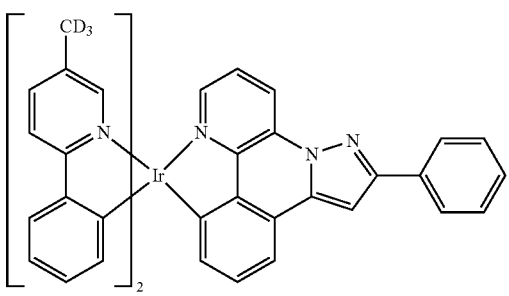
162
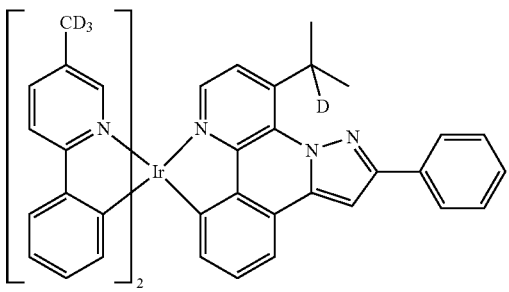
163
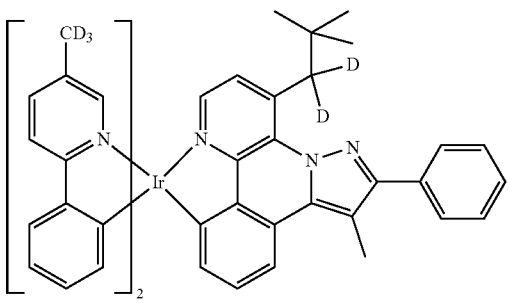
164
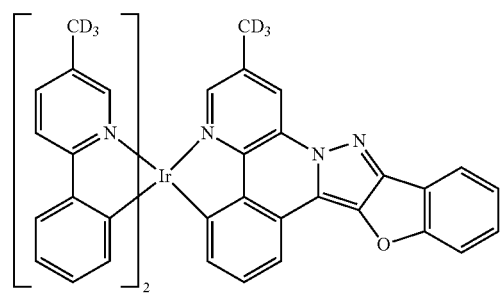
165

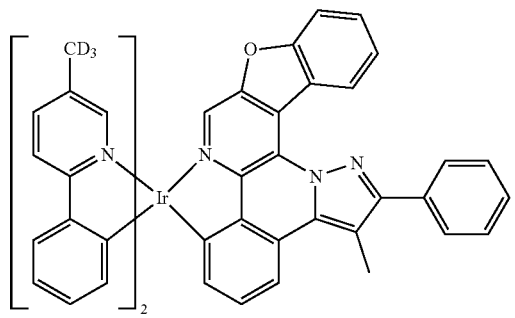
166
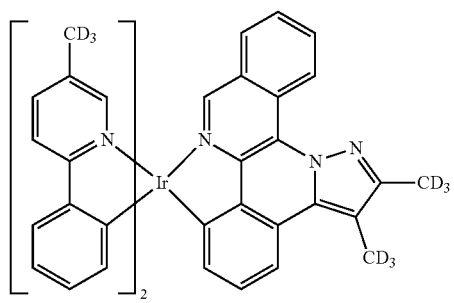
167
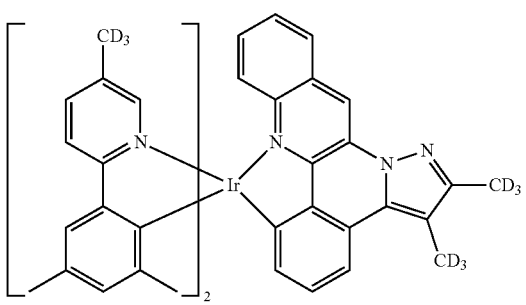
168
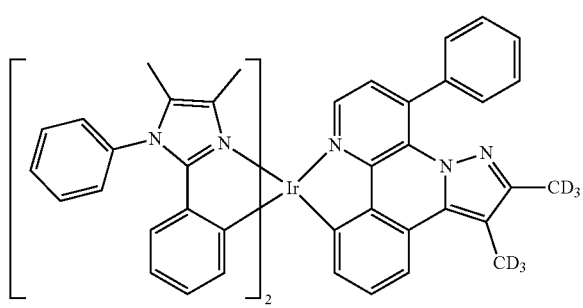
169

-continued
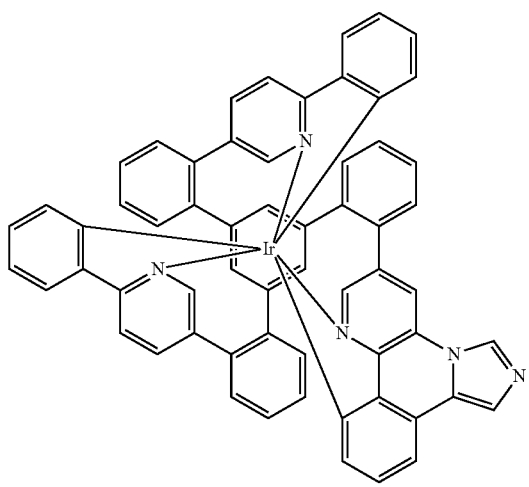
170
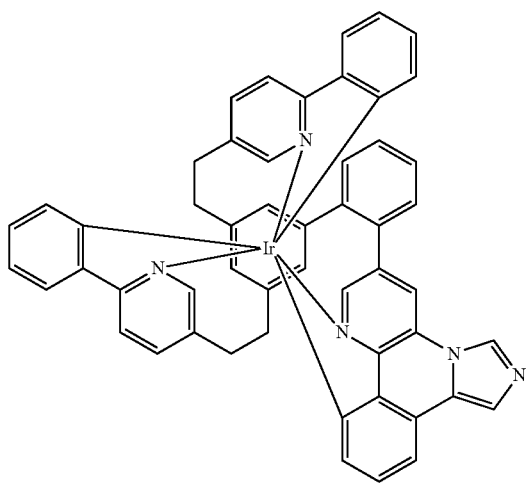
171
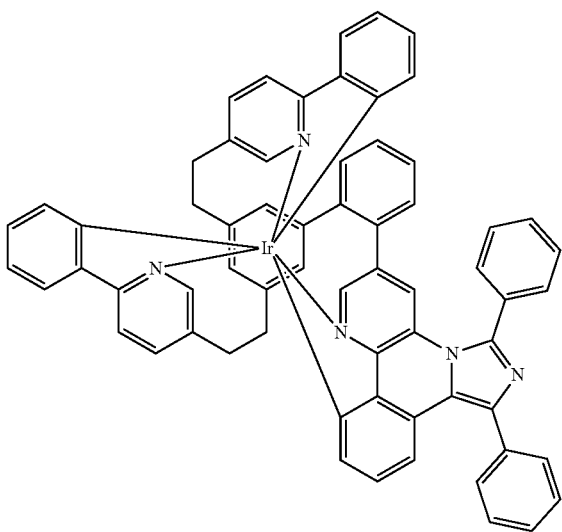
172

-continued
173
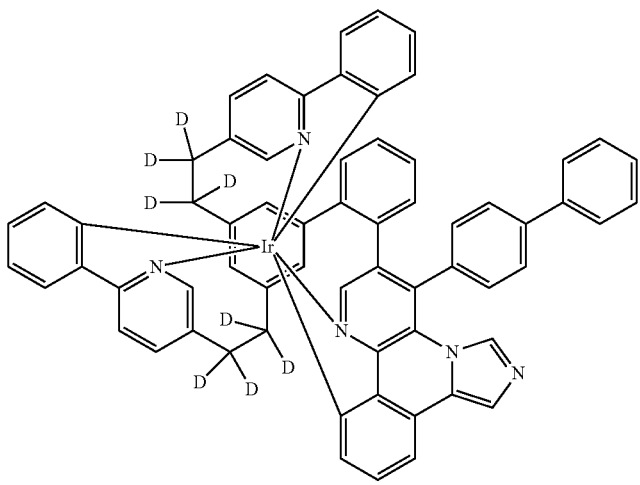
174
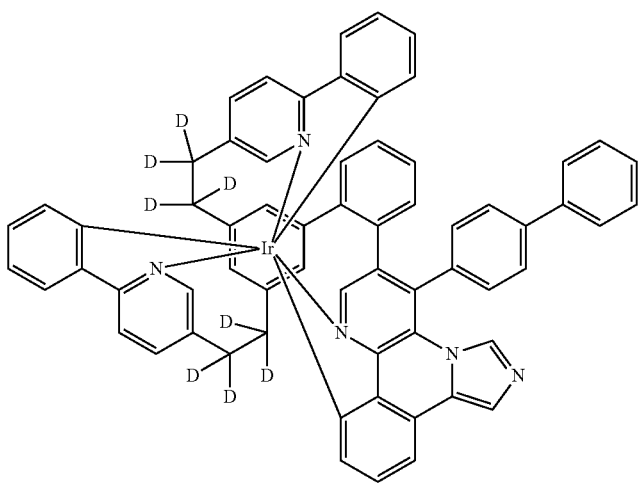
175
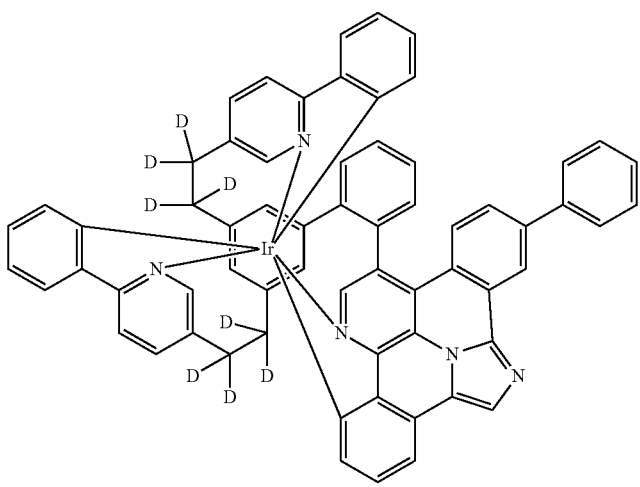

-continued
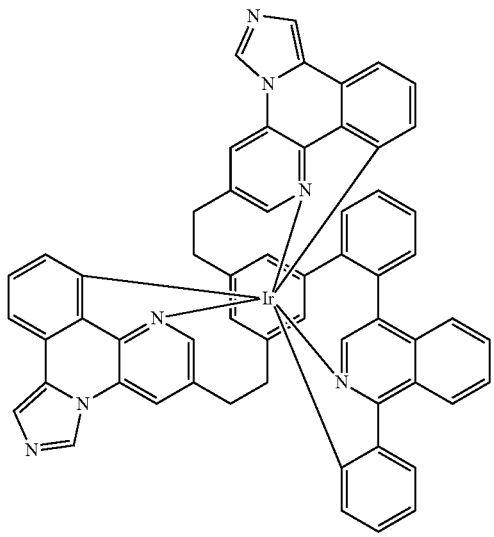
176
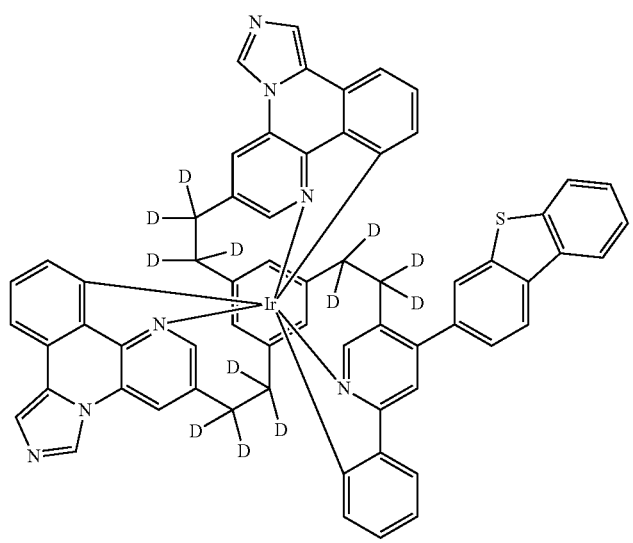
177
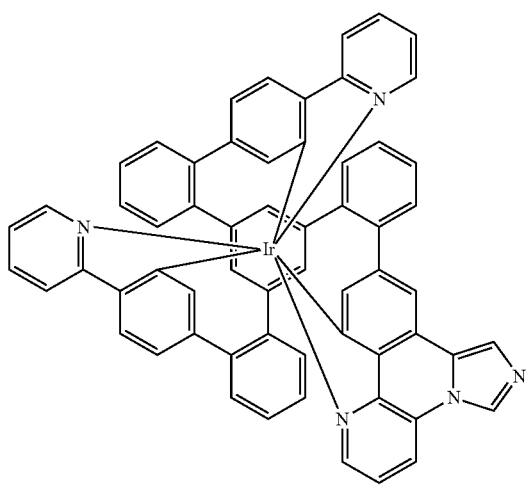
178

-continued
179
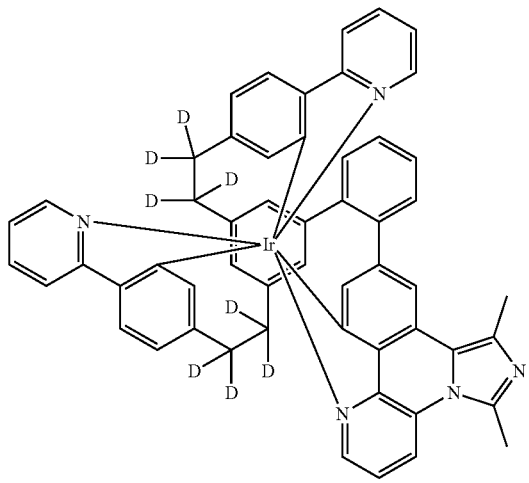
180
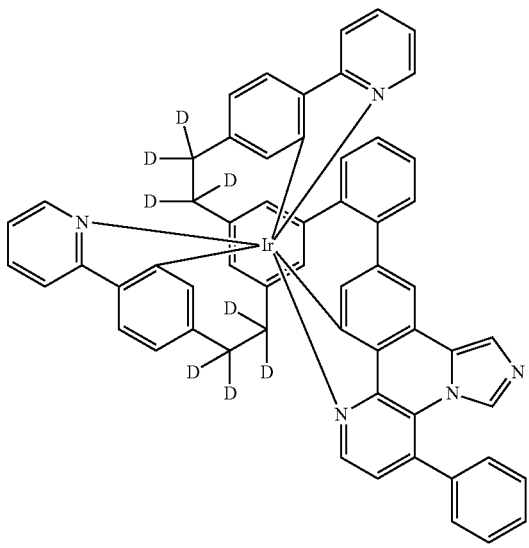
181
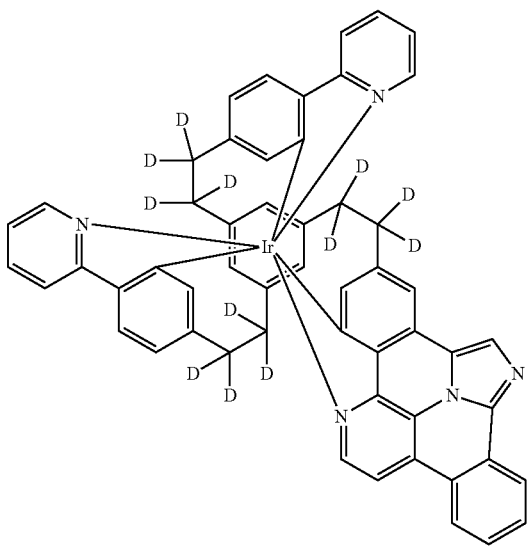

-continued
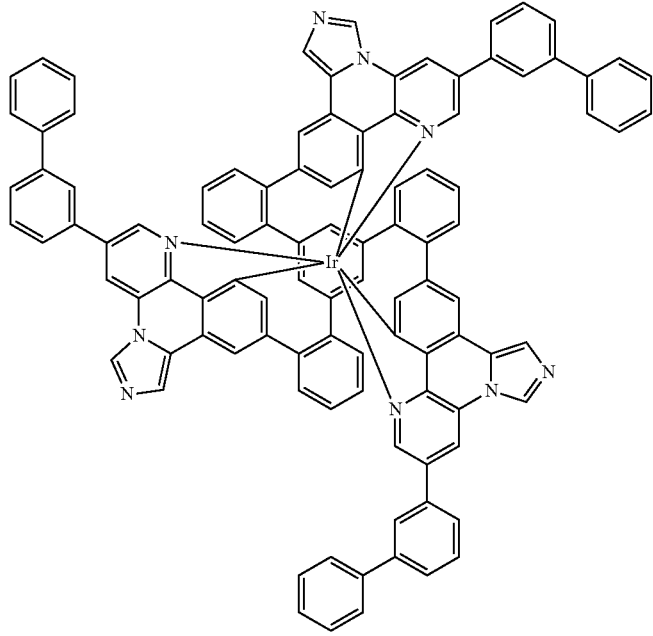
182
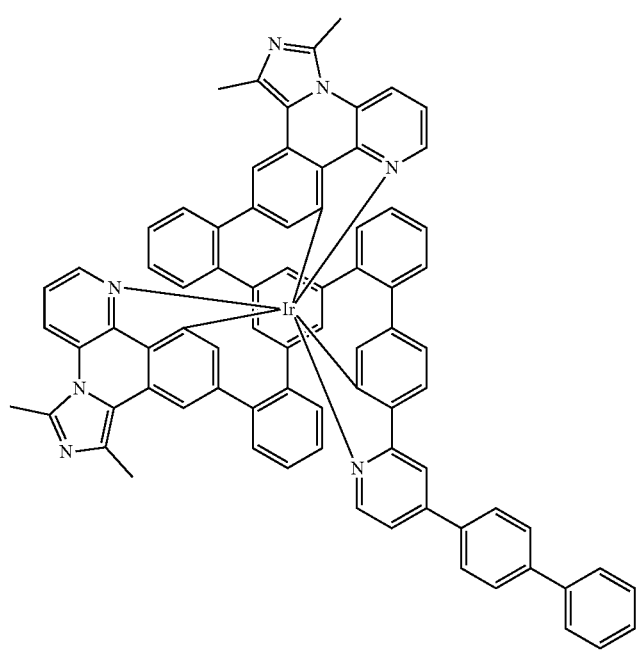
183

-continued
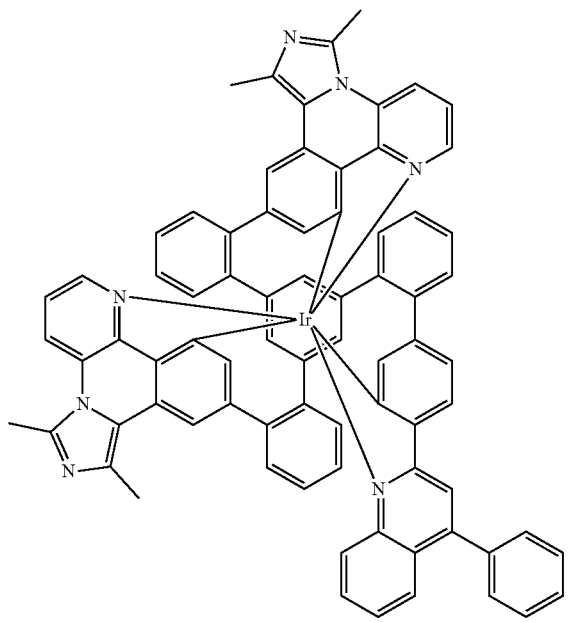
184
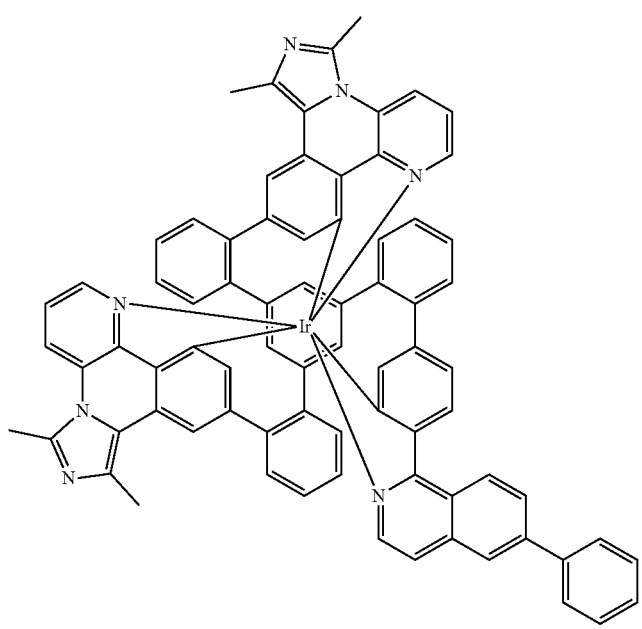
185
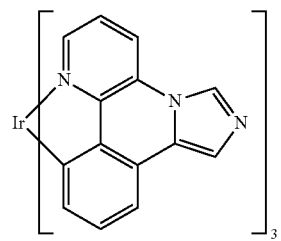
186

| | |
|---|---|
| 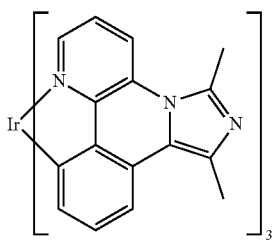 | 187 |
| 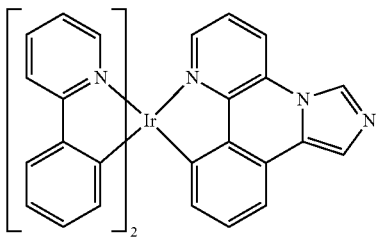 | 188 |
| 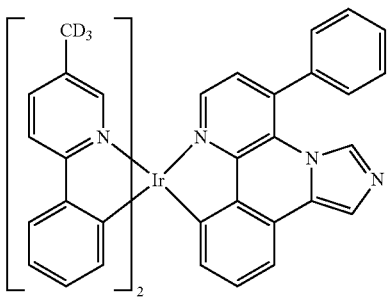 | 189 |
| 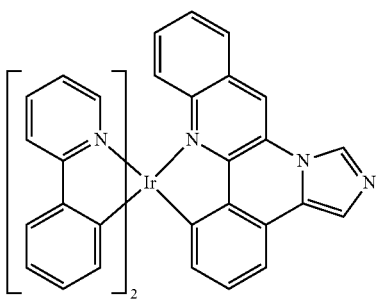 | 190 |
| 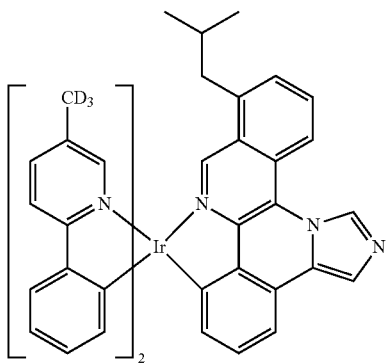 | 191 |

-continued
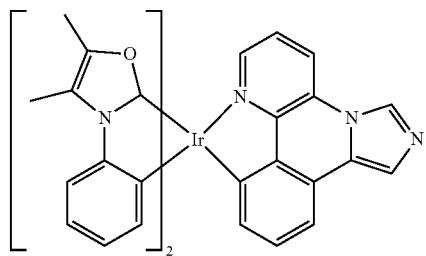
192
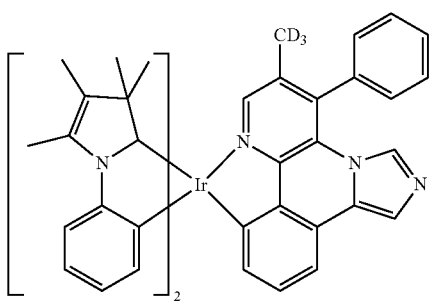
193
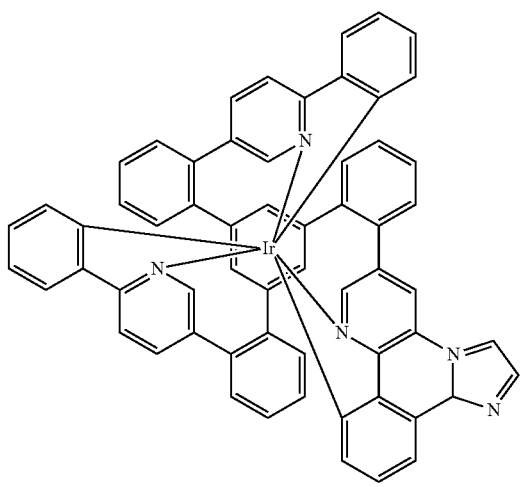
194
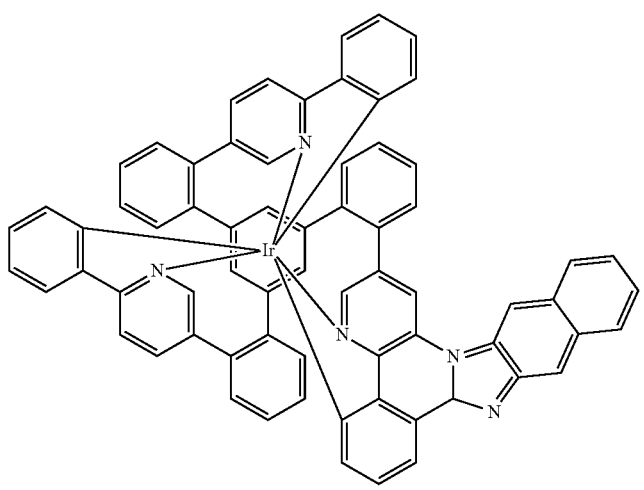
194

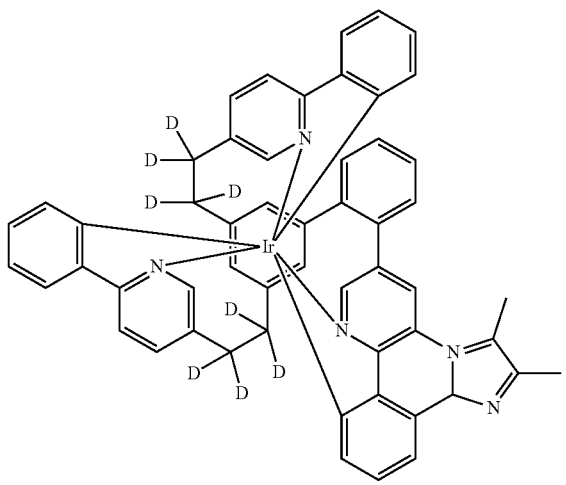
196
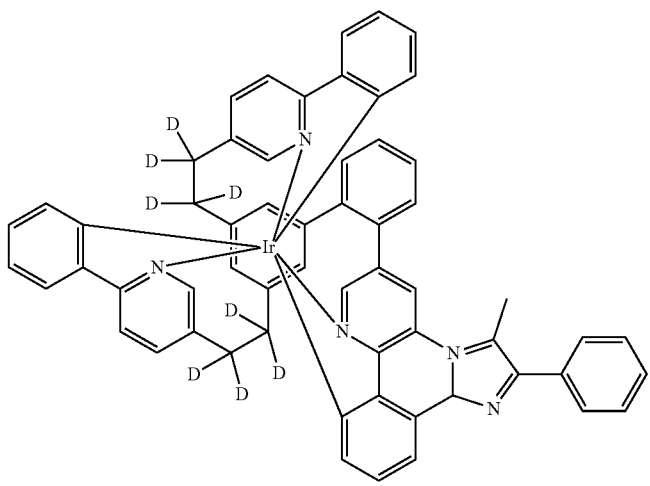
197
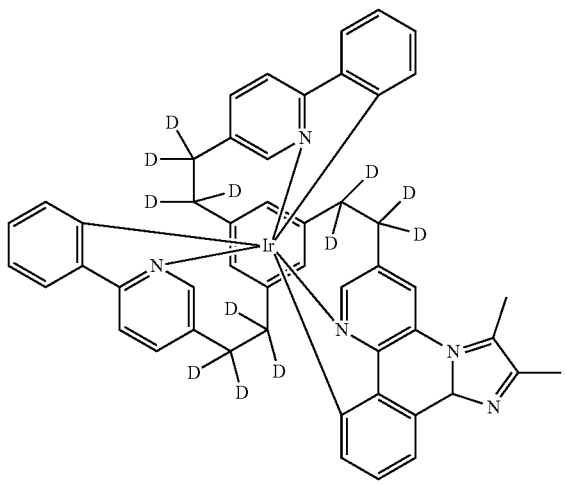
198

-continued
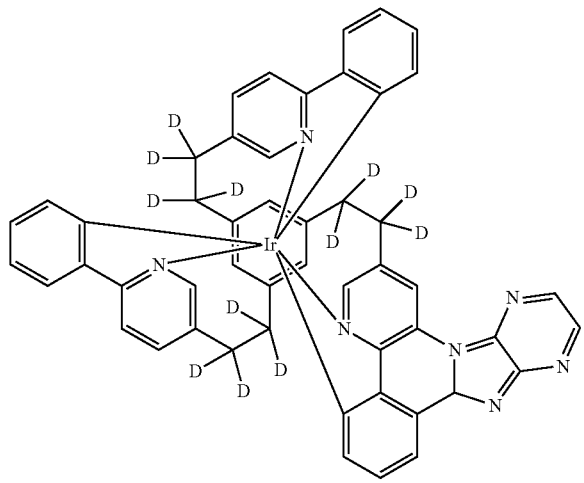
199
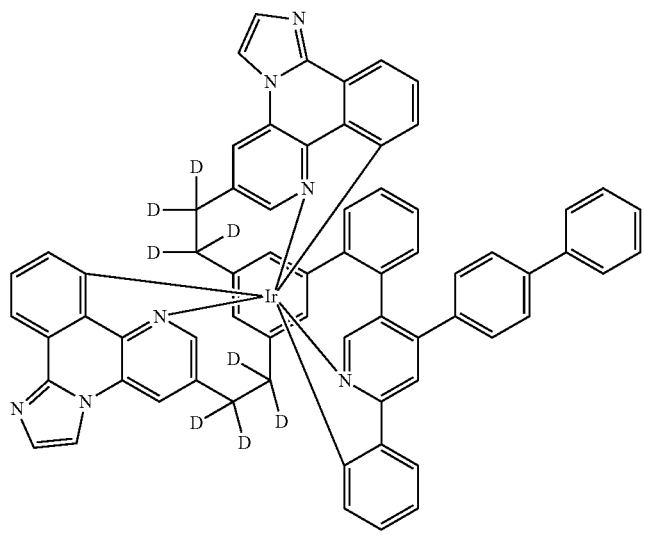
200
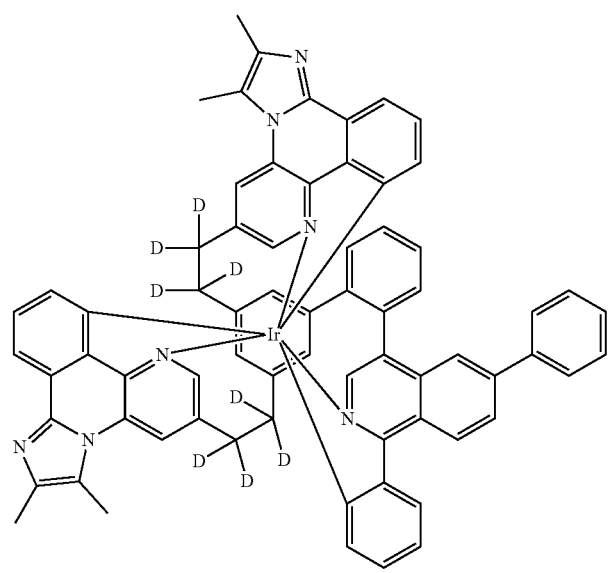
201

-continued
202
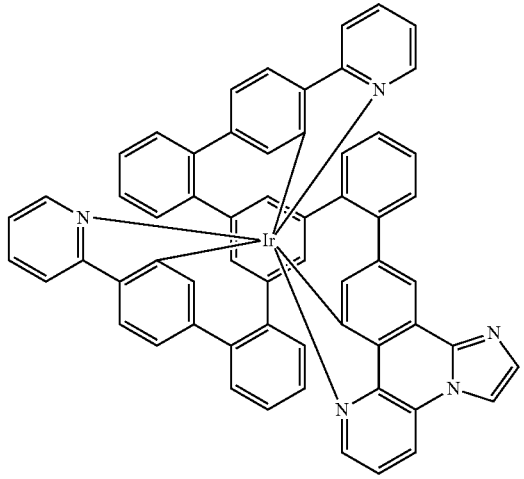
203
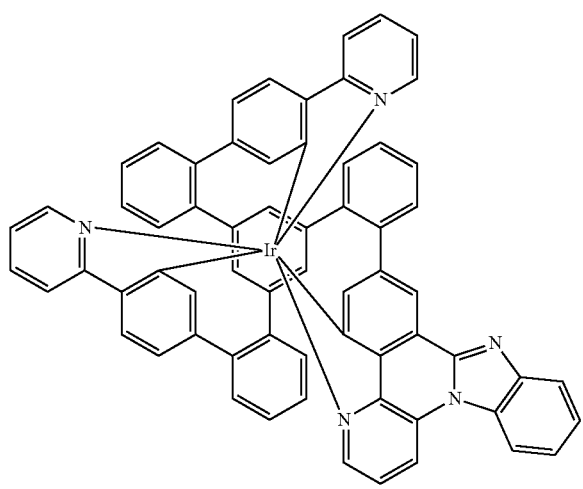
204
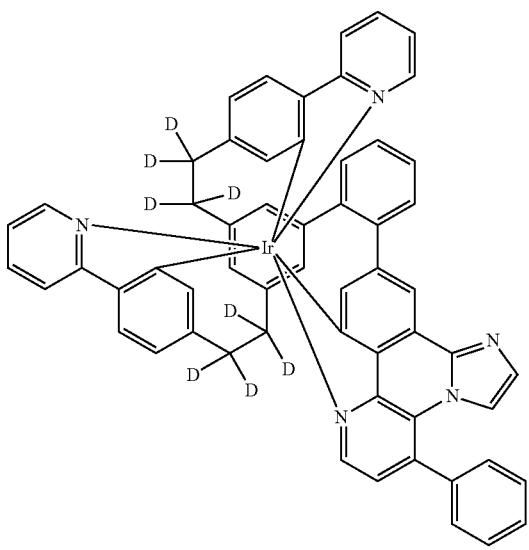

-continued
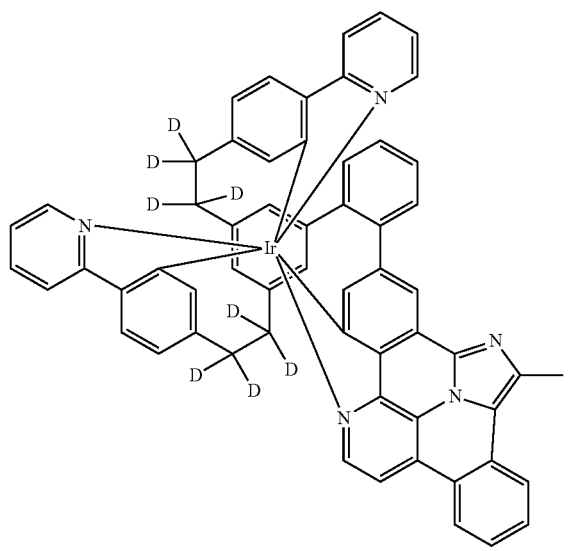
205
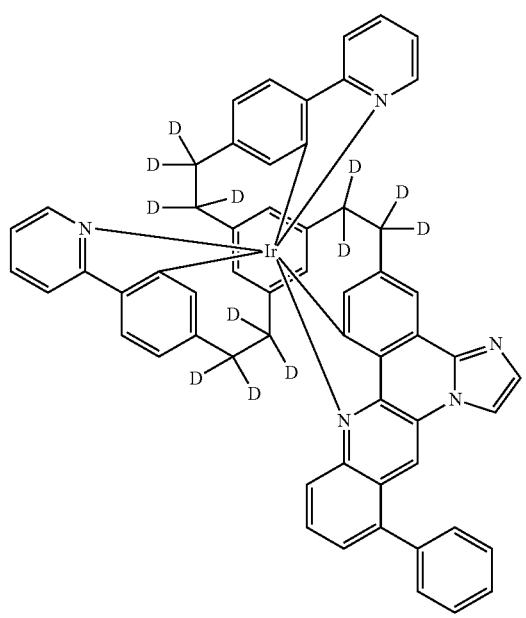
206

-continued
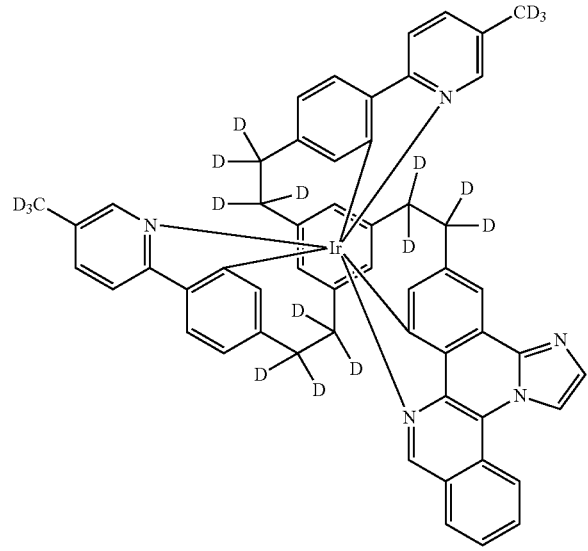
207
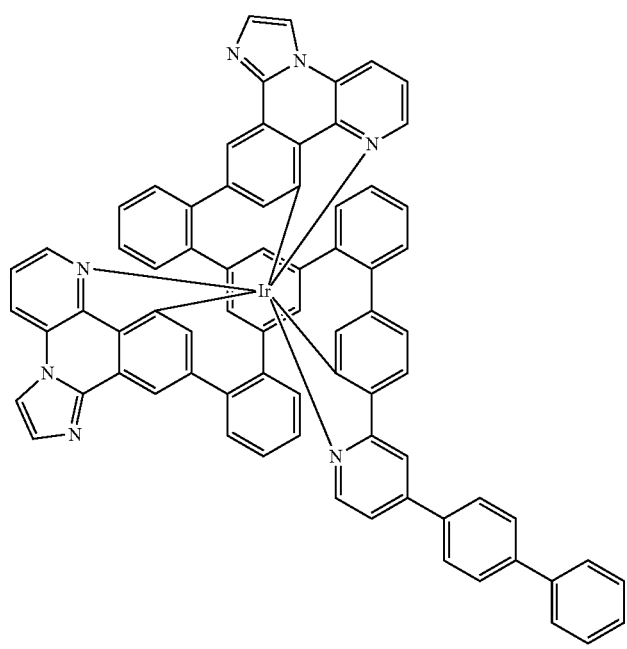
208

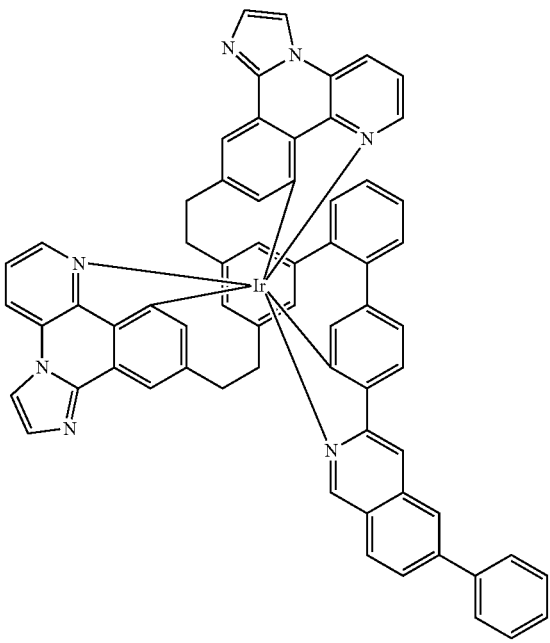
209
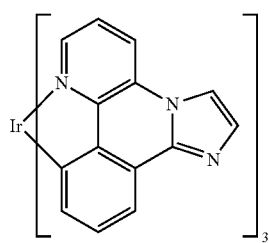
210
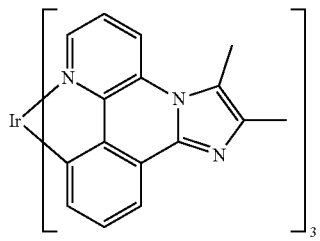
211
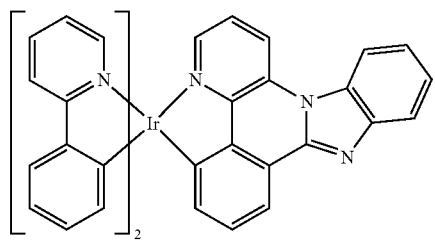
212

213
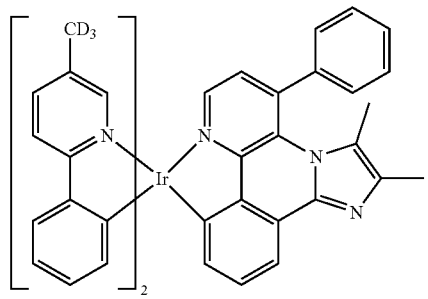
214
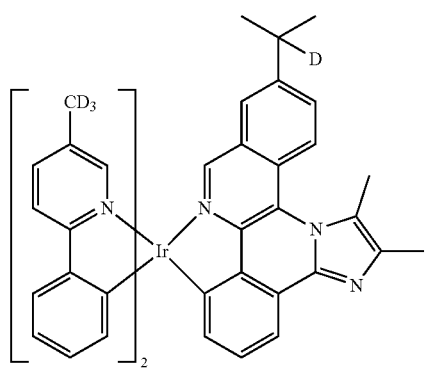
215
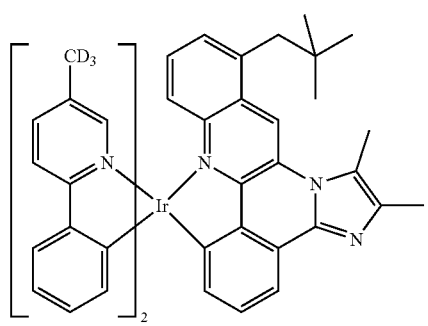
216
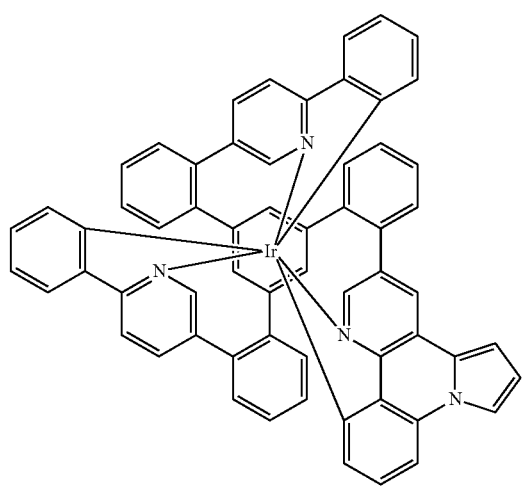

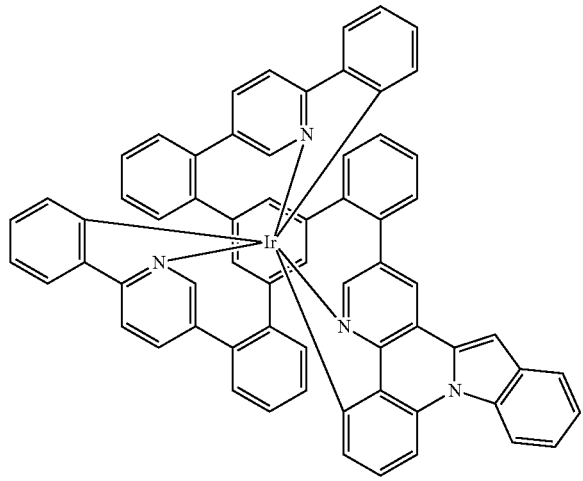
217
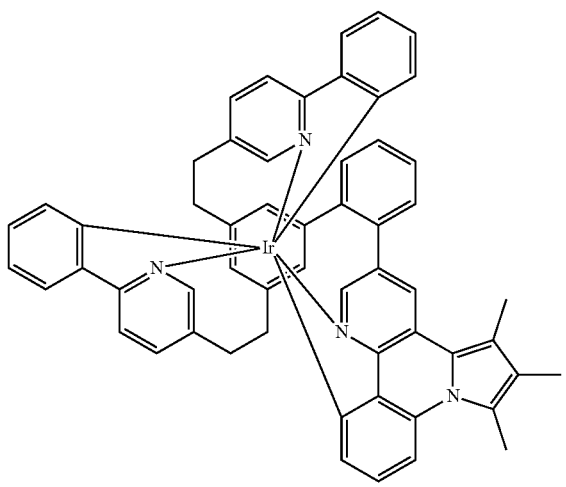
218
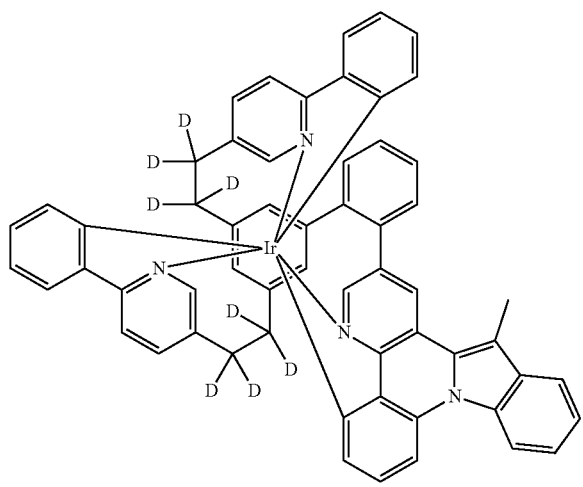
219

-continued
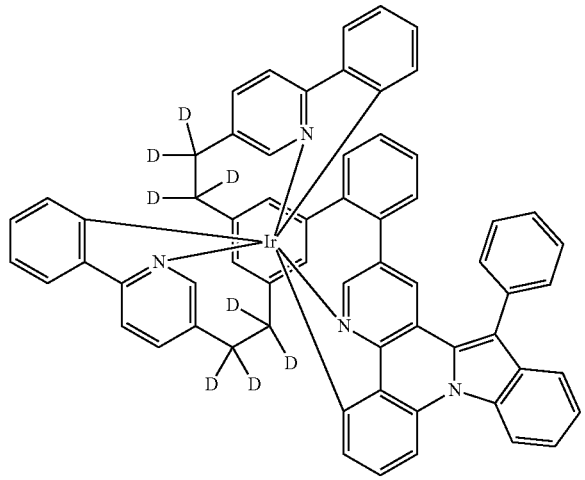
220
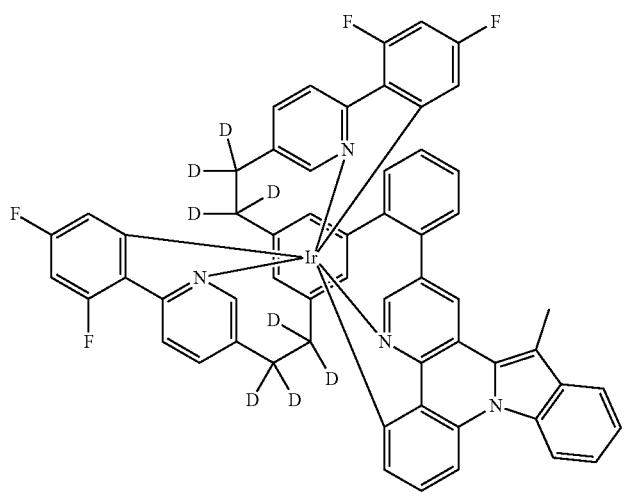
221
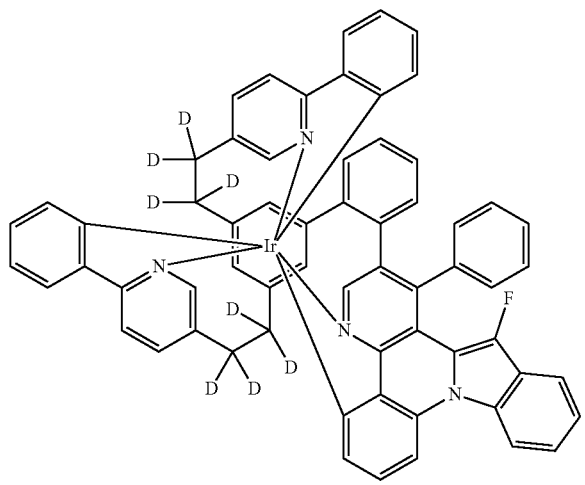
222

-continued
223
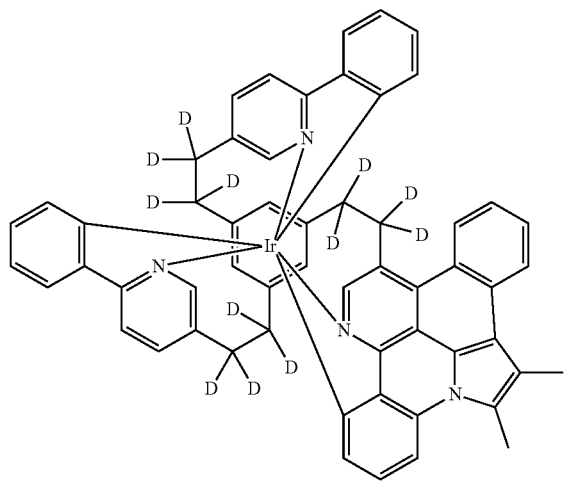
224
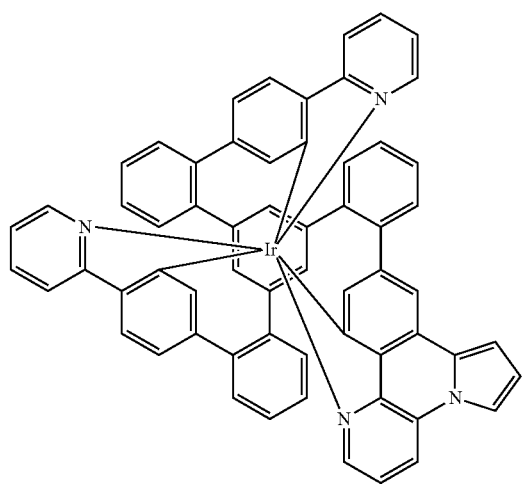
225
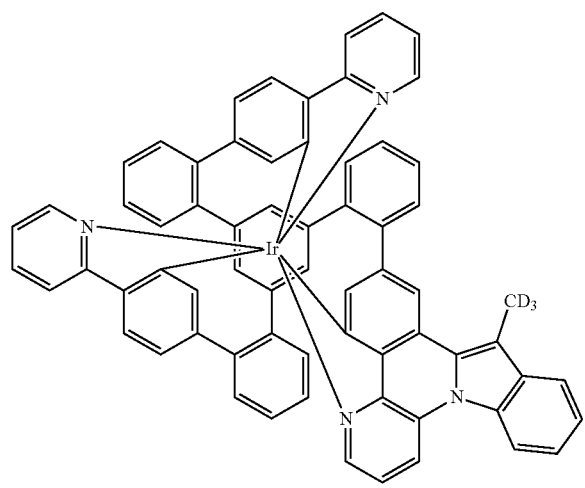

-continued
226
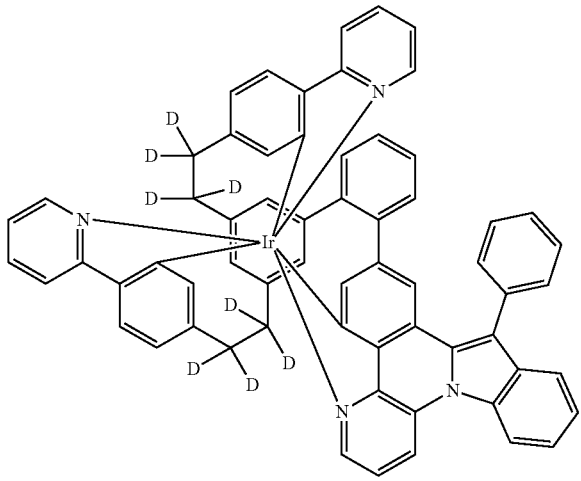
227
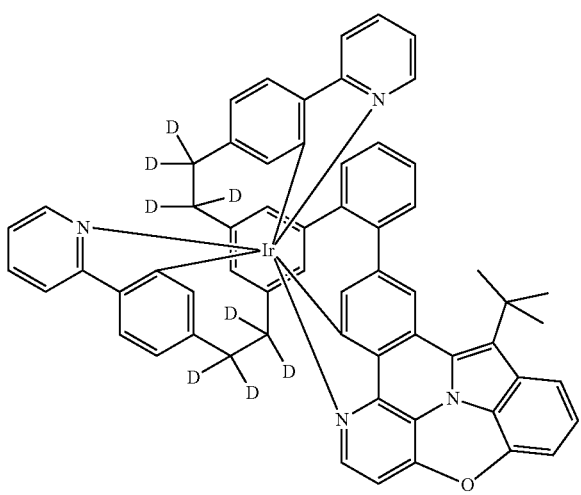
228
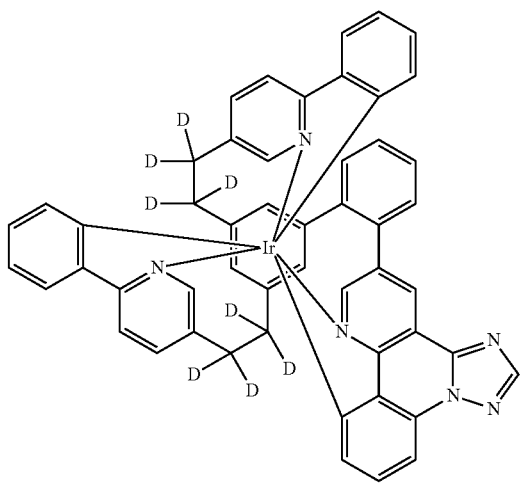

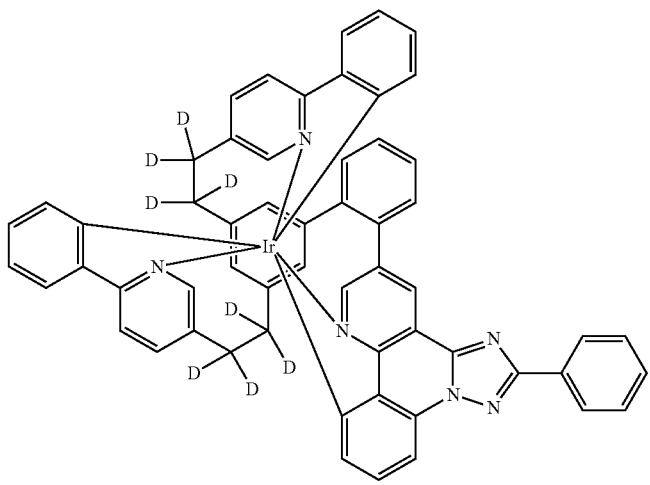
229
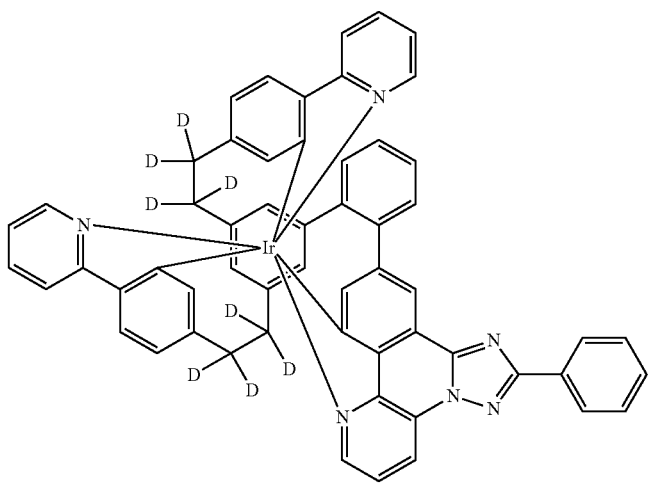
230
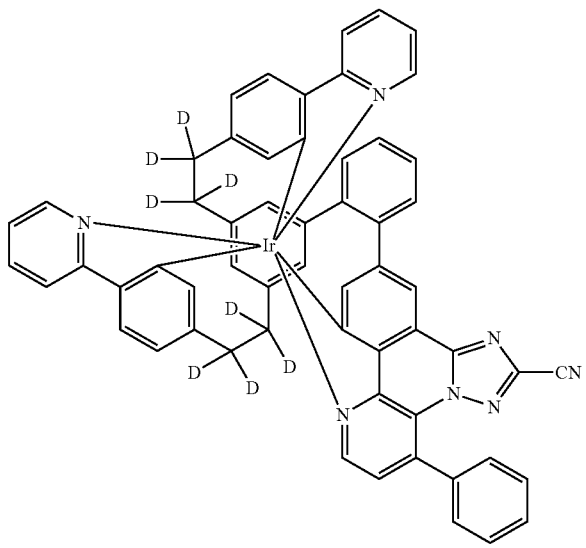
231

-continued
232
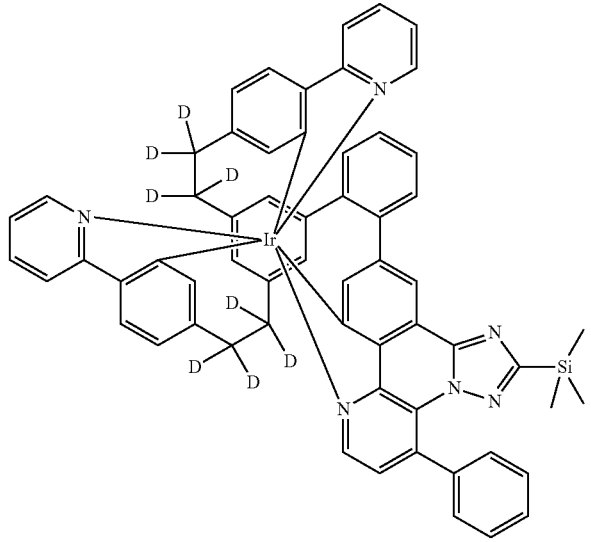
233
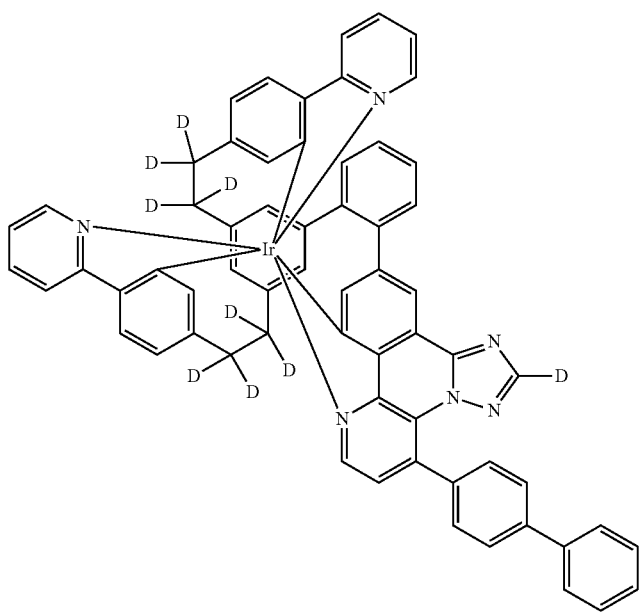
234
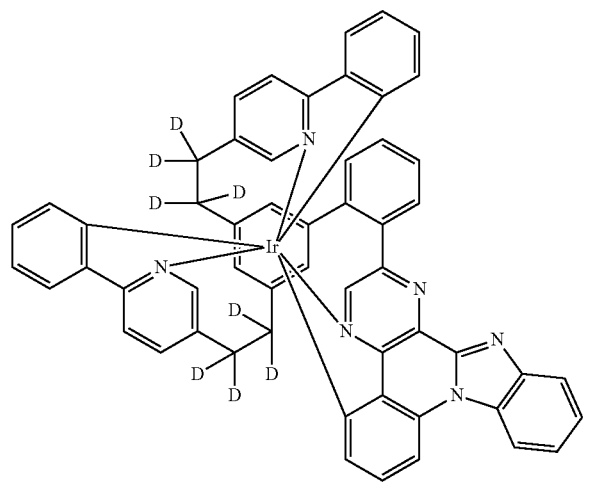

-continued
235
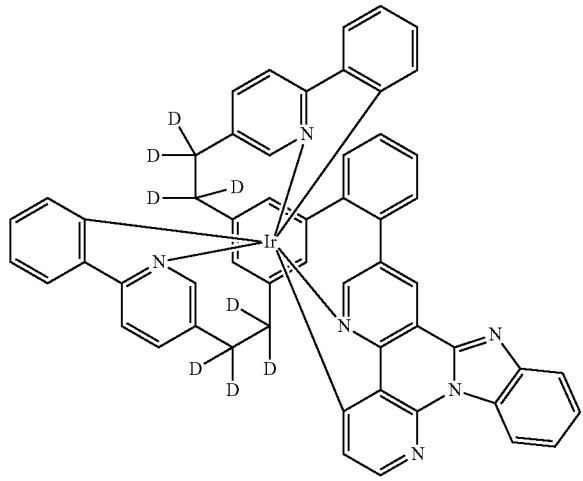
236
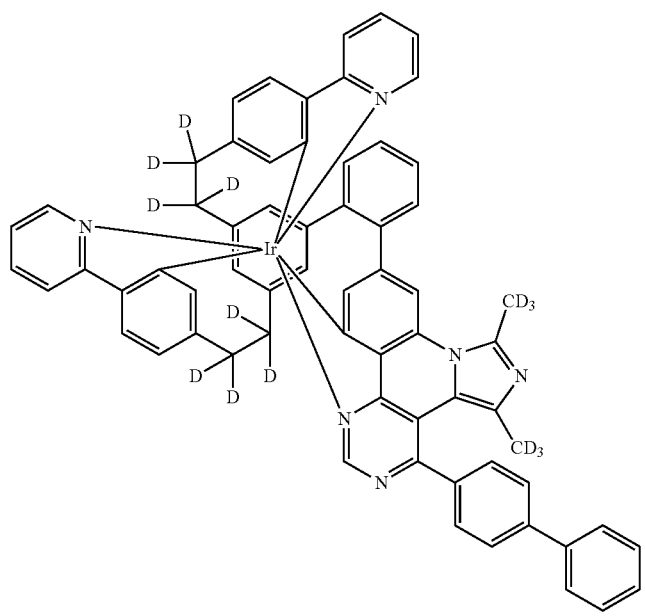

-continued
237
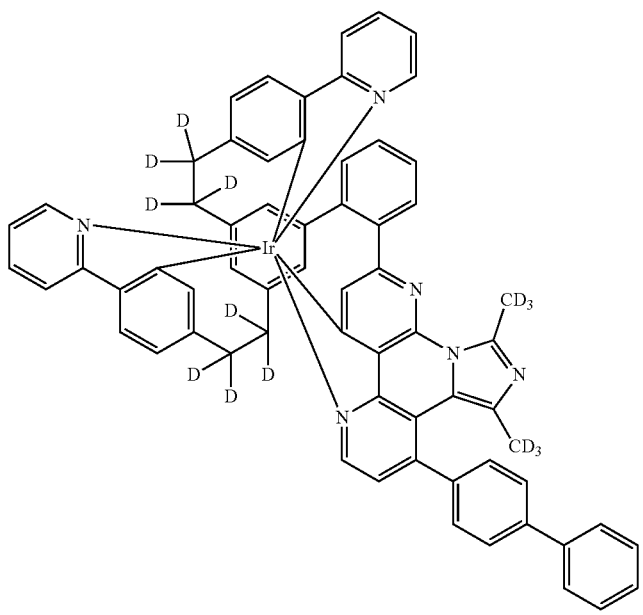
238
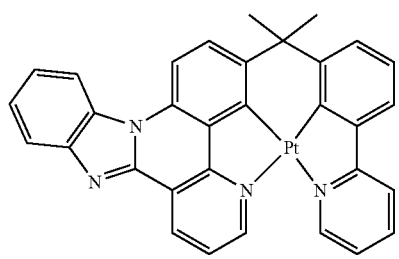
239
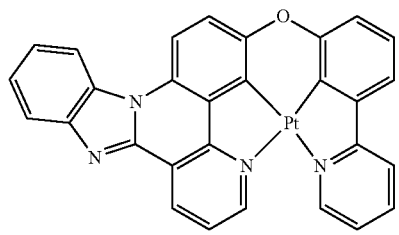
240
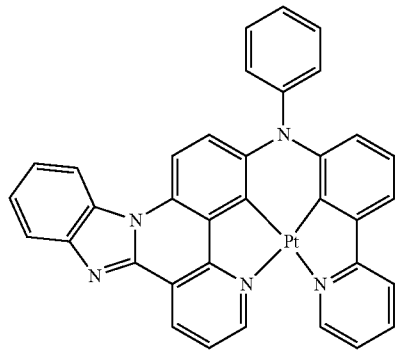

241
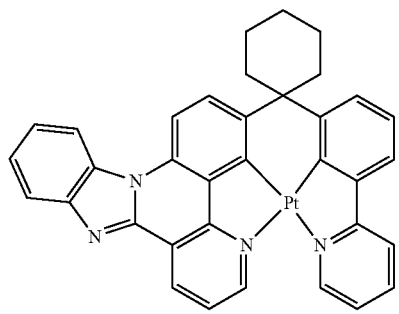
242
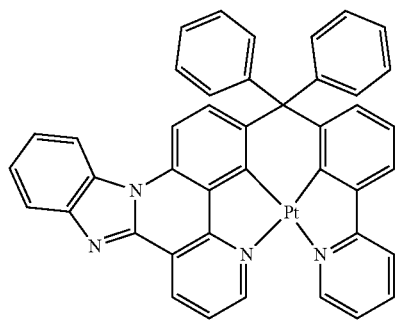
243
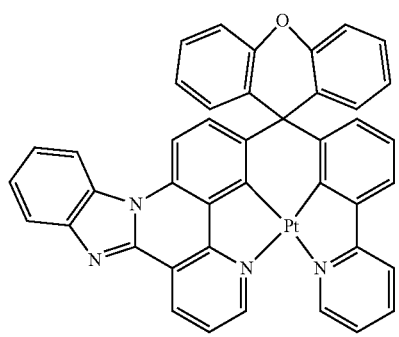
244
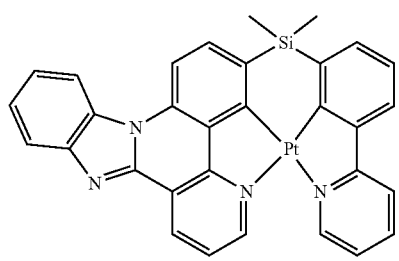
245
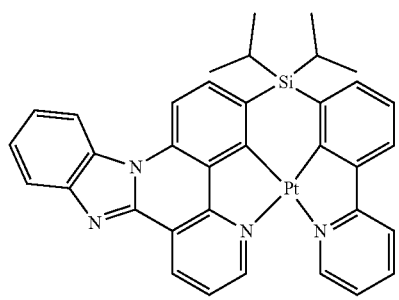

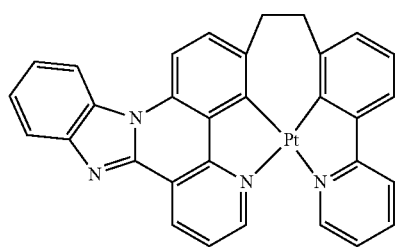
246
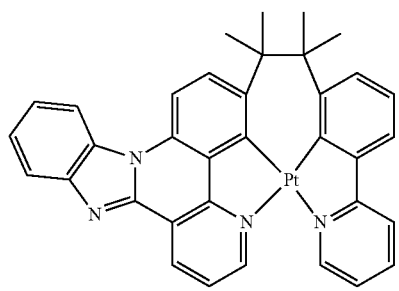
247
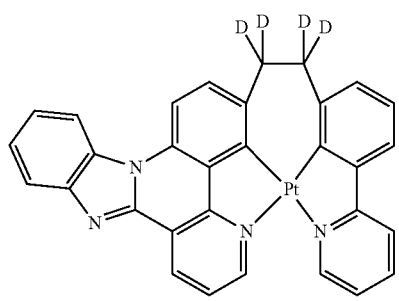
248
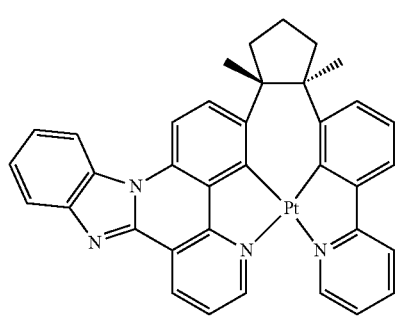
249
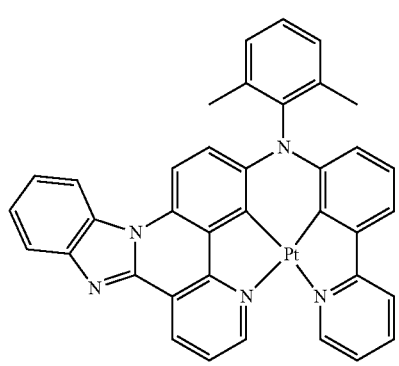
250

-continued
251
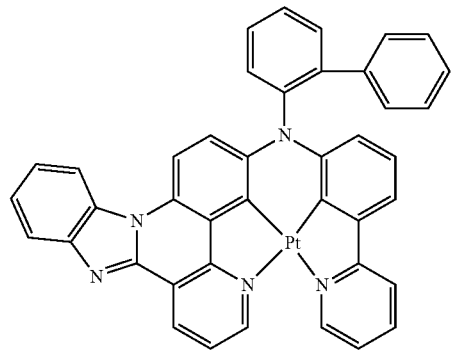
252
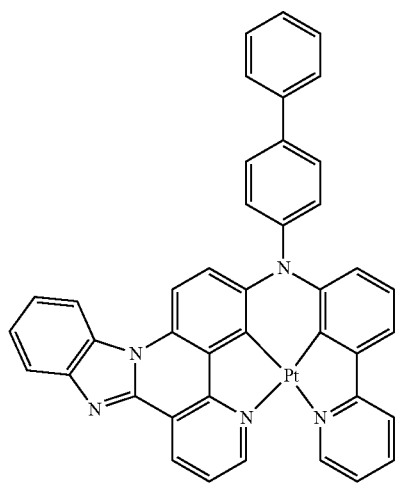
253
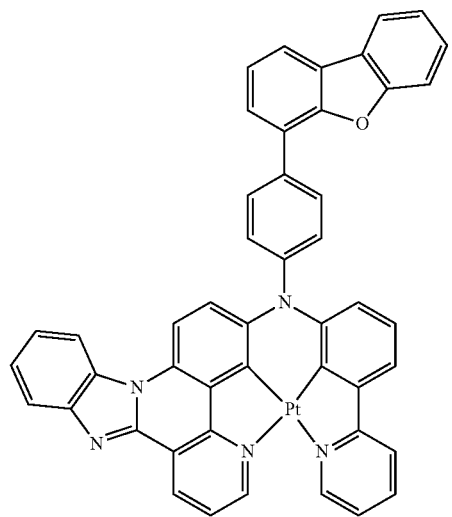

-continued
254
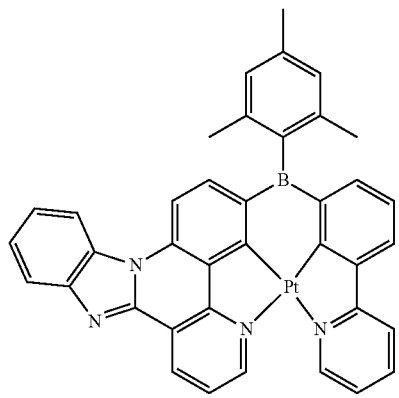
255
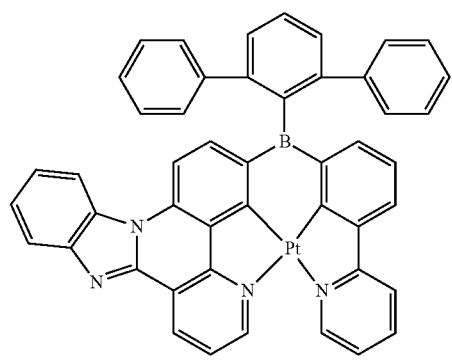
256
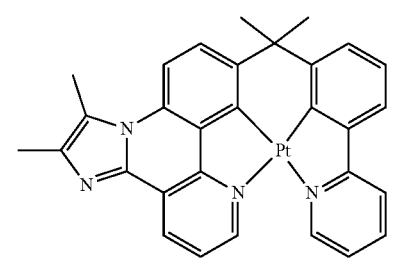
257
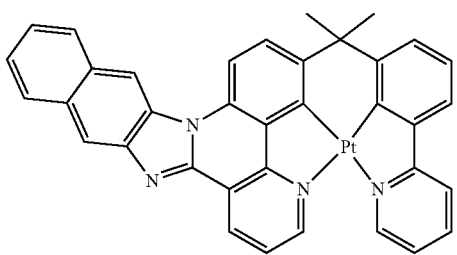
258
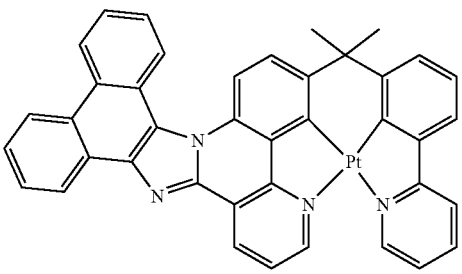

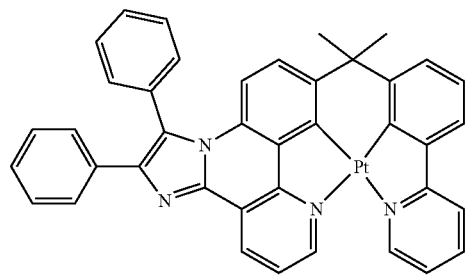
259
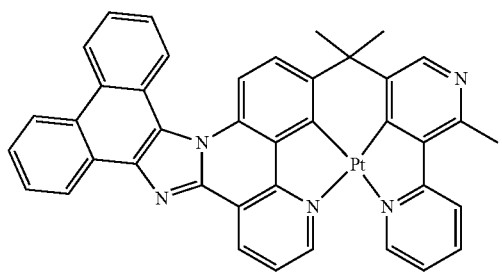
260
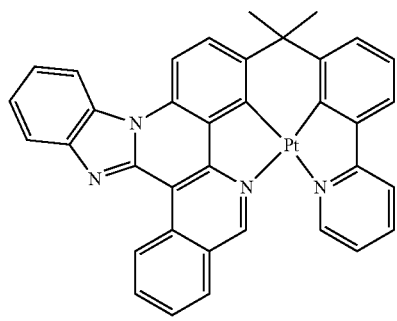
261
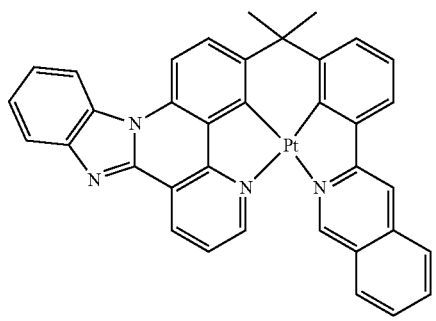
262
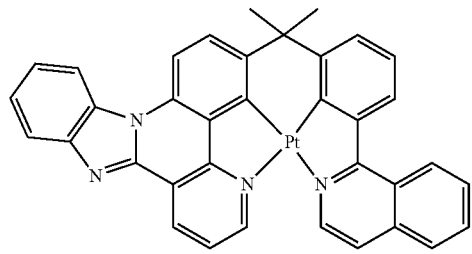
263

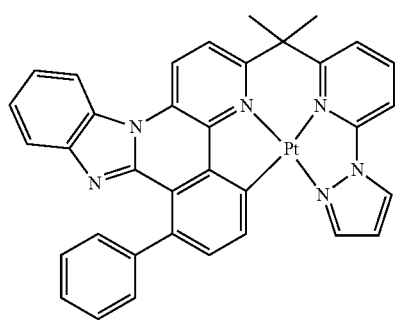
264
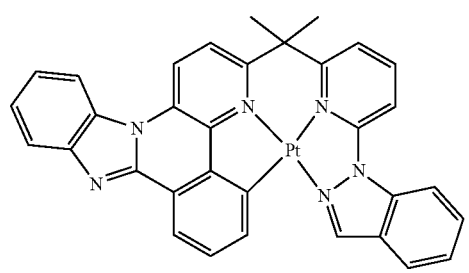
265
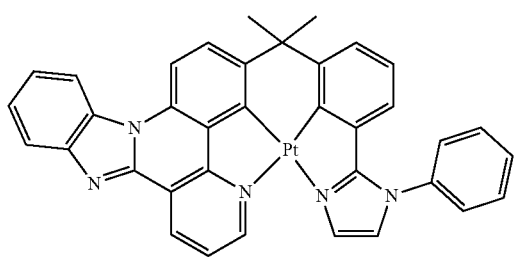
266
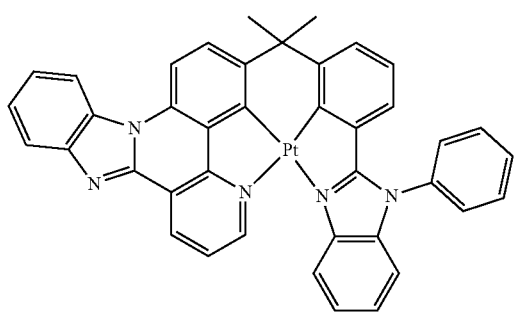
267
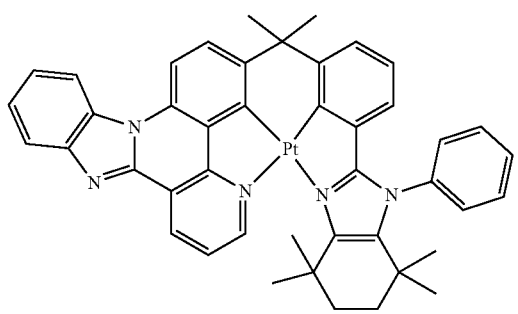
268

-continued
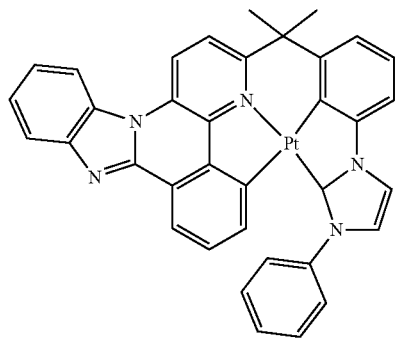
269
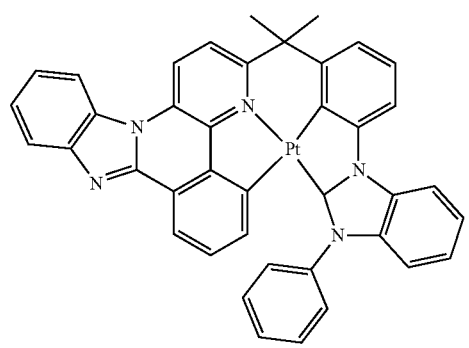
270
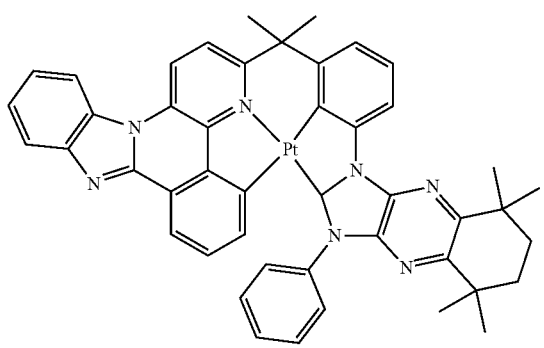
271
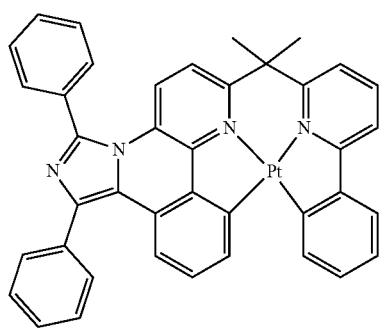
272

273
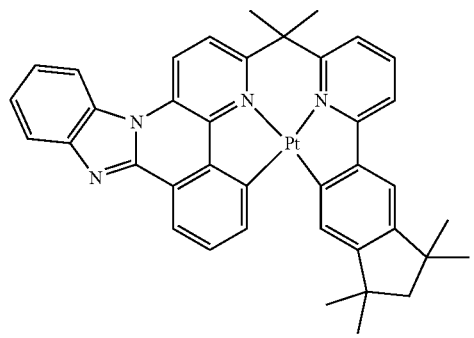
274
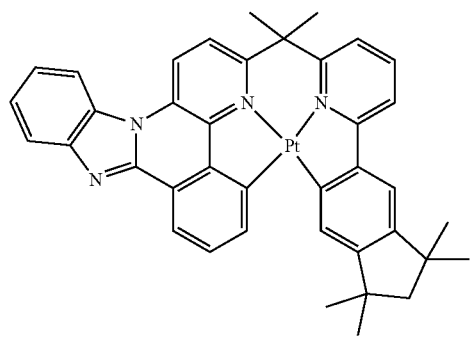
275
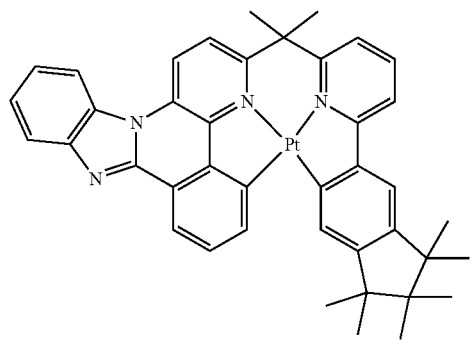
276
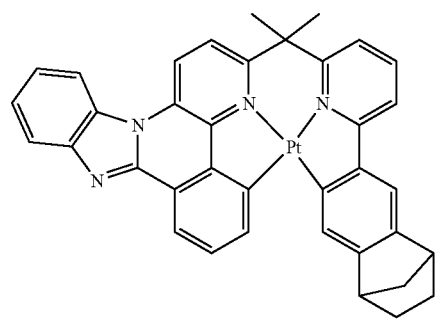

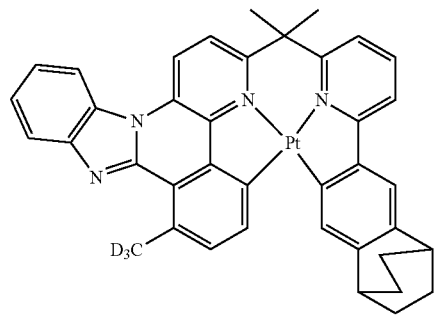
277
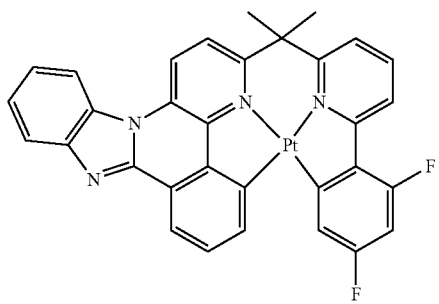
278
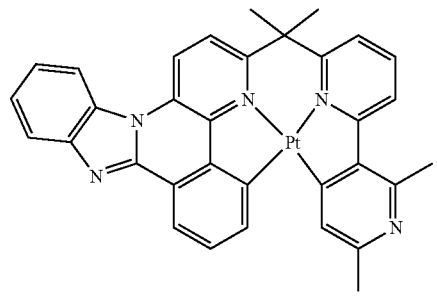
279
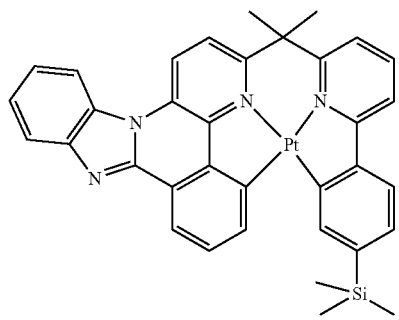
280
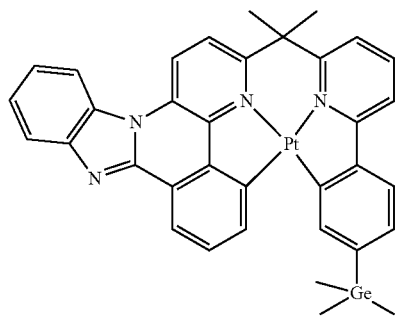
281

-continued
282
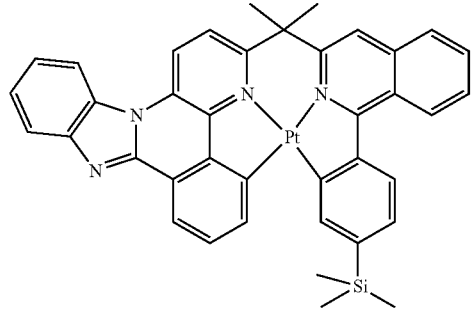
283
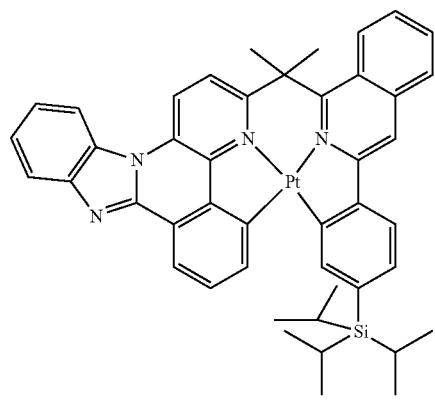
284
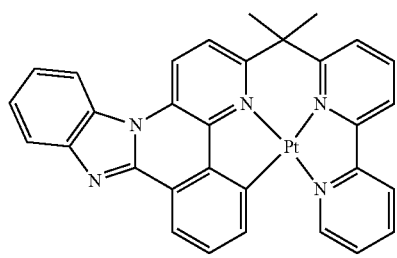
285
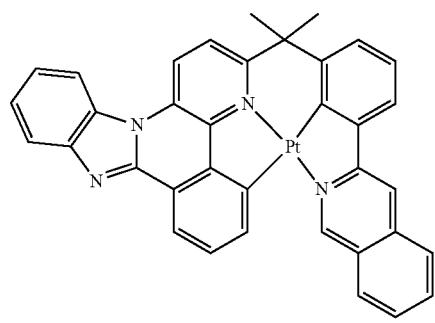
286
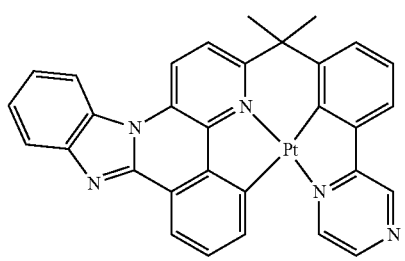

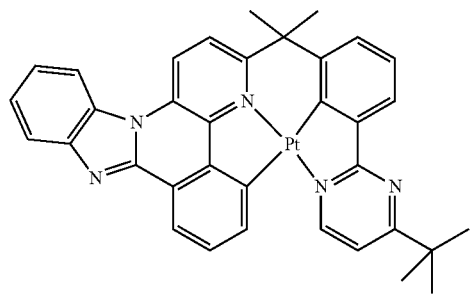
287
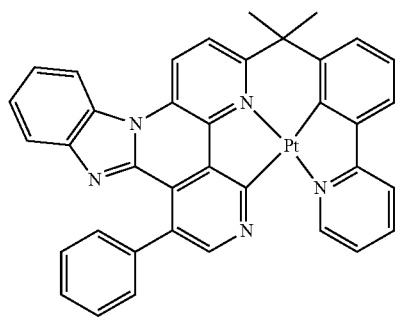
288
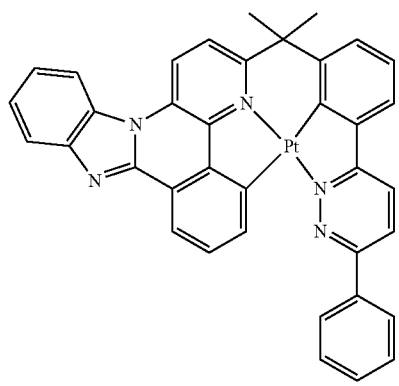
289
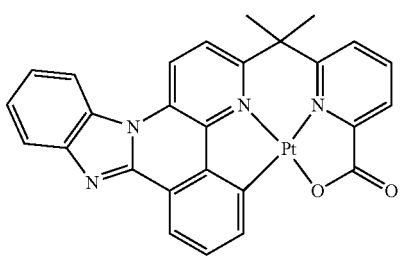
290
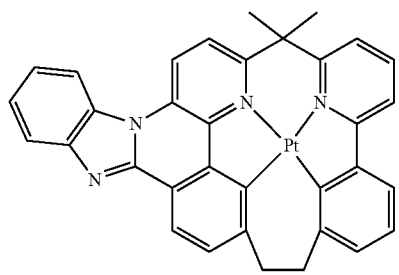
292

-continued
293
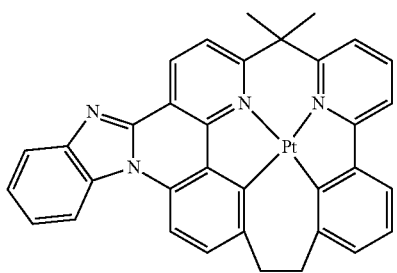
294
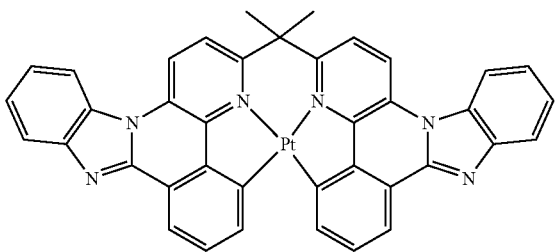
295
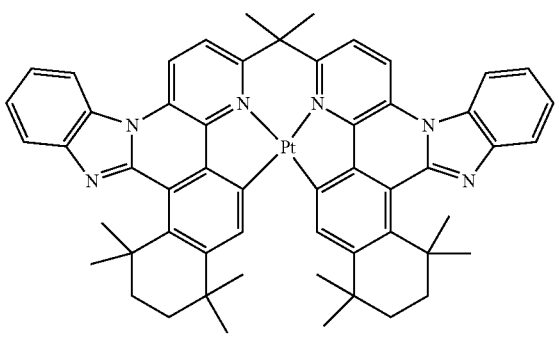
296
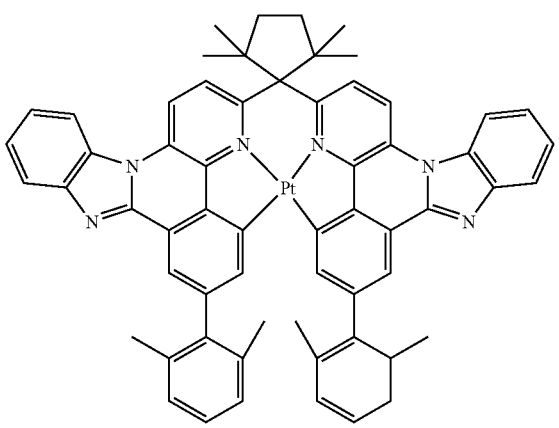
297
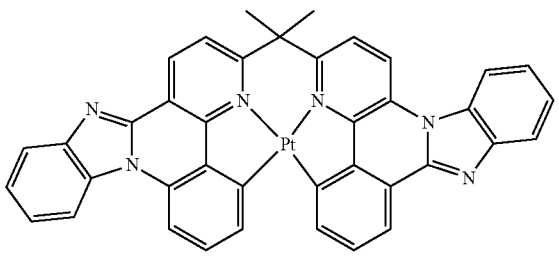

-continued
| | |
|---|---|
| 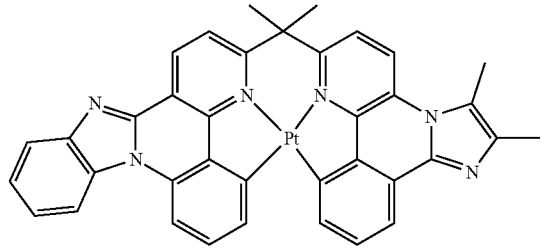 | 298 |
| 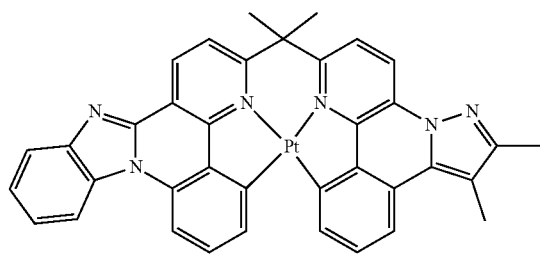 | 299 |
| 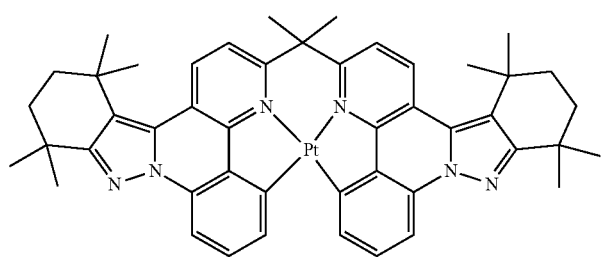 | 300 |
| 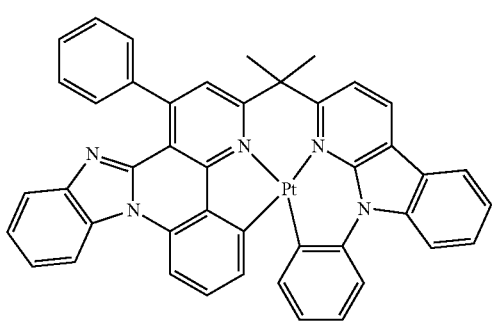 | 301 |
| 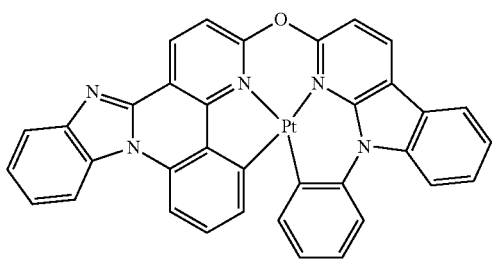 | 302 |
| 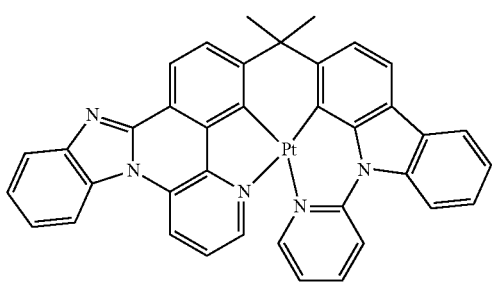 | 303 |

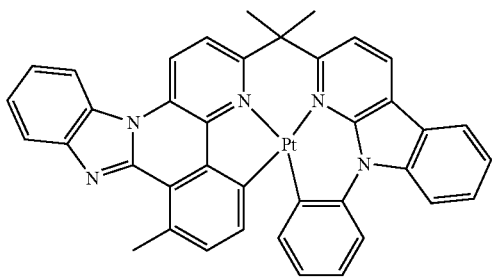

304

The present invention further provides a process for preparing the metal complex compounds of formula (1) by reacting the corresponding free ligands L and optionally L' with metal alkoxides of the formula (79), with metal ketoketonates of the formula (80), with metal halides of the formula (81), with dimeric metal complexes of the formula (82) or with metal complexes of the formula (83), M(OR)$_n$              Formula (79)

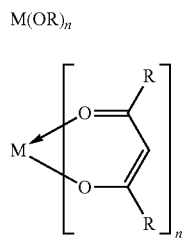           Formula (80)

MHal$_n$              Formula (81)

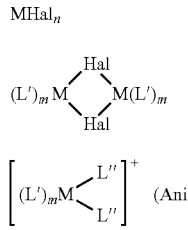           Formula (82)

Formula (83)

where the symbols M, m, n and R have the definitions given above, Hal=F, Cl, Br or I, L" is an alcohol, especially an alcohol having 1 to 4 carbon atoms or a nitrile, especially acetonitrile or benzonitrile, and (Anion) is a non-coordinating anion, for example triflate.

It is possible to ensure via the temperature regime of the reaction and, if necessary, the presence of blocking substituents that the ligand L coordinates via the two six-membered rings and not via one five-membered and one six-membered ring. More specific details of the reaction regime can be found in the examples section. It is likewise possible to use metal compounds, especially iridium compounds, bearing both alkoxide and/or halide and/or hydroxyl radicals and ketoketonate radicals. These compounds may also be charged. Corresponding iridium compounds of particular suitability as reactants are disclosed in WO 2004/085449. Particularly suitable are [IrCl$_2$(acac)$_2$]$^-$, for example Na[IrCl$_2$(acac)$_2$], metal complexes with acetylacetonate derivatives as ligand, for example Ir(acac)$_3$ or tris(2,2,6,6-tetramethylheptane-3,5-dionato)iridium, and IrCl$_3$.xH$_2$O where x is typically a number from 2 to 4.

Suitable platinum reactants are, for example, PtCl$_2$, K$_2$[PtCl$_4$], PtCl$_2$(DMSO)$_2$, Pt(Me)$_2$(DMSO)$_2$ or PtCl$_2$(benzonitrile)$_2$.

The synthesis of the complexes is preferably conducted as described in WO 2002/060910, WO 2004/085449 and WO 2007/065523. Heteroleptic complexes can be synthesized, for example, according to WO 2005/042548 as well. In this case, the synthesis can, for example, also be activated by thermal or photochemical means and/or by microwave radiation. For activation of the reaction, it is additionally also possible to add a Lewis acid, for example a silver salt or AlCl$_3$.

The reactions can be conducted without addition of solvents or melting aids in a melt of the corresponding ligands to be o-metalated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenylene, 1,2-, 1,3- or 1,4-bisphenoxybenzene, triphenylphosphine oxide, 18-crown-6, phenol, 1-naphthol, hydroquinone, etc.

It is possible by these processes, if necessary followed by purification, for example recrystallization or sublimation, to obtain the inventive compounds of formula (1) in high purity, preferably more than 99% and more preferably more than 99.9% (determined by means of $^1$H NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the compounds of the invention from a liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore still further provides a formulation comprising a compound of the invention and at least one further compound. The further compound may, for example, be a solvent. The further compound may alternatively be a further organic or inorganic compound which is likewise used in the electronic device, for example a matrix material.

The above-described compounds of formula (1) and the above-detailed preferred embodiments can be used as active component in the electronic device. The invention therefore further provides for the use of a compound of formula (1) or according to the preferred embodiments in an electronic device.

An electronic device is understood to mean any device comprising anode, cathode and at least one layer, said layer comprising at least one organic or organometallic compound. The electronic device of the invention thus comprises anode, cathode and at least one layer comprising at least one compound of the above-detailed formula (1). Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) and organic laser diodes (O-lasers), comprising at least one compound of the above-detailed formula (1) in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention may be used for production of singlet oxygen, in photocatalysis or in light conversion, for example in pixel color converters (PCCs).

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce.

In a preferred embodiment of the invention, the organic electroluminescent device comprises the compound of formula (1) or the above-detailed preferred embodiments as emitting compound in one or more emitting layers.

When the compound of formula (1) is used as emitting compound in an emitting layer, it is preferably used in combination with one or more matrix materials. The mixture of the compound of formula (1) and the matrix material contains between 0.1% and 99% by volume, preferably between 1% and 90% by volume, more preferably between 3% and 40% by volume and especially between 5% and 15% by volume of the compound of formula (1), based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/

000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579.

Preferred biscarbazoles that can be used as matrix materials for the compounds of the invention are the structures of the following formulae (84) and (85):

Formula (84)

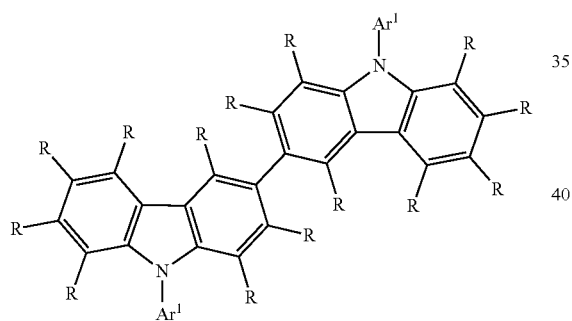

Formula (85)

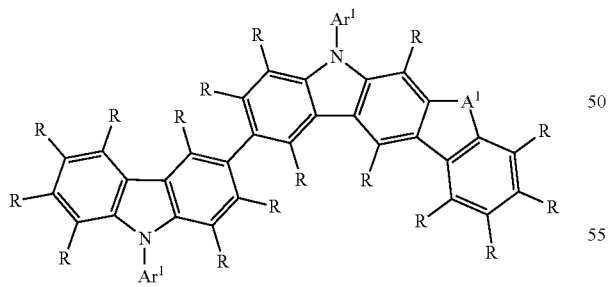

where $Ar^1$ is the same or different and is an aromatic or heteroaromatic ring system which has 5 to 40 aromatic ring atoms, preferably 6 to 30 aromatic ring atoms, and may be substituted in each case by one or more R radicals, $A^1$ is NR, $CR_2$, O or S, and R has the definitions given above. In a preferred embodiment of the invention, $A^1$ is $CR_2$.

Preferred embodiments of the compounds of the formulae (84) and (85) are the compounds of the following formulae (84a) and (85a):

Formula (84a)

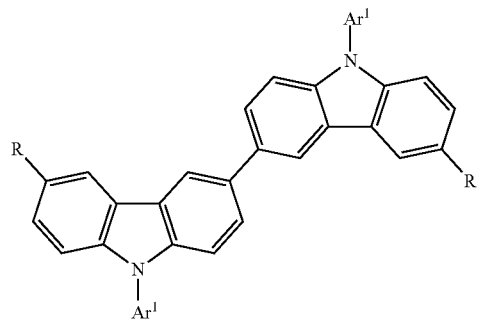

Formula (85a)

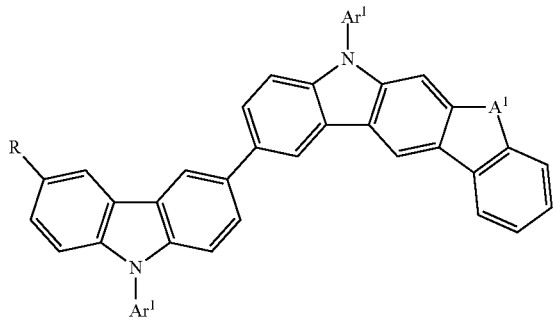

where the symbols used have the definitions given above.

Examples of suitable compounds of formulae (84) and (85) are the compounds depicted below:

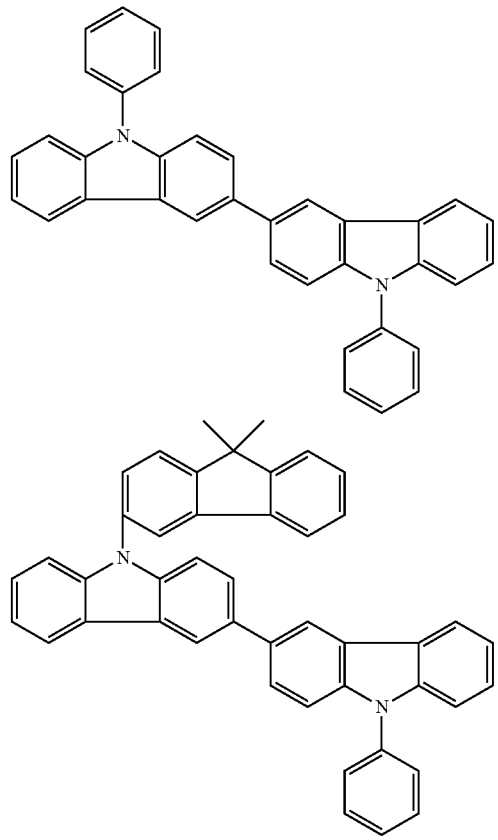

221
-continued
222
-continued
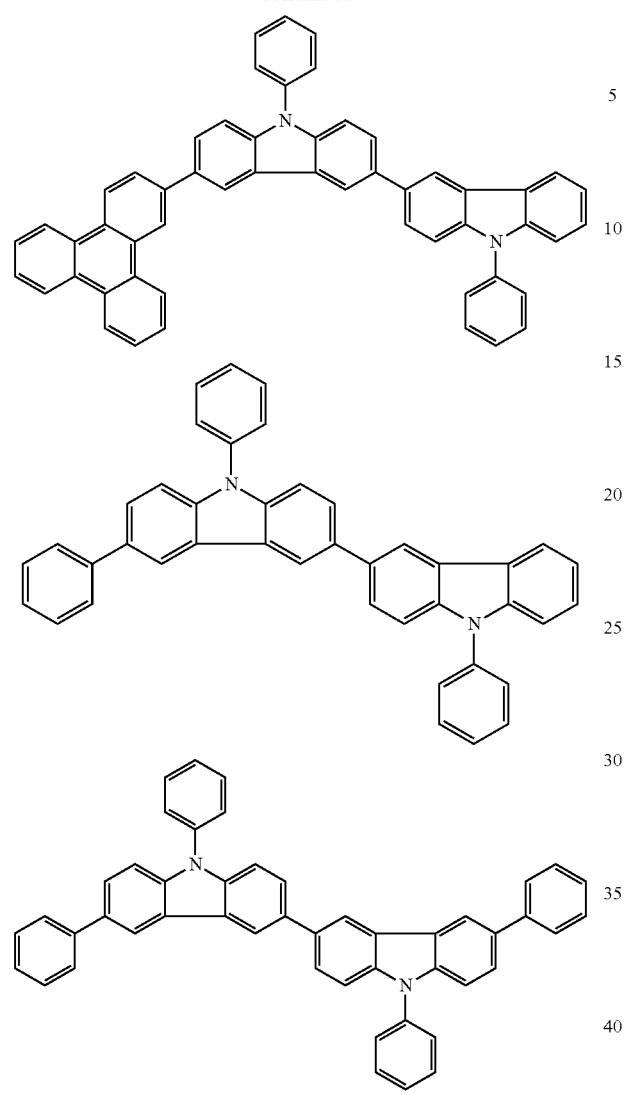
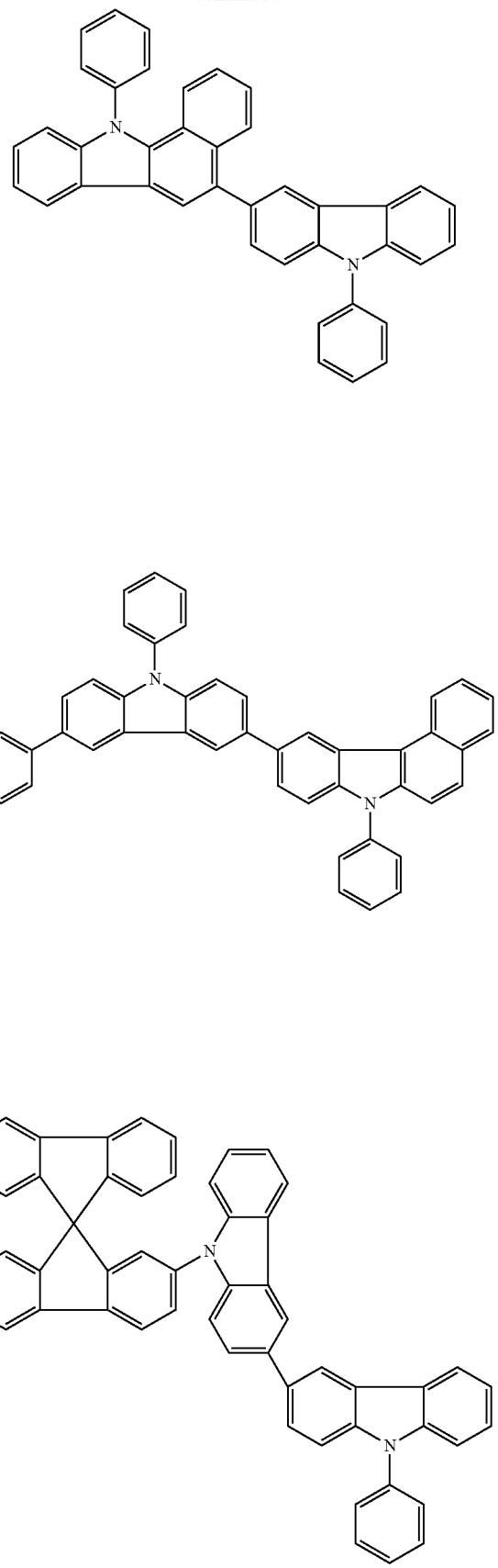

223
-continued
224
-continued
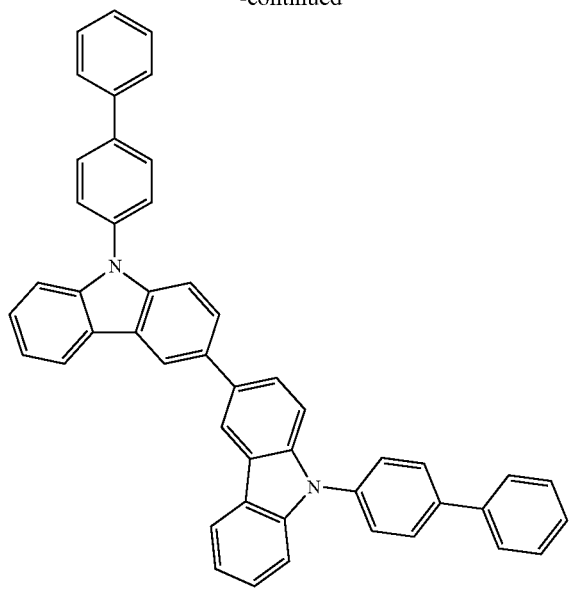
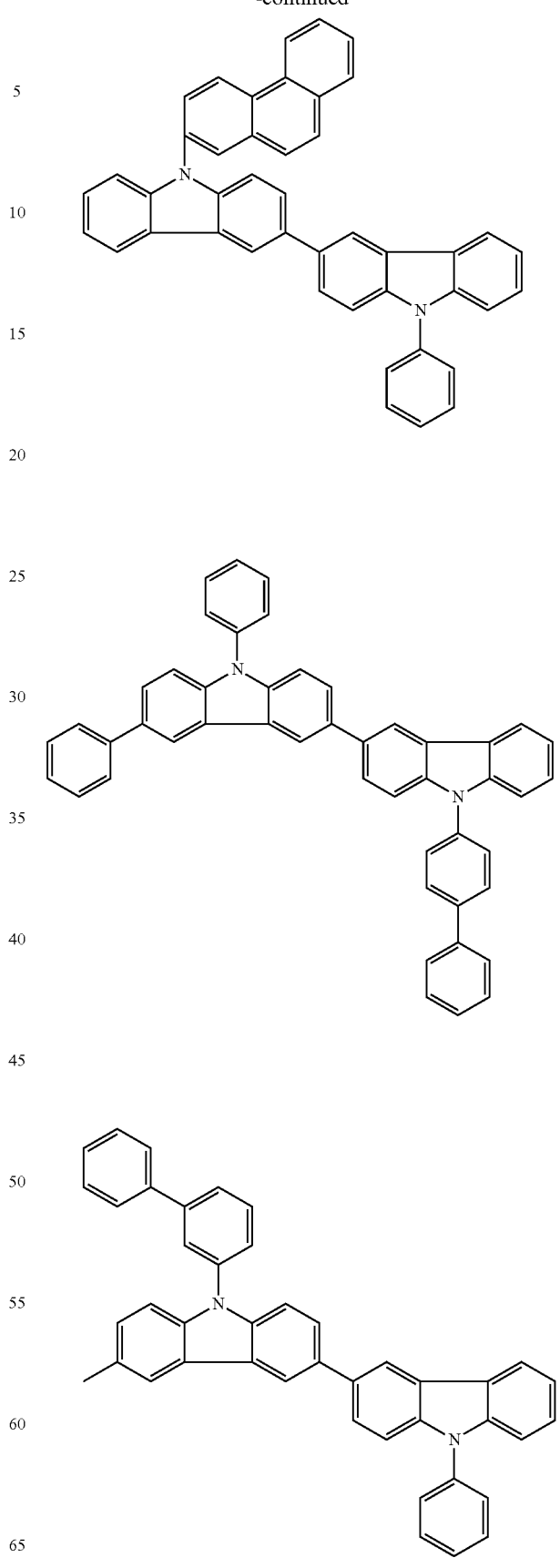

225
-continued
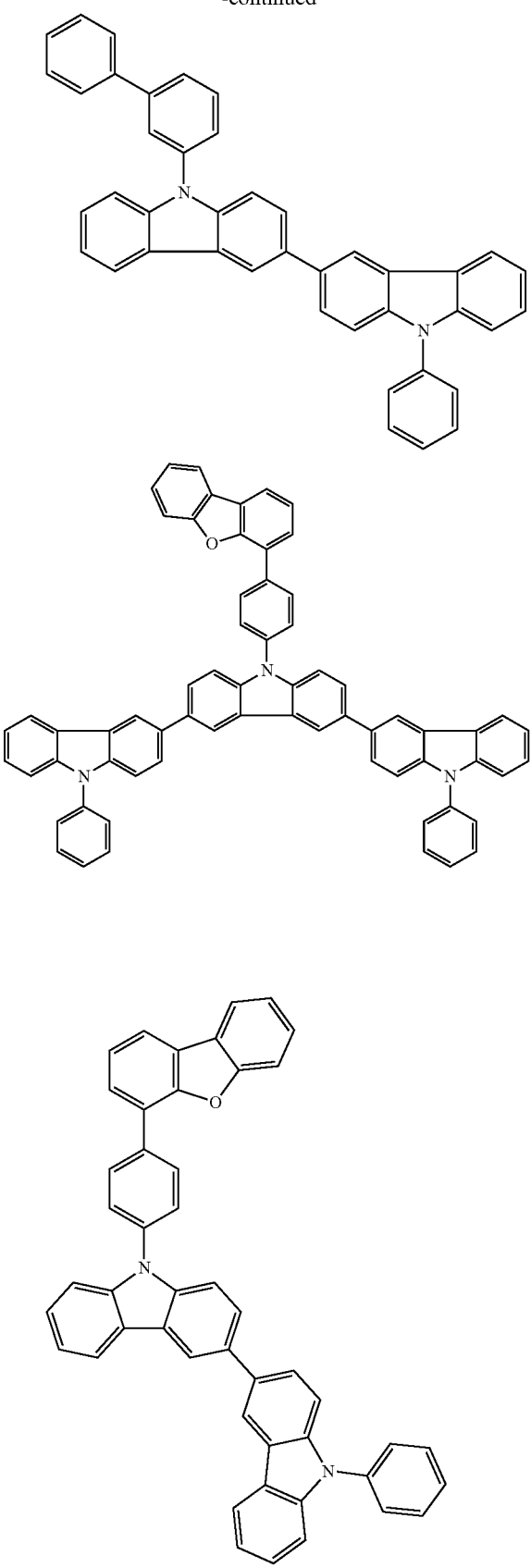
226
-continued
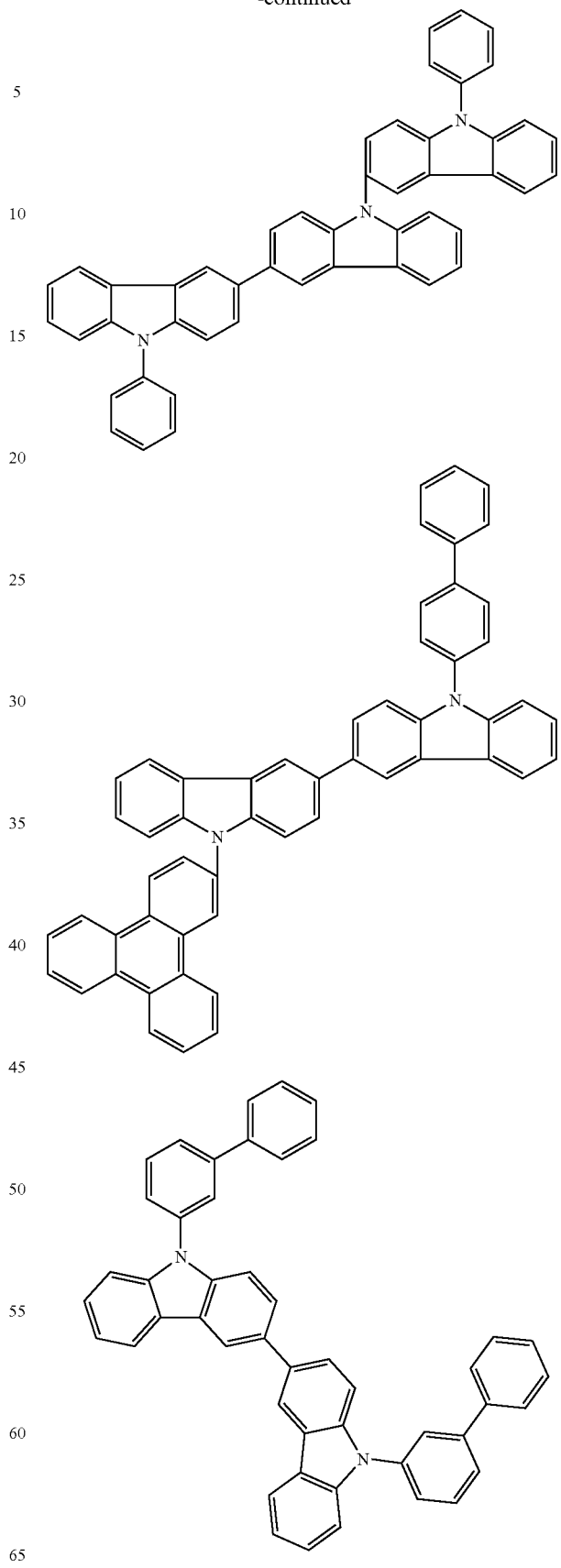

227
-continued
228
-continued
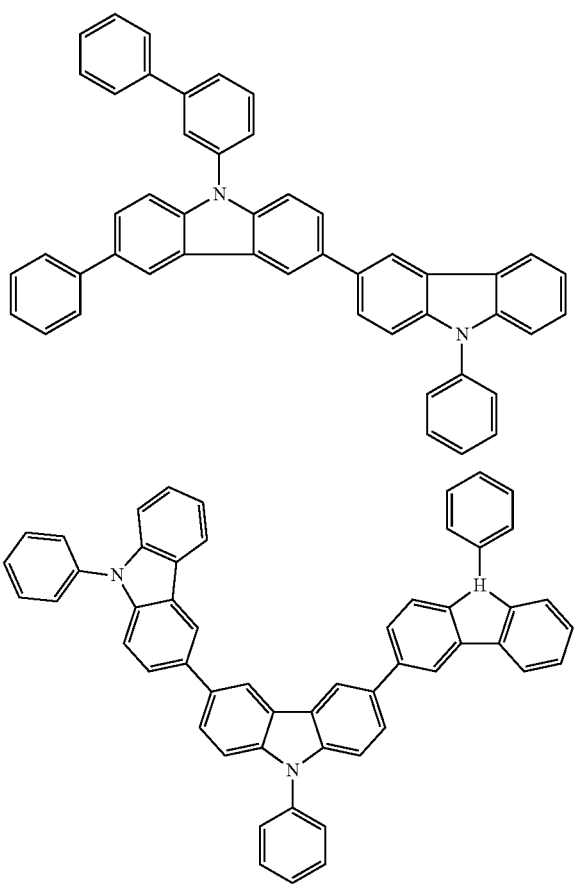
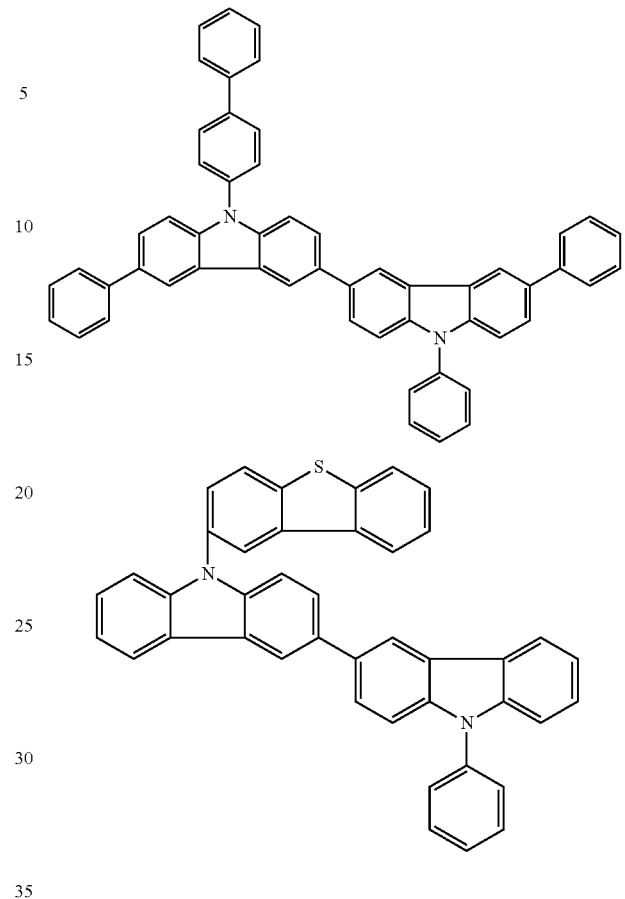
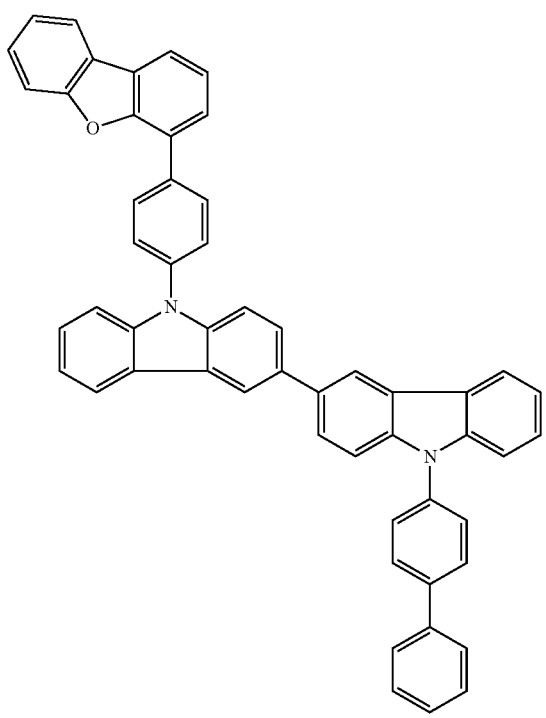

229
-continued
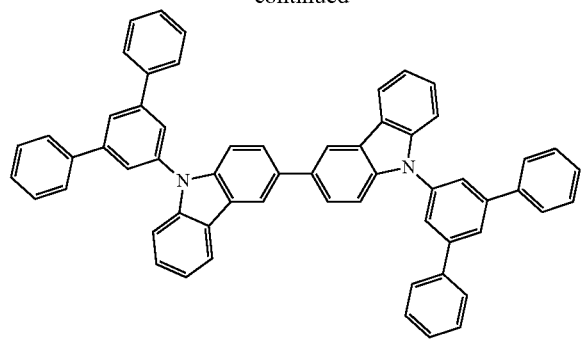
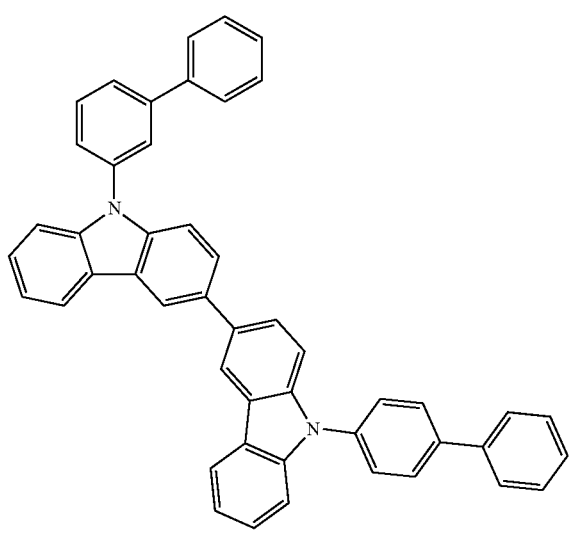
230
-continued
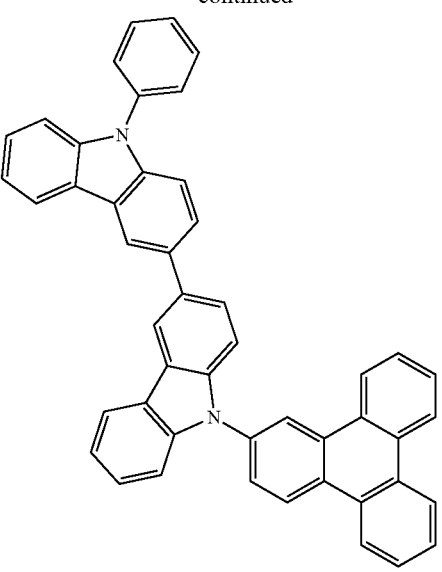
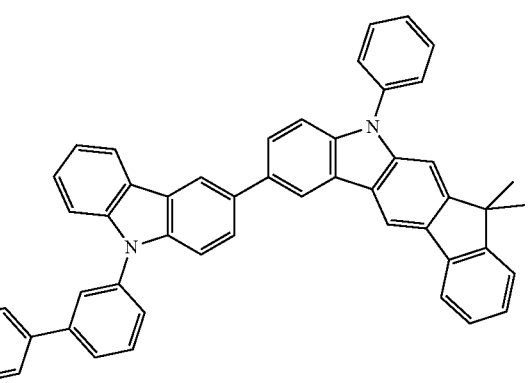
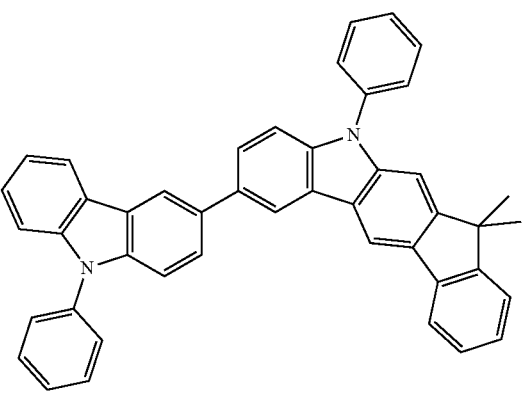

Preferred dibenzofuran derivatives are the compounds of the following formula (86):

Formula (86)

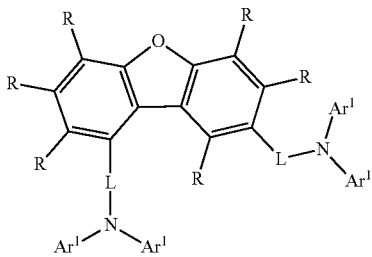

where the oxygen may also be replaced by sulfur so as to form a dibenzothiophene, L is a single bond or an aromatic or heteroaromatic ring system which has 5 to 30 aromatic ring atoms and may also be substituted by one or more R radicals, and R and Ar¹ have the definitions given above. It is also possible here for the two Ar¹ groups that bind to the same nitrogen atom, or for one Ar¹ group and one L group that bind to the same nitrogen atom, to be bonded to one another, for example to give a carbazole.

Preferred carbazoleamines are the structures of the following formulae (87), (88) and (89):

Formula (87)

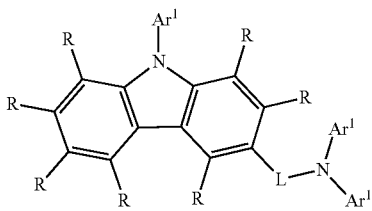

Formula (88)

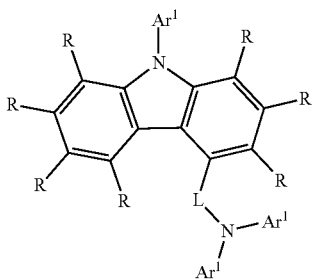

Formula (89)

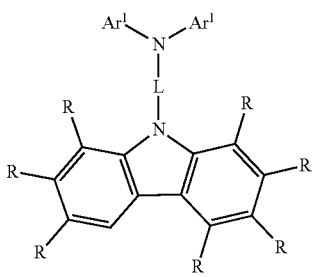

where L is an aromatic or heteroaromatic ring system which has 5 to 30 aromatic ring atoms and may be substituted by one or more R radicals, and R and Ar¹ have the definitions given above.

Preferred triazine, quinazoline or pyrimidine derivatives that can be used as a mixture together with the compounds of the invention are the compounds of the following formulae (90), (91) and (92):

Formula (90)

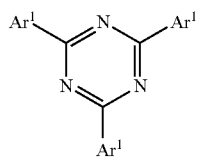

Formula (91)

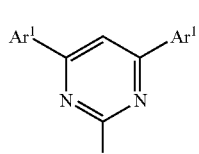

Formula (92)

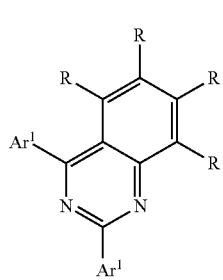

where Ar¹ and R have the definitions given above.

Particular preference is given to the triazine derivatives of the formula (90) and the quinazoline derivatives of the formula (92), especially the triazine derivatives of the formula (90).

In a preferred embodiment of the invention, Ar¹ in the formulae (90), (91) and (92) is the same or different at each instance and is an aromatic or heteroaromatic ring system which has 6 to 30 aromatic ring atoms, especially 6 to 24 aromatic ring atoms, and may be substituted by one or more R radicals. Suitable aromatic or heteroaromatic ring systems Ar¹ here are the same as set out above as embodiments for Ar¹, Ar² and Ar³ especially the structures Ar-1 to Ar-76.

Examples of suitable triazine compounds that may be used as matrix materials together with the compounds of the invention are the compounds depicted in the following table:

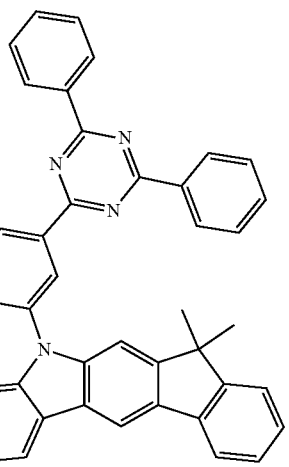

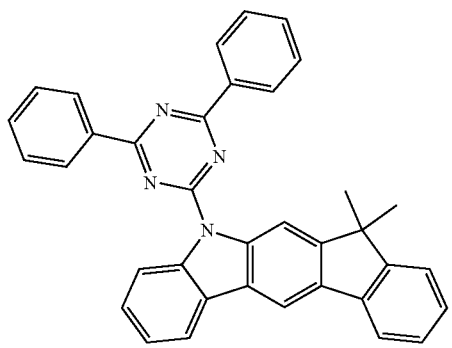 [SMILES: CC1(C)c2ccccc2-c2cc3c4ccccc4n(-c4nc(-c5ccccc5)nc(-c5ccccc5)n4)c3cc21]
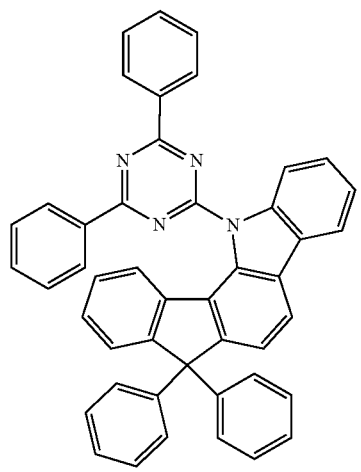 [SMILES: c1ccc(-c2nc(-c3ccccc3)nc(-n3c4ccccc4c4ccc5c(c43)-c3ccccc3C5(c3ccccc3)c3ccccc3)n2)cc1]
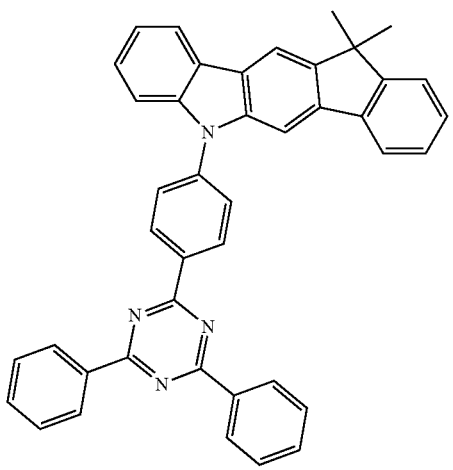 [SMILES: CC1(C)c2ccccc2-c2cc3c(cc21)c1ccccc1n3-c1ccc(-c2nc(-c3ccccc3)nc(-c3ccccc3)n2)cc1]
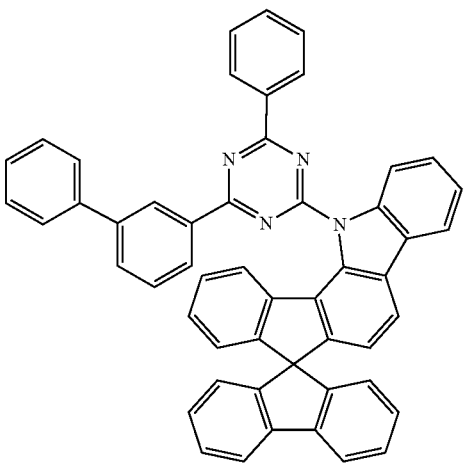 [SMILES: c1ccc(-c2cccc(-c3nc(-c4ccccc4)nc(-n4c5ccccc5c5ccc6c(c54)-c4ccccc4C64c5ccccc5-c5ccccc54)n3)c2)cc1]
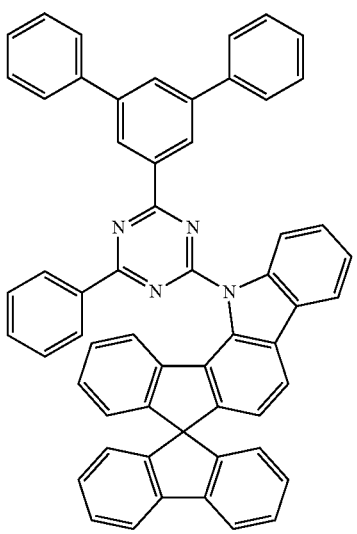 [SMILES: c1ccc(-c2cc(-c3ccccc3)cc(-c3nc(-c4ccccc4)nc(-n4c5ccccc5c5ccc6c(c54)-c4ccccc4C64c5ccccc5-c5ccccc54)n3)c2)cc1]
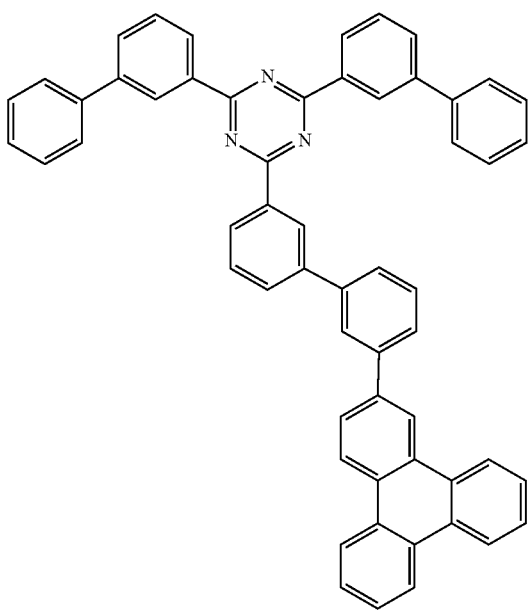 [SMILES: c1ccc(-c2cccc(-c3nc(-c4cccc(-c5ccccc5)c4)nc(-c4cccc(-c5cccc(-c6ccc7c8ccccc8c8ccccc8c7c6)c5)c4)n3)c2)cc1]

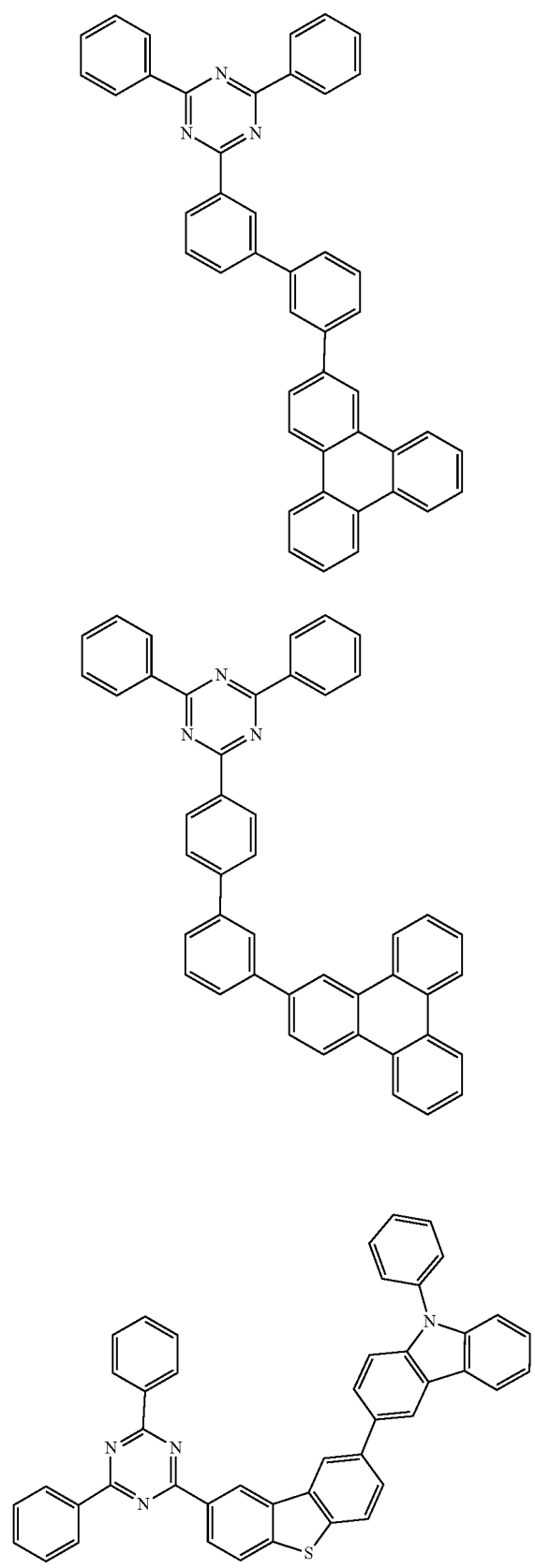

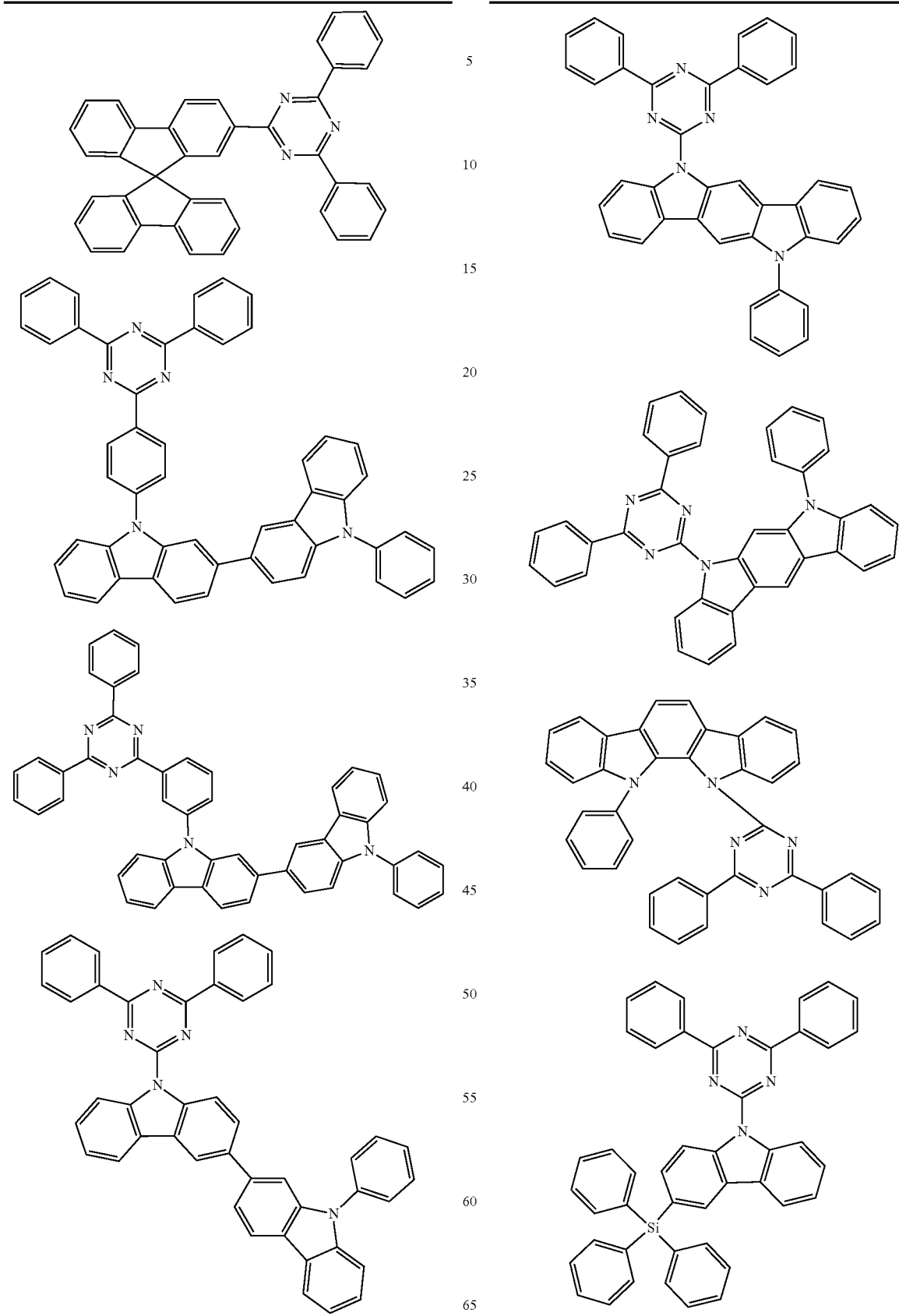

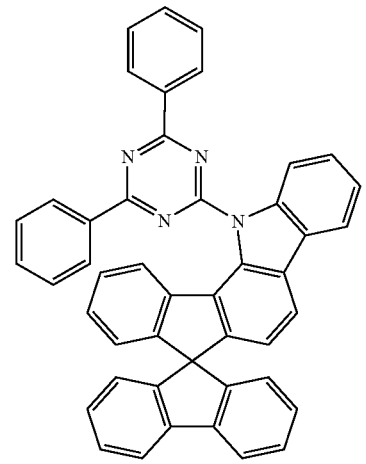 [SMILES: c1ccc(-c2nc(-c3ccccc3)nc(-n3c4ccccc4c4ccc5c(c43)-c3ccccc3C53c4ccccc4-c4ccccc43)n2)cc1]
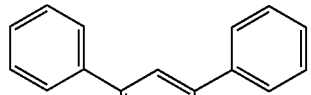
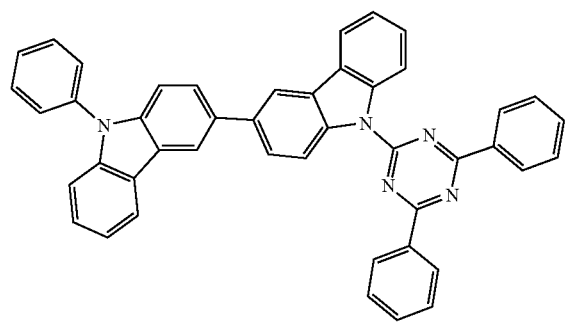 [SMILES: c1ccc(-c2nc(-c3ccccc3)nc(-n3c4ccccc4c4cc(-c5ccc6c(c5)c5ccccc5n6-c5ccccc5)ccc43)n2)cc1]
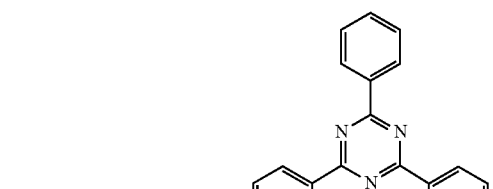
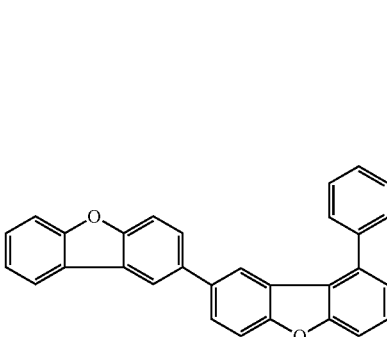
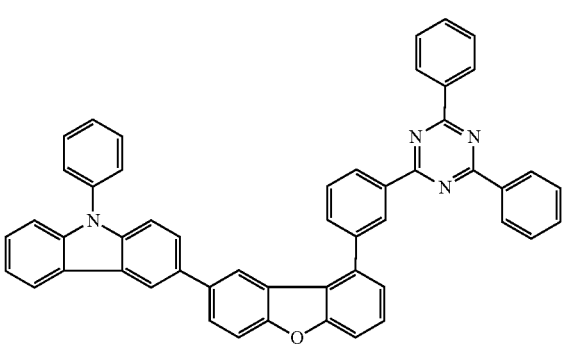
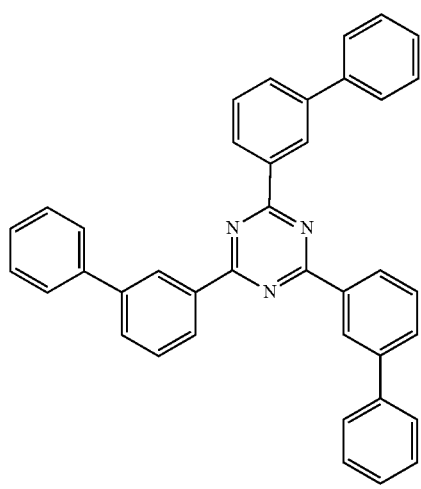 [SMILES: c1ccc(-c2cccc(-c3nc(-c4cccc(-c5ccccc5)c4)nc(-c4cccc(-c5ccccc5)c4)n3)c2)cc1]
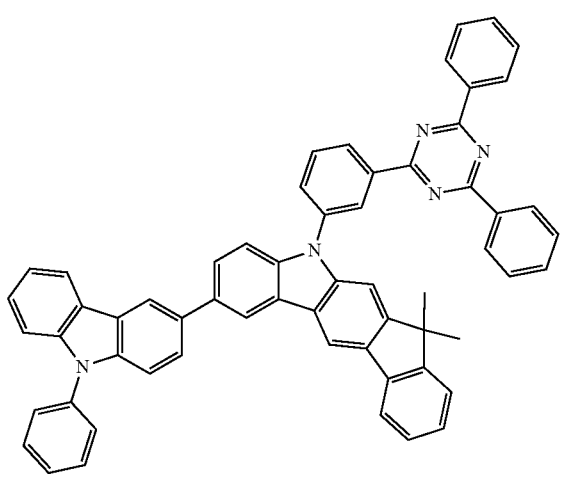 [SMILES: CC1(C)c2ccccc2-c2cc3c4cc(-c5ccc6c(c5)c5ccccc5n6-c5ccccc5)ccc4n(-c4cccc(-c5nc(-c6ccccc6)nc(-c6ccccc6)n5)c4)c3cc21]

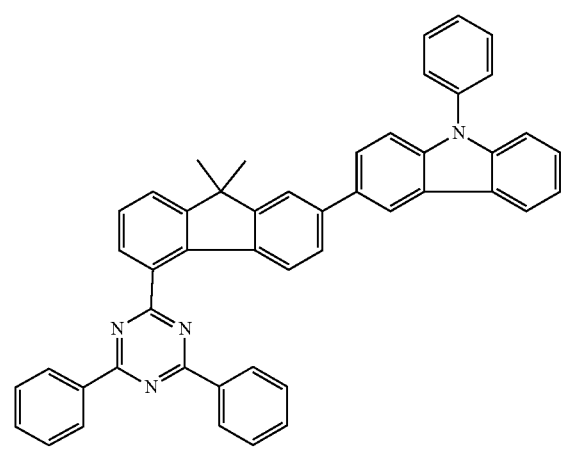 [SMILES: CC1(C)c2cc(-c3ccc4c(c3)c3ccccc3n4-c3ccccc3)ccc2-c2c(-c3nc(-c4ccccc4)nc(-c4ccccc4)n3)cccc21]
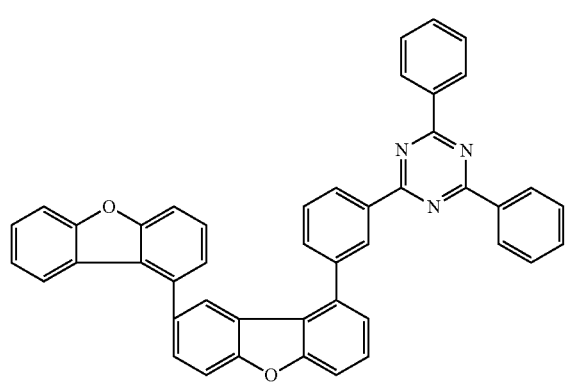 [SMILES: c1ccc(-c2nc(-c3ccccc3)nc(-c3cccc(-c4cccc5oc6ccc(-c7cccc8oc9ccccc9c78)cc6c45)c3)n2)cc1]
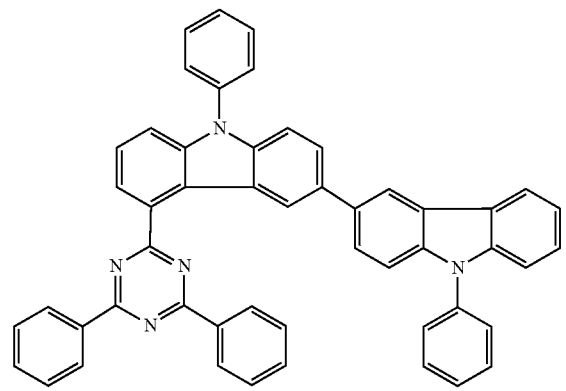 [SMILES: c1ccc(-c2nc(-c3ccccc3)nc(-c3cccc4c3c3cc(-c5ccc6c(c5)c5ccccc5n6-c5ccccc5)ccc3n4-c3ccccc3)n2)cc1]
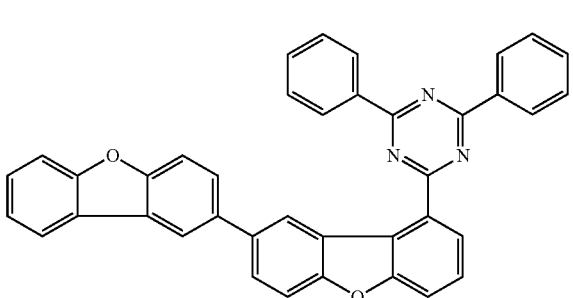
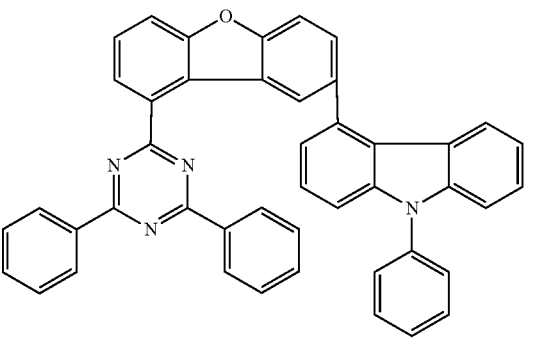 [SMILES: c1ccc(-c2nc(-c3ccccc3)nc(-c3cccc4oc5ccc(-c6cccc7c6c6ccccc6n7-c6ccccc6)cc5c34)n2)cc1]
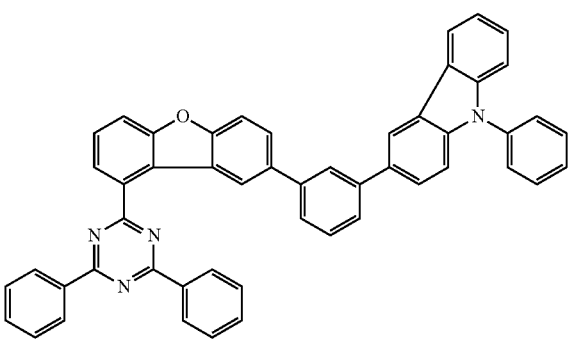 [SMILES: c1ccc(-c2nc(-c3ccccc3)nc(-c3cccc4oc5ccc(-c6cccc(-c7ccc8c(c7)c7ccccc7n8-c7ccccc7)c6)cc5c34)n2)cc1]
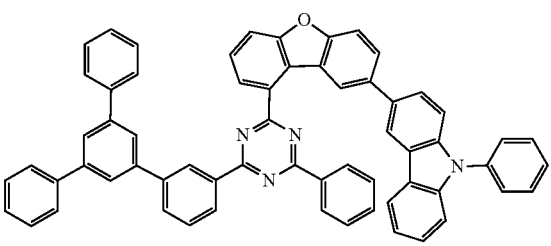 [SMILES: c1ccc(-c2cc(-c3ccccc3)cc(-c3cccc(-c4nc(-c5ccccc5)nc(-c5cccc6oc7ccc(-c8ccc9c(c8)c8ccccc8n9-c8ccccc8)cc7c56)n4)c3)c2)cc1]
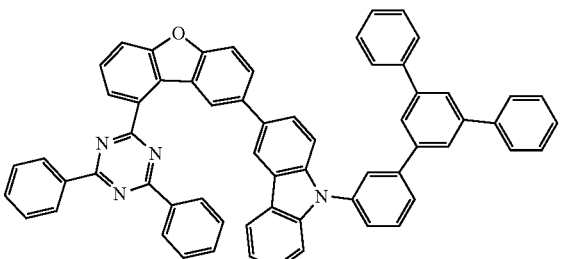
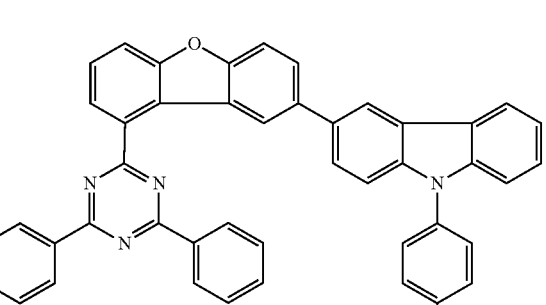

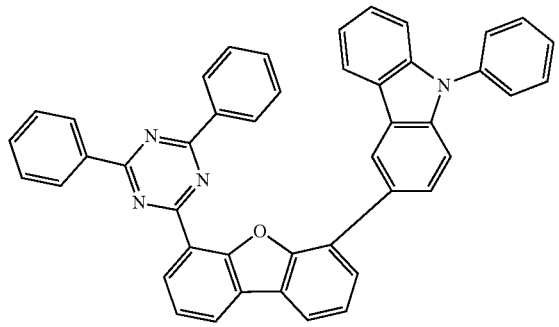 [SMILES: c1ccc(-c2nc(-c3ccccc3)nc(-c3cccc4c3oc3c(-c5ccc6c(c5)c5ccccc5n6-c5ccccc5)cccc34)n2)cc1]

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the inventive complexes of formula (1) as co-matrix for longer-wave emitting triplet emitters, for example for green- or red-emitting triplet emitters.

The compounds of the invention can also be used in other functions in the electronic device, for example as hole transport material in a hole injection or transport layer, as charge generation material or as electron blocker material. It is likewise possible to use the complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapor deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapor phase deposition) method or with the aid of a carrier gas sublimation. In this case, the materials are applied at a pressure between $10^{-5}$ mbar and 1 bar. A special case of this method is the OVJP (organic vapor jet printing) method, in which the materials are applied directly by a nozzle and thus structured (for example M. S. Arnold et al., Appl. Phys. Lett. 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapor deposition. For example, it is possible to apply an emitting layer comprising a compound of formula (1) and a matrix material from solution, and to apply a hole blocker layer and/or an electron transport layer thereto by vapor deposition under reduced pressure.

245

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for good color coordinates, good efficiency and good lifetime.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature. In the case of compounds that can have multiple enantiomeric, diastereomeric or tautomeric forms, one form is shown in a representative manner.

246

A: Synthesis of the Synthons S

Example S1

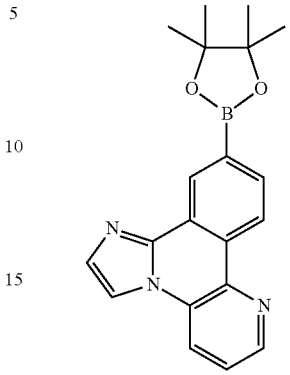

To a mixture of 29.8 g (100 mmol) of 11-bromobenz[c]imidazo[1,2-a][1,5]naphthyridine[2253277-62-9], 26.7 g (105 mmol) of bis(pinacolato)diborane, 29.4 g (300 mmol) of potassium acetate (anhydrous), 50 g of glass beads (diameter 3 mm) and 500 ml of THF are added, with good stirring, 821 mg (2 mmol) of SPhos and then 225 mg (1 mmol) of palladium(II) acetate, and the mixture is heated under reflux for 16 h. While the mixture is still warm, the salts and glass beads are removed by suction filtration through a Celite bed in the form of a THF slurry, which is washed through with THF, and the filtrate is concentrated to dryness. The residue is taken up in 100 ml of MeOH and stirred in the warm solvent, and the crystallized product is filtered off with suction, washed twice with 30 ml each time of methanol and dried under reduced pressure. Yield: 30.0 g (81 mmol), 81%; purity: about 95% by $^1$H-NMR.

The following compounds can be prepared analogously:

| Ex. | Reactant | Product | Yield |
|---|---|---|---|
| S2 | Br-compound (2252376-88-6) | pinacol boronate | 83% |
| S3 | Cl-compound (1817894-47-5) | pinacol boronate | 78% |

| Ex. | Reactant | Product | Yield |
|---|---|---|---|
| S4 | [structure with Cl; 1418189-47-5] | [structure with pinacol boronate ester] | 63% |

Example S50

To a mixture of 34.5 g (100 mmol) of S1, 28.3 g (100 mmol) of 1-bromo-2-iodobenzene[583-55-1], 31.8 g (300 mmol) of sodium carbonate, 300 ml of toluene, 100 ml of ethanol and 300 ml of water are added, with very good stirring, 788 mg (3 mmol) of triphenylphosphine and then 225 mg (1 mmol) of palladium(II) acetate, and the mixture is heated under reflux for 48 h. After cooling, the organic phase is removed and washed once with 300 ml of water and once with 300 ml of saturated sodium chloride solution, and dried over magnesium sulfate. The desiccant is filtered off and the filtrate is concentrated fully under reduced pressure. The residue is subjected to flash chromatography (Torrent automatic column system from A. Semrau) or recrystallized from acetonitrile/ethyl acetate. Yield: 31.8 g (85 mmol), 85%; purity: about 95% by $^1$H-NMR.

The following compounds can be prepared analogously:

| Ex. | Reactant | Product | Yield |
|---|---|---|---|
| S51 | S2 | [structure with Br] | 84% |
| S52 | S3 | [structure with Br and methyl] | 88% |

-continued

| Ex. | Reactant | Product | Yield |
|---|---|---|---|
| S53 | S4 | 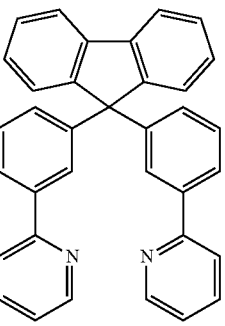 | 86% |

B Synthesis of the Ligands L

1) Synthesis of the Tetradentate Ligands TL

Example TL1

A)

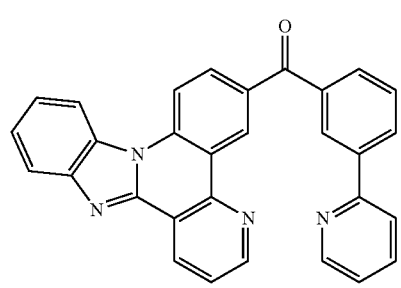

To a suspension, cooled to −78° C., of 15.2 g (50 mmol) of 6-chlorobenzimidazo[2,1-f]benzo[h][1,6]naphthyridine [1228276-32-0] in 200 ml of THF is added dropwise 59.0 ml (100 mmol) of tert-butyllithium (1.7 M in n-pentane), and the mixture is stirred for a further 2 h. Then a solution, precooled to −78° C., of 10.8 g (60 mmol) of 3-(2-pyridyl)benzonitrile[4350-51-0] is added dropwise, and the mixture is stirred at −78° C. for a further 1 h and then allowed to warm up gradually to room temperature. The reaction mixture is quenched by adding 20 ml of methanol, then 100 ml of 5 N hydrochloric acid is added and the mixture is heated under reflux for 2 h. The mixture is adjusted to pH~9 by adding 5 N aqueous NaOH and extracted three times with 200 ml each time of dichloromethane. The combined organic phases are washed three times with 300 ml each time of water and once with 300 ml of saturated sodium chloride solution and dried over magnesium sulfate. The desiccant is filtered off with suction and washed through thoroughly with dichloromethane, and the filtrate is concentrated to dryness. The crude product is chromatographed on silica gel with dichloromethane/ethyl acetate (8:2 w). Yield: 7.7 g (17 mmol) 34%; purity: about 95% by $^1$H-NMR.

B)

To a solution, cooled to −78° C., of 7.0 g (30 mmol) of 2-bromobiphenyl[2052-07-5] in 100 ml of THF is added dropwise 12.0 ml (30 mmol) of n-butyllithium (2.5 N in hexane), and the mixture is stirred for a further 30 min. Then a solution of 13.5 g (30 mmol) of TL1 Stage A) in 200 ml of THF is added dropwise, and the mixture is allowed to warm up slowly to room temperature and stirred for a further 6 h. The reaction mixture is quenched by adding 10 ml of ethanol, the solvent is evaporated off completely under reduced pressure, the residue is taken up in 200 ml of glacial acetic acid, 1 ml of conc. sulfuric acid is added dropwise while stirring, and the mixture is stirred at 60° C. for a further 3 h. Then the glacial acetic acid is largely removed under reduced pressure, the residue is taken up in 300 ml of dichloromethane, and the mixture is alkalized by adding 5% by weight aqueous NaOH while cooling with ice. The organic phase is separated off, washed three times with 200 ml each time of water and dried over magnesium sulfate, the organic phase is concentrated completely, and the residue is taken up in 300 ml of methanol, homogenized while heating and then stirred for a further 12 h, in the course of which the product crystallizes. The crude product is filtered off with suction, washed twice with 30 ml each time of methanol, dried under reduced pressure and recrystallized twice from toluene:isopropanol (5:1). Yield: 6.5 g (11 mmol) 37%; purity: about 95% by $^1$H-NMR.

| Ex. | Reactants | Product | Yield |
|---|---|---|---|
| TL2 | 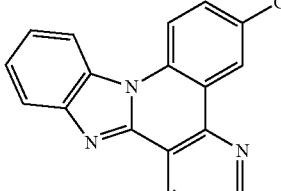<br>1228276-32-0<br>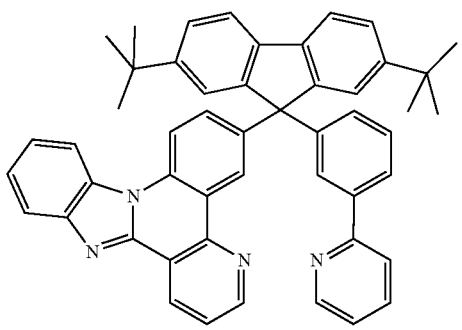 [SMILES: CC(C)(C)c1ccc2c(c1)C(c1cccc(-c3ccccn3)c1)(c1ccc3c(c1)c1ncccc1c1nc4ccccc4n31)c1cc(C(C)(C)C)ccc1-2]<br>70728-89-1 | 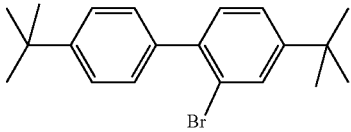 | 19% |
| TL3 | 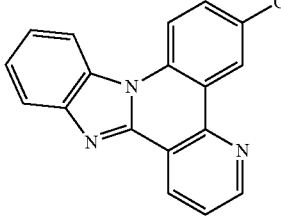<br>1228276-32-0<br>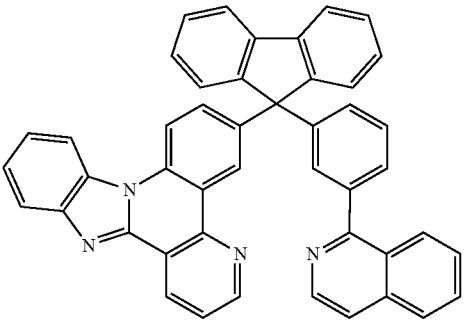 [SMILES: c1cc(-c2nccc3ccccc23)cc(C2(c3ccc4c(c3)c3ncccc3c3nc5ccccc5n43)c3ccccc3-c3ccccc32)c1]<br>126939-18-1 | 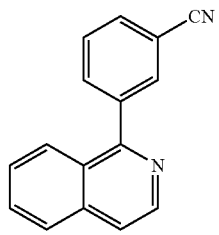 | 15% |
| TL4 | 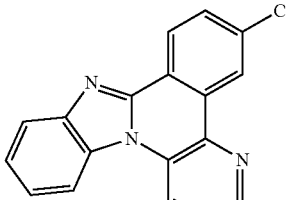<br>1228276-28-4 | 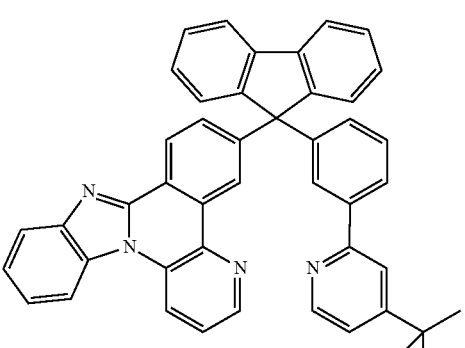 | 21% |

| Ex. | Reactants | Product | Yield |
|---|---|---|---|
| | 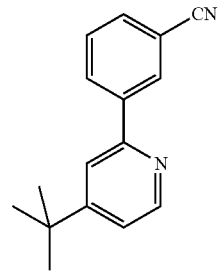<br>1246851-76-2 | | |
| TL5 | 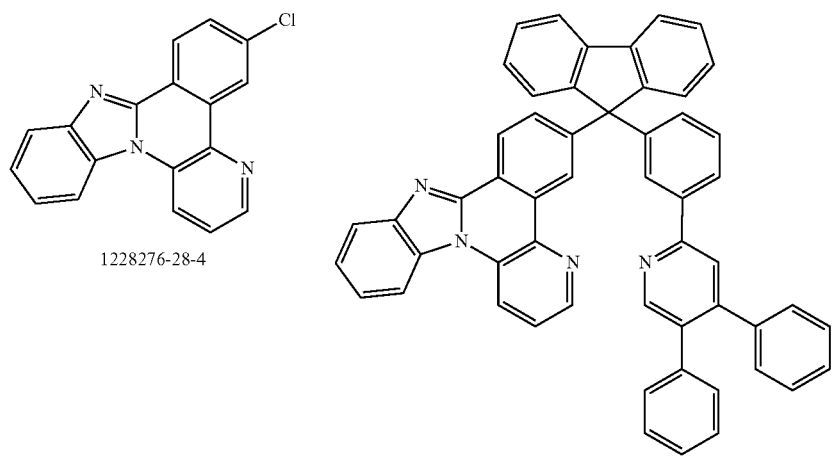<br>1228276-28-4 | | 20% |
| | 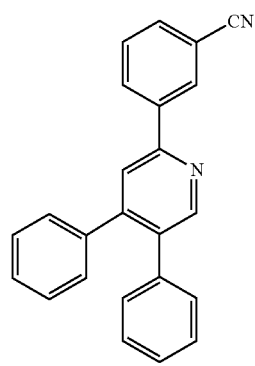<br>1345015-12-4 | | |

2) Synthesis of the Hexadentate Ligands HL

Example HL1

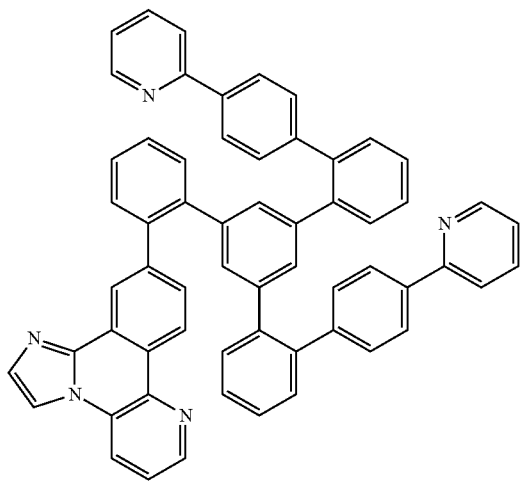 [SMILES: c1ccc(-c2ccc(-c3ccccc3-c3cc(-c4ccccc4-c4ccc(-c5ccccn5)cc4)cc(-c4ccccc4-c4ccc5c(c4)c4nccn4c4cccnc54)c3)cc2)nc1]

To a mixture of 66.3 g (100 mmol) of 2,2'-[5"-(4,4,5,5-tetramethyl-1,3,2-dioxaborolan-2-yl)[1,1':2',1":3",1'":2''', 1''''-quinquephenyl]-4,4''''-diyl]bispyridine[1989597-72-9], 37.4 g (100 mmol) of S50, 63.7 g (300 mmol) of tripotassium phosphate, 300 ml of toluene, 150 ml of dioxane and 300 ml of water are added, with good stirring, 1.64 g (4 mmol) of SPhos and then 449 mg (2 mmol) of palladium(II) acetate, and then the mixture is heated under reflux for 24 h. After cooling, the organic phase is removed and washed twice with 300 ml each time of water and once with 300 ml of saturated sodium chloride solution, and dried over magnesium sulfate. The desiccant is filtered off, the filtrate is concentrated to dryness under reduced pressure and the glassy crude product is recrystallized at boiling from acetonitrile (~150 ml) and then for a second time from acetonitrile/ethyl acetate. Yield: 58.1 g (70 mmol), 70%; purity: about 95% by $^1$H-NMR.

| Ex. | Reactants | Product | Yield |
|---|---|---|---|
| HL2 | 2245948-35-8 S50 | | 73% |
| HL3 | 2245948-36-9 S50 | | 70% |

| Ex. | Reactants | Product | Yield |
|---|---|---|---|
| HL4 | 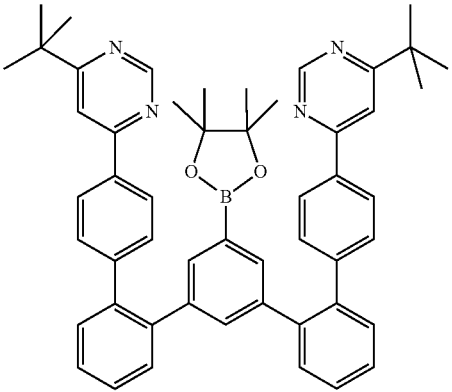<br>2202713-42-4<br>S50 | 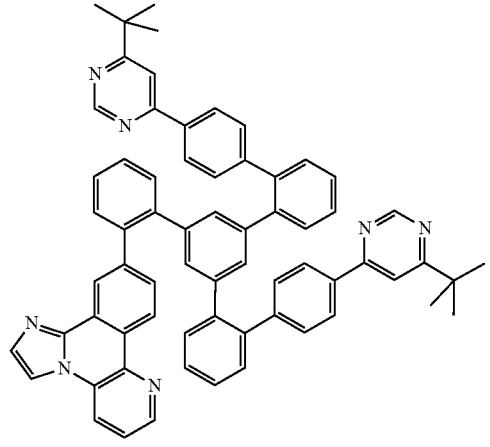 [SMILES: CC(C)(C)c1cc(-c2ccc(-c3ccccc3-c3cc(-c4ccccc4-c4ccc(-c5cc(C(C)(C)C)ncn5)cc4)cc(-c4ccccc4-c4ccc5c(c4)c4nccn4c4cccnc54)c3)cc2)ncn1] | 76% |
| HL5 | 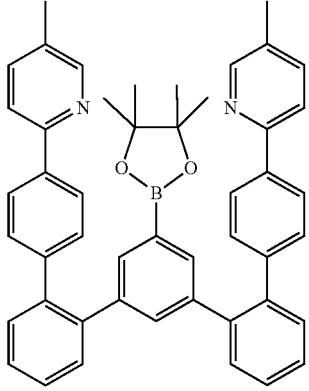<br>2245948-52-9<br>S51 | 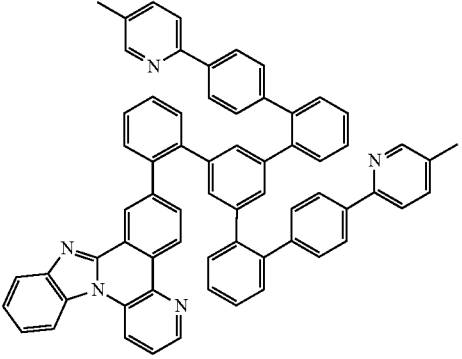 [SMILES: Cc1ccc(-c2ccc(-c3ccccc3-c3cc(-c4ccccc4-c4ccc(-c5ccc(C)cn5)cc4)cc(-c4ccccc4-c4ccc5c(c4)c4nc6ccccc6n4c4cccnc54)c3)cc2)nc1] | 74% |
| HL6 | 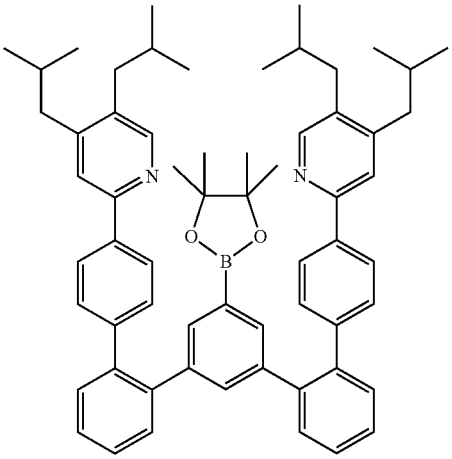<br>2202694-65-1<br>S51 | 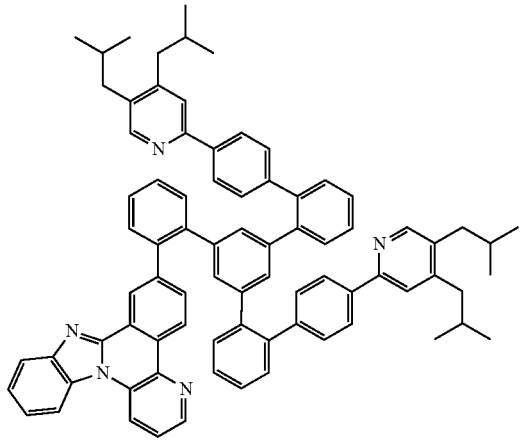 [SMILES: CC(C)Cc1cnc(-c2ccc(-c3ccccc3-c3cc(-c4ccccc4-c4ccc(-c5cc(CC(C)C)c(CC(C)C)cn5)cc4)cc(-c4ccccc4-c4ccc5c(c4)c4nc6ccccc6n4c4cccnc54)c3)cc2)cc1CC(C)C] | 61% |

-continued
| Ex. | Reactants | Product | Yield |
|---|---|---|---|
| HL7 | 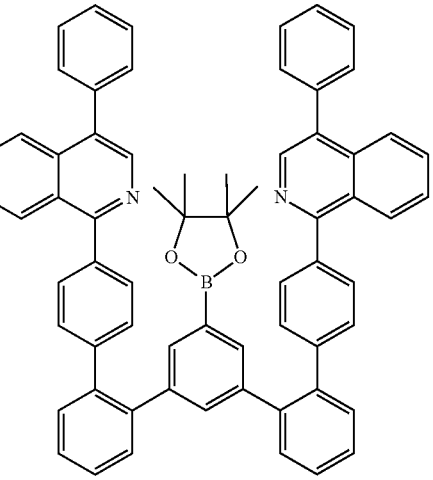<br>2202695-79-0<br>S51 | 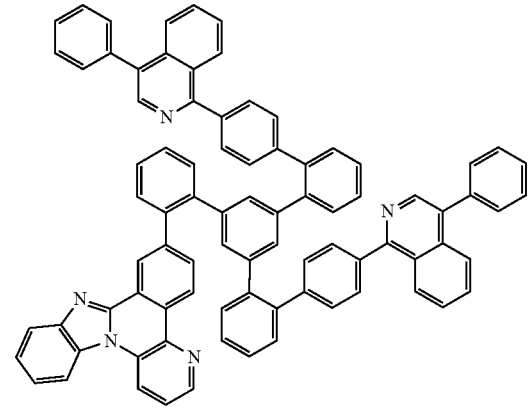 [SMILES: c1ccc(-c2cnc(-c3ccc(-c4ccccc4-c4cc(-c5ccccc5-c5ccc(-c6ncc(-c7ccccc7)c7ccccc67)cc5)cc(-c5ccccc5-c5ccc6c(c5)c5nc7ccccc7n5c5cccnc65)c4)cc3)c3ccccc23)cc1] | 73% |
| HL8 | 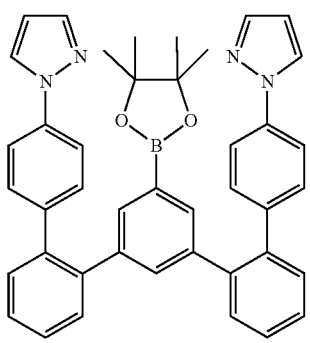<br>2245948-39-2<br>S52 | 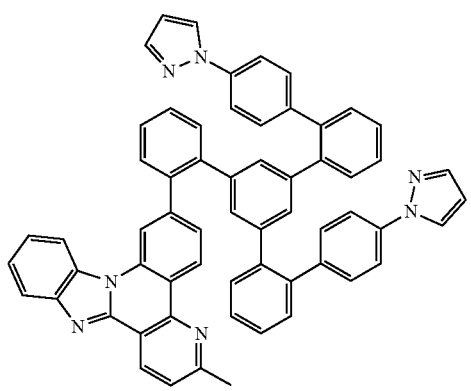 [SMILES: Cc1ccc2c(n1)c1ccc(-c3ccccc3-c3cc(-c4ccccc4-c4ccc(-n5cccn5)cc4)cc(-c4ccccc4-c4ccc(-n5cccn5)cc4)c3)cc1n1c3ccccc3nc21] | 70% |
| HL9 | 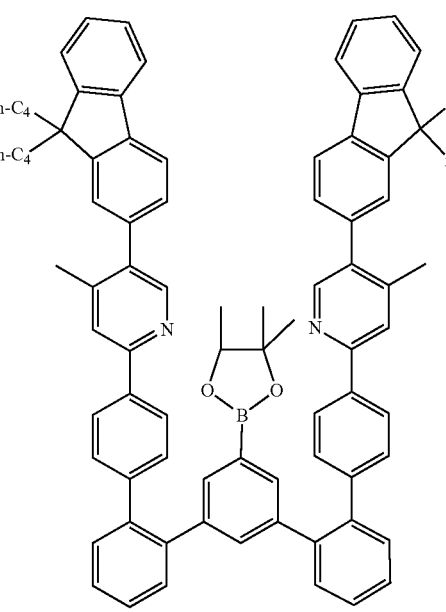<br>S52 | 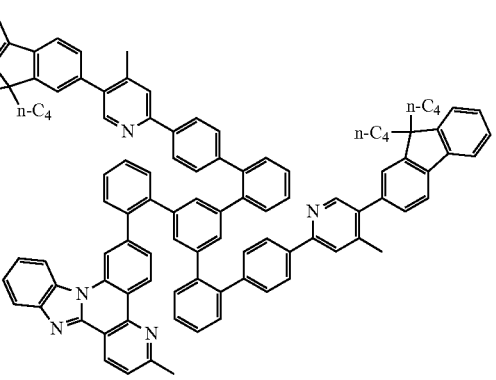 | 59% |

| Ex. | Reactants | Product | Yield |
|---|---|---|---|
| HL10 | 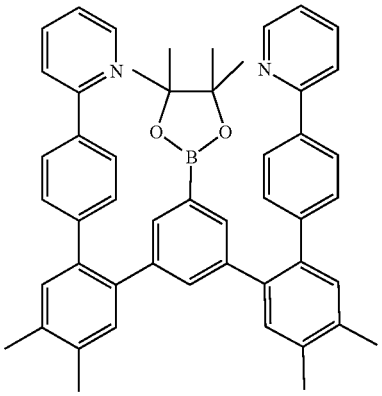 2202713-29-7 S53 | 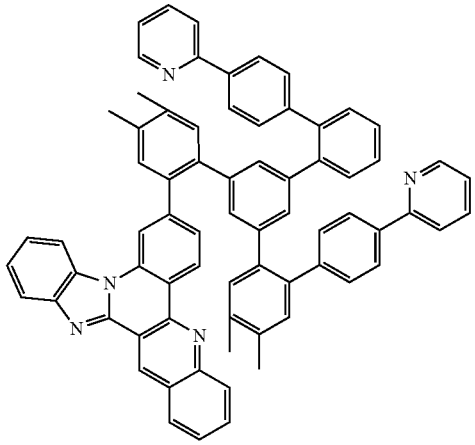 [SMILES: Cc1cc(-c2ccc(-c3ccccn3)cc2)c(-c2cc(-c3ccccc3-c3ccc(-c4ccccn4)cc3)cc(-c3cc(C)c(C)cc3-c3ccc4c5nc6ccccc6cc5c5nc6ccccc6n5c4c3)c2)cc1C] | 69% |

C Synthesis of the Metal Complexes

1) Synthesis of the Homoleptic Iridium Complexes of the IrL₃ Type: Homoleptic Tris-Facial Iridium Complexes Variant A: Tris(Acetylacetonato)Iridium(III) as Iridium Reactant A mixture of 10 mmol of tris(2,2,6,6-tetramethyl-3,5-heptanedionato)iridium (III) [99581-86-9] and 60 mmol of ligand L is sealed into a 50 ml glass ampoule by melting under reduced pressure ($10^{-5}$ mbar). The ampoule is heated at the temperature specified for the time specified, in the course of which the molten mixture is stirred with the aid of a magnetic stirrer. A high-boiling alkane, e.g. octadecane, is added if appropriate. After cooling (CAUTION: the ampoules are usually under pressure!), the ampoule is opened, and the sinter cake is stirred and mechanically digested with 100 g of glass beads (diameter 3 mm) in 100 ml of the suspension medium specified. The fine suspension is decanted off from the glass beads, the solids are filtered off with suction and dried under reduced pressure. The solids are dissolved in dichloromethane, sorbed onto Isolute SI (from Biotage) and then subjected to column chromatography on silica gel with dichloromethane. Further purification is effected by repeated hot extraction. The solids are placed atop a 5 cm alumina bed (alumina, basic activity level 1) and then extracted with the extractant specified (amount initially charged about 500 ml). The solids from the suspensions thus obtained are filtered off with suction, washed once with about 50 ml of methanol and dried. After drying, the purity of the metal complex is determined by means of NMR and/or HPLC. If the purity is below 99.5%, the hot extraction step is repeated. Once the purity of 99.5%-99.9% has been attained, the metal complex is heat-treated or sublimed. The heat treatment is effected under high vacuum (p about $10^{-6}$ mbar) within the temperature range of 200-350° C. The sublimation is effected under high vacuum (p about $10^{-6}$ mbar) within the temperature range of about 320 to about 450° C., the sublimation preferably being conducted in the form of a fractional sublimation.

| Ex. | Ligand L | Ir complex | Reaction temp./ reaction time Suspension medium Extractant | Yield |
|---|---|---|---|---|
| Ir(L1)₃ | 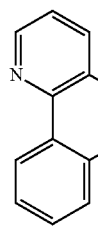 1613217-01-8 L1 | 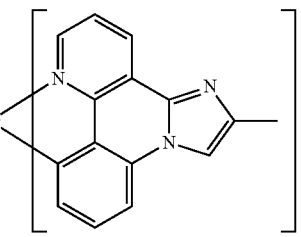 | 240° C. 30 h acetonitrile DCM/acetonitrile 2/1 (vv) | 16% |

| Ex. | Ligand L | Ir complex | Reaction temp./ reaction time Suspension medium Extractant | Yield |
|---|---|---|---|---|
| Ir(L2)$_3$ | 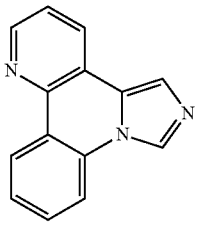<br>1247031-85-1<br>L2 | 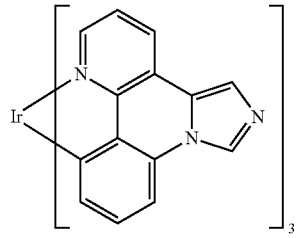 | 230° C.<br>40 h<br>acetonitrile<br>DCM/acetonitrile<br>3/1 (vv) | 24% |
| Ir(L3)$_3$ | 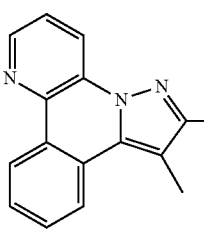<br>2010992-87-4<br>L3 | 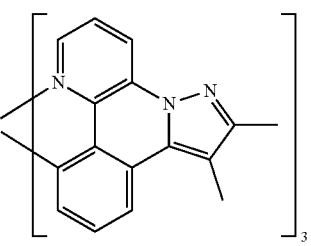 | 240° C.<br>30 h<br>ethyl acetate<br>DCM/acetonitrile<br>2/1 (vv) | 19% |
| Ir(L4)$_3$ | 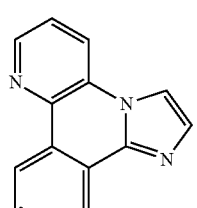<br>370884-26-7<br>L4 | 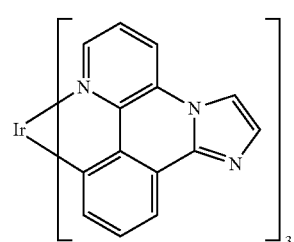 | 230° C.<br>20 h<br>acetonitrile<br>DCM/acetonitrile<br>3/1 (vv) | 12% |

2) Synthesis of the Heteroleptic Iridium Complexes of the L'$_2$IrL Type

To a well-stirred suspension of 5 mmol of the specified iridium reactant of the [L$_2$IrCl]$_2$ type, 10 mmol of ligand L and 50 g of glass beads (diameter 3 mm) in 200 ml of 1,2-dichloromethane are added 60 mmol of triethylamine and then 10 mmol of silver trifluoromethanesulfonate, and the mixture is stirred at 90° 0 for 24 h. While the mixture is still warm, the precipitated silver chloride is filtered off using a silica gel bed in the form of a slurry, which is washed through with a little 1,2-dichloroethane, and the filtrate is concentrated to dryness. Subsequently, the crude product is chromatographed on silica gel (eluent: dichloromethane, toluene, ethyl acetate, acetone, THF, cyclohexane, n-heptane, etc.; and/or mixtures thereof). Further purification is effected as described under 1) by repeated hot extraction and heat treatment or fractional sublimation under high vacuum.

| Ex. | Ligand Iridium reactant L | Ir complex | Yield |
|---|---|---|---|
| Ir1 | 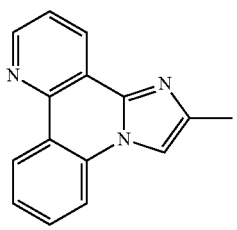<br>1613217-01-8 | 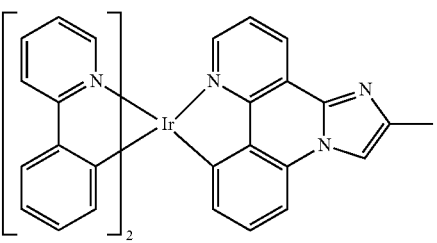 | 32% |

-continued

| Ex. | Ligand<br>Iridium reactant<br>L | Ir complex | Yield |
|---|---|---|---|
| | 603109-48-4 | | |
| Ir2 | 2010992-87-4 | | 29% |
| | 391611-77-1 | | |
| Ir3 | 259751-02-5 | | 34% |

-continued

| Ex. | Ligand<br>Iridium reactant<br>L | Ir complex | Yield |
|---|---|---|---|
| | 1011724-97-2 | | |
| Ir4 | 367954-96-9 | | 30% |
| | 1216857-33-8 | | |
| Ir5 | 2252356-04-8 | | 26% |

| Ex. | Ligand<br>Iridium reactant<br>L | Ir complex | Yield |
|---|---|---|---|
| | 1528723-21-8 | | |
| Ir6 | 1418298-54-0 | | 31% |
| | 1801622-72-9 | | |

| Ex. | Ligand<br>Iridium reactant<br>L | Ir complex | Yield |
|---|---|---|---|
| Ir7 | 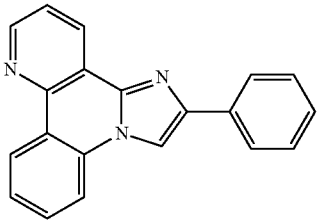<br>367954-97-0<br>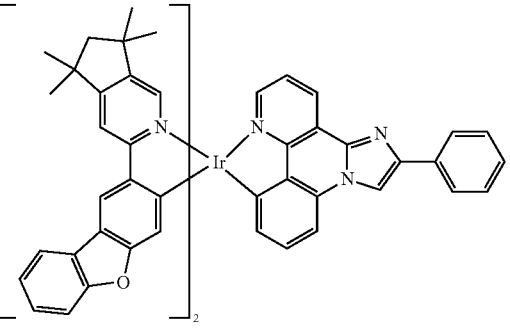<br>1562423-12-4 | 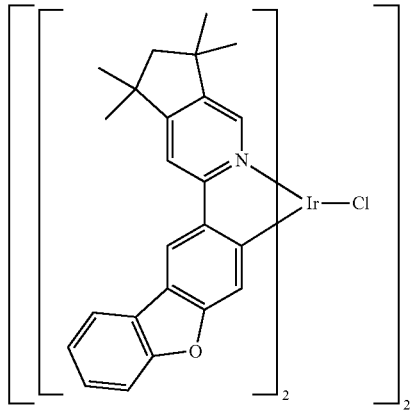 | 35% |
| Ir8 | 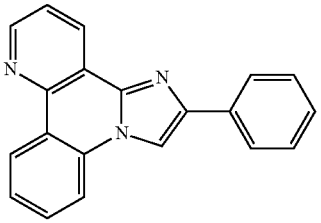<br>367954-97-0<br>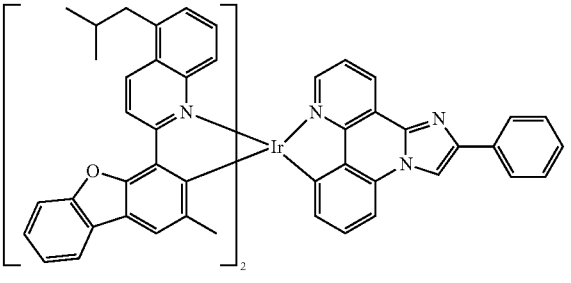<br>2226129-26-4 | 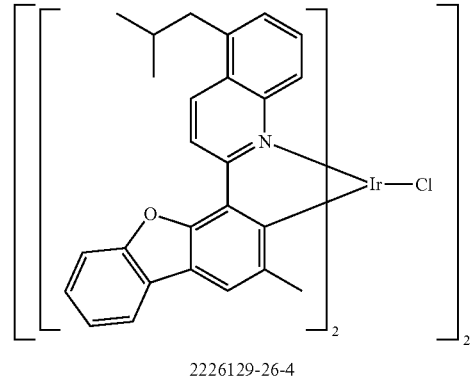 | 38% |

3) Synthesis of the Pt Complexes with Tetradentate Ligands of the Pt(TL) Type

A mixture of 10 mmol of ligand L, 10 mmol of $K_2PtCl_4$, 400 mmol of lithium acetate (anhydrous) and 200 ml of glacial acetic acid is heated to 150° C. in a stirred autoclave for 60 h. After cooling and adding 200 ml of water, the precipitated solids are filtered off, and these are twice extracted by stirring in 200 ml of hot ethanol/water (1:1 vv), filtered off with suction and washed through three times with 50 ml each time of ethanol. Subsequently, the crude product is chromatographed on silica gel (eluent: dichloromethane, toluene, ethyl acetate, acetone, THF, cyclohexane, n-heptane, etc.; and/or mixtures thereof). Further purification is effected as described under 1) by repeated hot extraction and heat treatment or fractional sublimation under high vacuum.

| Ex. | Reactant | Product | Yield |
|---|---|---|---|
| Pt(TL1) | TL1 | | 40% |
| Pt(TL2) | TL2 | | 36% |
| Pt(TL3) | TL3 | | 39% |

| Ex. | Reactant | Product | Yield |
|---|---|---|---|
| Pt(TL4) | TL4 | | 41% |
| Pt(TL5) | TL5 | | 35% |

4) Synthesis of the Iridium Complexes with Hexadentate Ligands of the Ir(HL) Type A mixture of 10 mmol of ligand HL, 4.90 g (10 mmol) of trisacetylacetonatoiridium(III) [15635-87-7] and 120 g of hydroquinone[123-31-9] is initially charged in a 1000 ml two-neck round-bottom flask with a glass-sheathed magnetic bar. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer bar. Then the apparatus is thermally insulated with several loose windings of domestic aluminum foil, the insulation being run up to the middle of the riser tube of the water separator. Then the apparatus is heated rapidly with a heated laboratory stirrer system to 250-255° C., measured with the Pt-100 temperature sensor which dips into the molten stirred reaction mixture. Over the next 2 h, the reaction mixture is kept at 250-255° C., in the course of which a small amount of condensate is distilled off and collects in the water separator. After 2 h, the mixture is allowed to cool down to 190° C., the heating bath is removed and then 100 ml of ethylene glycol are added dropwise. After cooling to 100° C., 400 ml of methanol are slowly added dropwise. The yellow suspension thus obtained is filtered through a double-ended frit, and the yellow solids are washed three times with 50 ml of methanol and then dried under reduced pressure. Crude yield: quantitative. The solids thus obtained are dissolved in 200-500 ml of dichloromethane and filtered through about 1 kg of silica gel in the form of a dichloromethane slurry (column diameter about 18 cm) with exclusion of air in the dark, leaving dark-colored components at the start. The core fraction is cut out and concentrated on a rotary evaporator, with simultaneous continuous dropwise addition of MeOH until crystallization. After filtration with suction, washing with a little MeOH and drying under reduced pressure, the orange product is purified further by continuous hot extraction four times with dichloromethane/isopropanol 1:1 (vv) and then hot extraction four times with dichloromethane/acetonitrile (amount initially charged in each case about 200 ml, extraction thimble: standard Soxhlet thimbles made of cellulose from Whatman) with careful exclusion of air and light. The loss into the mother liquor can be adjusted via the ratio of dichloromethane (low boilers and good dissolvers): isopropanol or acetonitrile (high boilers and poor dissolvers). It should typically be 3-6% by weight of the amount used. Hot extraction can also be accomplished using other solvents such as toluene, xylene, ethyl acetate, butyl acetate, etc. Finally, the product is subjected to fractional sublimation or heat treatment under high vacuum at $p\sim10^{-6}$ mbar and $T\sim350\text{-}430°$ C. Purity typically >99.7%.

| Ex. | Reactant | Product | Yield |
|---|---|---|---|
| Ir(HL1) | HL1 | 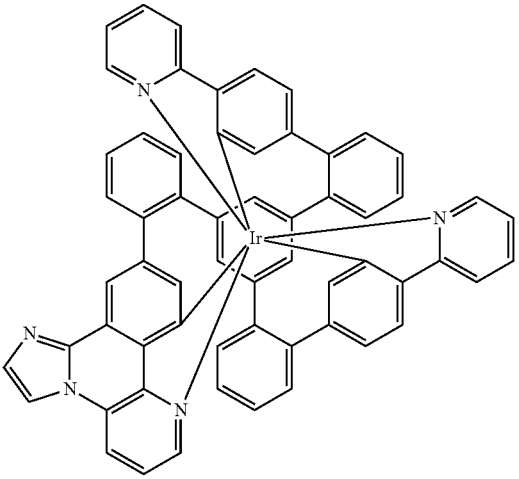 | 55% |
| Ir(HL2) | HL2 | 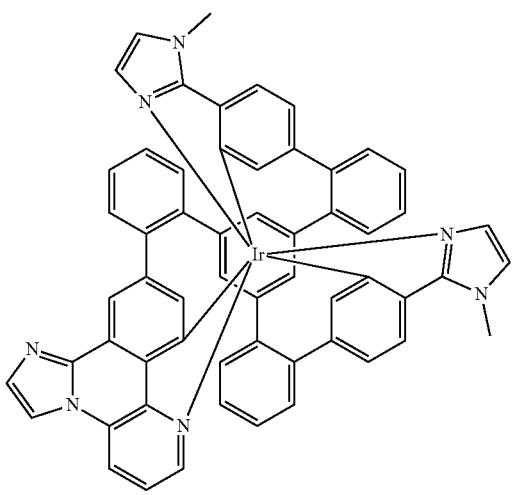 | 57% |
| Ir(HL3) | HL3 | 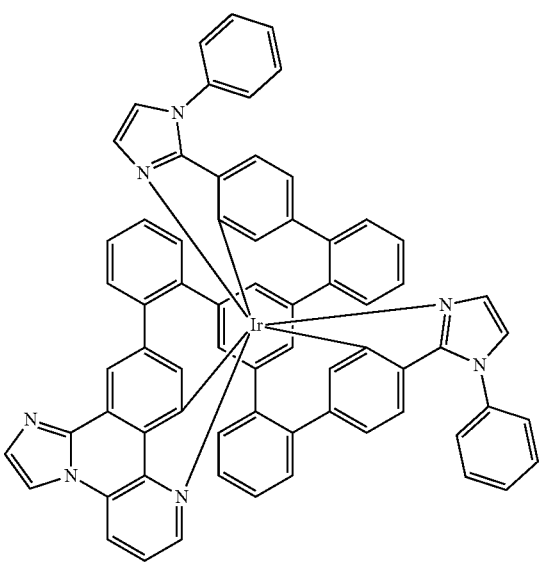 | 48% |

-continued

| Ex. | Reactant | Product | Yield |
|---|---|---|---|
| Ir(HL4) | HL4 | | 56% |
| Ir(HL5) | HL5 | | 53% |
| Ir(HL6) | HL6 | | 41% |

-continued

| Ex. | Reactant | Product | Yield |
|---|---|---|---|
| Ir(HL7) | HL7 | | 47% |
| Ir(HL8) | HL8 | | 57% |
| Ir(HL9) | HL9 | | 40% |

-continued

| Ex. | Reactant | Product | Yield |
|---|---|---|---|
| Ir(HL10) | HL10 | | 45% |

Example: Production of the OLEDs

1) Vacuum-Processed Devices

OLEDs of the invention and OLEDs according to the prior art are produced by a general method according to WO 2004/058911, which is adapted to the circumstances described here (variation in layer thickness, materials used). In the examples which follow, the results for various OLEDs are presented. Cleaned glass plates (cleaning in Miele laboratory glass washer, Merck Extran detergent) coated with structured ITO (indium tin oxide) of thickness 50 nm are pretreated with UV ozone for 25 minutes (PR-100 UV ozone generator from UVP) and, within 30 min, for improved processing, coated with 20 nm of PEDOT:PSS (poly(3,4-ethylenedioxythiophene) poly(styrenesulfonate), purchased as CLEVIOS™ P VP AI 4083 from Heraeus Precious Metals GmbH Deutschland, spun on from aqueous solution) and then baked at 180° C. for 10 min. These coated glass plates form the substrates to which the OLEDs are applied.

The OLEDs basically have the following layer structure: substrate/hole injection layer 1 (HIL1) consisting of HTM1 doped with 5% NDP-9 (commercially available from Novaled), 20 nm/hole transport layer 1 (HTL1) consisting of HTM1, 220 nm for green/yellow devices, 110 nm for red devices/hole transport layer 2 (HTL2)/emission layer (EML)/hole blocker layer (HBL)/electron transport layer (ETL)/optional electron injection layer (EIL) and finally a cathode. The cathode is formed by an aluminum layer of thickness 100 nm.

First of all, vacuum-processed OLEDs are described. For this purpose, all the materials are applied by thermal vapor deposition in a vacuum chamber. In this case, the emission layer always consists of at least one matrix material (host material) and an emitting dopant (emitter) which is added to the matrix material(s) in a particular proportion by volume by co-evaporation. Details given in such a form as M1:M2:Ir(L1) (55%:35%:10%) mean here that the material M1 is present in the layer in a proportion by volume of 55%, M2 in a proportion by volume of 35% and Ir(L1) in a proportion by volume of 10%. Analogously, the electron transport layer may also consist of a mixture of two materials. The exact structure of the OLEDs can be found in table 2. The materials used for production of the OLEDs are shown in table 4.

The OLEDs are characterized in a standard manner. For this purpose, the electroluminescence spectra, the current efficiency (measured in cd/A), the power efficiency (measured in lm/W) and the external quantum efficiency (EQE, measured in percent) as a function of luminance, calculated from current-voltage-luminance characteristics (IUL characteristics) assuming Lambertian emission characteristics, and also the lifetime are determined. Electroluminescence spectra are determined at a luminance of 1000 cd/m$^2$, and these are used to calculate the CIE 1931 x and y color coordinates. The lifetime LT50 is defined as the time after which the luminance in operation has dropped to 50% of the starting luminance with a starting brightness of 1000 cd/m$^2$.

The OLEDs can initially also be operated at different starting luminances. The values for the lifetime can then be converted to a figure for other starting luminances with the aid of conversion formulae known to those skilled in the art.

Use of Compounds of the Invention as Emitter Materials in Phosphorescent OLEDs

One use of the compounds of the invention is as phosphorescent emitter materials in the emission layer in OLEDs. The results for the OLEDs are collated in table 2.

TABLE 1

Structure of the OLEDs

| Ex. | HTL2 thickness | EML thickness | HBL thickness | ETL Thickness |
|---|---|---|---|---|
| D1 | HTM2 10 nm | M1:M9:Ir(L1)$_3$ (55%:30%:15%) 30 nm | ETM1 10 nm | ETM1:ETM2 (50%:50%) 30 nm |

TABLE 1-continued

Structure of the OLEDs

| Ex. | HTL2 thickness | EML thickness | HBL thickness | ETL Thickness |
|---|---|---|---|---|
| D2 | HTM2 10 nm | M1:M9:Ir(L2)$_3$ (55%:30%:15%) 30 nm | ETM1 10 nm | ETM1:ETM2 (50%:50%) 30 nm |
| D3 | HTM2 10 nm | M1:M2:Ir(L3)$_3$ (55%:30%:15%) 30 nm | ETM1 10 nm | ETM1:ETM2 (50%:50%) 30 nm |
| D4 | HTM2 10 nm | M1:M2:Ir(L4)$_3$ (55%:30%:15%) 30 nm | ETM1 10 nm | ETM1:ETM2 (50%:50%) 30 nm |
| D5 | HTM2 10 nm | M1:M9:Ir1 (55%:35%:10%) 30 nm | ETM1 10 nm | ETM1:ETM2 (50%:50%) 30 nm |
| D6 | HTM2 10 nm | M1:M9:Ir2 (55%:35%:10%) 30 nm | ETM1 10 nm | ETM1:ETM2 (50%:50%) 30 nm |
| D7 | HTM2 10 nm | M1:M2:Ir3 (55%:35%:10%) 30 nm | ETM1 10 nm | ETM1:ETM2 (50%:50%) 30 nm |
| D8 | HTM2 10 nm | M1:M2:Ir4 (50%:40%:10%) 30 nm | ETM1 10 nm | ETM1:ETM2 (50%:50%) 30 nm |
| D9 | HTM2 10 nm | M1:M7:Pt(TL1) (40%:40%:20%) 30 nm | ETM1 10 nm | ETM1:ETM2 (50%:50%) 30 nm |
| D10 | HTM2 10 nm | M1:M9:Pt(TL2) (50%:40%:10%) 30 nm | ETM1 10 nm | ETM1:ETM2 (50%:50%) 30 nm |
| D11 | HTM2 10 nm | M6:Pt(TL3) (90%:10%) 30 nm | ETM1 10 nm | ETM1:ETM2 (50%:50%) 30 nm |
| D12 | HTM2 10 nm | M1:M2:Pt(TL4) (50%:40%:10%) 30 nm | ETM1 10 nm | ETM1:ETM2 (50%:50%) 30 nm |
| D13 | HTM2 10 nm | M1:M9:Ir(HL1) (50%:40%:10%) 30 nm | ETM1 10 nm | ETM1:ETM2 (50%:50%) 30 nm |
| D14 | HTM2 10 nm | M1:M7:Ir(HL2) (40%:40%:20%) 30 nm | ETM1 10 nm | ETM1:ETM2 (50%:50%) 30 nm |
| D15 | HTM2 10 nm | M1:M9:Ir(HL4) (50%:40%:10%) 30 nm | ETM1 10 nm | ETM1:ETM2 (50%:50%) 30 nm |
| D16 | HTM2 10 nm | M1:M9:Ir(HL5) (50%:40%:10%) 30 nm | ETM1 10 nm | ETM1:ETM2 (50%:50%) 30 nm |
| D17 | HTM2 10 nm | M1:M8:Ir(HL8) (60%:30%:10%) 30 nm | ETM1 10 nm | ETM1:ETM2 (50%:50%) 30 nm |
| D18 | HTM2 10 nm | M6:Ir(HL10) (90%:10%) 30 nm | — | ETM1:ETM2 (50%:50%) 30 nm |

TABLE 2

Results for the vacuum-processed OLEDs

| Ex. | EQE (%) 1000 cd/m$^2$ | Voltage (V) 1000 cd/m$^2$ | CIE x/y 1000 cd/m$^2$ | LT50 (h) 1000 cd/m$^2$ |
|---|---|---|---|---|
| D1 | 16.3 | 3.3 | 0.19/0.41 | 10000 |
| D2 | 17.0 | 3.2 | 0.22/0.43 | 15000 |
| D3 | 20.0 | 3.2 | 0.29/0.61 | 200000 |
| D4 | 20.5 | 3.3 | 0.33/0.62 | 220000 |
| D5 | 17.0 | 3.3 | 0.24/0.46 | 20000 |
| D6 | 15.8 | 3.3 | 0.20/0.42 | 15000 |
| D7 | 20.1 | 3.3 | 0.30/0.62 | 230000 |
| D8 | 20.6 | 3.1 | 0.33/0.63 | 210000 |
| D9 | 20.2 | 3.6 | 0.31/0.62 | 200000 |
| D10 | 19.9 | 3.3 | 0.31/0.61 | 190000 |
| D11 | 18.0 | 3.2 | 0.65/0.34 | 300000 |
| D12 | 20.4 | 3.3 | 0.37/0.59 | 250000 |
| D13 | 20.1 | 3.3 | 0.38/0.58 | 260000 |
| D14 | 19.5 | 3.2 | 0.34/0.61 | 220000 |
| D15 | 18.8 | 3.3 | 0.42/0.57 | 210000 |
| D16 | 18.4 | 3.4 | 0.41/0.56 | 260000 |
| D17 | 17.2 | 3.6 | 0.29/0.62 | — |
| D18 | 16.7 | 3.2 | 0.66/0.34 | 300000 |

Solution-Processed Devices

A: From Soluble Functional Materials of Low Molecular Weight

The iridium complexes of the invention may also be processed from solution and lead therein to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport, in this case, HL-X from Merck is used. The interlayer may alternatively also be replaced by one or more layers which merely have to fulfill the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices of type 1 contain an emission layer composed of M4:M5:IrL (20%:58%:22%), and those of type 2 contain an emission layer composed of M4:M5:IrLa:IrLb (30%:34%:29%:7%); in other words, they contain two different Ir complexes. The percent figures in the case of materials processed from solution mean % by weight. The emission layer is spun on in an inert gas atmosphere, argon in the present case, and baked at 160° C. for 10 min. Vapor-deposited above the latter are the hole blocker layer (10 nm ETM1) and the electron transport layer (40 nm ETM1 (50%)/ETM2 (50%)) (vapor deposition systems from Lesker or the like, typical vapor deposition pressure 5×10$^{-6}$ mbar). Finally, a cathode of aluminum (100 nm) (high-purity metal from Aldrich) is applied by vapor deposition. In order to protect the device from air and air humidity, the device is finally encapsulated and then characterized. The OLED examples cited have not yet been optimized. Table 3 summarizes the data obtained. The lifetime LT50 is defined as the time after which the luminance in operation drops to 50% of the starting luminance with a starting brightness of 1000 cd/m².

TABLE 3

Results with materials processed from solution

| Ex. | Emitter Device | EQE (%) 1000 cd/m² | Voltage (V) 1000 cd/m² | CIE x/y | LT50 (h) 1000 cd/m² |
|---|---|---|---|---|---|
| Sol-D1 | Ir5 Type 1 | 16.6 | 4.3 | 0.40/0.56 | 170000 |
| Sol-D2 | Ir6 Type 1 | 17.3 | 4.5 | 0.46/0.52 | 210000 |
| Sol-D3 | Ir7 Type 1 | 19.0 | 4.5 | 0.40/0.58 | 200000 |
| Sol-D4 | Ir5 Ir8 Type 2 | 18.1 | 4.2 | 0.66/0.34 | 260000 |
| Sol-D5 | Pt(TLS) Type 1 | 17.8 | 4.6 | 0.43/0.55 | 290000 |
| Sol-D6 | Ir(HL3) Type 1 | 16.8 | 4.5 | 0.33/0.61 | 220000 |
| Sol-D7 | Ir(HL6) Type 1 | 17.4 | 4.5 | 0.43/0.55 | 250000 |
| Sol-D8 | Ir(HL6) Ir(HL7) Type 2 | 16.8 | 4.2 | 0.66/0.34 | 250000 |
| Sol-D9 | Ir(HL9) Type 1 | 17.8 | 4.5 | 0.36/0.60 | 220000 |

TABLE 4

Structural formulae of the materials used

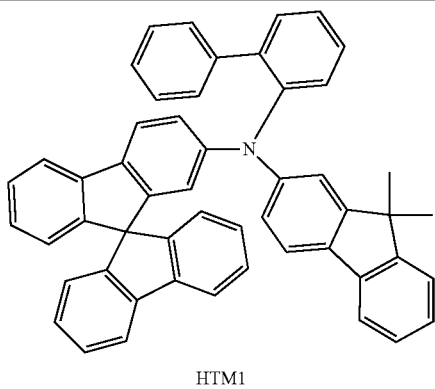

HTM1
[136463-07-5]

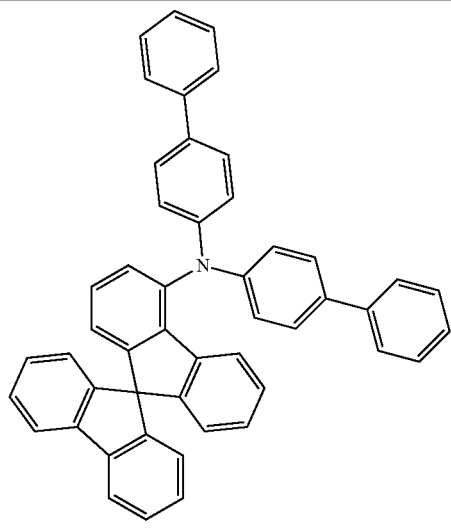

HTM2
[1450933-43-3]

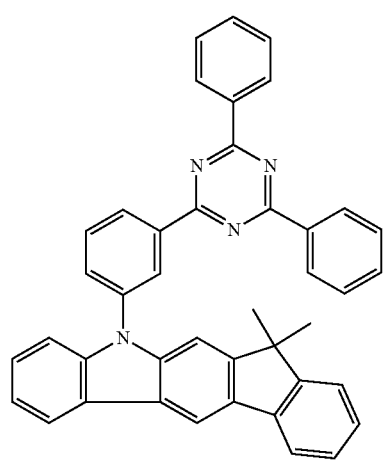

M1
[1257248-13-7]

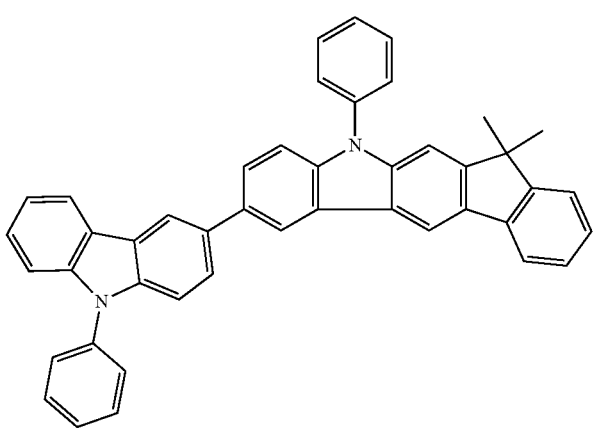

M2
[1357150-54-9]

TABLE 4-continued
Structural formulae of the materials used
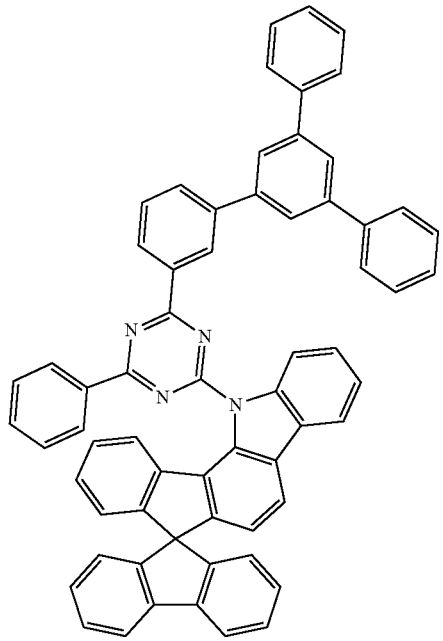
M4
1616231-60-7
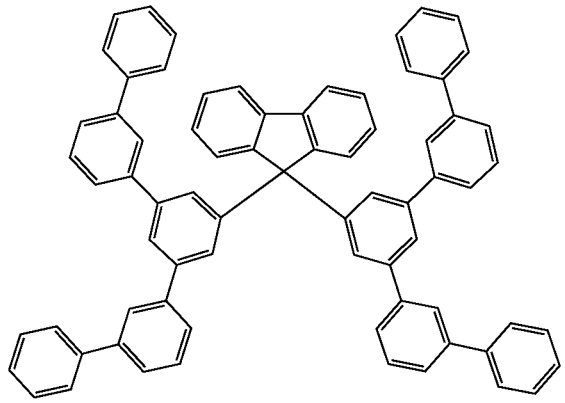
M5
1246496-85-4
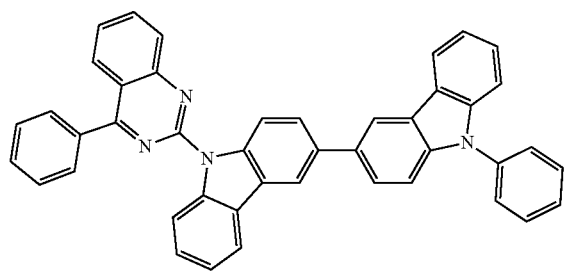
M6
1398395-92-0
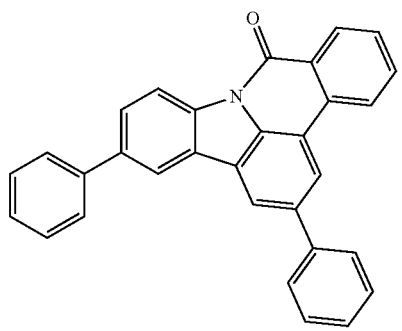
M7
1915695-76-5
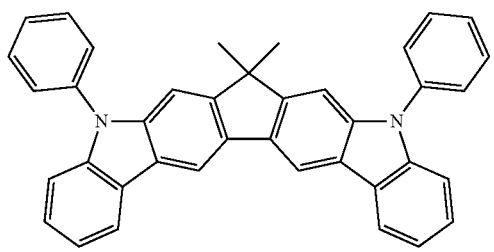
M8
1257248-72-8
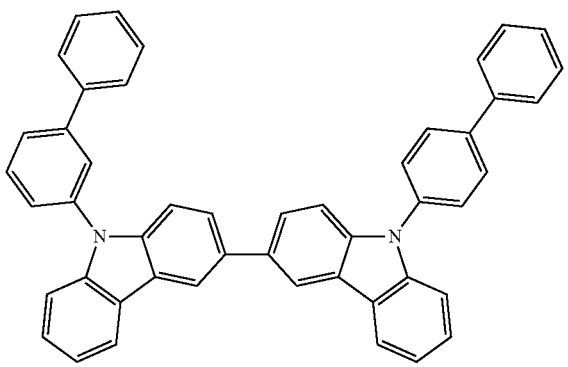
M9
1643479-47-3

TABLE 4-continued

Structural formulae of the materials used

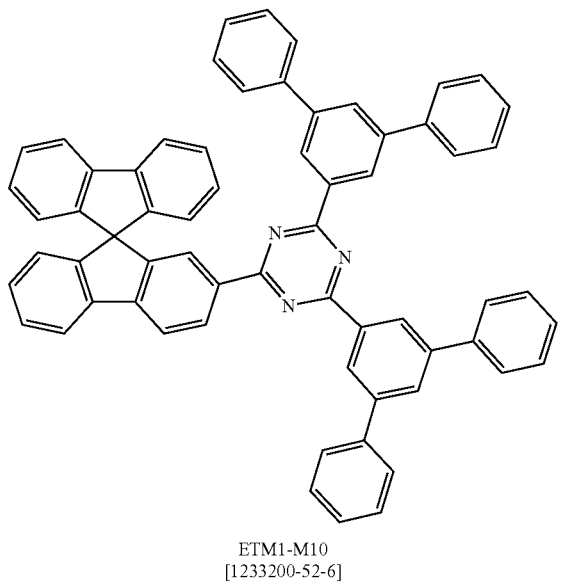 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]

ETM1-M10
[1233200-52-6]

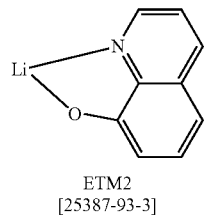

ETM2
[25387-93-3]

Comparison with the Prior Art

The complexes depicted below that have a similar ligand to the complexes of the invention, where the ligands here coordinate via the five-membered ring and a six-membered ring rather than via two six-membered rings in accordance with the invention, are known from US 2012/0153816.

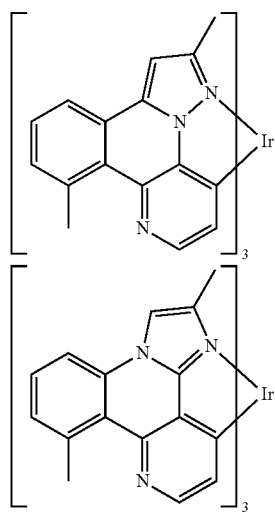

For the two complexes, CIE color coordinates of CIE x/y 0.19/0.28 are reported. The complexes that coordinate to the iridium via one five-membered and one six-membered ring thus show blue emission, whereas the complexes of the invention show green, yellow or red emission.

The invention claimed is:
1. A compound of formula (1)

$$M(L)_n(L')_m \quad \text{Formula (1)}$$

containing a substructure $M(L)_n$ of the formula (2):

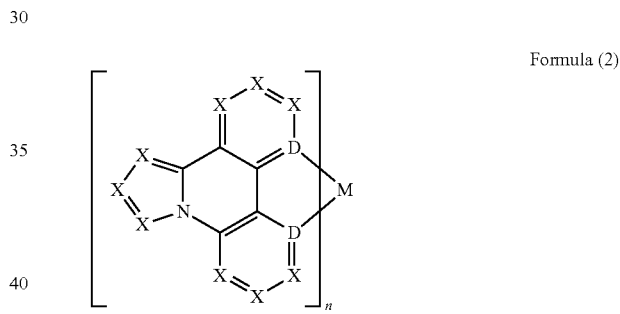

Formula (2)

where the symbols and indices used are as follows:
M is iridium or platinum;
D is C or N, where one D is C and the other D is N;
X is the same or different at each instance and is CR or N;
R is the same or different at each instance and is H, D, F, Cl, Br, I, $N(R^1)_2$, CN, $NO_2$, $OR^1$, $SR^1$, $COOR^1$, $C(=O)N(R^1)_2$, $Si(R^1)_3$, $B(OR^1)_2$, $C(=O)R_1$, $P(=O)(R^1)_2$, $S(=O)R^1$, $S(=O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals, where one or more nonadjacent $CH_2$ groups may be replaced by $Si(R^1)_2$, $C=O$, $NR^1$, O, S or $CONR^1$, or an aromatic or heteroaromatic ring system which has 5 to 60 aromatic ring atoms, preferably 5 to 40 aromatic ring atoms, and may be substituted in each case by one or more $R^1$ radicals; optionally, two R radicals together may form an aliphatic, heteroaliphatic, aromatic or heteroaromatic ring system;
$R^1$ is the same or different at each instance and is H, D, F, Cl, Br, I, $N(R^2)_2$, CN, $NO_2$, $OR^2$, $SR^2$, $Si(R^2)_3$, $B(OR^2)_2$, $C(=O)R^2$, $P(=O)(R^2)_2$, $S(=O)_2R^2$, S(=O)$_2$R$^2$, OSO$_2$R$^2$, a straight chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may each be substituted by one or more R$^2$ radicals, where one or more non-adjacent CH$_2$ groups may be replaced by Si(R$^2$)$_2$, C=O, NR$^2$, O, S or CONR$^2$ and where one or more hydrogen atoms in the alkyl, alkenyl or alkynyl group may be replaced by D, F, Cl, Br, I or CN, or an aromatic or heteroaromatic ring system which has 5 to 40 aromatic ring atoms and may be substituted in each case by one or more R$^2$ radicals; optionally, two or more R$^1$ radicals together may form an aliphatic, heteroaliphatic, aromatic or heteroaromatic ring system;

R$^2$ is the same or different at each instance and is H, D, F, CN or an aliphatic, aromatic or heteroaromatic organic radical, in which one or more hydrogen atoms may also be replaced by F;

L' is the same or different at each instance and is a ligand;

n is 1, 2 or 3;

m is 0, 1, 2, 3 or 4;

optionally, L and one or more of L and L' may join together by a single bond or a bivalent or trivalent bridge, thus forming a tridentate, tetradentate, pentadentate or hexadentate ligand system.

2. The compound as claimed in claim 1, wherein the unit of the formula (2) is selected from the structures of the formula (3)

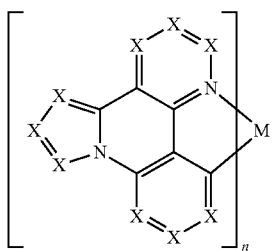

Formula (3)

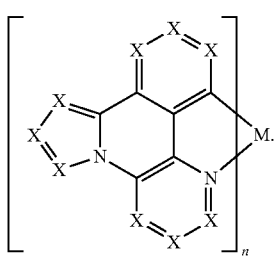

Formula (4)

3. The compound as claimed in claim 1, wherein the unit of the formula (2) is selected from the structures of the formulae (3a) to (3f) and (4a) to (4f),

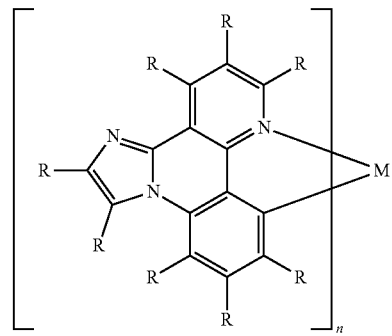

Formula (3a)

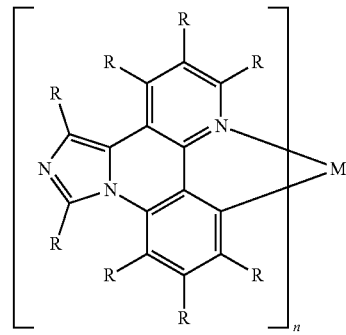

Formula (3b)

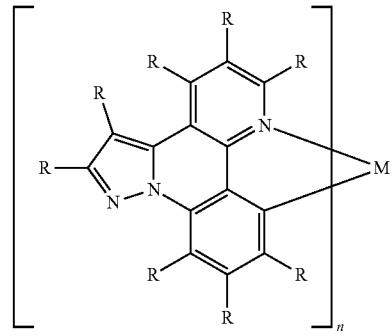

Formula (3c)

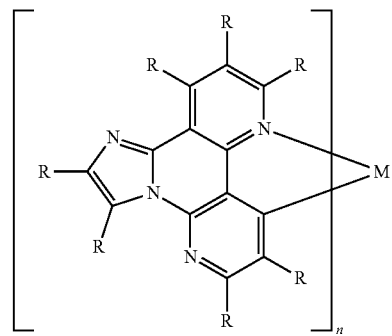

Formula (3d)

Formula (3e)
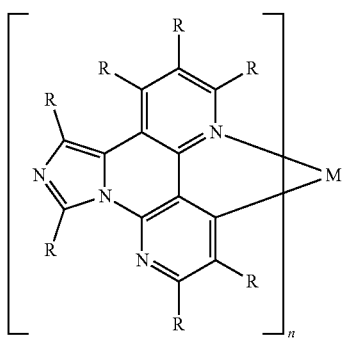
Formula (3f)
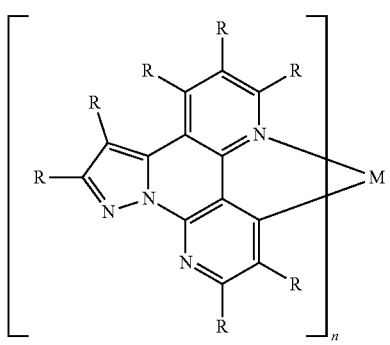
Formula (4a)
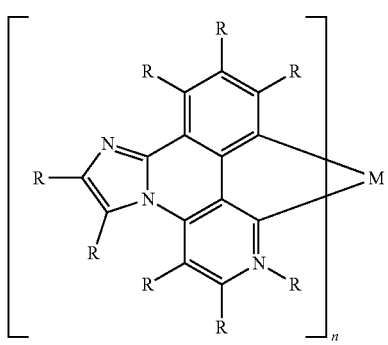
Formula (4b)
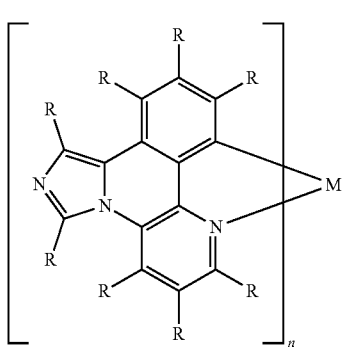
Formula (4c)
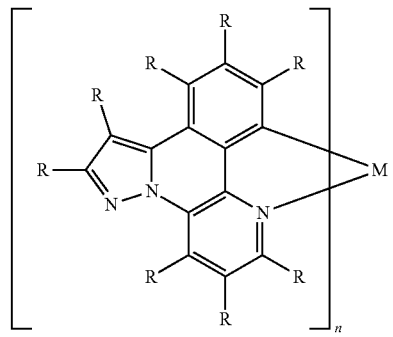
Formula (4d)
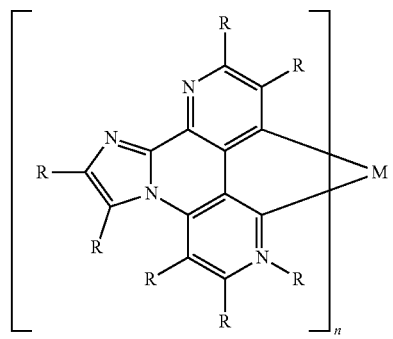
Formula (4e)
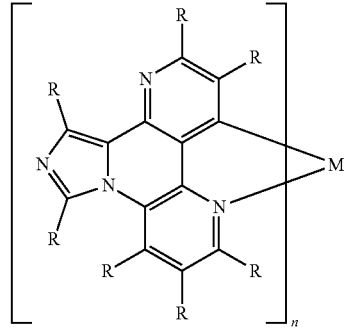
Formula (4f)
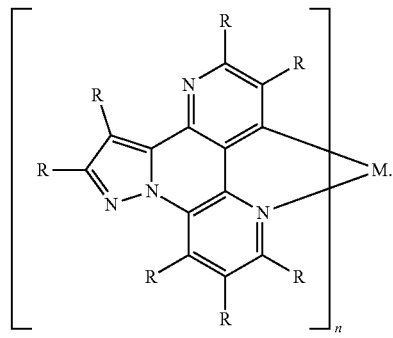

4. The compound as claimed in claim 1, wherein the unit of the formula (2) is selected from the structures of the formulae (3a-1) to (4f-1):
Formula (3a-1)
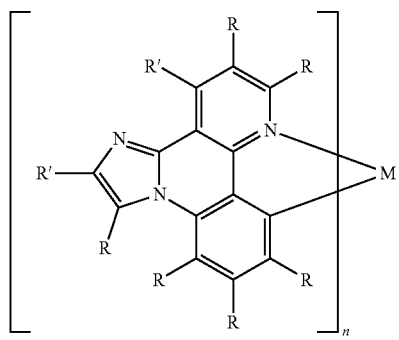
Formula (3b-1)
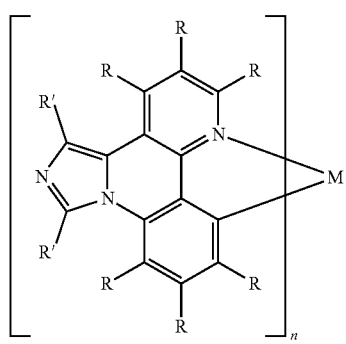
Formula (3c-1)
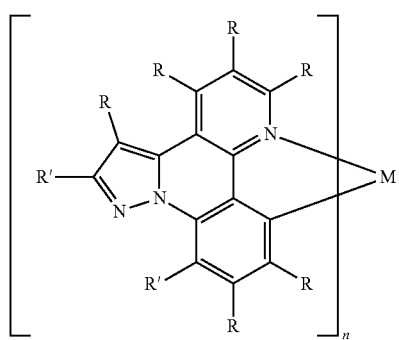
Formula (4a-1)
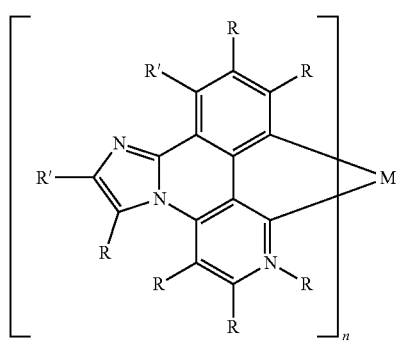
-continued
Formula (4b-1)
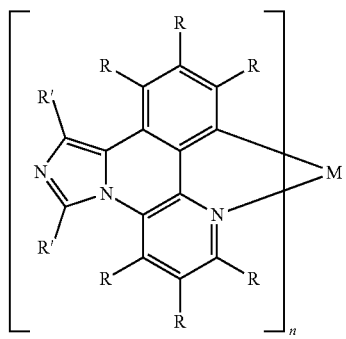
Formula (4c-1)
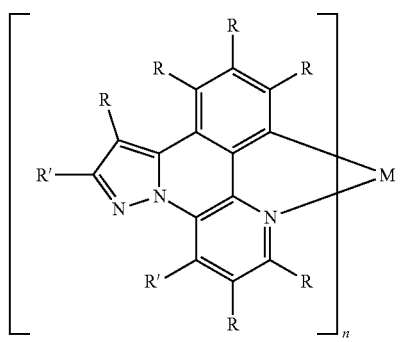
Formula (4d-1)
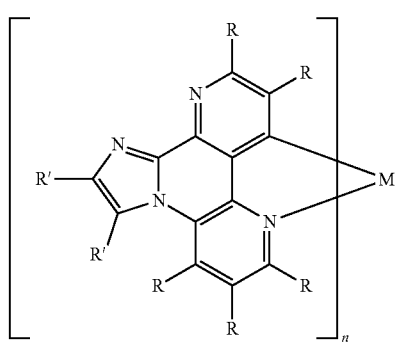
Formula (4e-1)
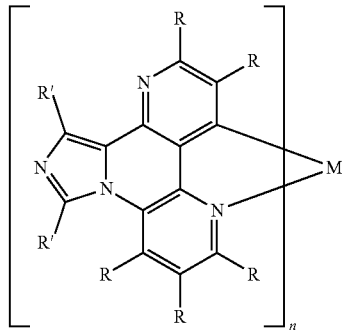

Formula (4f-1)
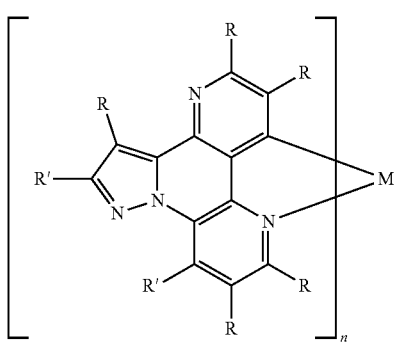
where R' has the same definitions as R, where at least one substituent R' is not H or D.
5. The compound as claimed in claim 1, wherein the unit of the formula (2) is selected from the structures of the formulae (3a-2) to (4a-6):
Formula (3a-2)
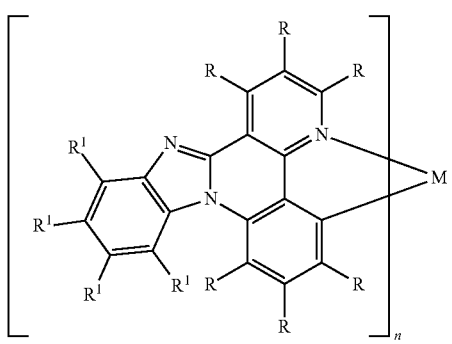
Formula (4a-2)
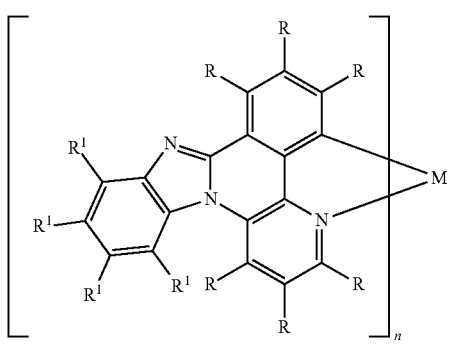
Formula (3a-3)
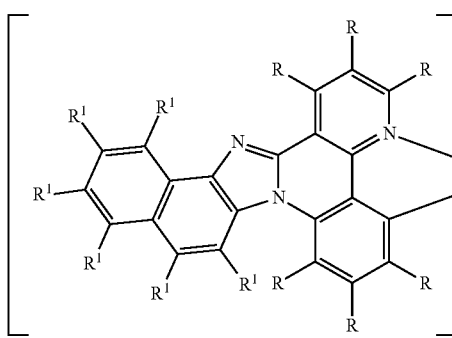
Formula (4a-3)
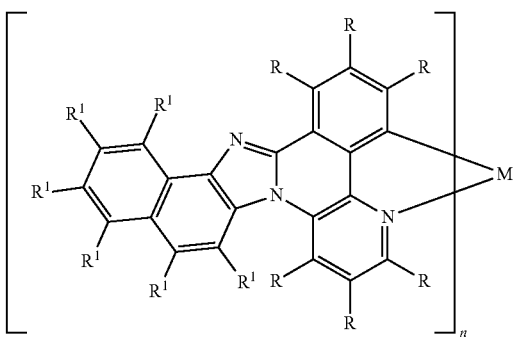
Formula (3a-4)
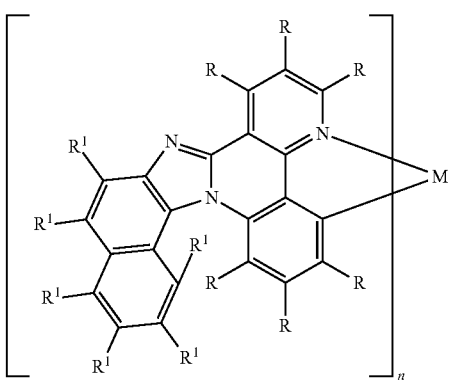
Formula (4a-4)
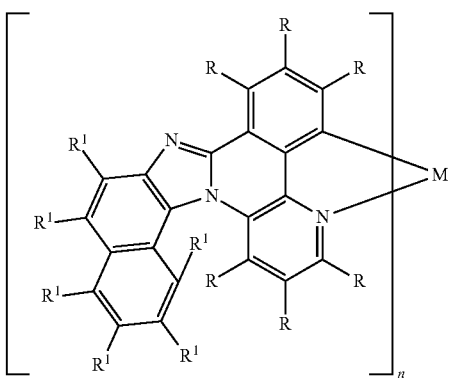
Formula (3a-5)
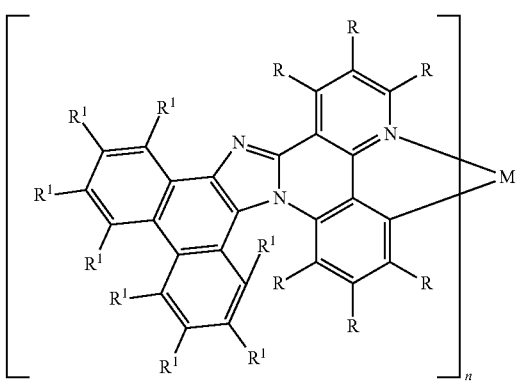

-continued

Formula (4a-5)

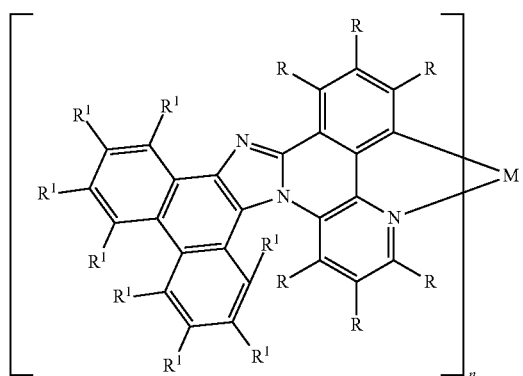

Formula (3a-6)

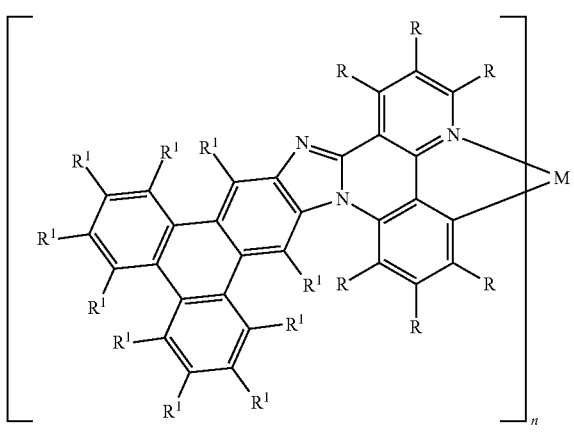

Formula (4a-6)

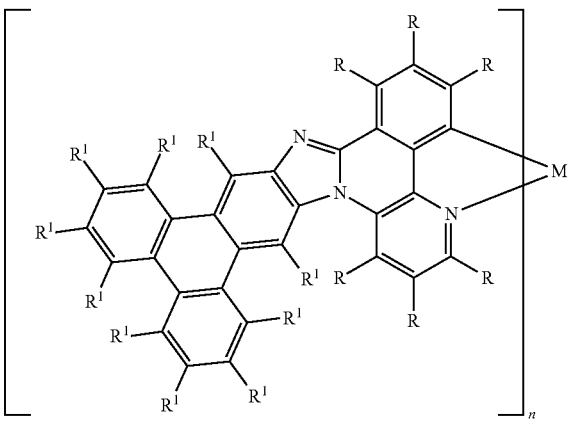

6. The compound as claimed in claim 1, wherein R is the same or different at each instance and is selected from the group consisting of H, D, F, Br, I, $N(R^1)_2$, CN, $Si(R^1)_3$, $B(OR^1)_2$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, where one or more hydrogen atoms may be replaced by D or F, or an aromatic or heteroaromatic ring system which has 5 to 24 aromatic ring atoms and may be substituted in each case by one or more $R^1$ radicals; optionally, two adjacent R radicals together may form an aliphatic, heteroaliphatic, aromatic or heteroaromatic ring system.

7. The compound as claimed in claim 1, wherein the compound is selected from the structures of the formulae (12) to (15):

Formula (12)

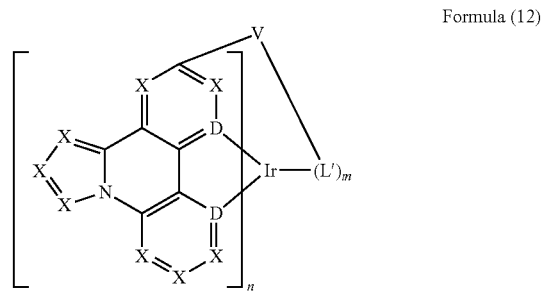

Formula (13)

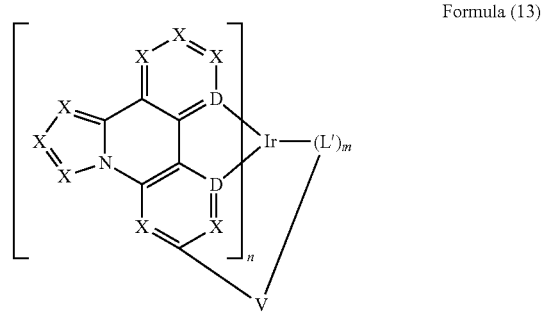

Formula (14)

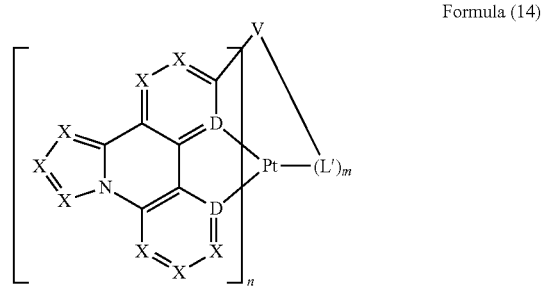

Formula (15)

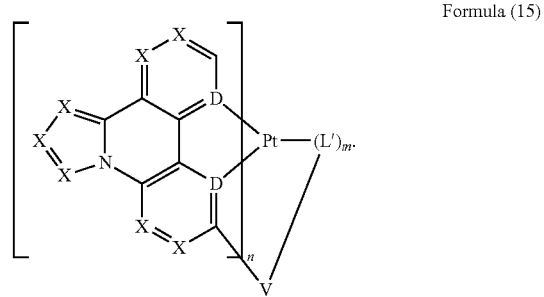

8. The compound as claimed in claim 7, wherein V in the compounds of the formulae (12) and (13) is a group of the formula (26), where the dotted bonds represent the position of the linkage of the sub-ligands L and L':

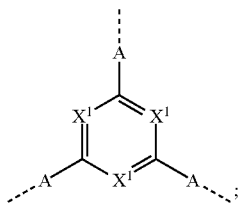

Formula (26)

where:
X¹ is the same or different at each instance and is CR or N;
X² is the same or different at each instance and is CR or N;
A is the same or different at each instance and is $CR_2$—$CR_2$, $CR_2$—O, $CR_2$—NR, C(=O)—O, C(=O)—NR or a group of the following formula (27):

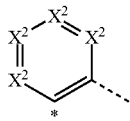

Formula (27)

where the dotted bond in each case represents the position of the bond of the bidentate sub-ligands L or L' to this structure, * represents the position of the linkage of the unit of the formula (27) to the central trivalent aryl or heteroaryl group.

9. The compound as claimed in claim 7, wherein V in the compounds of the formulae (12) and (13) represents a structure of one of the formulae (36) to (39):

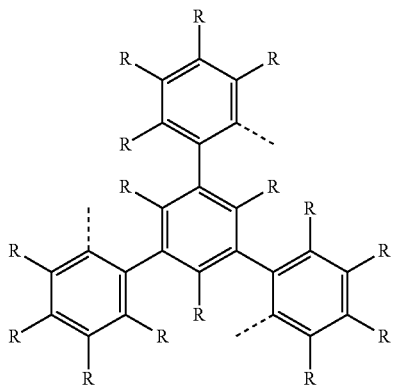

Formula (36)

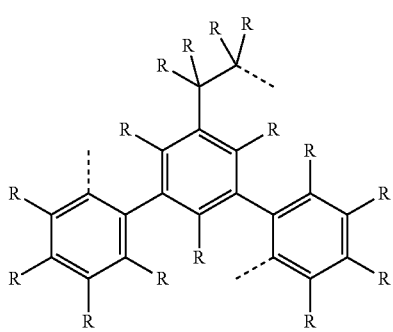

Formula (37)

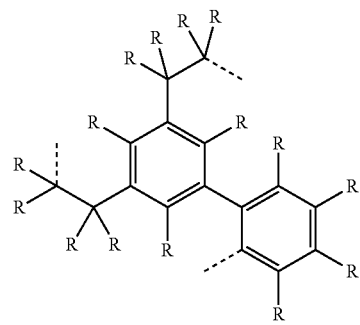

Formula (38)

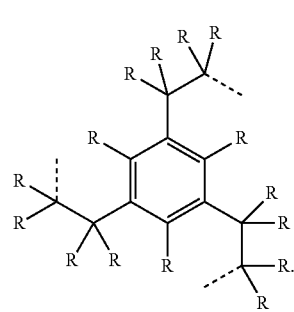

Formula (39)

10. The compound as claimed in claim 1, wherein L' is the same or different at each instance and is a bidentate monoanionic ligand.

11. A process for preparing the compound as claimed in claim 1 which comprises reacting the ligands L and optionally L' with metal alkoxides of the formula (79), with metal ketoketonates of the formula (80), with metal halides of the formula (81), with dimeric metal complexes of the formula (82) or with metal complexes of the formula (83):

Formula (79)

M(OR)$_n$

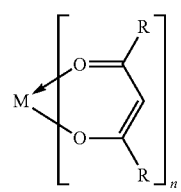

Formula (80)

Formula (81)

MHal$_n$

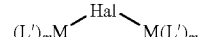

Formula (82)

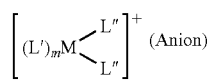

Formula (83)

where Hal=F, Cl, Br or I, L" is an alcohol or a nitrile and (Anion) is a non-coordinating anion.

12. A formulation comprising at least one compound as claimed in claim 1 and at least one further compound and/or at least one solvent.

13. An electronic device comprising at least one compound as claimed in claim 1.

14. An organic electroluminescent device which comprises the compound as claimed in claim 1 is used as an emitting compound in one or more emitting layers in combination with one or more matrix materials.

* * * * *

UNITED STATES PATENT AND TRADEMARK OFFICE
CERTIFICATE OF CORRECTION

PATENT NO. : 12,250,871 B2
APPLICATION NO. : 17/603704
DATED : March 11, 2025
INVENTOR(S) : Philipp Stoessel et al.

Page 1 of 2

It is certified that error appears in the above-identified patent and that said Letters Patent is hereby corrected as shown below:

In the Claims

The structure in Claim 3 at Column 295, Line 35 - Line 50, should read as follows:

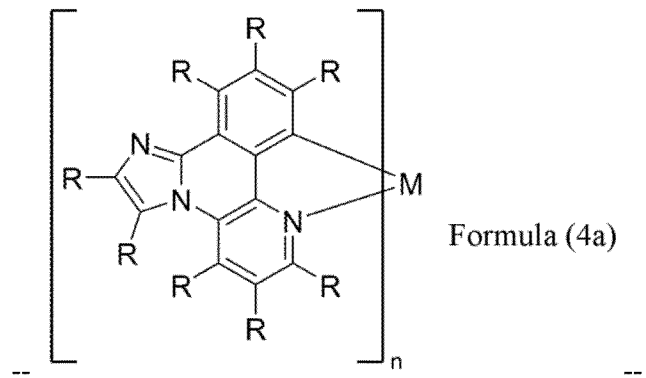 Formula (4a)

The structure in Claim 3 at Column 296, Line 20 - Line 33, should read as follows:

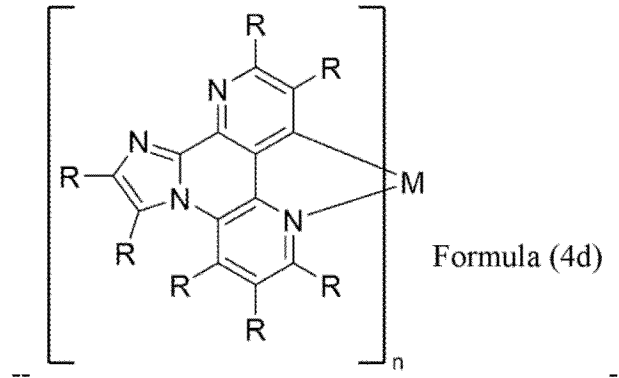 Formula (4d)

Signed and Sealed this
Twenty-seventh Day of May, 2025

Coke Morgan Stewart
*Acting Director of the United States Patent and Trademark Office*

CERTIFICATE OF CORRECTION (continued)
U.S. Pat. No. 12,250,871 B2

The structure in Claim 4 at Column 297, Line 50 - Line 66, should read as follows:

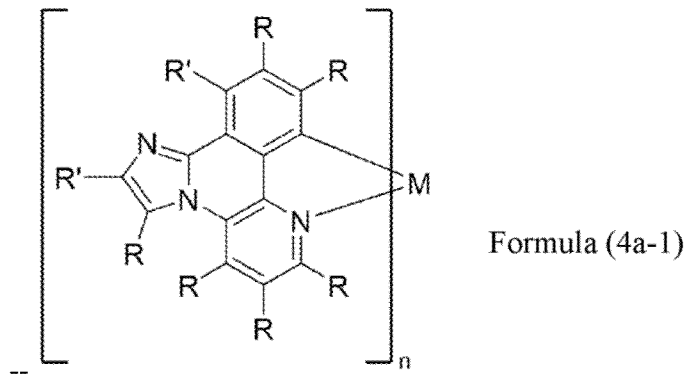

Formula (4a-1)

The structure in Claim 7 at Column 302, Line 50 - Line 62, should read as follows:

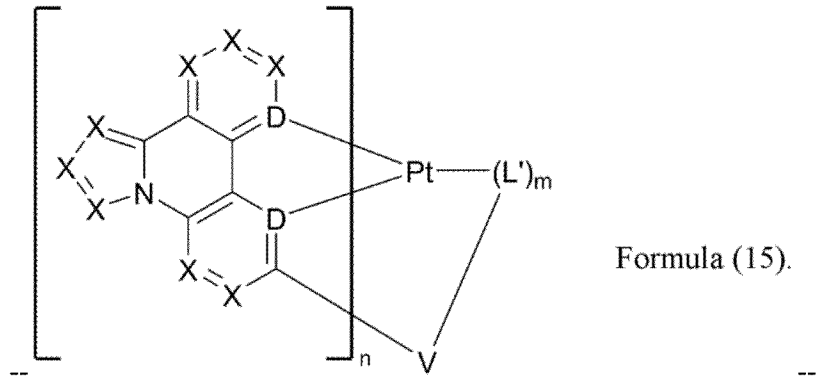

Formula (15).